United States Patent
Haketa et al.

(10) Patent No.: US 9,991,445 B2
(45) Date of Patent: Jun. 5, 2018

(54) HETEROCYCLIC COMPOUND, MATERIAL FOR ORGANIC ELECTROLUMINESCENCE DEVICE INCLUDING THE SAME, AND ORGANIC ELECTROLUMINESCENCE DEVICE AND ELECTRONIC EQUIPMENT EMPLOYING THE SAME

(71) Applicant: Idemitsu Kosan Co., Ltd., Chiyoda-ku (JP)

(72) Inventors: Tasuku Haketa, Chiba (JP); Masahiro Kawamura, Chiba (JP); Kazuki Nishimura, Chiba (JP); Yumiko Mizuki, Chiba (JP); Hirokatsu Ito, Chiba (JP); Tomoharu Hayama, Chiba (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 809 days.

(21) Appl. No.: 14/289,840

(22) Filed: May 29, 2014

(65) Prior Publication Data

US 2014/0353640 A1 Dec. 4, 2014

(30) Foreign Application Priority Data

May 29, 2013 (JP) .................................. 2013-113471

(51) Int. Cl.
| | |
|---|---|
| *H01L 51/54* | (2006.01) |
| *C09K 11/06* | (2006.01) |
| *H01L 51/00* | (2006.01) |
| *H01L 51/50* | (2006.01) |

(52) U.S. Cl.
CPC ...... *H01L 51/0054* (2013.01); *H01L 51/0067* (2013.01); *H01L 51/0052* (2013.01); *H01L 51/0061* (2013.01); *H01L 51/0071* (2013.01); *H01L 51/5012* (2013.01); *H01L 51/5016* (2013.01); *H01L 51/5056* (2013.01); *H01L 51/5072* (2013.01)

(58) Field of Classification Search
CPC .. C07D 209/82; C07D 403/00; C07D 403/14; C07D 407/00; C07D 407/14; C07D 409/00; C07D 409/14; C07D 491/00; C07D 491/12; C07D 491/147; C07D 491/153; C07D 493/00; C07D 493/12; C07D 493/14; C07D 493/16; C07D 495/00; C07D 495/12; C07D 495/14; C07D 495/16; H01L 51/0032; H01L 51/005; H01L 51/0052; H01L 51/054; H01L 51/0056; H01L 51/067; H01L 51/0062; H01L 51/0071; H01L 51/0072; H01L 51/0073; H01L 51/0074; H01L 51/50; H01L 51/5012; H01L 51/5056; H01L 51/5072; H01L 51/5088; H01L 51/5092
USPC ....... 428/690, 691, 917, 411.4, 336; 427/58, 427/66; 313/500–512; 257/40, 88–104, 257/E51.001–E51.052; 252/301.16–301.35; 544/212, 284, 331, 544/416
See application file for complete search history.

(56) References Cited

U.S. PATENT DOCUMENTS

| | | | |
|---|---|---|---|
| 2002/0034656 A1* | 3/2002 | Thompson | ........... C07D 209/86 428/690 |
| 2013/0082591 A1 | 4/2013 | Seo et al. | |

FOREIGN PATENT DOCUMENTS

| | | |
|---|---|---|
| JP | 2000-260566 A | 9/2000 |
| JP | 2006-135146 | 5/2006 |
| JP | 2013-65842 A | 4/2013 |
| KR | 10-2011-0011579 | 2/2011 |
| WO | WO 2009/136595 A1 | 11/2009 |
| WO | WO 2010/151011 A1 | 12/2010 |
| WO | WO 2012/141273 | 10/2012 |

OTHER PUBLICATIONS

Machine translation JP2006-135146. Year of publication: 2006.*
U.S. Appl. No. 14/767,395, filed Aug. 12, 2015, Haketa, et al.
Office Action dated Aug. 16, 2016 in Japanese Patent Application No. 2014-111777.

* cited by examiner

*Primary Examiner* — Andrew K Bohaty
(74) *Attorney, Agent, or Firm* — Oblon, McClelland, Maier & Neustadt, L.L.P.

(57) ABSTRACT

A heterocyclic compound wherein three five-membered rings are fused to one benzene ring and a saturated or unsaturated ring is fused to each five-membered ring. An organic electroluminescence device includes one or more organic thin film layers between an anode and a cathode. The one or more organic thin film layers include a light emitting layer. At least one layer of the one or more organic thin film layers includes the heterocyclic compound.

19 Claims, 1 Drawing Sheet

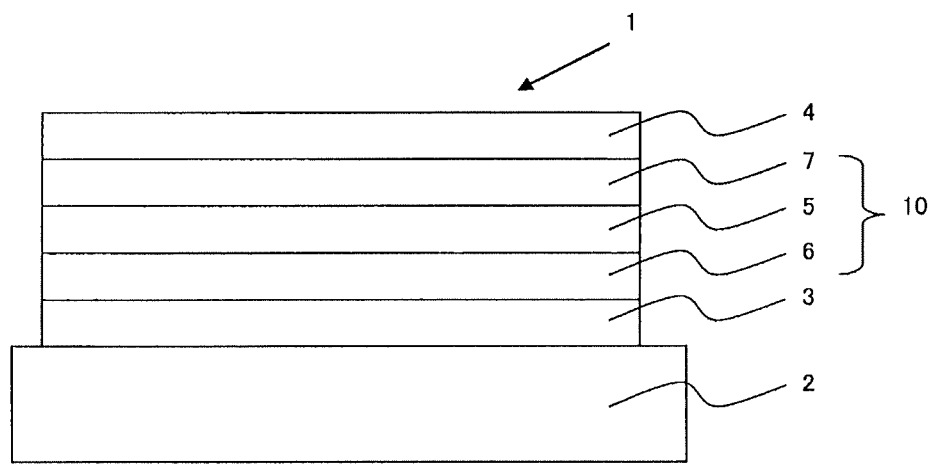

HETEROCYCLIC COMPOUND, MATERIAL FOR ORGANIC ELECTROLUMINESCENCE DEVICE INCLUDING THE SAME, AND ORGANIC ELECTROLUMINESCENCE DEVICE AND ELECTRONIC EQUIPMENT EMPLOYING THE SAME

CROSS-REFERENCE TO RELATED APPLICATION

This application is based upon and claims the benefit of priority from the prior Japanese Patent Application No. 2013-113471, filed on May 29, 2013; the entire contents of which are incorporated herein by reference.

TECHNICAL FIELD

The present invention relates to heterocyclic compounds, materials for organic electroluminescence device comprising the heterocyclic compounds, and organic electroluminescence devices and electronic equipment each employing the heterocyclic compound.

BACKGROUND ART

An organic electroluminescence (EL) device generally comprises an anode, a cathode, and one or more organic thin film layers sandwiched between the anode and the cathode. When a voltage is applied between the electrodes, electrons are injected from the cathode and holes are injected from the anode into a light emitting region. The injected electrons recombine with the injected holes in the light emitting region to form excited states. When the excited states return to the ground state, the energy is released as light.

Many researches have been made on the applications of organic EL device to display, etc. because of its possibility of a wide selection of emission colors by using various emitting materials in a light emitting layer. Particularly, the research on the materials which emit three primary red, green, blue colors has been made most actively, and the intensive research has been made to improve their properties.

Patent Documents 1 to 4 disclose the compounds wherein 2 or 3 indene structures or indole structures are fused to one benzene ring as the material for organic EL device. In Patent Documents 1 and 2, the indole skeletons are fused to one benzene ring in the opposite directions. In Patent Documents 3 and 4, the indene or indole skeletons are fused to one benzene ring in the same direction.

However, it has been still required in the field of organic EL device to develop new materials which can further improve the device performance.

PRIOR ART

Patent Documents

Patent Document 1: WO 2009/136595
Patent Document 2: KR 2011-0011579A
Patent Document 3: JP 2006-135146A
Patent Document 4: WO 2012/141273

SUMMARY OF THE INVENTION

Problem to be Solved by the Invention

The present invention has been made to solve the above problems and an object of the invention is to provide a new material useful for organic EL device.

Means for Solving the Problem

Patent Document 3 discloses a compound in which the nitrogen atom of the indole fused to a benzene ring has an alkyl substituent.

As a result of extensive research, the inventors have found that an inventive heterocyclic compound, in which the nitrogen atom of the indole fused to a benzene ring has an aryl substituent or a heteroaryl substituent, is expected to make the intermolecular charge transfer easy and prolong the device lifetime, because the substituent of the heterocyclic compound is more bulky than the alkyl substituent of the known compound mentioned above, thereby allowing the heterocyclic compound to easily become amorphous and making the heterocyclic compound hardly crystallizable. In addition, it has been further found that when introducing an aryl or heteroaryl substituent to the nitrogen atom, a high stabilization effect due to the resonance between the aryl or heteroaryl substituent and the lone pair of the nitrogen atom is obtained. By this effect, the hole transported from the anode is captured on the nitrogen atom to improve the structural stability of the heterocyclic compound against the hole transport, and therefore, the lifetime is expected to be prolonged.

Patent Documents 3 and 4 propose a compound in which three indole skeletons are fused to one benzene.

As a result of further research, the inventors have found that a compound in which one or two indole skeletons are fused to one benzene is expected to be a useful phosphorescent host material, because its triplet energy is higher than that of the proposed compounds in which three indole skeletons are fused to one benzene.

In an aspect, the present invention provides (1) to (4):
(1) A heterocyclic compound represented by formula (1):

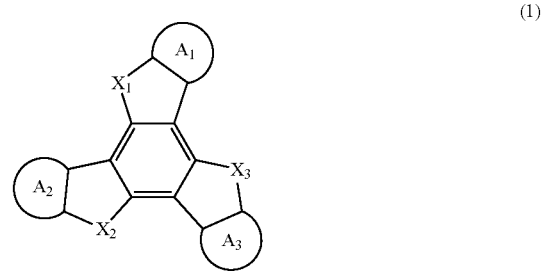

wherein:
each of $A_1$ to $A_3$ independently represents a saturated or unsaturated ring, and each of $A_1$ to $A_3$ is optionally substituted with a substituent;
each of $X_1$ to $X_3$ independently represents a linking group represented by any of formulae (2) to (5), and one or two of $X_1$ to $X_3$ are represented by formula (2) and the rest is represented by any of formulae (3) to (5):

-continued

(4)

(5)

in formula (2), $Y_1$ represents a substituted or unsubstituted aryl group having 6 to 50 ring carbon atoms or a substituted or unsubstituted heteroaryl group having 5 to 50 ring atoms; and in formula (3), each of $Y_2$ and $Y_3$ independently represents a hydrogen atom or a group, $Y_2$ and $Y_3$ are optionally bonded to each other to form a ring structure, and each of $Y_1$ to $Y_3$ is optionally bonded to the substituent of $A_1$ to $A_3$ to form a ring structure;

(2) A material for organic electroluminescence device comprising the heterocyclic compound;

(3) An organic electroluminescence device which comprises one or more organic thin film layers between an anode and a cathode, wherein
 one or more organic thin film layers comprise a light emitting layer; and
 at least one layer of one or more organic thin film layers comprises the heterocyclic compound; and (4) An electronic equipment comprising the organic electroluminescence device.

Effect of the Invention

The present invention provides a novel material useful as a material for organic EL device and an organic EL device produced by using the material.

BRIEF DESCRIPTION OF THE DRAWINGS

The FIGURE is a schematic illustration showing an example of the structure of an organic electroluminescence device (hereinafter also referred to as "organic EL device") according to an embodiment of the invention.

MODE FOR CARRYING OUT THE INVENTION

The term of "XX to YY carbon atoms" in the expression of "a substituted or unsubstituted Z group having XX to YY carbon atoms" used herein is the number of carbon atoms of the unsubstituted Z group and does not include any carbon atom in the substituent of the substituted Z group. "YY" is larger than "XX" and each of "XX" and "YY" represents an integer of 1 or more.

The term of "XX to YY atoms" in the expression of "a substituted or unsubstituted ZZ group having XX to YY atoms" used herein is the number of atoms of the unsubstituted ZZ group and does not include any atom in the substituent of the substituted ZZ group. "YY" is larger than "XX" and each of "XX" and "YY" represents an integer of 1 or more.

The term of "unsubstituted ZZ group" in the expression of "a substituted or unsubstituted ZZ group" used herein means the ZZ group wherein no hydrogen atom is substituted with a substituent.

The definition of "hydrogen atom" used herein includes isotopes different in the neutron numbers, i.e., light hydrogen (protium), heavy hydrogen (deuterium), and tritium.

In the present invention, a substituted or unsubstituted carbazolyl group includes the following carbazolyl groups:

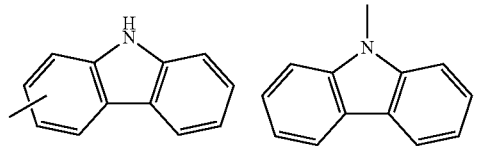

and a carbazolyl group substituted with an optional substituent mentioned below, and further include, for example, the following substituted carbazolyl group:

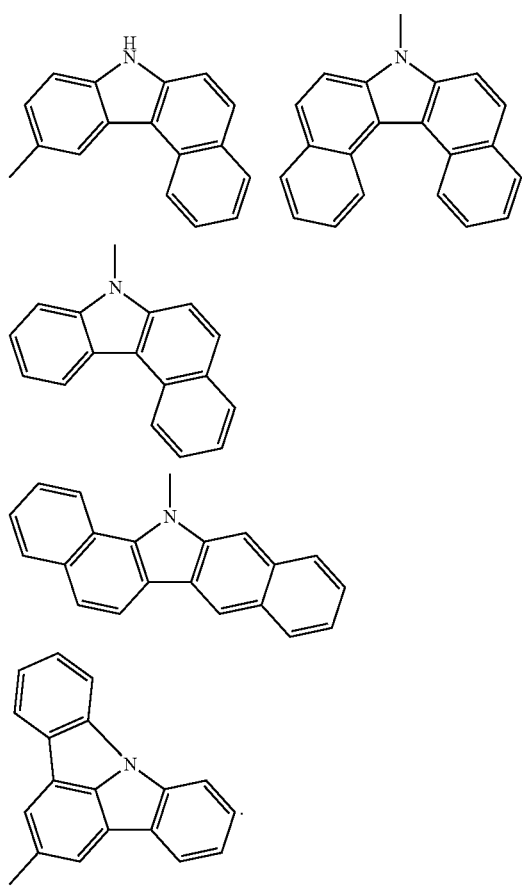

In the present invention, a substituted or unsubstituted dibenzofuranyl group and a substituted or unsubstituted dibenzothiophenyl group include the following dibenzofuranyl group and the following dibenzothiophenyl group:

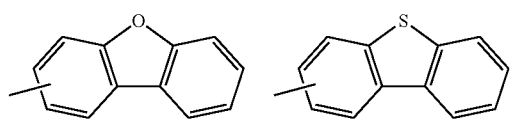

and a dibenzofuranyl group and a dibenzothiophenyl group each being substituted with an optional substituent mentioned below, and further includes, for example, the following substituted dibenzofuranyl group and the following substituted dibenzothiophenyl group:

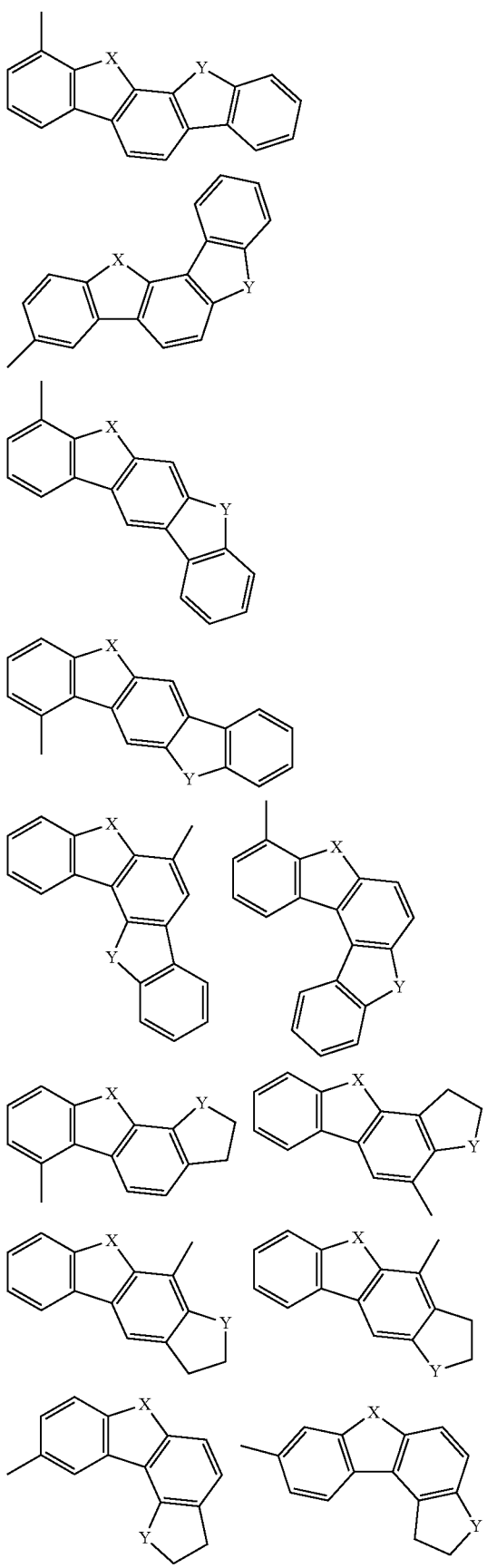

-continued

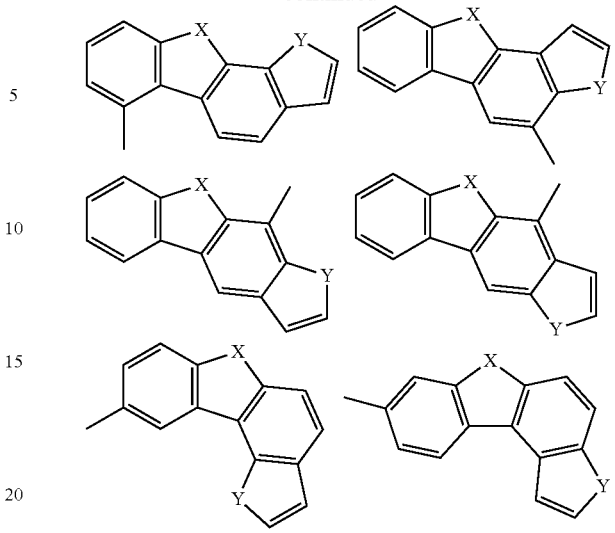

wherein X represents an oxygen atom or a sulfur atom and Y represents an oxygen atom, a sulfur atom, NH, NR$^a$ wherein R$^a$ represents an alkyl group or an aryl group, CH$_2$, or CR$^b{}_2$ wherein Rb represents an alkyl group or an aryl group.

The number of "ring carbon atoms" referred to herein means the number of the carbon atoms included in the atoms which are members forming the ring itself of a compound in which a series of atoms is bonded to form the ring (for example, a monocyclic compound, a fused ring compound, a cross-linked compound, a carbocyclic compound, and a heterocyclic compound). If the ring has a substituent, the carbon atom in the substituent is not included in the ring carbon atom. The same applies to the number of "ring carbon atom" described below, unless otherwise noted. For example, a benzene ring has 6 ring carbon atoms, a naphthalene ring has 10 ring carbon atoms, a pyridinyl group has 5 ring carbon atoms, and a furanyl group has 4 ring carbon atoms. If a benzene ring or a naphthalene ring has, for example, an alkyl substituent, the carbon atom in the alkyl substituent is not counted as the ring carbon atom of the benzene or naphthalene ring. In case of a fluorene ring to which a fluorene substituent is bonded (inclusive of a spirofluorene ring), the carbon atom in the fluorene substituent is not counted as the ring carbon atom of the fluorene ring.

The number of "ring atom" referred to herein means the number of the atoms which are members forming the ring itself (for example, a monocyclic ring, a fused ring, and a ring assembly) of a compound in which a series of atoms is bonded to form the ring (for example, a monocyclic compound, a fused ring compound, a cross-linked compound, a carbocyclic compound, and a heterocyclic compound). The atom not forming the ring (for example, hydrogen atom(s) for saturating the valence of the atom which forms the ring) and the atom in a substituent, if the ring is substituted, are not counted as the ring atom. The same applies to the number of "ring atoms" described below, unless otherwise noted. For example, a pyridine ring has 6 ring atoms, a quinazoline ring has 10 ring atoms, and a furan ring has 5 ring atoms. The hydrogen atom on the ring carbon atom of a pyridine ring or a quinazoline ring and the atom in a substituent are not counted as the ring atom. In case of a fluorene ring to which a fluorene substituent is bonded (inclusive of a spirofluorene ring), the atom in the fluorene substituent is not counted as the ring atom of the fluorene ring.

The optional substituent referred to by "substituted or unsubstituted" used herein is preferably selected from the group consisting of an alkyl group having 1 to 50, preferably 1 to 18, more preferably 1 to 8 carbon atoms; a cycloalkyl group having 3 to 50, preferably 3 to 10, more preferably 3 to 8, still more preferably 5 or 6 ring carbon atoms; an aryl group having 6 to 50, preferably 6 to 25, more preferably 6 to 18 ring carbon atoms; an aralkyl group having 7 to 51, preferably 7 to 30, more preferably 7 to 20 carbon atoms which includes an aryl group having 6 to 50, preferably 6 to 25, more preferably 6 to 18 ring carbon atoms; an amino group; a mono- or di-substituted amino group, wherein the substituent is selected from an alkyl group having 1 to 50, preferably 1 to 18, more preferably 1 to 8 carbon atoms and an aryl group having 6 to 50, preferably 6 to 25, more preferably 6 to 18 ring carbon atoms; an alkoxy group including an alkyl group having 1 to 50, preferably 1 to 18, more preferably 1 to 8 carbon atoms; an aryloxy group including an aryl group having 6 to 50, preferably 6 to 25, more preferably 6 to 18 ring carbon atoms; a mono-, di- or tri-substituted silyl group having a substituent selected from an alkyl group having 1 to 50, preferably 1 to 18, more preferably 1 to 8 carbon atoms and an aryl group having 6 to 50, preferably 6 to 25, more preferably 6 to 18 ring carbon atoms; a heteroaryl group having 5 to 50, preferably 5 to 24, more preferably 5 to 13 ring atoms; a haloalkyl group having 1 to 50, preferably 1 to 18, more preferably 1 to 8 carbon atoms; a halogen atom selected from a fluorine atom, a chlorine atom, a bromine atom and an iodine atom; a cyano group; a nitro group; a substituted sulfonyl group, wherein the substituent is selected from an alkyl group having 1 to 50, preferably 1 to 18, more preferably 1 to 8 carbon atoms and an aryl group having 6 to 50, preferably 6 to 25, more preferably 6 to 18 ring carbon atoms; a di-substituted phosphoryl group having a substituent selected from an alkyl group having 1 to 50, preferably 1 to 18, more preferably 1 to 8 carbon atoms and an aryl group having 6 to 50, preferably 6 to 25, more preferably 6 to 18 ring carbon atoms; an alkylsulfonyloxy group; an arylsulfonyloxy group; an alkylcarbonyloxy group; an arylcarbonyloxy group; a boron-containing group; a zinc-containing group; a tin-containing group; a silicon-containing group; a magnesium-containing group; a lithium-containing group; a hydroxyl group; an alkyl-substituted or aryl-substituted carbonyl group; a carboxyl group; a vinyl group; a (meth) acryloyl group; an epoxy group; and an oxetanyl group.

The optional substituent may be further substituted with an optional substituent mentioned above.

Heterocyclic Compound

The heterocyclic compound of the invention is represented by formula (1):

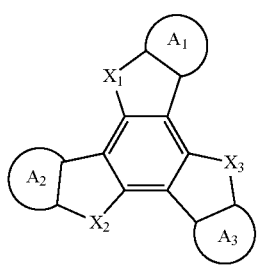

(1)

wherein:

each of $A_1$ to $A_3$ independently represents a saturated or unsaturated ring, and each of $A_1$ to $A_3$ is optionally substituted with a substituent;

each of $X_1$ to $X_3$ independently represents a linking group represented by any of formulae (2) to (5), and one or two of $X_1$ to $X_3$ are represented by formula (2) and the rest is represented by any of formulae (3) to (5):

(2)

(3)

(4)

(5)

in formula (2), $Y_1$ represents a substituted or unsubstituted aryl group having 6 to 50 ring carbon atoms or a substituted or unsubstituted heteroaryl group having 5 to 50 ring atoms; and in formula (3), each of $Y_2$ and $Y_3$ independently represents a hydrogen atom or a group, $Y_2$ and $Y_3$ are optionally bonded to each other to form a ring structure, and each of $Y_1$ to $Y_3$ is optionally bonded to the substituent on $A_1$ to $A_3$ to form a ring structure.

Preferably, each of $A_1$ to $A_3$ independently represents a substituted or unsubstituted 5-, 6- or 7-membered ring, and more preferably, each of $A_1$ to $A_3$ independently represents a substituted or unsubstituted 6-membered ring.

The heterocyclic compound is preferably represented by formula (6):

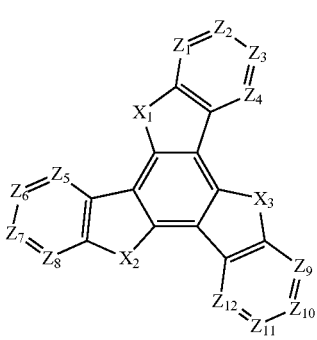

(6)

wherein:

$X_1$ to $X_3$ are as defined above;

each of $Z_1$ to $Z_{12}$ independently represents C(R) or a nitrogen atom; and

R independently represents a hydrogen atom or a group; provided that when two or more of $Z_1$ to $Z_{12}$ have the groups, the groups are optionally bonded to each other to form a ring structure.

Preferably, each of $Z_1$ to $Z_{12}$ of formula (6) independently represents C(R).

The substituent of $A_1$ to $A_3$ in formula (1), the group represented by $Y_2$ and $Y_3$ of formula (3), and the group represented by R of formula (6) are independently selected from the following group (A), preferably from the following group (B), more preferably from the following group (C), and still more preferably from the following group (D).

The group (A) comprises a substituted or unsubstituted alkyl group having 1 to 50 carbon atoms; a substituted or unsubstituted cycloalkyl group having 3 to 50 ring carbon atoms; a substituted or unsubstituted aryl group having 6 to 50 ring carbon atoms; a substituted or unsubstituted aralkyl group having 7 to 51 carbon atoms; an amino group; a mono- or di-substituted amino group, wherein the substituent is selected from a substituted or unsubstituted alkyl group having 1 to 50 carbon atoms and a substituted or unsubstituted aryl group having 6 to 50 ring carbon atoms; a substituted or unsubstituted alkoxy group having 1 to 50 carbon atoms; an aryloxy group having 6 to 50 ring carbon atoms; a mono-, di- or tri-substituted silyl group, wherein the substituent is selected from a substituted or unsubstituted alkyl group having 1 to 50 carbon atoms and a substituted or unsubstituted aryl group having 6 to 50 ring carbon atoms; a substituted or unsubstituted heteroaryl group having 5 to 50 ring atoms; a substituted or unsubstituted haloalkyl group having 1 to 50 carbon atoms; a halogen atom; a cyano group; a nitro group; a substituted sulfonyl group, wherein the substituent is selected from a substituted or unsubstituted alkyl group having 1 to 50 carbon atoms and a substituted or unsubstituted aryl group having 6 to 50 ring carbon atoms; a di-substituted phosphoryl group, wherein the substituent is selected from a substituted or unsubstituted alkyl group having 1 to 50 carbon atoms and a substituted or unsubstituted aryl group having 6 to 50 ring carbon atoms; an alkylsulfonyloxy group; an arylsulfonyloxy group; an alkylcarbonyloxy group; an arylcarbonyloxy group; a boron-containing group; a zinc-containing group; a tin-containing group; a silicon-containing group; a magnesium-containing group; a lithium-containing group; a hydroxyl group; an alkyl-substituted or aryl-substituted carbonyl group; a carboxyl group; a vinyl group; a (meth)acryloyl group; an epoxy group; and an oxetanyl group.

The group (B) comprises a substituted or unsubstituted alkyl group having 1 to 50 carbon atoms; a substituted or unsubstituted cycloalkyl group having 3 to 50 ring carbon atoms; a substituted or unsubstituted aryl group having 6 to 50 ring carbon atoms; a substituted or unsubstituted aralkyl group having 7 to 51 carbon atoms; an amino group; a mono- or di-substituted amino group, wherein the substituent is selected from a substituted or unsubstituted alkyl group having 1 to 50 carbon atoms and a substituted or unsubstituted aryl group having 6 to 50 ring carbon atoms; a substituted or unsubstituted alkoxy group having 1 to 50 carbon atoms; an aryloxy group having 6 to 50 ring carbon atoms; a mono-, di- or tri-substituted silyl group, wherein the substituent is selected from a substituted or unsubstituted alkyl group having 1 to 50 carbon atoms and a substituted or unsubstituted aryl group having 6 to 50 ring carbon atoms; a substituted or unsubstituted heteroaryl group having 5 to 50 ring atoms; a substituted or unsubstituted haloalkyl group having 1 to 50 carbon atoms; a halogen atom; a cyano group; a nitro group; a substituted sulfonyl group, wherein the substituent is selected from a substituted or unsubstituted alkyl group having 1 to 50 carbon atoms and a substituted or unsubstituted aryl group having 6 to 50 ring carbon atoms; and a di-substituted phosphoryl group, wherein the substituent is selected from a substituted or unsubstituted alkyl group having 1 to 50 carbon atoms and a substituted or unsubstituted aryl group having 6 to 50 ring carbon atoms.

The group (C) comprises a substituted or unsubstituted alkyl group having 1 to 50 carbon atoms; a substituted or unsubstituted cycloalkyl group having 3 to 50 ring carbon atoms; a substituted or unsubstituted aryl group having 6 to 50 ring carbon atoms; a substituted or unsubstituted aralkyl group having 7 to 51 carbon atoms; an amino group; a mono- or di-substituted amino group, wherein the substituent is selected from a substituted or unsubstituted alkyl group having 1 to 50 carbon atoms and a substituted or unsubstituted aryl group having 6 to 50 ring carbon atoms; a substituted or unsubstituted alkoxy group having 1 to 50 carbon atoms; an aryloxy group having 6 to 50 ring carbon atoms; a mono-, di- or tri-substituted silyl group, wherein the substituent is selected from a substituted or unsubstituted alkyl group having 1 to 50 carbon atoms and a substituted or unsubstituted aryl group having 6 to 50 ring carbon atoms; a substituted or unsubstituted heteroaryl group having 5 to 50 ring atoms; a substituted or unsubstituted haloalkyl group having 1 to 50 carbon atoms; a halogen atom; a cyano group; and a nitro group.

The group (D) comprises a substituted or unsubstituted alkyl group having 1 to 50 carbon atoms; a substituted or unsubstituted cycloalkyl group having 3 to 50 ring carbon atoms; a substituted or unsubstituted aryl group having 6 to 50 ring carbon atoms; a mono- or di-substituted amino group, wherein the substituent is selected from a substituted or unsubstituted alkyl group having 1 to 50 carbon atoms and a substituted or unsubstituted aryl group having 6 to 50 ring carbon atoms; a substituted or unsubstituted heteroaryl group having 5 to 50 ring atoms; a halogen atom; a cyano group; and a nitro group.

Examples of the alkyl group having 1 to 50, preferably 1 to 18, more preferably 1 to 8 carbon atoms include methyl group, ethyl group, n-propyl group, isopropyl group, n-butyl group, isobutyl group, s-butyl group, t-butyl group, pentyl group (inclusive of isomeric groups), hexyl group (inclusive of isomeric groups), heptyl group (inclusive of isomeric groups), octyl group (inclusive of isomeric groups), nonyl group (inclusive of isomeric groups), decyl group (inclusive of isomeric groups), undecyl group (inclusive of isomeric groups), dodecyl group (inclusive of isomeric groups), tridecyl group, tetradecyl group, octadecyl group, tetracosanyl group, and tetracontanyl group. Preferred examples include methyl group, ethyl group, n-propyl group, isopropyl group, n-butyl group, isobutyl group, s-butyl group, t-butyl group, pentyl group (inclusive of isomeric groups), hexyl group (inclusive of isomeric groups), heptyl group (inclusive of isomeric groups), octyl group (inclusive of isomeric groups), nonyl group (inclusive of isomeric groups), decyl group (inclusive of isomeric groups), undecyl group (inclusive of isomeric groups), dodecyl group (inclusive of isomeric groups), tridecyl group, tetradecyl group, and octadecyl group. More preferred examples include methyl group, ethyl group, n-propyl group, isopropyl group, n-butyl group, isobutyl group, s-butyl group, t-butyl group, pentyl group (inclusive of isomeric groups), hexyl group (inclusive of isomeric groups), heptyl group (inclusive of isomeric groups), and octyl group (inclusive of isomeric groups).

Examples of the cycloalkyl group having 3 to 50, preferably 3 to 10, more preferably 3 to 8, still more preferably 5 or 6 ring carbon atoms include cyclopropyl group, cyclobutyl group, cyclopentyl group, cyclohexyl group, cycloheptyl group, cyclooctyl group, and adamantyl group, with cyclopentyl group and cyclohexyl group being preferred.

Examples of the aryl group having 6 to 50, preferably 6 to 25, more preferably 6 to 18 ring carbon atoms include phenyl group, naphthyl group, naphthylphenyl group, biphenylyl group, terphenylyl group, acenaphthylenyl group, anthryl group, benzanthryl group, aceanthryl group, phenanthryl group, benzophenanthryl group, phenalenyl group, fluorenyl group, 9,9'-spirobifluorenyl group, benzofluorenyl group, dibenzofluorenyl group, picenyl group, pentaphenyl group, pentacenyl group, pyrenyl group, chrysenyl group, benzochrysenyl group, s-indacenyl group, as-indacenyl group, fluoranthenyl group, benzofluoranthenyl group, tetracenyl group, triphenylenyl group, benzotriphenylenyl group, perylenyl group, coronyl group, and dibenzanthryl group.

Examples of the arylene group having 6 to 50, preferably 6 to 25, more preferably 6 to 18 ring carbon atoms include the groups obtained by removing one hydrogen atom from the aryl groups mentioned above, preferably from phenyl group, naphthyl group, biphenylyl group, terphenylyl group, phenanthryl group, fluorenyl group, fluoranthenyl group, and triphenylenyl group.

The heteroaryl group having 5 to 50, preferably 5 to 24, more preferably 5 to 13 ring atoms include at least one, preferably 1 to 5, more preferably 1 to 3, and still more preferably 1 or 2 hetero atoms, for example, a nitrogen atom, a sulfur atom, an oxygen atom, a phosphorus atom. Examples thereof include pyrrolyl group, furyl group, thienyl group, pyridyl group, pyridazinyl group, pyrimidinyl group, pyrazinyl group, triazinyl group, imidazolyl group, oxazolyl group, thiazolyl group, pyrazolyl group, isooxazolyl group, isothiazolyl group, oxadiazolyl group, thiadiazolyl group, triazolyl group, tetrazolyl group, indolyl group, isoindolyl group, benzofuranyl group, isobenzofuranyl group, benzothiophenyl group, isobenzothiophenyl group, indolizinyl group, quinolizinyl group, quinolyl group, isoquinolyl group, cinnolyl group, phthalazinyl group, quinazolinyl group, quinoxalinyl group, benzimidazolyl group, benzoxazolyl group, benzothiazolyl group, indazolyl group, benzisoxazolyl group, benzisothiazolyl group, dibenzofuranyl group, dibenzothiophenyl group, carbazolyl group, phenanthridinyl group, acridinyl group, phenanthrolinyl group, phenazinyl group, phenothiazinyl group, phenoxazinyl group, azatriphenylenyl group, diazatriphenylenyl group, xanthenyl group, azacarbazolyl group, azadibenzofuranyl group, azadibenzothiophenyl group, benzofuranobenzothiophenyl group, benzothienobenzothiophenyl group, dibenzofuranonaphthyl group, dibenzothienonaphthyl group, and dinaphthothienothiophenyl group. Preferred are pyridyl group, pyrimidinyl group, pyrazinyl group, triazinyl group, indolyl group, benzofuranyl group, benzothiophenyl group, quinolyl group, isoquinolyl group, quinazolinyl group, quinoxalinyl group, benzimidazolyl group, dibenzofuranyl group, dibenzothiophenyl group, carbazolyl group, phenanthridinyl group, phenanthrolinyl group, and diazatriphenylenyl group.

In addition, examples of the heteroaryl group having 5 to 50 ring atoms preferably include mono-valent groups derived from the following compounds by removing one hydrogen atom:

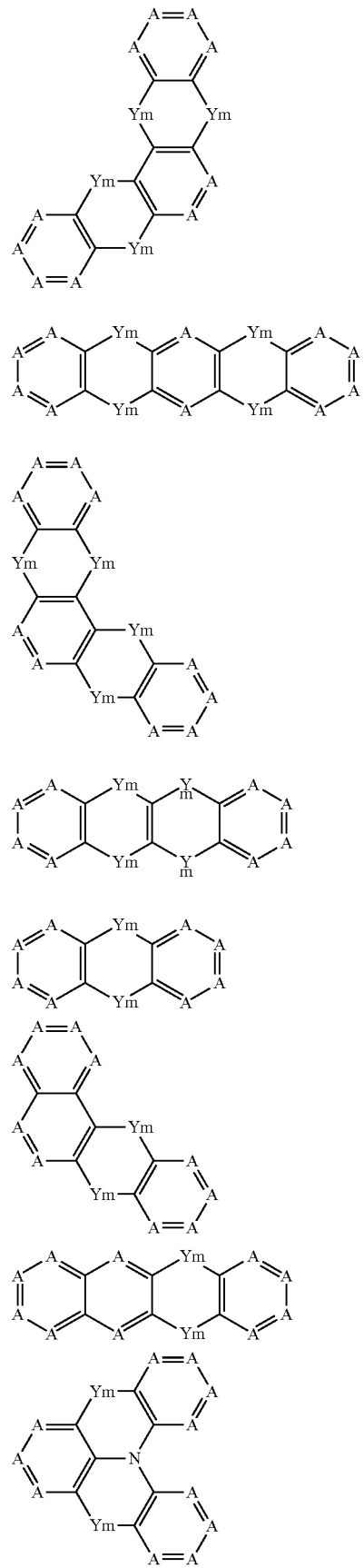

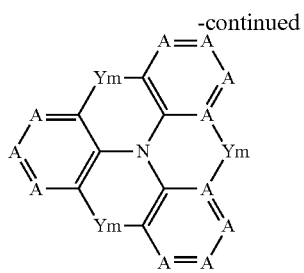

wherein:

A independently represents $CR^{100}$ or a nitrogen atom;

$R^{100}$ independently represents a hydrogen atom or a group;

Y independently represents a single bond, $C(R^{101})(R^{102})$, an oxygen atom, a sulfur atom, or $N(R^{103})$;

each of $R^{101}$, $R^{102}$ and $R^{103}$ independently represents a hydrogen atom or a group;

m independently represents 0 or 1; and $Y_0$ represents a single bond.

The group referred to in the above formulae is selected from those mentioned above.

Examples of the aralkyl group having 7 to 51 total carbon atoms include those having an aryl group having 6 to 50, preferably 6 to 25, more preferably 6 to 18 ring carbon atoms which is selected from the aryl groups mentioned above.

Examples of the mono- or di-substituted amino group include those having a substituent selected from an alkyl group having 1 to 50, preferably 1 to 18, more preferably 1 to 8 carbon atoms and an aryl group having 6 to 50, preferably 6 to 25, more preferably 6 to 18 ring carbon atoms, wherein the substituent is selected from the alkyl groups and the aryl groups mentioned above.

Examples of the alkoxy group include those having an alkyl group having 1 to 50, preferably 1 to 18, more preferably 1 to 8 carbon atoms which is selected from the alkyl groups mentioned above.

Examples of the aryloxy group include those having an aryl group having 6 to 50, preferably 6 to 25, more preferably 6 to 18 ring carbon atoms which is selected from the aryl groups mentioned above.

Examples of the mono-, di- or tri-substituted silyl group include those having a substituent selected from an alkyl group having 1 to 50, preferably 1 to 18, more preferably 1 to 8 carbon atoms and an aryl group having 6 to 50, preferably 6 to 25, more preferably 6 to 18 ring carbon atoms, wherein the substituent is selected form the alkyl groups and the aryl groups mentioned above.

Examples of the haloalkyl group having 1 to 50, preferably 1 to 18, more preferably 1 to 8 carbon atoms included those obtained by replacing one or more hydrogen atoms of the alkyl groups mentioned above with a halogen atom, such as a fluorine atom, a chlorine atom, a bromine atom and an iodine atom.

Examples of the substituted sulfonyl group include those having a substituent selected from an alkyl group having 1 to 50, preferably 1 to 18, more preferably 1 to 8 carbon atoms and an aryl group having 6 to 50, preferably 6 to 25, more preferably 6 to 18 ring carbon atoms, wherein the substituent is selected from the alkyl groups and the aryl groups mentioned above.

Examples of the di-substituted phosphoryl group include those having a substituent selected from an alkyl group having 1 to 50, preferably 1 to 18, more preferably 1 to 8 carbon atoms and an aryl group having 6 to 50, preferably 6 to 25, more preferably 6 to 18 ring carbon atoms, wherein the substituent is selected from the alkyl groups and the aryl groups mentioned above.

The di-substituted phosphoryl group is preferably represented by formula (P):

wherein each of $Ar_{p1}$ and $Ar_{p2}$ independently represents a substituted or unsubstituted aryl group having 6 to 50 ring carbon atoms.

The aryl group having 6 to 50 ring carbon atoms for $Ar_{p1}$ and $Ar_{p2}$ of formula (P) is selected from the aryl group having 6 to 50 ring carbon atoms mentioned above with respect to formula (1).

The saturated ring represented by $A_1$ to $A_3$ of formula (1) is preferably an aliphatic hydrocarbon ring having 5 to 50, preferably 3 to 6, and more preferably 5 or 6 ring carbon atoms.

The unsaturated ring represented by $A_1$ to $A_3$ of formula (1) is preferably an aromatic hydrocarbon ring having 6 to 50, preferably 6 to 24, and more preferably 6 to 18 ring carbon atoms or an aromatic heterocyclic ring having 5 to 50, preferably 5 to 24, and more preferably 5 to 13 ring atoms.

In formula (1), the ring structure which is formed by $Y_1$ to $Y_3$ bonded to the substituent of $A_1$ to $A_3$, the ring structure which is formed by $Y_1$ to $Y_3$ bonded to each other, and the ring structure formed by the groups in two or more of $Z_1$ to $Z_{12}$ are preferably selected from the saturated or unsaturated rings mentioned above with respect to $A_1$ to $A_3$.

Examples of the aliphatic hydrocarbon ring having 5 to 50 ring carbon atoms include a cyclopropane ring, a cyclobutane ring, a cyclopentane ring, a cyclohexane ring, a cycloheptane ring, a cyclooctane ring, and an adamantane ring, with a cyclopentane ring and a cyclohexane ring being preferred.

Examples of the aromatic hydrocarbon ring having 6 to 50 ring carbon atoms include a benzene ring, a naphthalene ring, an anthracene ring, a benzanthracene ring, a phenanthrene ring, a benzophenanthrene ring, a fluorene ring, a benzofluorene ring, a dibenzofluorene ring, a picene ring, a tetracene ring, a pentacene ring, a pyrene ring, a chrysene ring, a benzochrysene ring, a s-indacene ring, an as-indacene ring, a fluoranthene ring, a benzofluoranthene ring, a triphenylene ring, a benzotriphenylene ring, a perylene ring, a coronene ring, and a dibenzanthracene ring. Preferred are a benzene ring, a naphthalene ring, a phenanthrene ring, a benzophenanthrene ring, a fluorene ring, a benzofluorene ring, a fluoranthene ring, a benzofluoranthene ring, and a triphenylene ring.

Examples of the aromatic heterocyclic ring having 5 to 50 ring atoms include a pyrrole ring, a pyrazole ring, an isoindole ring, a benzofuran ring, a benzothiophene ring, an isobenzofuran ring, a dibenzothiophene ring, an isoquinoline ring, a cinnoline ring, a quinoxaline ring, a phenanthridine ring, a phenanthroline ring, a pyridine ring, a pyrazine ring, a pyrimidine ring, a pyridazine ring, a triazine ring, an imidazopyridine ring, an indole ring, an indazole ring, a benzimidazole ring, a quinoline ring, a quinazoline ring, an acridine ring, a pyrrolidine ring, a dioxane ring, a piperidine ring, a morpholine ring, a piperazine ring, a carbazole ring, a furan ring, a thiophene ring, an oxazole ring, an oxadiazole ring, a benzoxazole ring, a thiazole ring, a thiadiazole ring, a benzothiazole ring, a triazole ring, an imidazole ring, a pyran ring, a dibenzofuran ring, a benzo[c]dibenzofuran ring, a purine ring, and an acridine ring. Preferred are a benzofuran ring, a benzothiophene ring, a dibenzothiophene ring, an isoquinoline ring, a quinoxaline ring, a phenanthridine ring, a phenanthroline ring, a pyridine ring, a pyrimidine ring, a triazine ring, an indole ring, a quinoline ring, a quinazoline ring, a carbazole ring, a benzimidazole ring, and a dibenzofuran ring. More preferred are a dibenzothiophene ring, a pyridine ring, a pyrimidine ring, a triazine ring, a quinazoline ring, a carbazole ring, a benzimidazole ring, and a dibenzofuran ring.

$Y_1$ of the nitrogen-containing compound of the invention is a substituted or unsubstituted aryl group having 6 to 50 ring carbon atoms or a substituted or unsubstituted heteroaryl group having 5 to 50 ring atoms, which are selected from the aryl group having 6 to 50 ring carbon atoms and the heteroaryl group having 5 to 50 ring atoms mentioned above.

The following group represented by formula (8) is also preferred as $Y_1$:

   (8)

wherein:

$Ar_6$ represents a substituted or unsubstituted aryl group having 6 to 50 ring carbon atoms or a substituted or unsubstituted heteroaryl group having 5 to 50 ring atoms; and $L_{14}$ represent a single bond, a substituted or unsubstituted divalent aromatic hydrocarbon group (arylene group) having 6 to 60 ring carbon atoms or a substituted or unsubstituted divalent heterocyclic group (heteroarylene group) having 3 to 60 ring atoms.

The aryl group having 6 to 50 ring carbon atoms for $Ar_6$ of formula (8) is selected from the aryl group having 6 to 50 ring carbon atoms mentioned above with respect to formula (1). The heteroaryl group having 5 to 50 ring atoms for $Ar_6$ of formula (8) is selected from the heteroaryl group having 5 to 50 ring atoms mentioned above with respect to formula (1).

Examples of $L_{14}$ of formula (8) are selected from those mentioned above with respect to $L_{11}$ of formula (7).

$Ar_6$ of formula (8) is more preferably a phenyl group, a naphthyl group, a biphenylyl group, a terphenylyl group, a phenanthryl group, a benzophenanthryl group, a fluorenyl group, a benzofluorenyl group, a chrysenyl group, a benzochrysenyl group, a fluoranthenyl group, a triphenylenyl group, a pyridyl group, a pyrimidinyl group, a pyrazinyl group, a triazinyl group, an indolyl group, a benzofuranyl group, a benzothiophenyl group, a quinolyl group, an isoquinolyl group, a quinazolinyl group, a quinoxalinyl group, a benzimidazolyl group, a dibenzofuranyl group, a dibenzothiophenyl group, a carbazolyl group, a phenanthridinyl group, a phenanthrolinyl group, or a diazatriphenylenyl group. Still more preferred are a phenyl group, a biphenylyl group, a fluorenyl group, a triphenylenyl group, a pyridyl group, a pyrimidinyl group, a triazinyl group, a quinazolinyl group, a dibenzofuranyl group, a dibenzothiophenyl group, and a carbazolyl group.

$L_{14}$ of formula (8) is particularly preferably a single bond, a phenylene group, a naphthylene group, a biphenylene group, a terphenylene group, a phenanthrylene group, or a fluorenylene group.

Formula (1) and formula (6) preferably satisfy any of the following requirements (i) to (v), more preferably any of (iii) to (v), still more preferably (iv) or (v), and particularly preferably (v):

(i) one of $X_1$ to $X_3$ is represented by formula (2) and the other two are represented by any of formulae (3) to (5);

(ii) two of $X_1$ to $X_3$ are represented by formula (2) and the other one is represented by any of formulae (3) to (5);

(iii) at least one of $X_1$ to $X_3$ is represented by formula (2) and at least one of $X_1$ to $X_3$ is represented by formula (3) or (4);

(iv) at least one of $X_1$ to $X_3$ is represented by formula (2) and at least one of $X_1$ to $X_3$ is represented by formula (4); and (v) at least one of $X_1$ to $X_3$ is represented by formula (2) and at least one of $X_1$ to $X_3$ is represented by formula (3).

In the requirement (iv), $Y_1$ is preferably represented by formula (8), wherein two $Y_1$ groups, if any, may be the same or different. In the requirement (iv), $Y_1$ is preferably represented by formula (8) and $Ar_6$ of formula (8) (one or two, preferably one of $Ar_6$ groups, if two $Y_1$ groups are present) is preferably a fused aryl group or a fused heteroaryl group. $Ar_6$ is particularly preferably a fluoranthenyl group, a triphenylenyl group, a quinazolinyl group, a naphthyl group, a phenanthrolinyl group, a chrysenyl group, or a benzochrysenyl group, because the device performance of a red phosphorescent device is improved.

In the requirement (v), $Y_1$ is preferably represented by formula (8), wherein two $Y_1$ groups, if any, may be the same or different.

Material for Organic Electroluminescence Device

The material for organic EL device of the invention comprises the heterocyclic compound mentioned above. The content of the heterocyclic compound in the material for organic EL device is not particularly limited and suitably 1% by mass or more, preferably 10% by mass or more, more preferably 50% by mass or more, still more preferably 80% by mass or more, and particularly preferably 90% by mass or more.

The material for organic EL device of the invention is useful as a material for use in organic EL devices and usable as, for example, a host material or a dopant material in a light emitting layer of a fluorescent emission unit or a host material in a light emitting layer of a phosphorescent emission unit. The material for organic EL device is also useful as a material for use in the fluorescent emission unit and the phosphorescent emission unit, for example, as a material for use in an anode-side organic thin film layer formed between an anode and a light emitting layer and a cathode-side organic thin film layer formed between a cathode and a light emitting layer, i.e., a material for use in a hole transporting layer, a hole injecting layer, an electron transporting layer, an electron injecting layer, a hole barrier layer, and an electron barrier layer.

The "emission unit" referred to herein is the smallest unit for emitting light by the recombination of injected holes and injected electrons, which comprises one or more organic layers wherein at least one layer is a light emitting layer.

Examples of the heterocyclic compound represented by formula (1) or (6) are shown below, although not limited thereto.

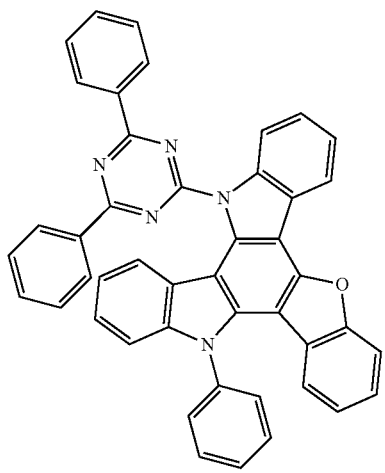
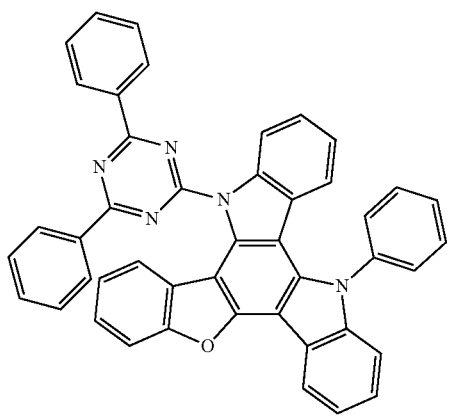
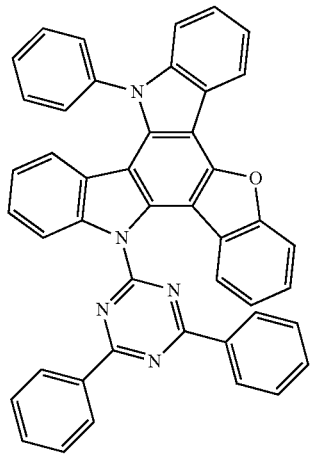
-continued
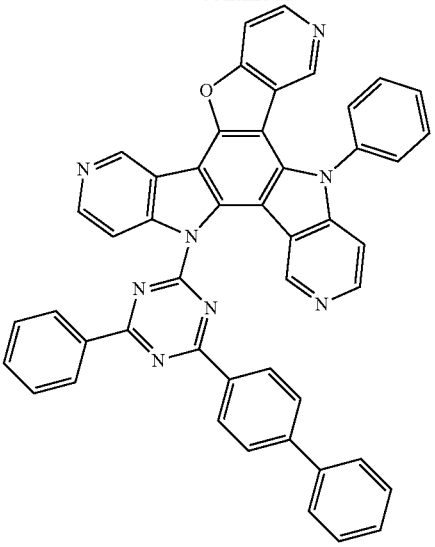
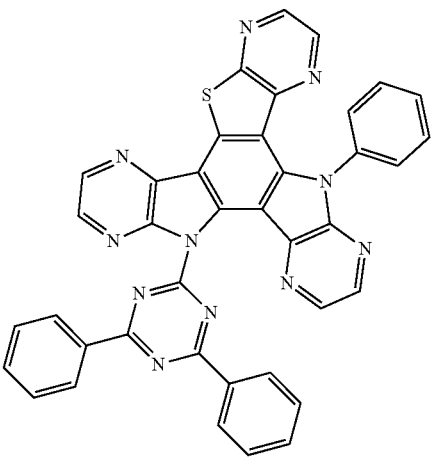
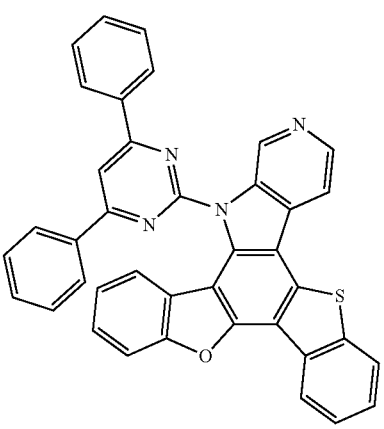

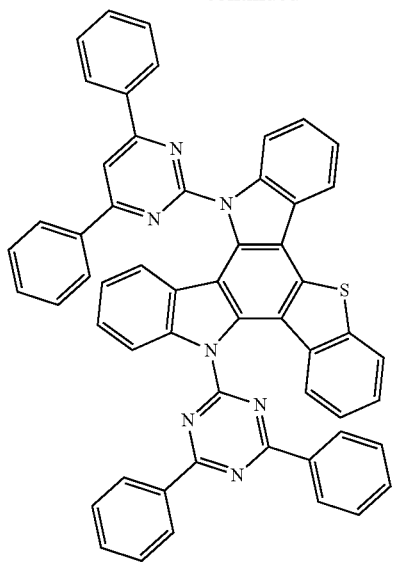
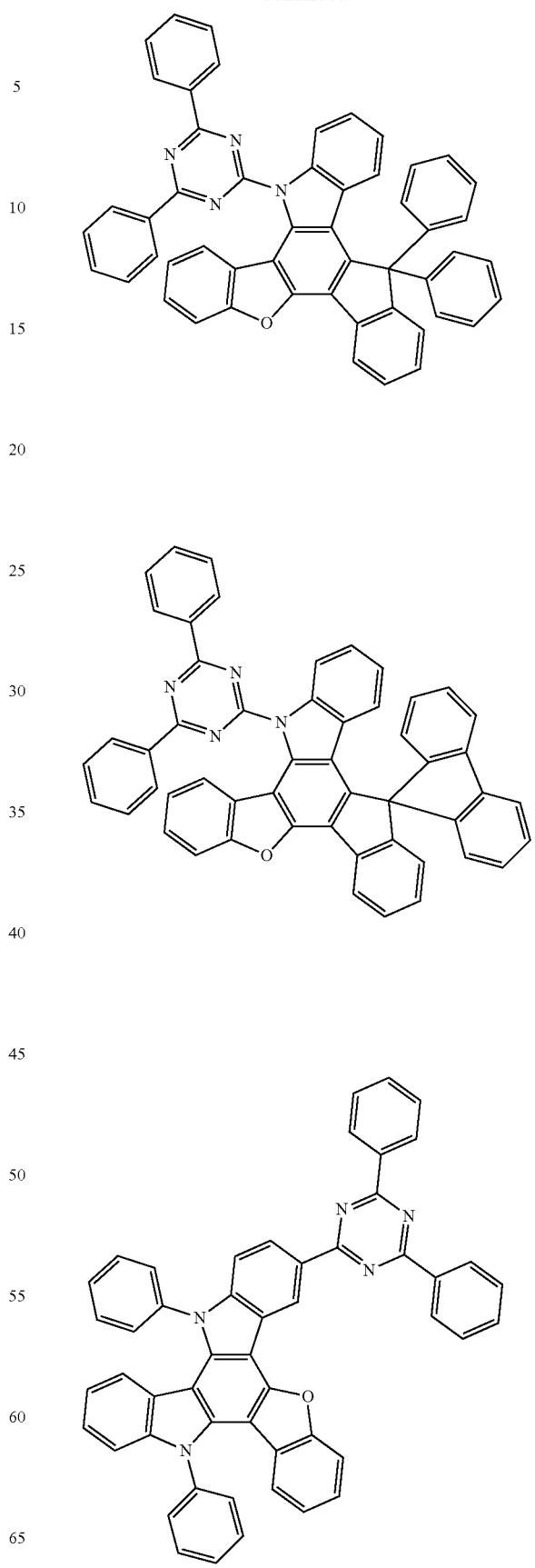

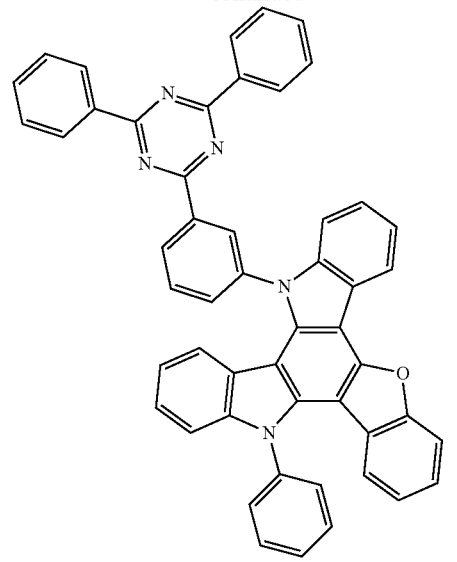
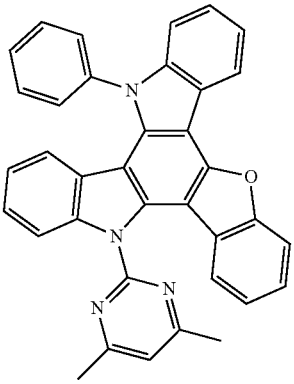
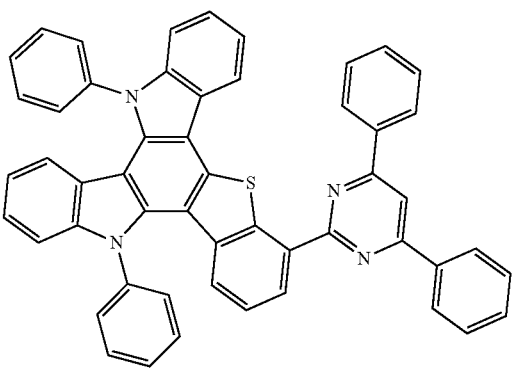
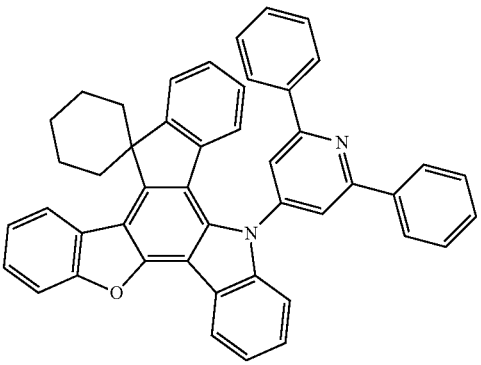
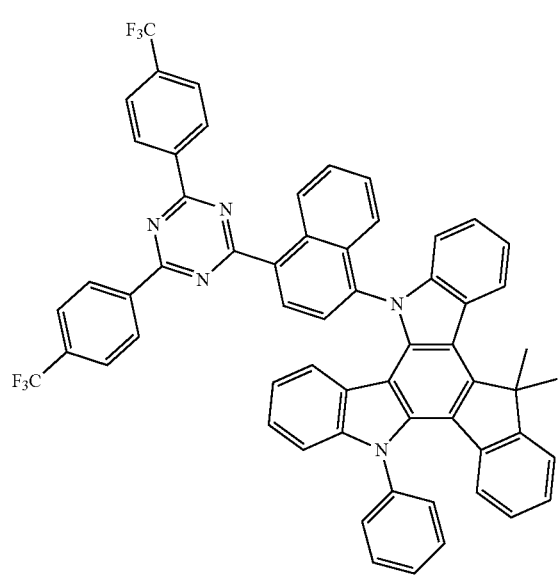
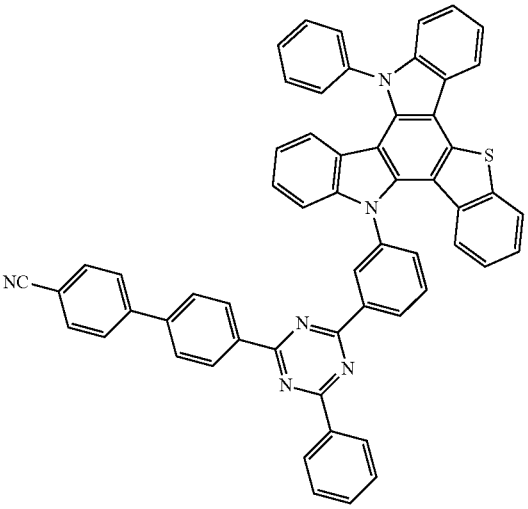

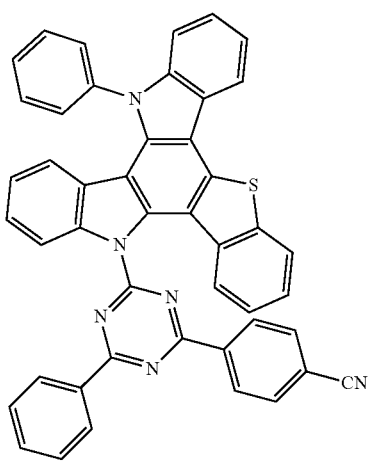
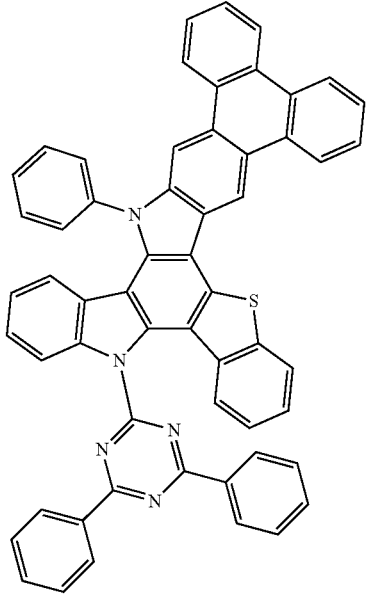
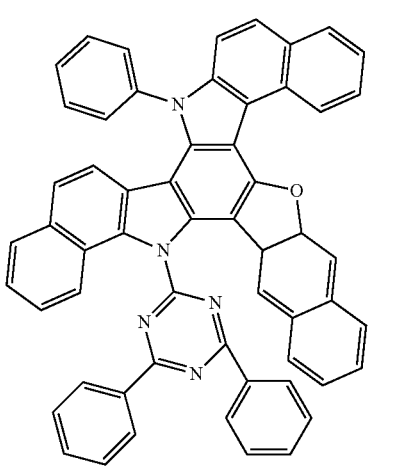
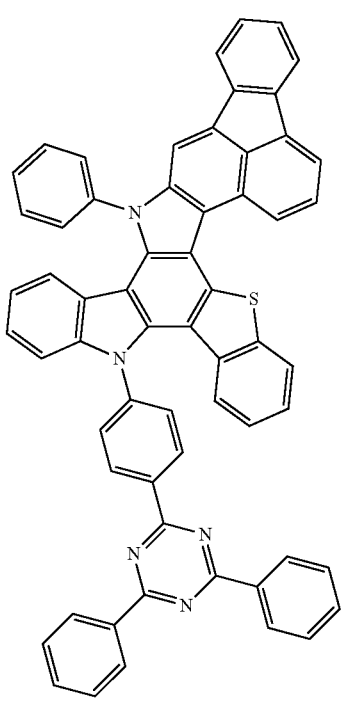
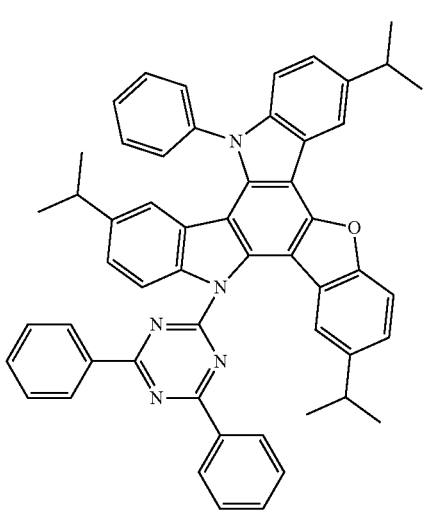

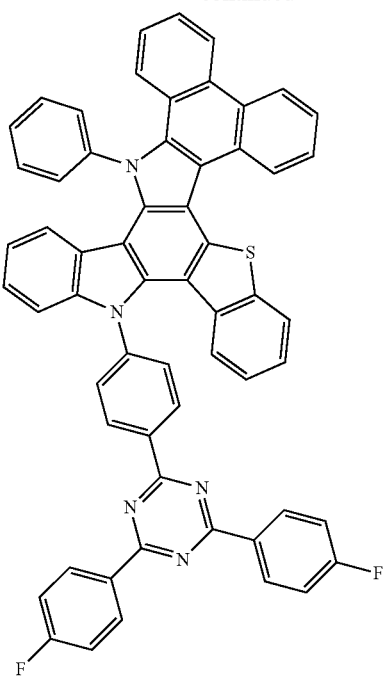
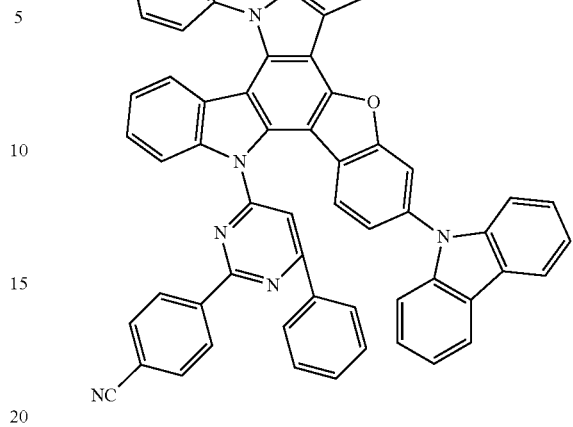
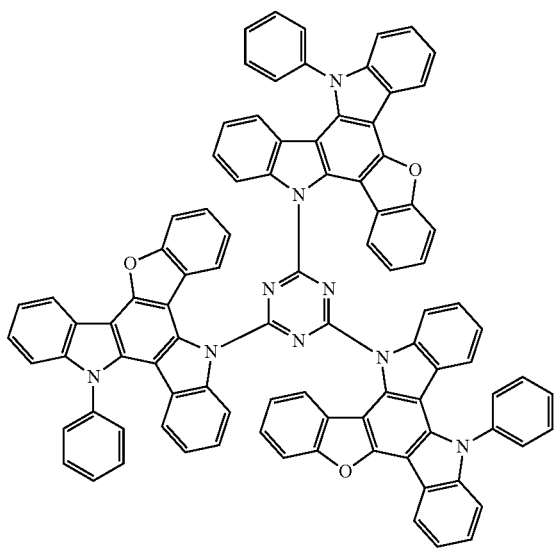
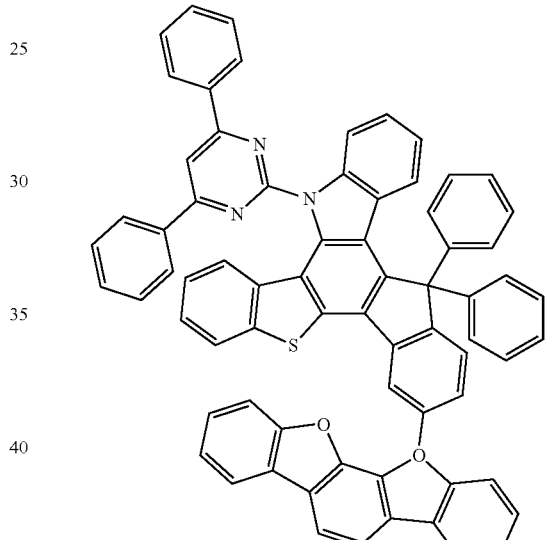
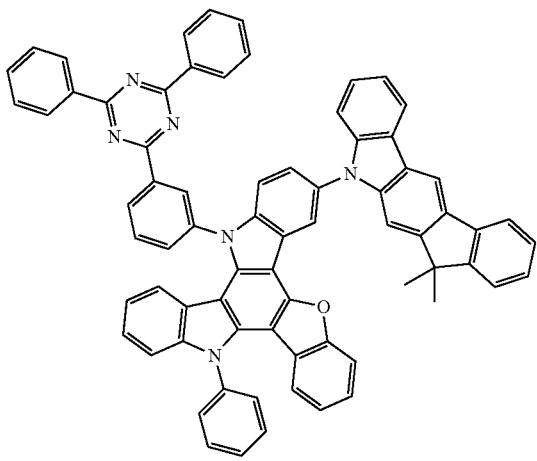
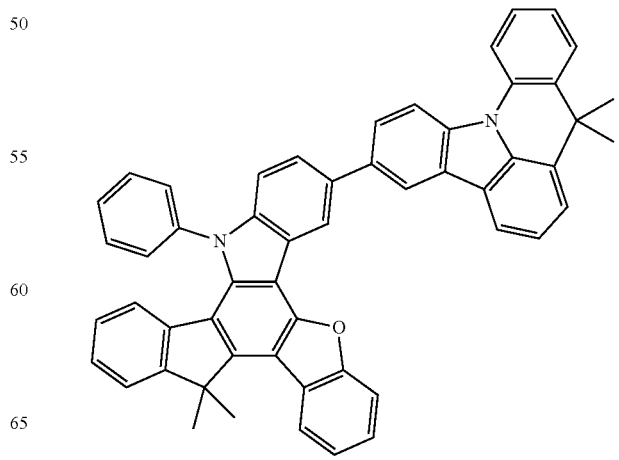

-continued
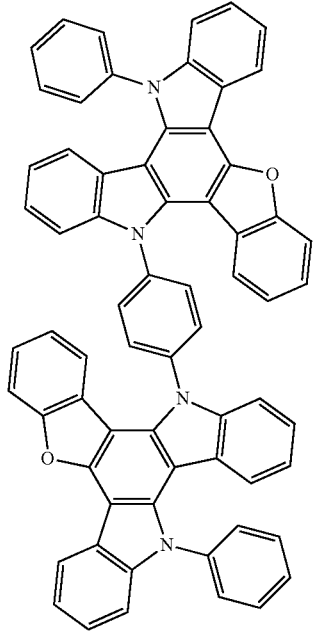
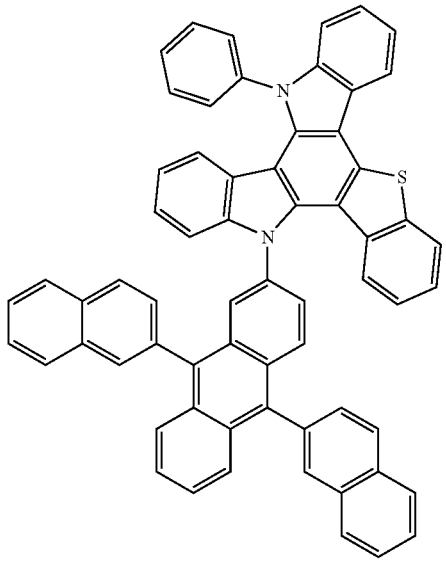
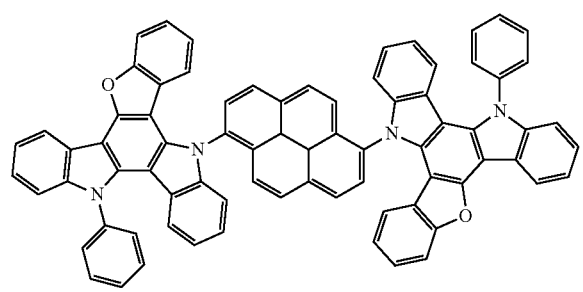
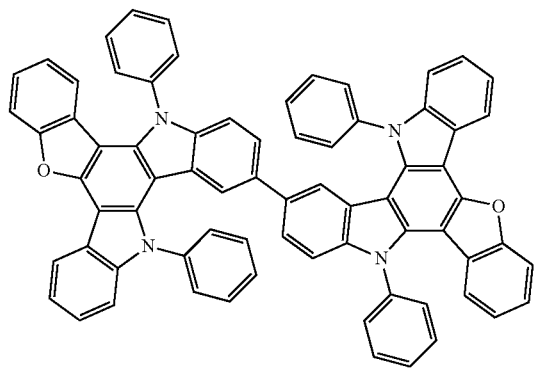
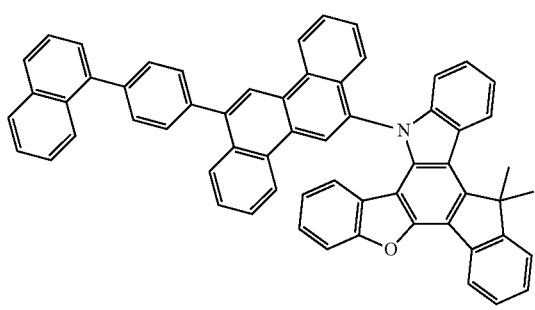
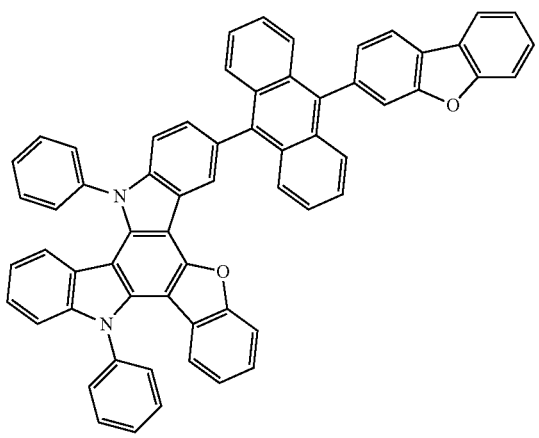

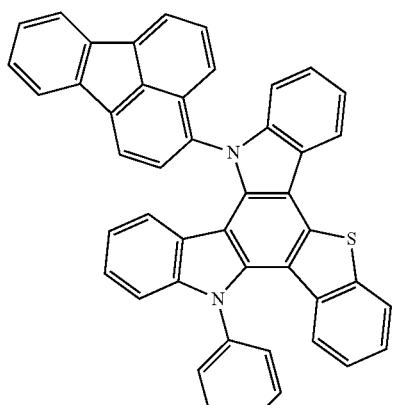
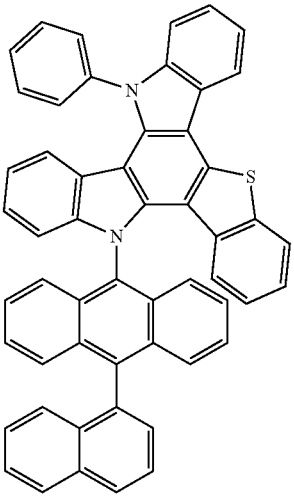
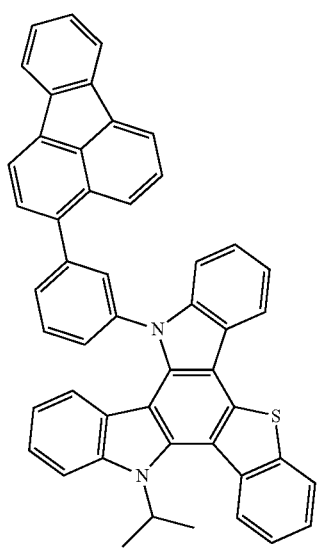
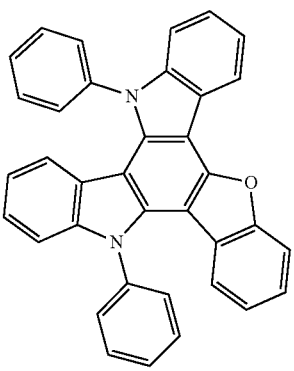
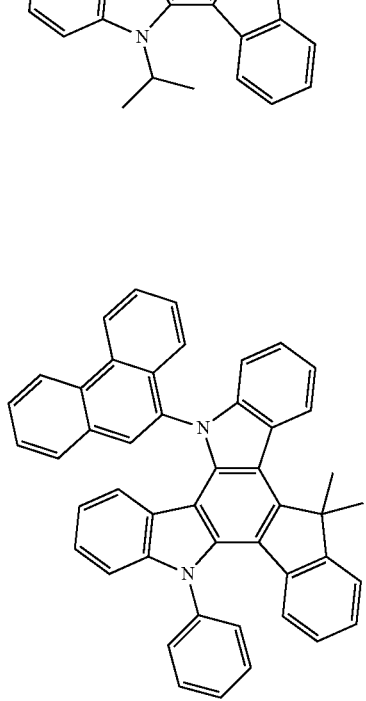
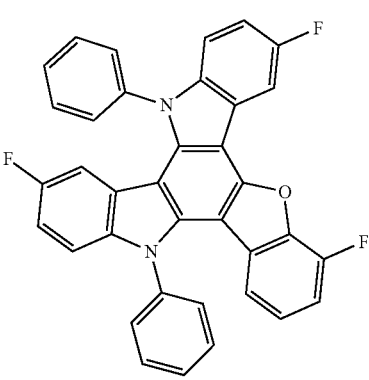
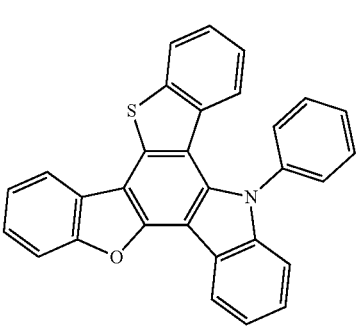

31
-continued
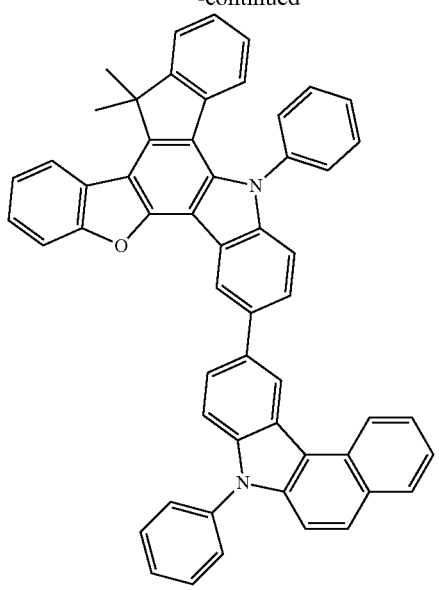
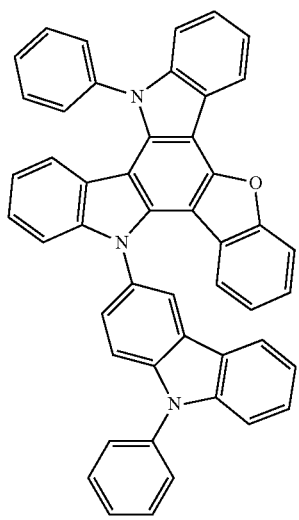
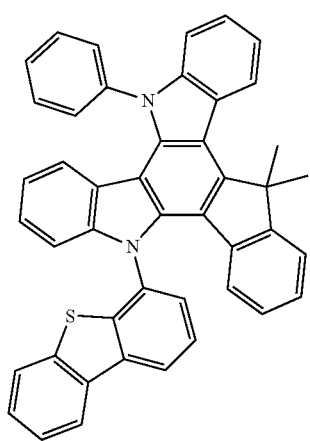
32
-continued
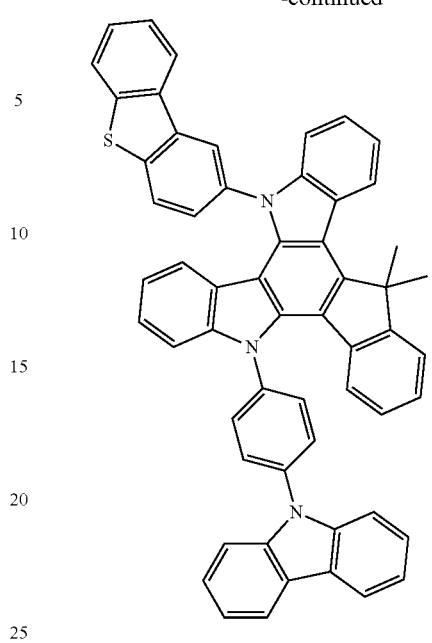
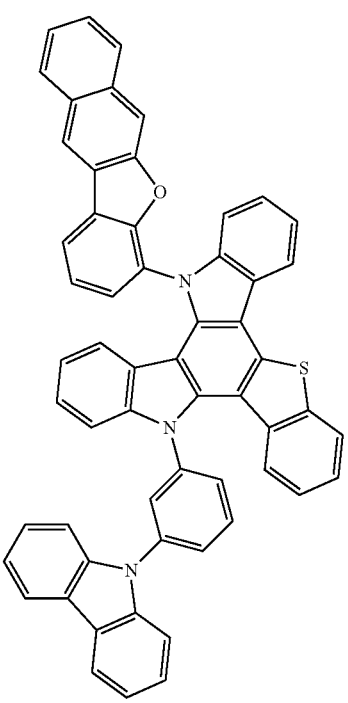

33
-continued
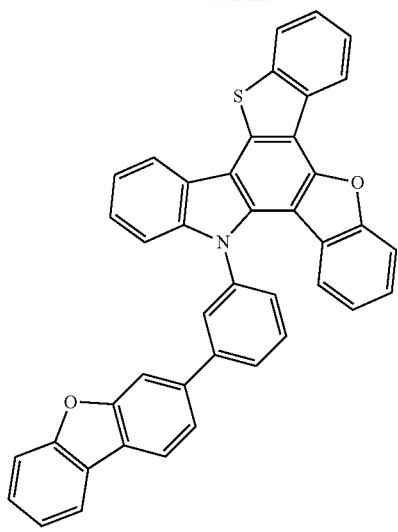
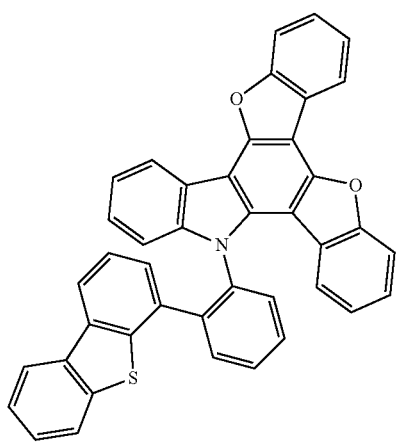
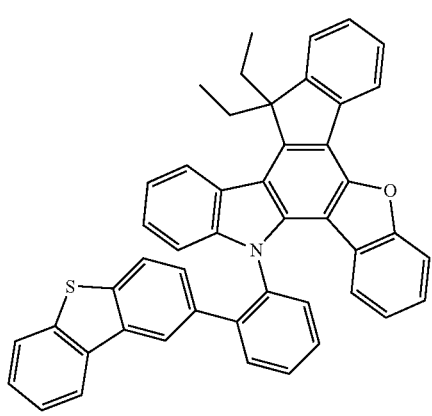
34
-continued
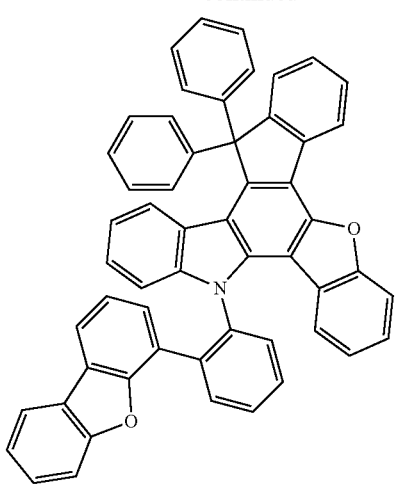
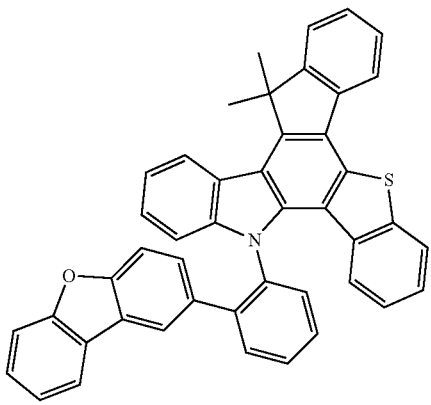
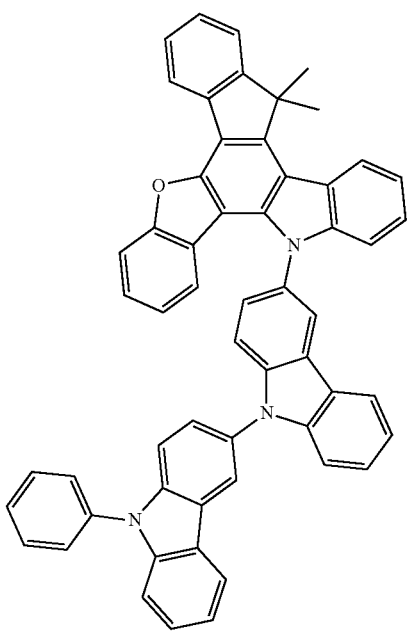

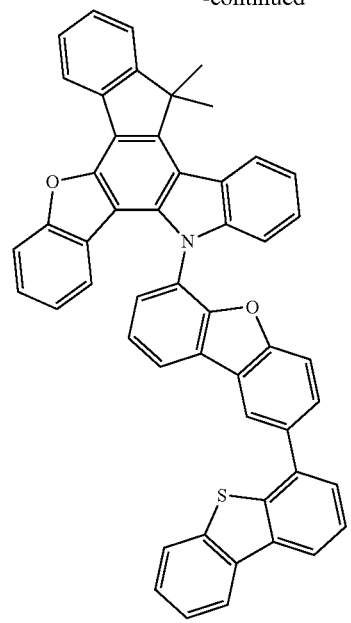
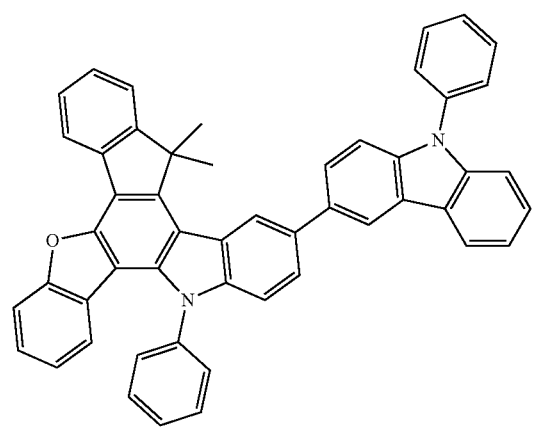
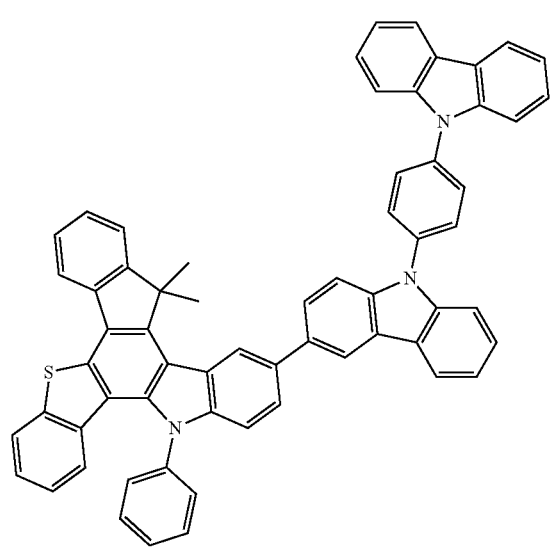
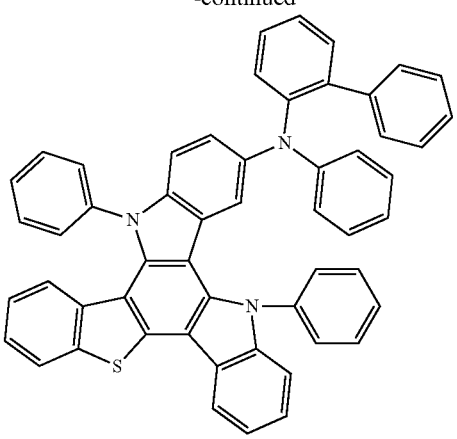
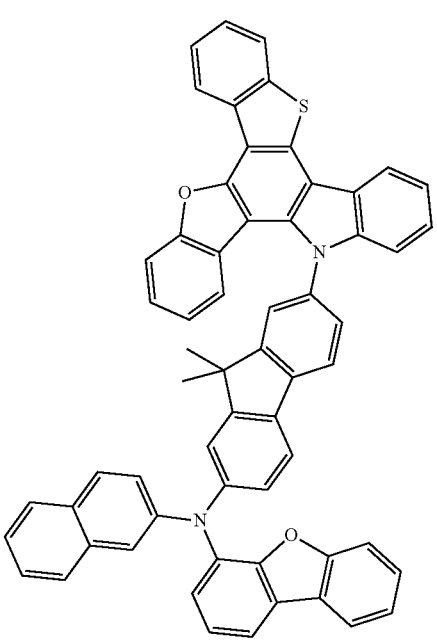
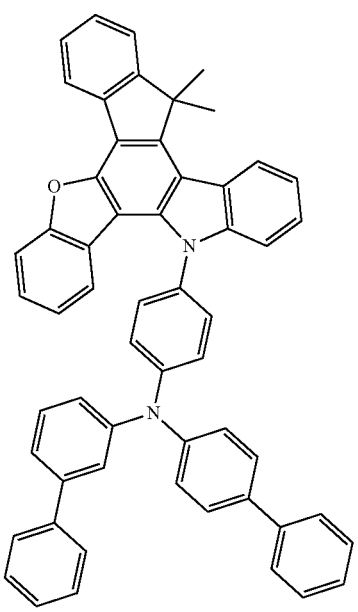

37
-continued
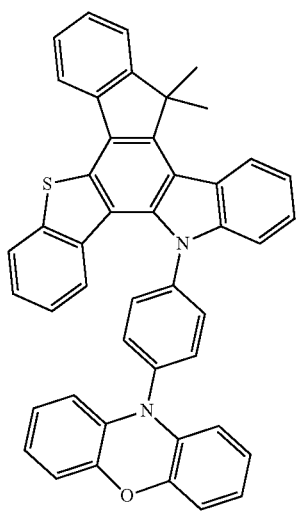
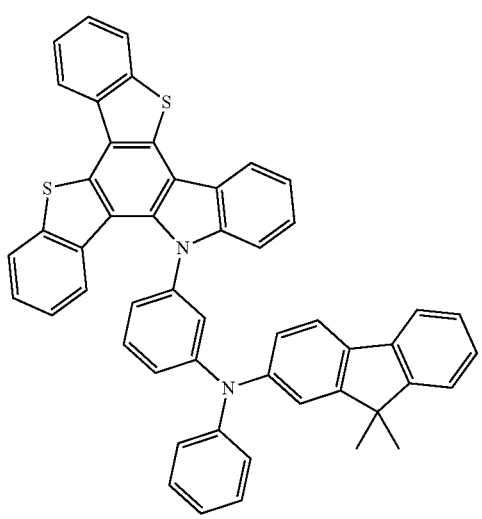
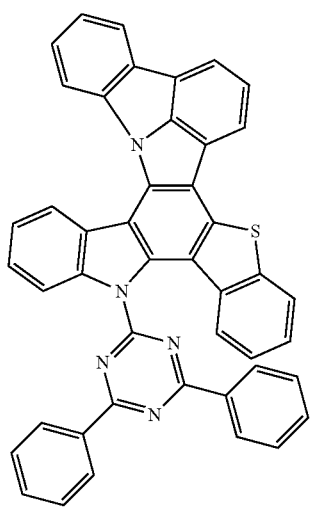
38
-continued
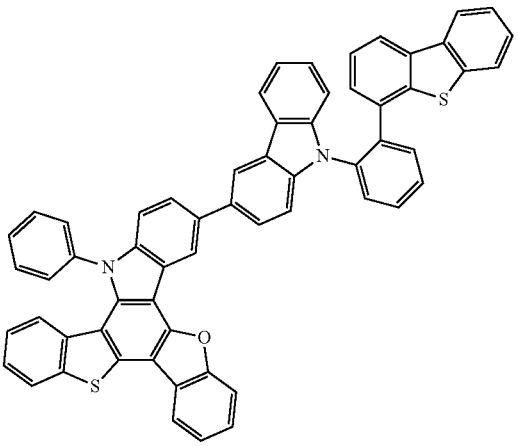
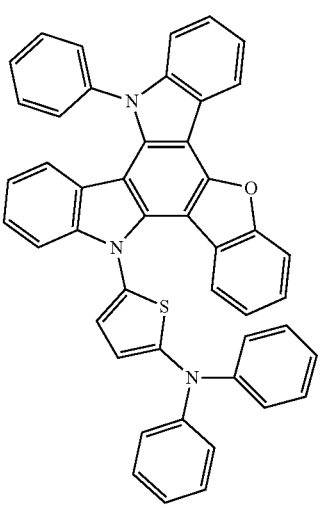
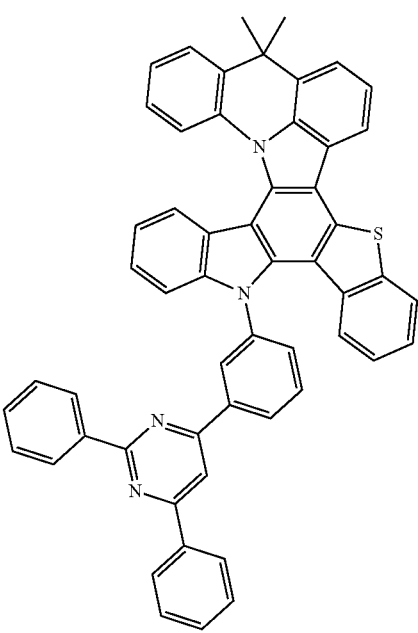

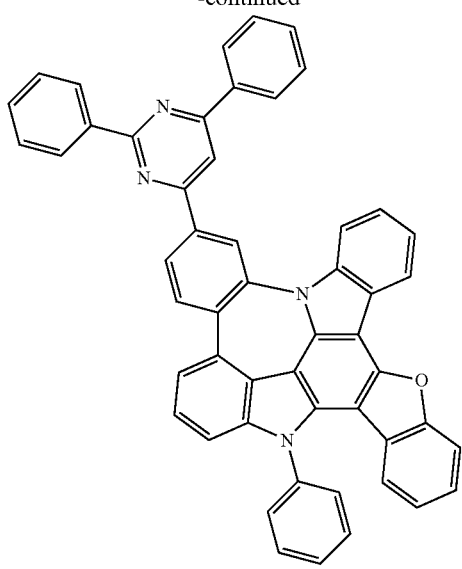
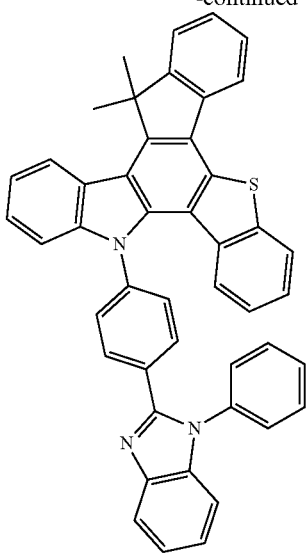
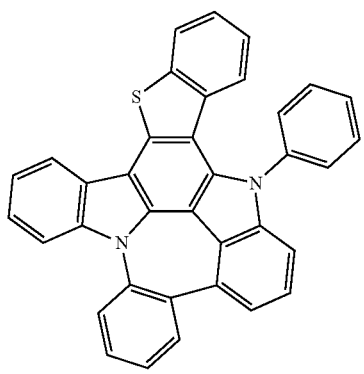
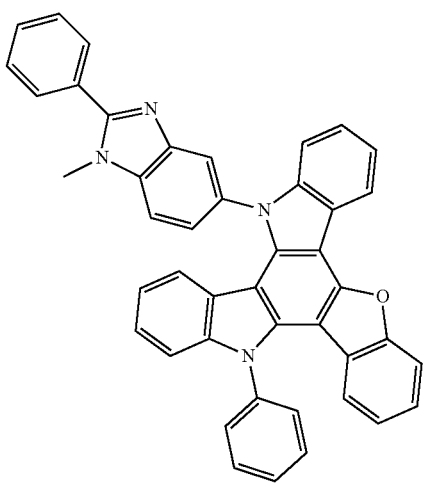
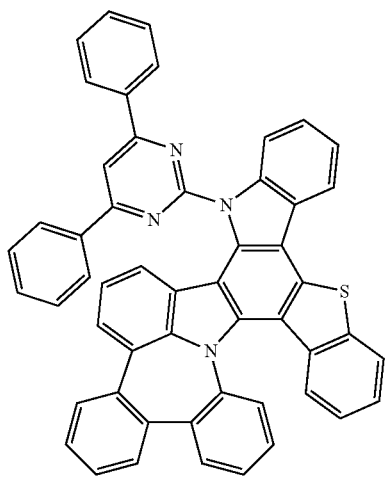
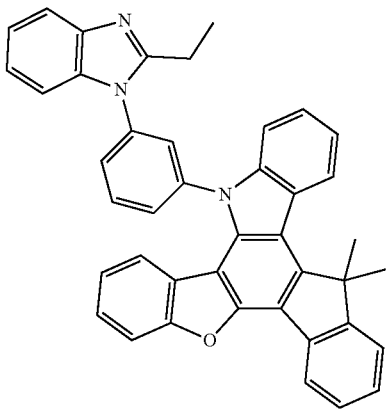

41
-continued
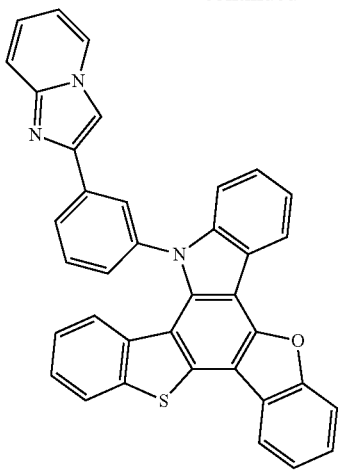
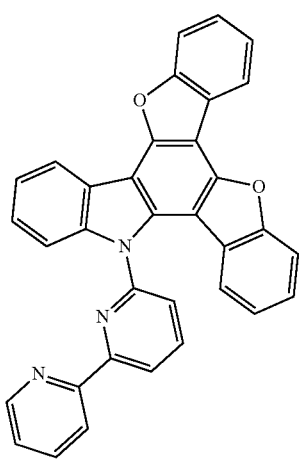
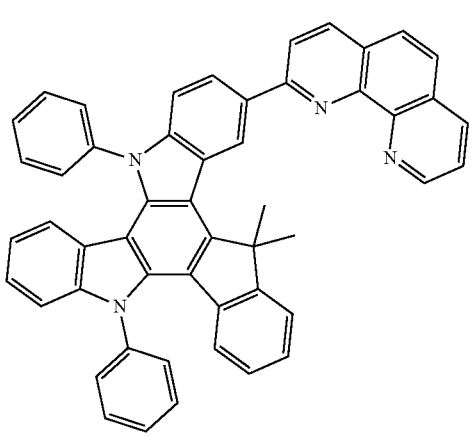
42
-continued
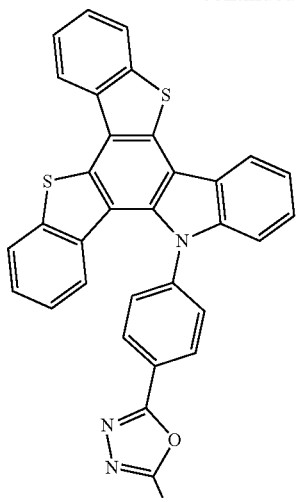
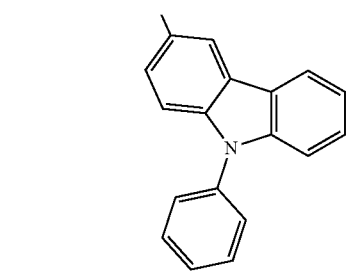
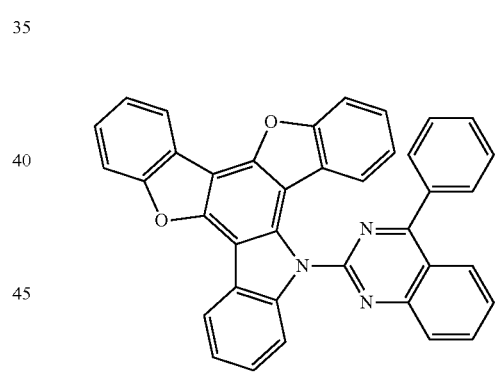
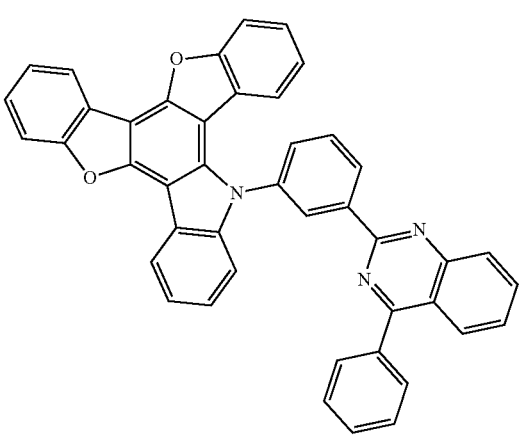

43
-continued
44
-continued
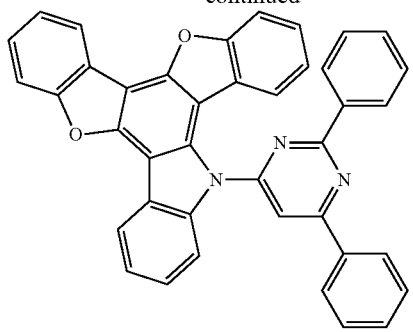
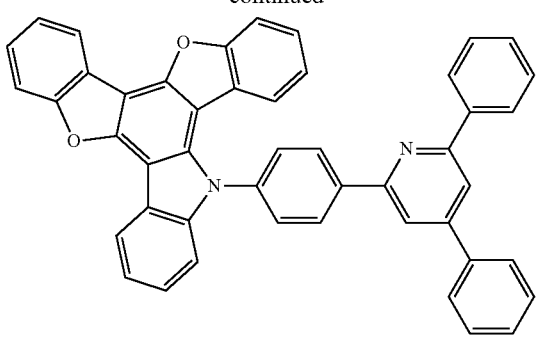
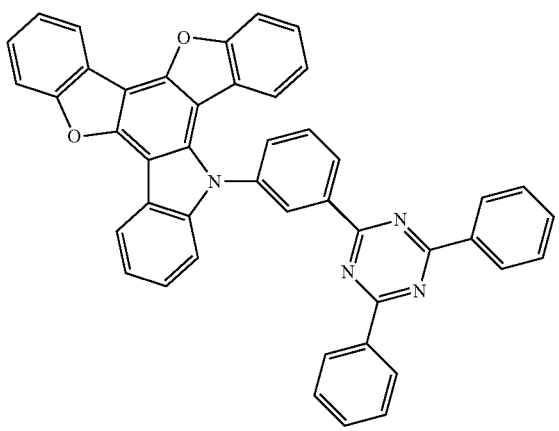
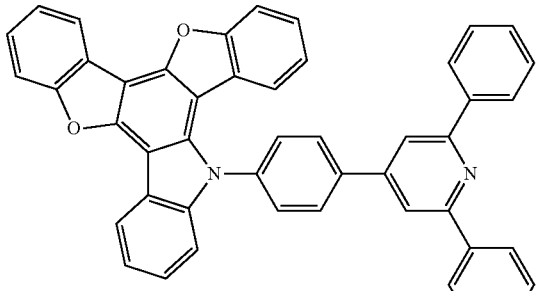
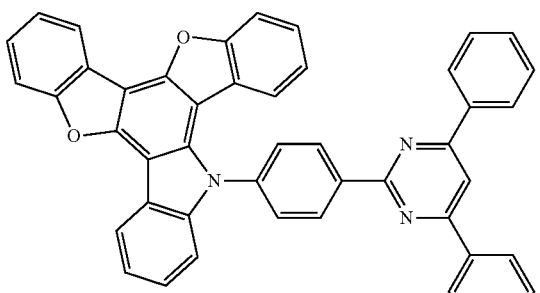
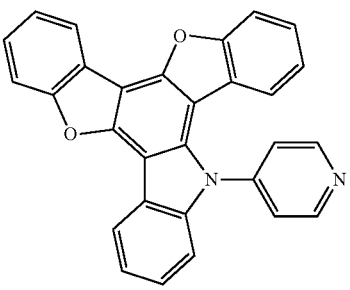

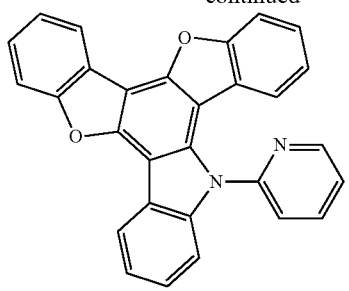
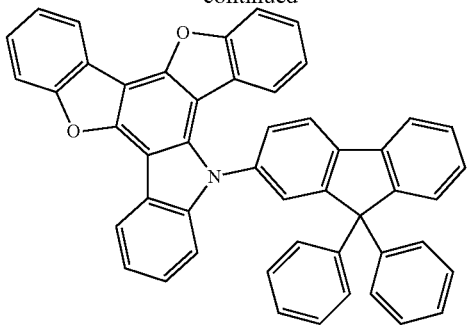
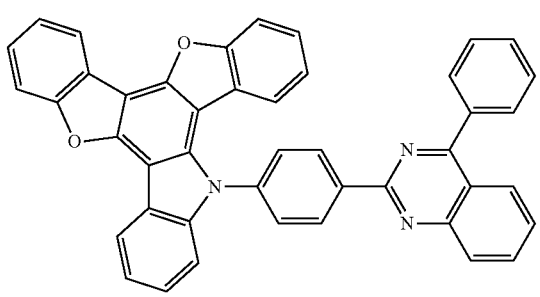
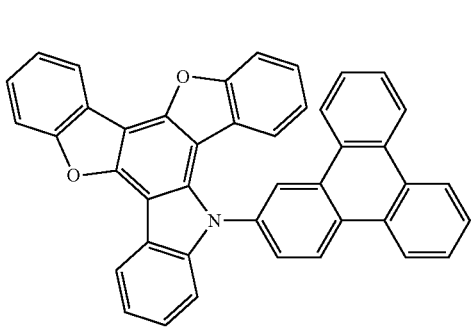
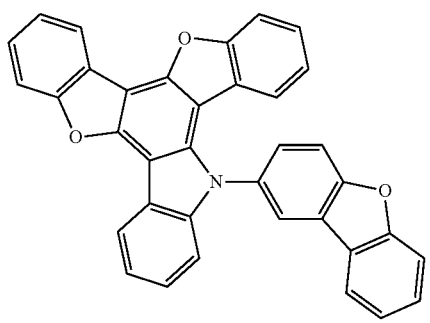
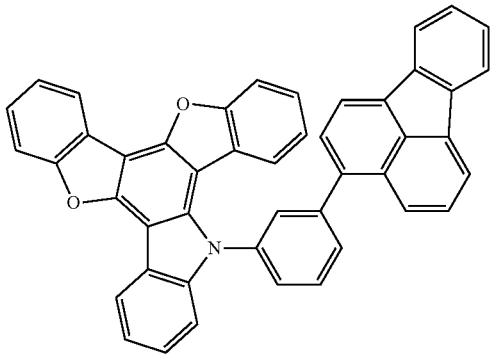
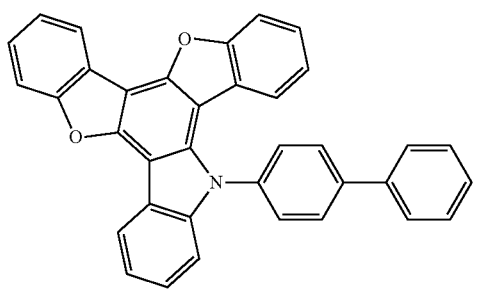
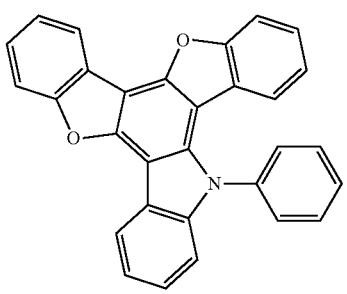
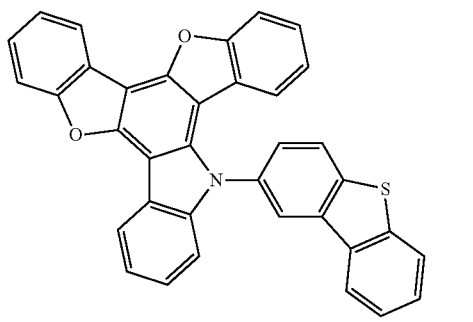
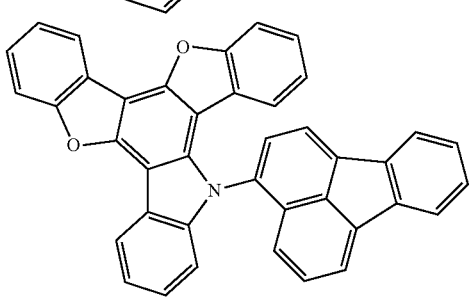

47
-continued
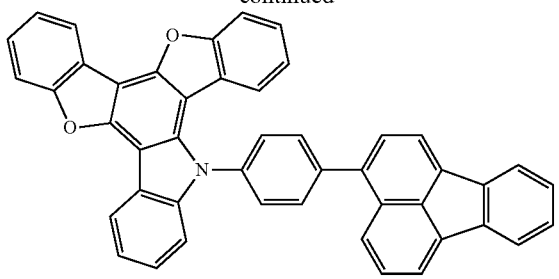
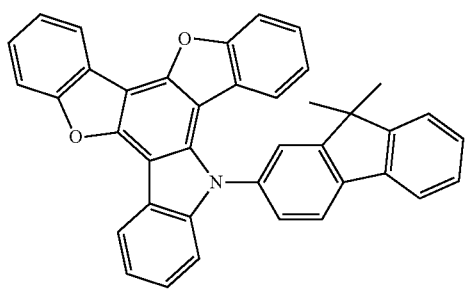
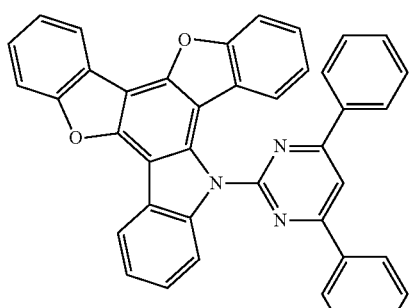
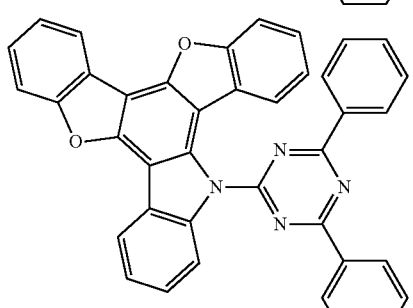
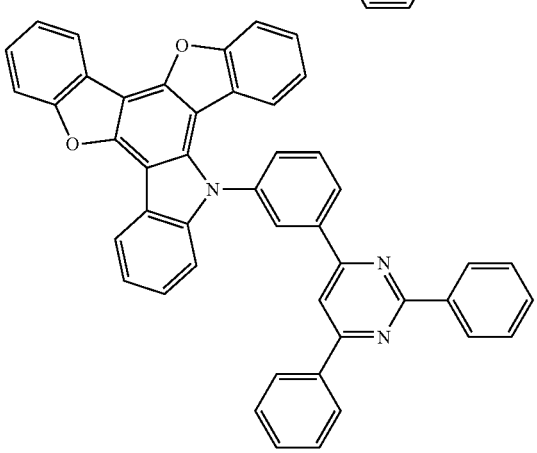
48
-continued
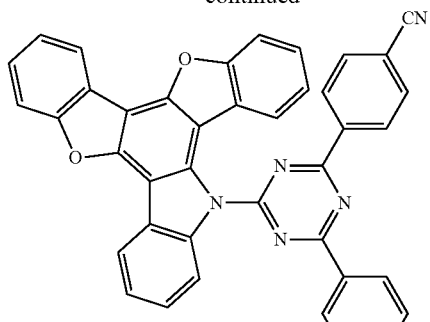
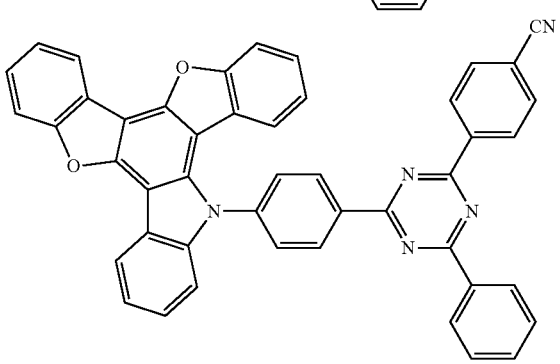
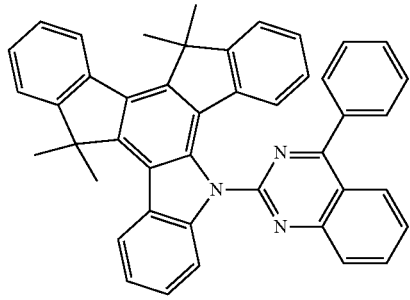
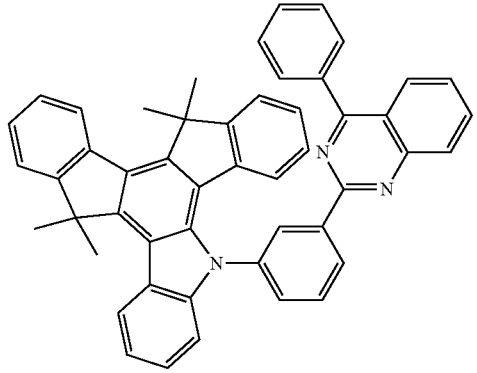
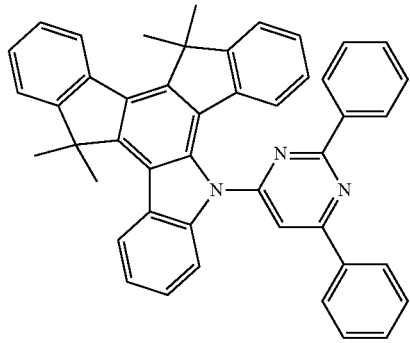

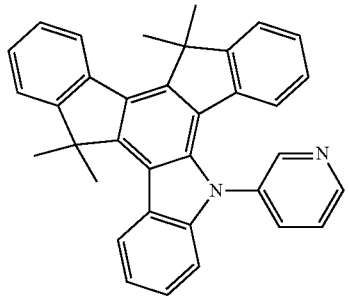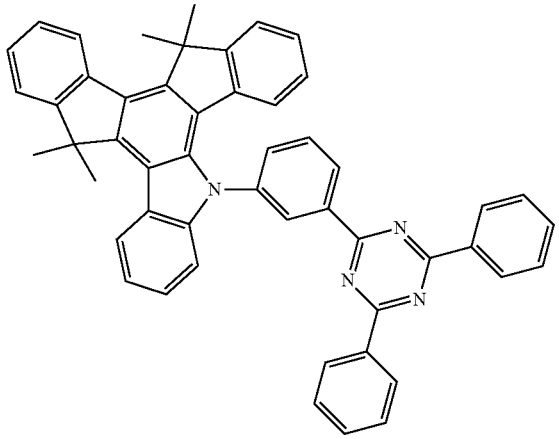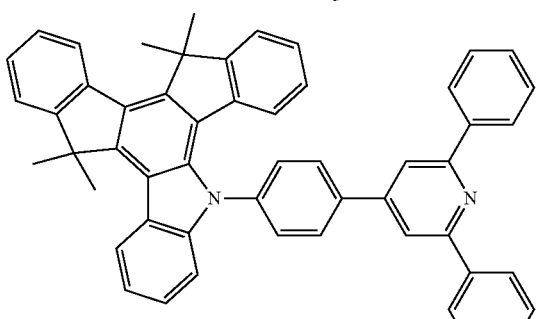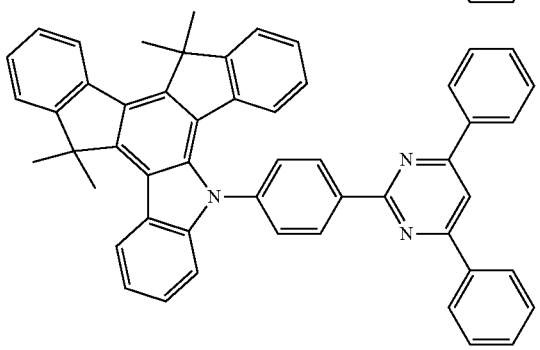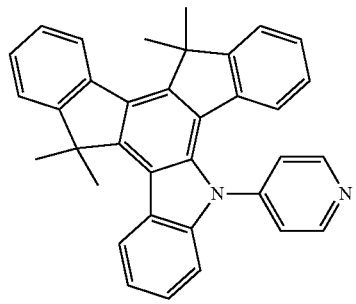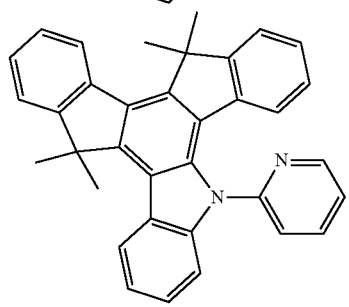

51
-continued
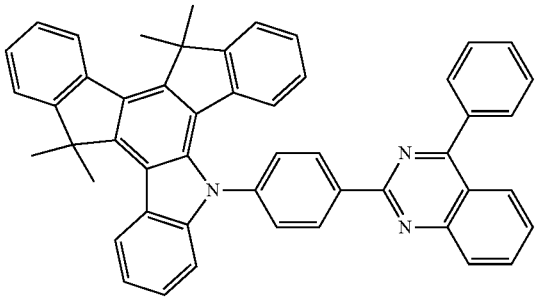
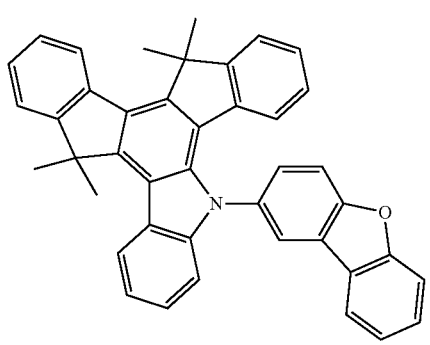
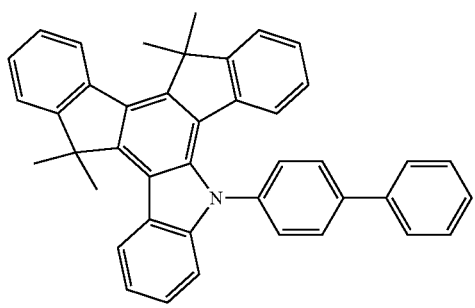
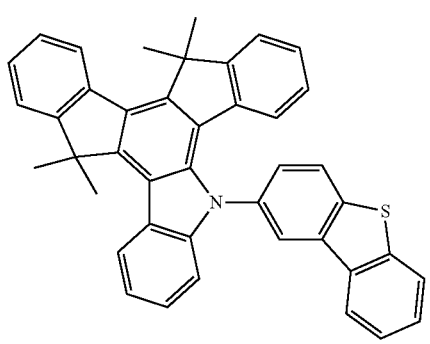
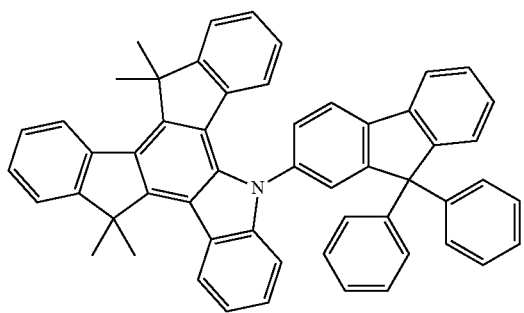
52
-continued
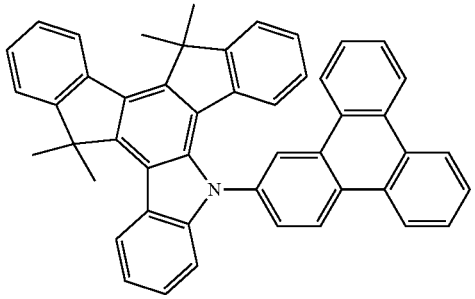
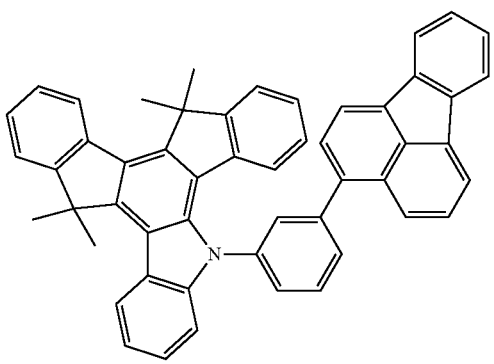
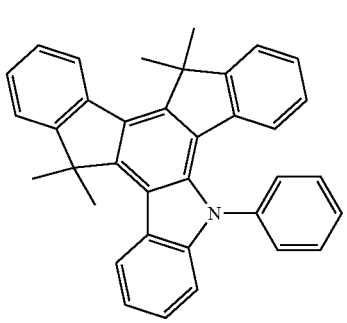
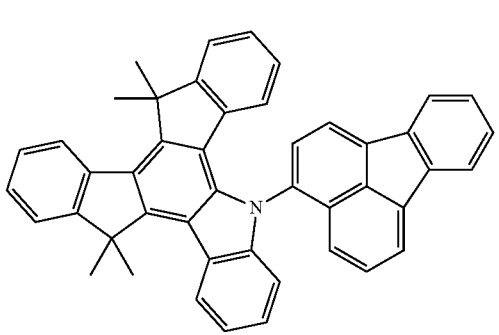
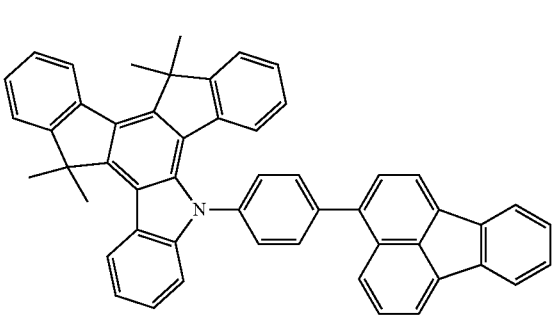

53
-continued
54
-continued
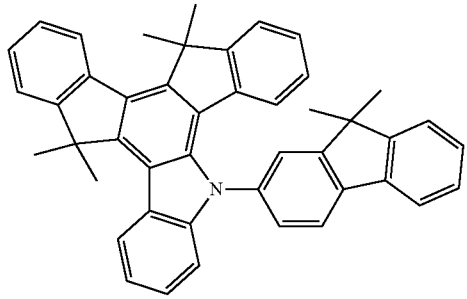
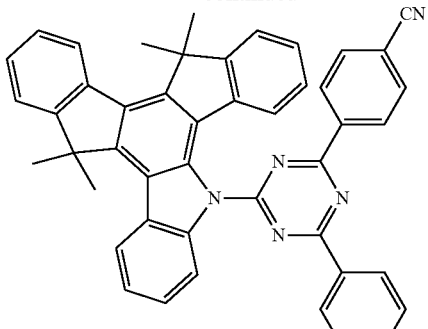
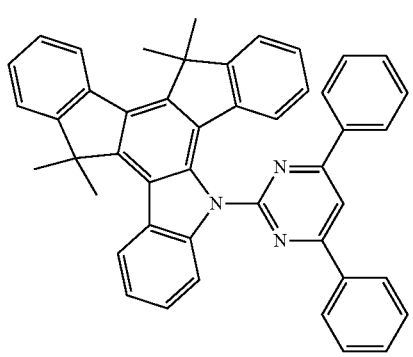
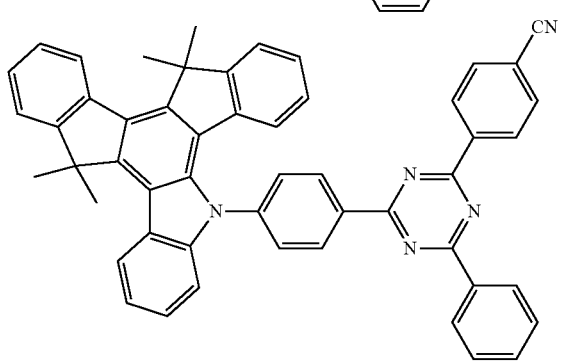
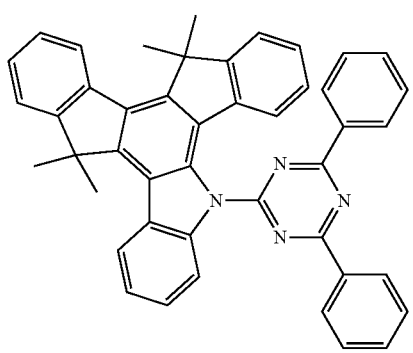
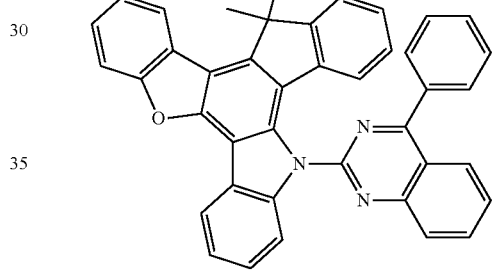
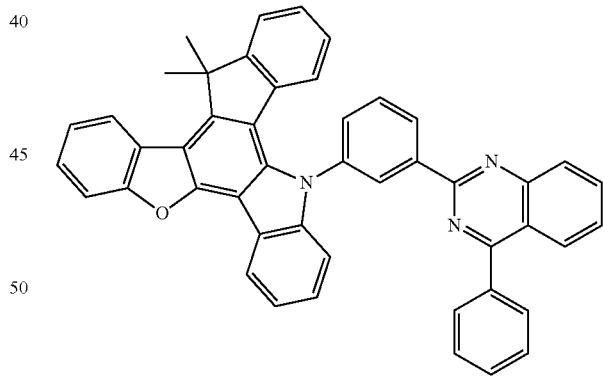
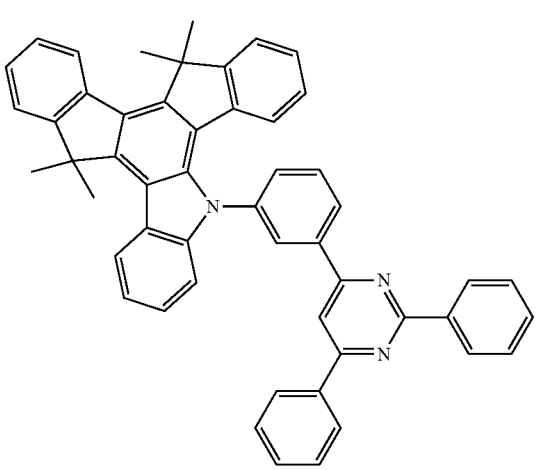
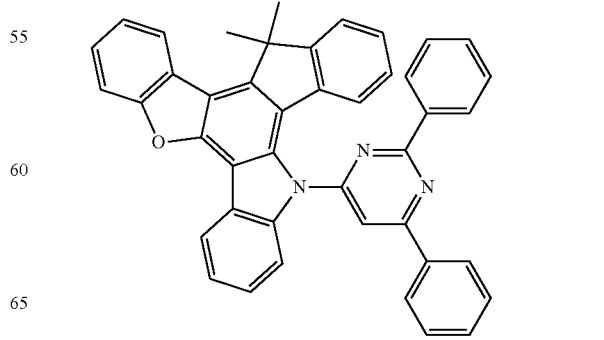

55
-continued
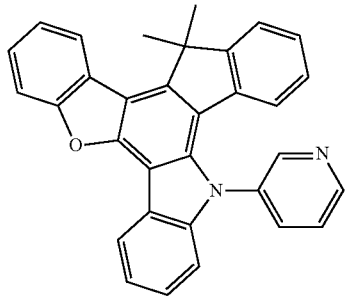
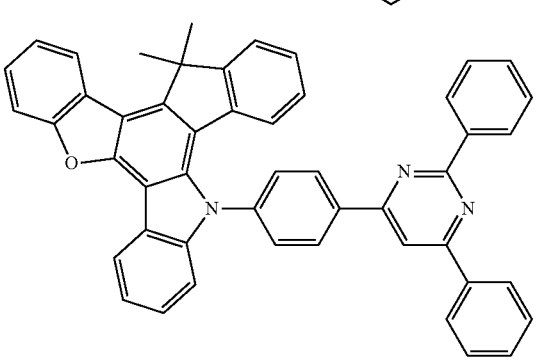
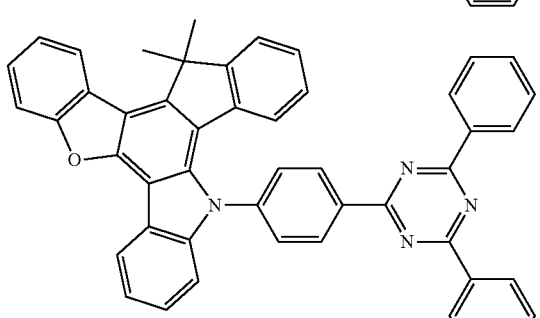
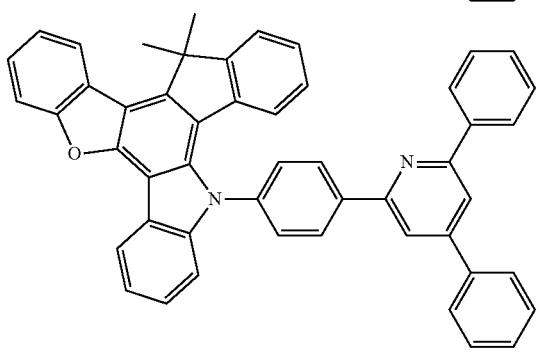
56
-continued
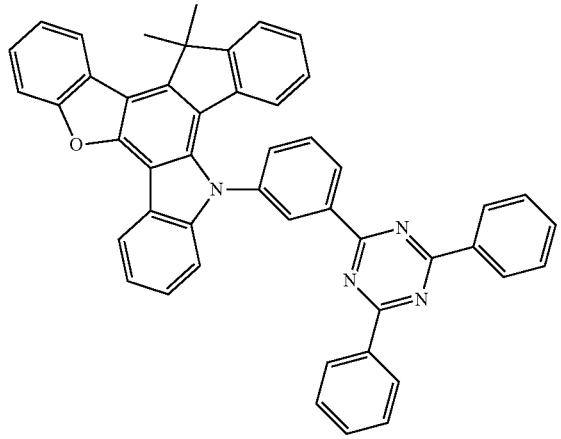
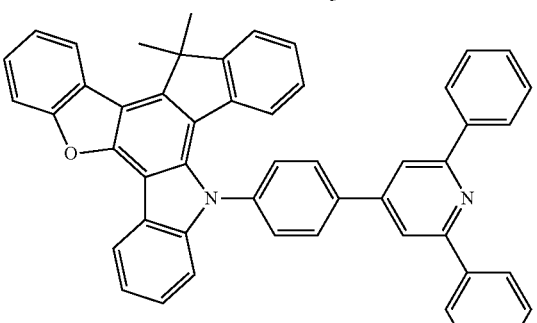
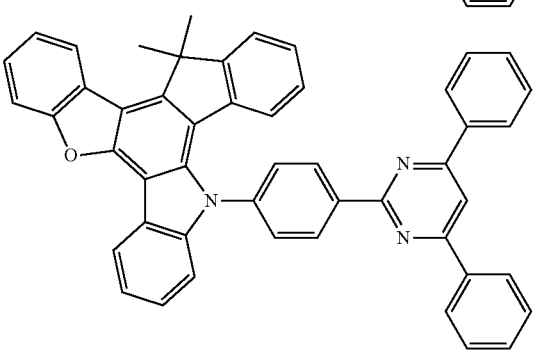
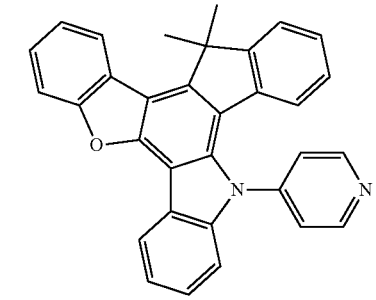
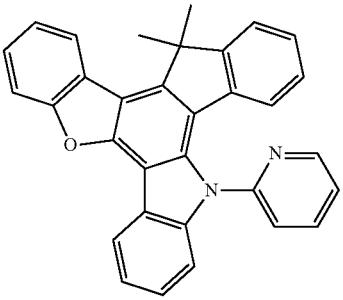

57
-continued
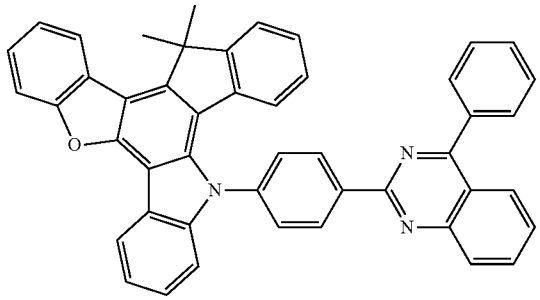
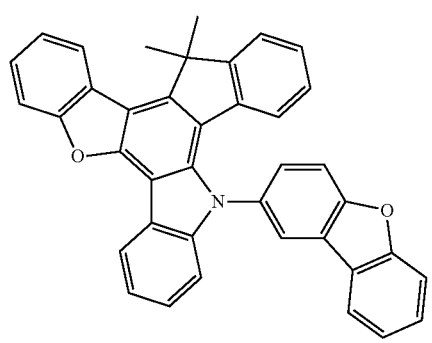
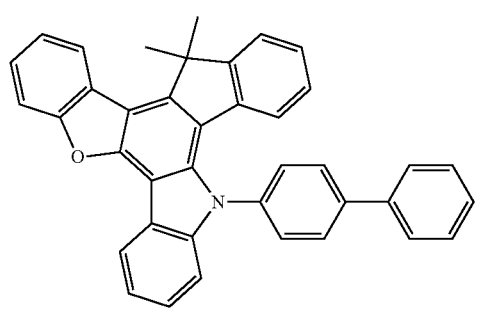
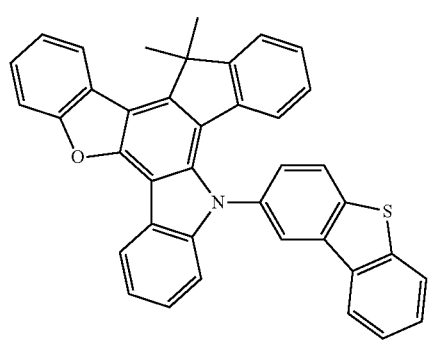
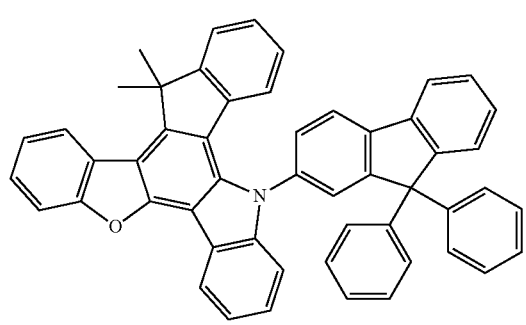
58
-continued
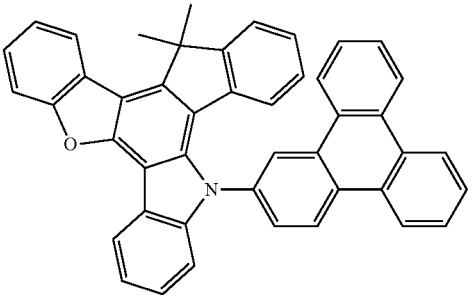
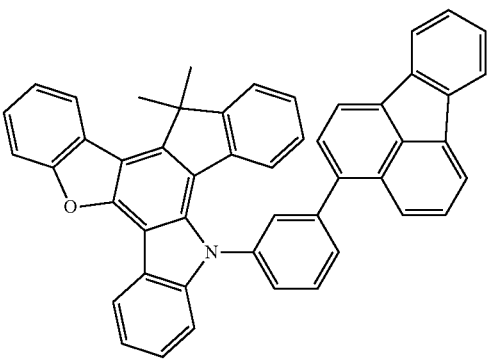
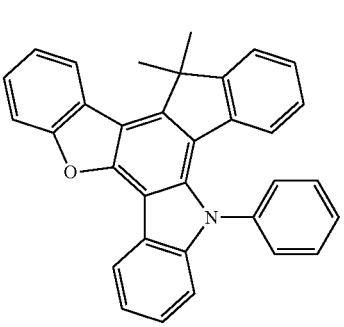
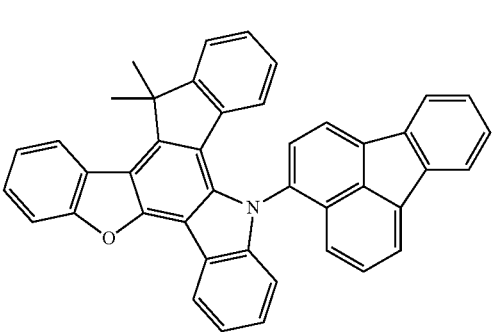
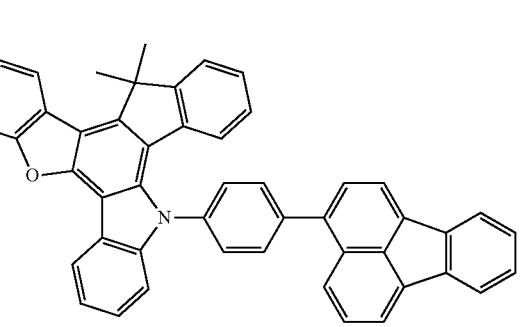

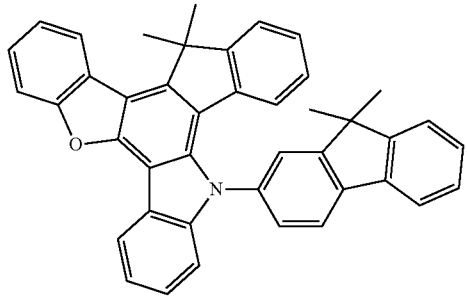
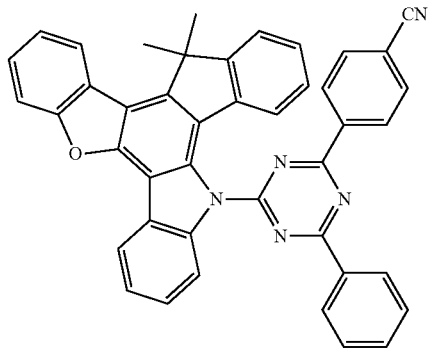
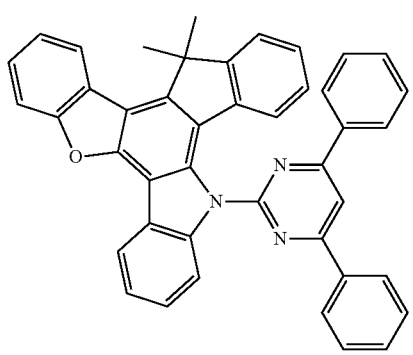
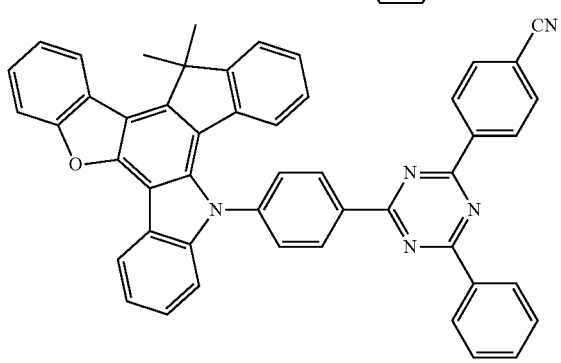
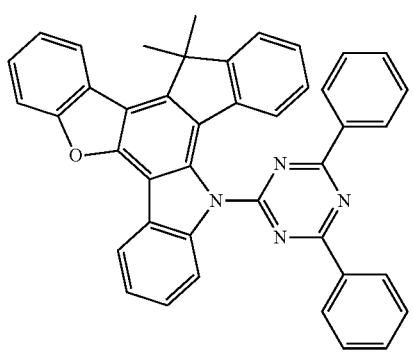
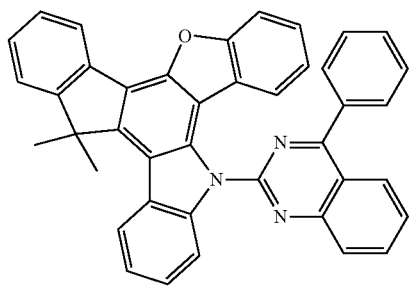
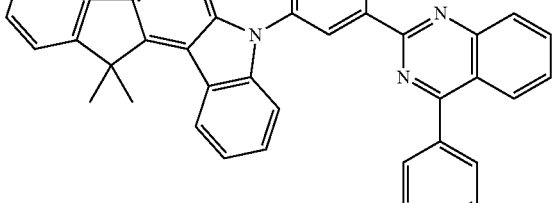

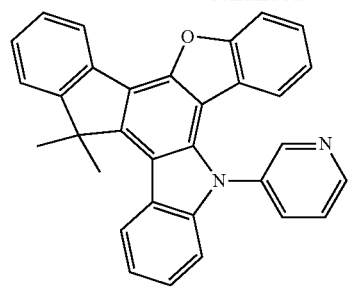
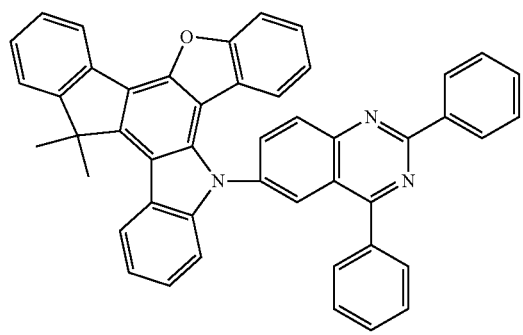
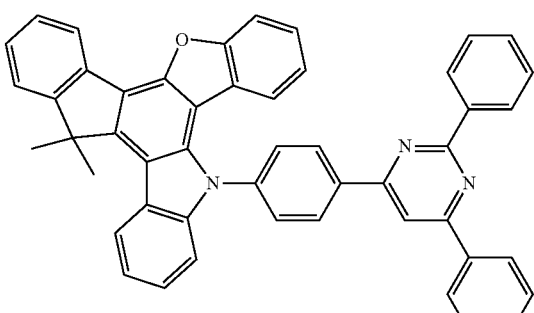
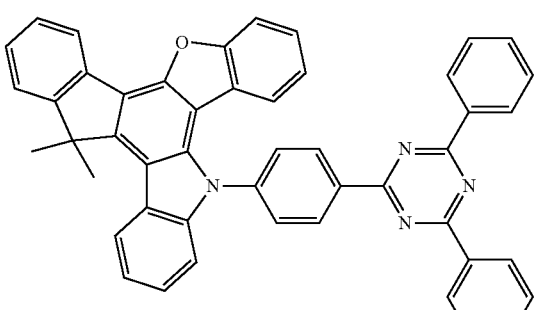
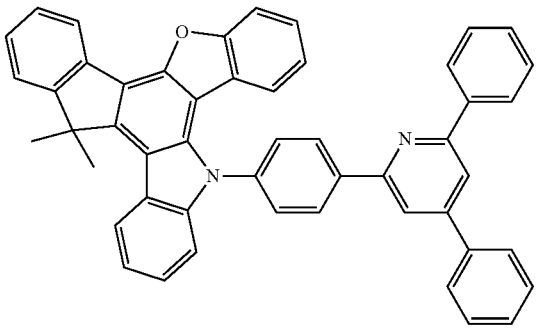
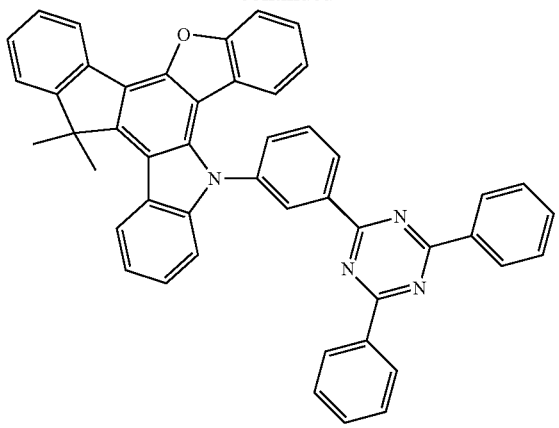
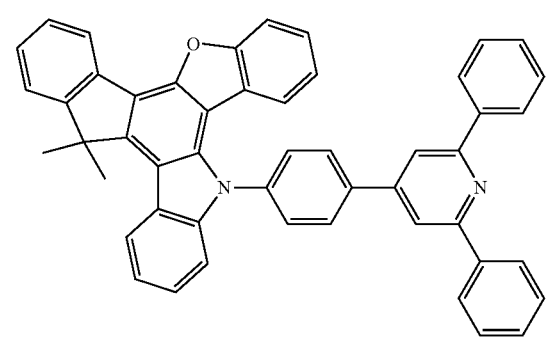
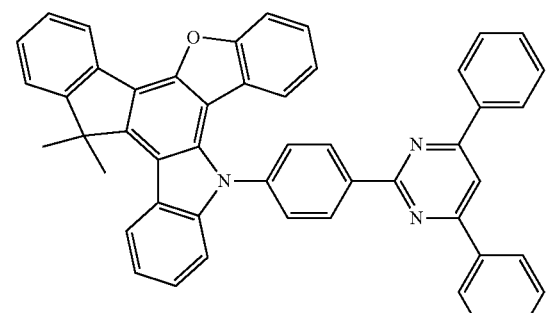
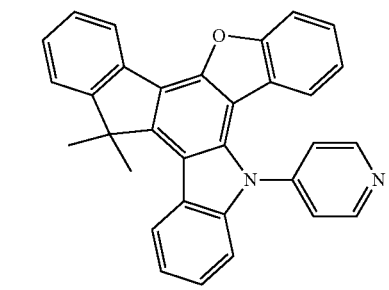
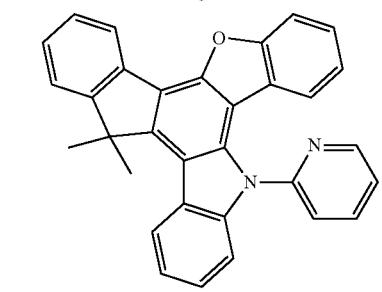

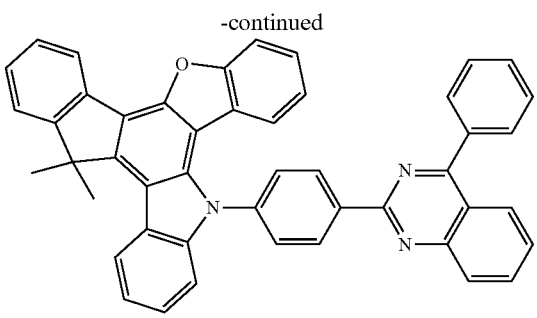
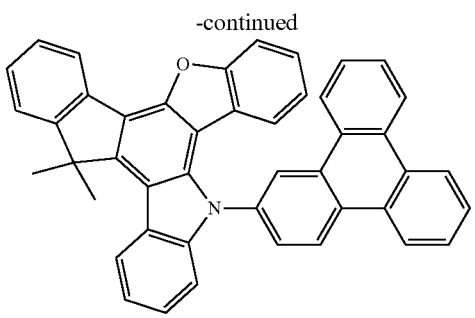

65
-continued
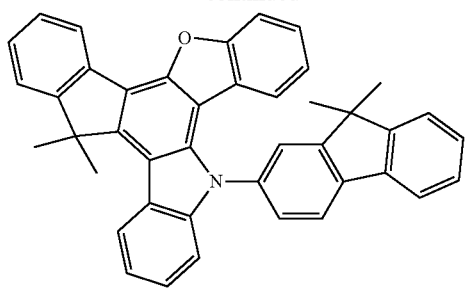
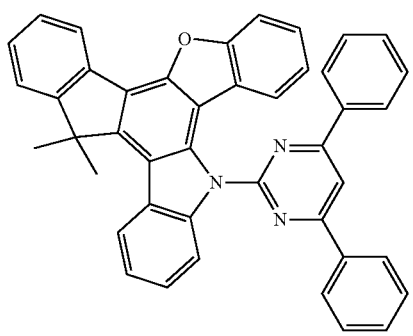
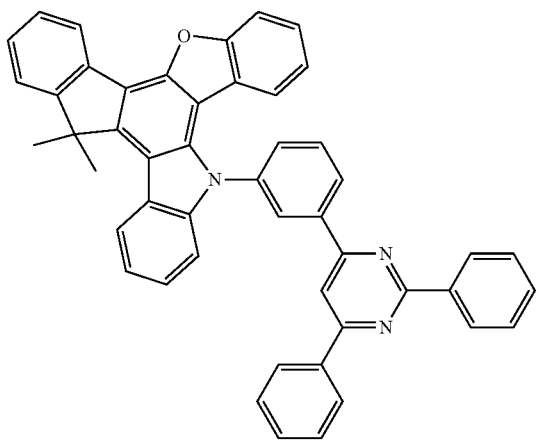
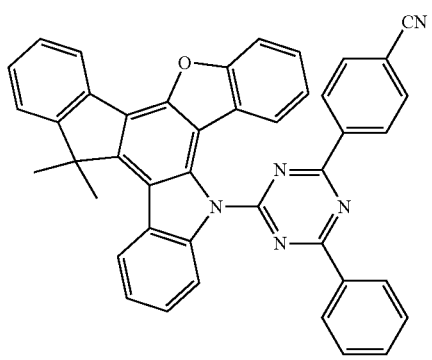
66
-continued
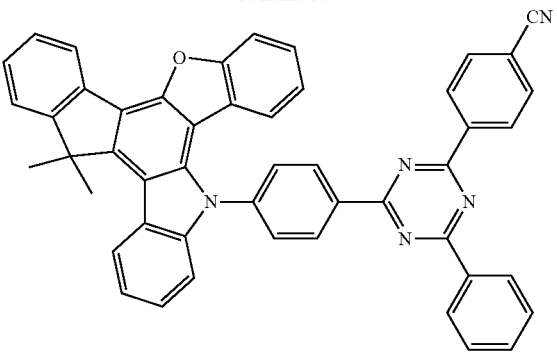 [SMILES: CC1(C)c2ccccc2-c2c1c1c3ccccc3n(-c3ccc(-c4nc(-c5ccccc5)nc(-c5ccc(C#N)cc5)n4)cc3)c1c1c2sc2ccccc21]
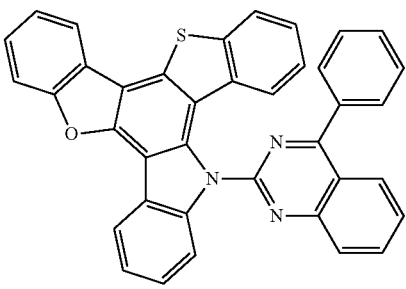
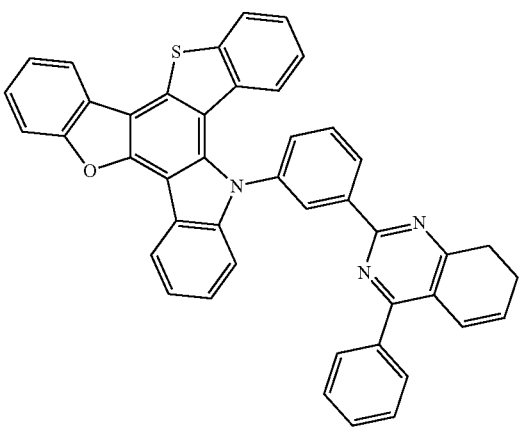
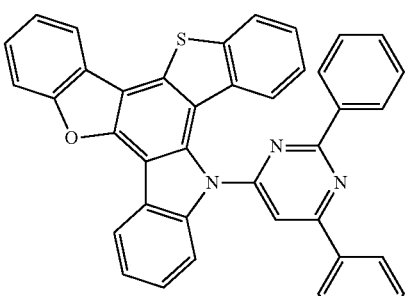
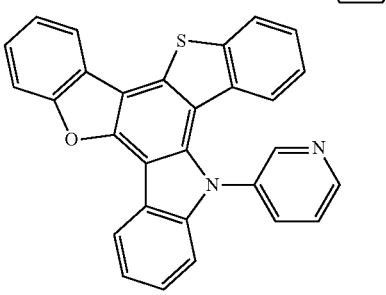

-continued
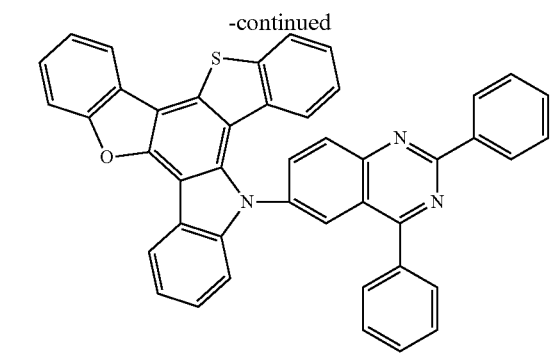
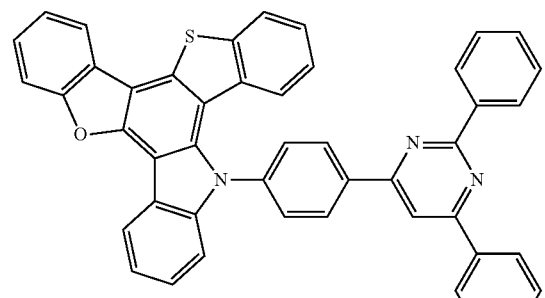
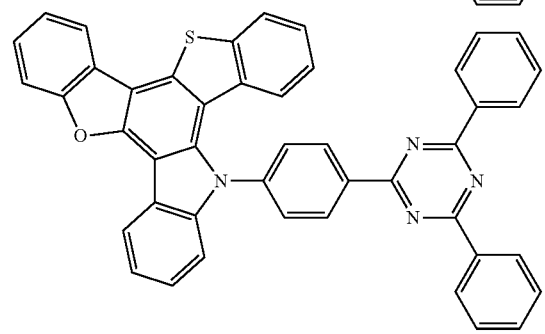
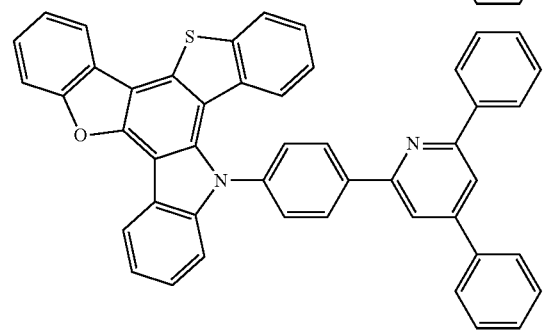
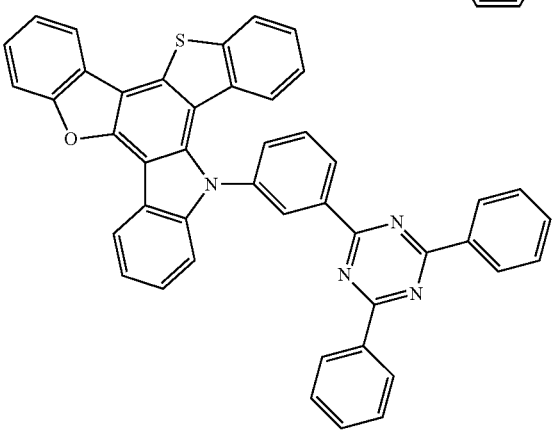
-continued
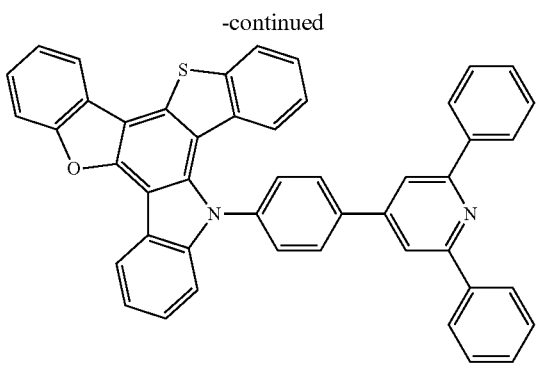
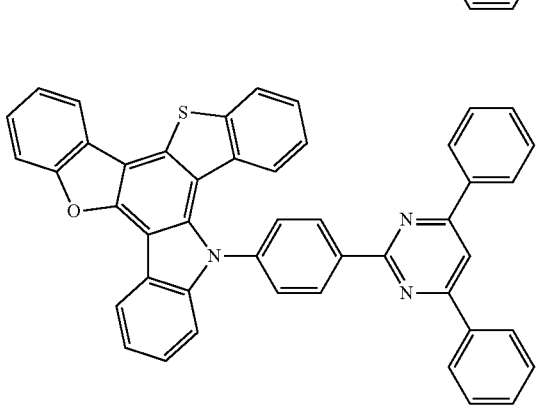
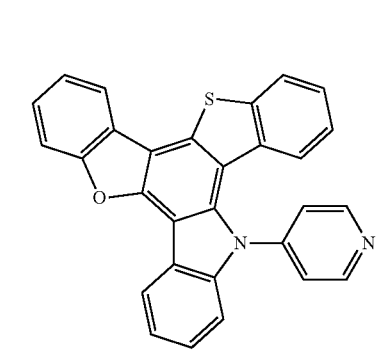
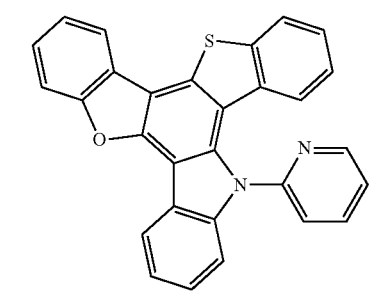
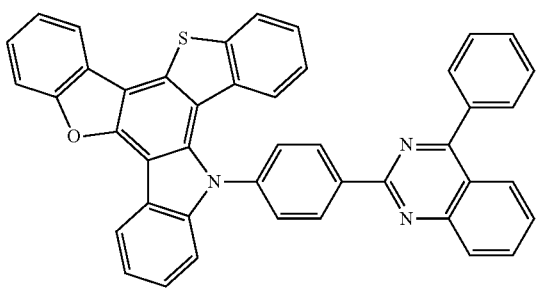

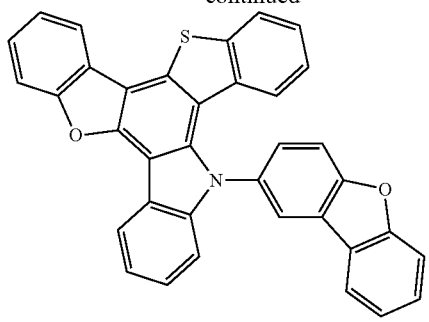
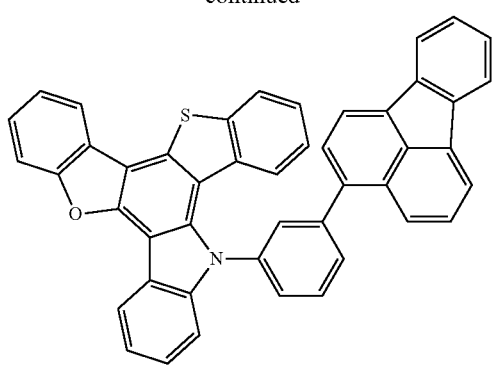
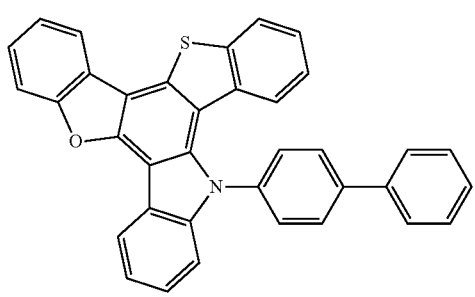
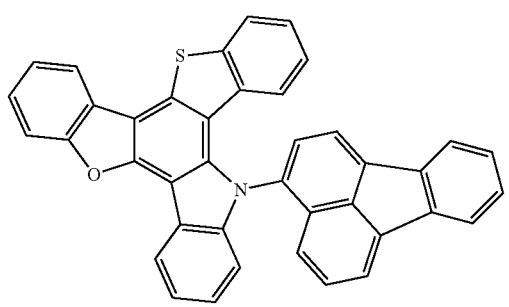
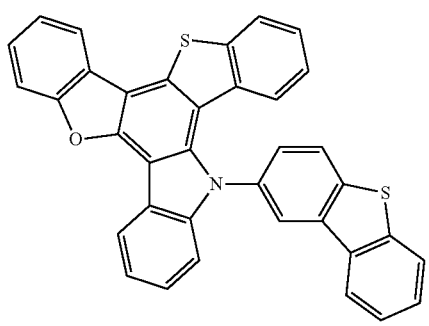
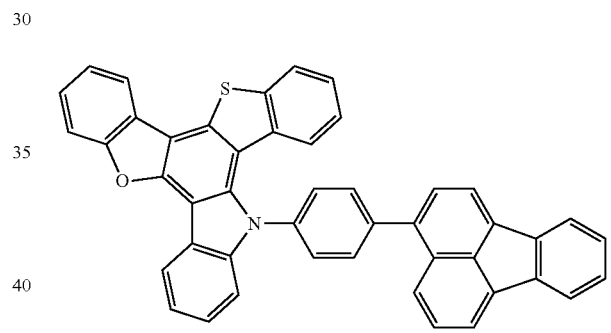
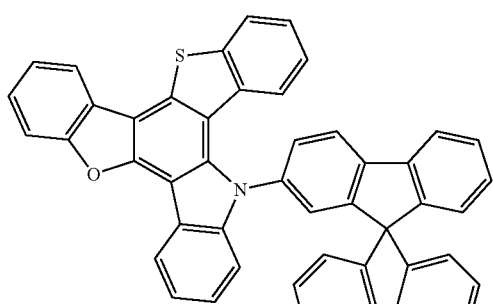
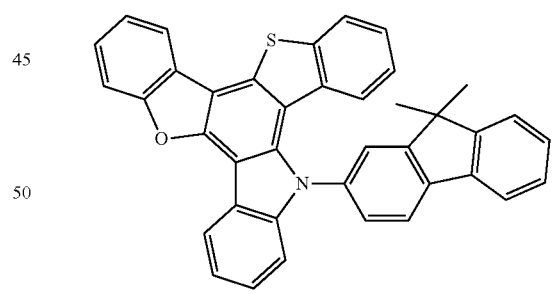
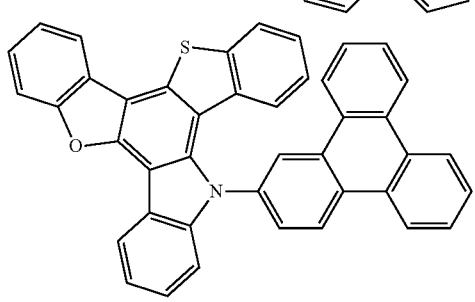
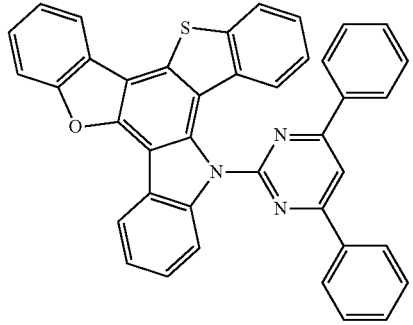

71
-continued
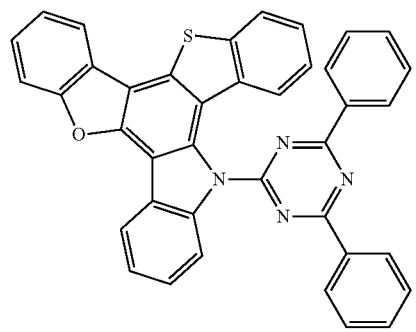
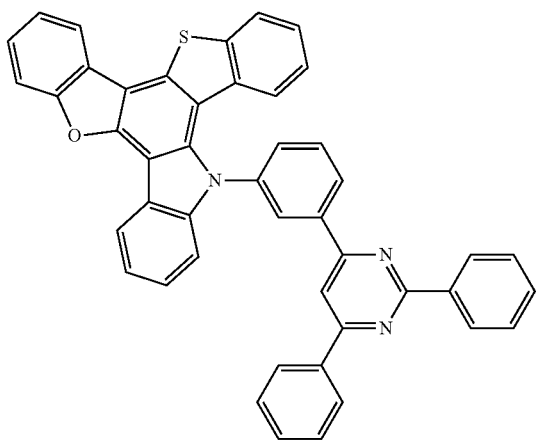
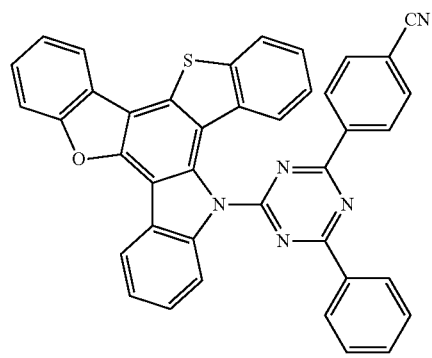
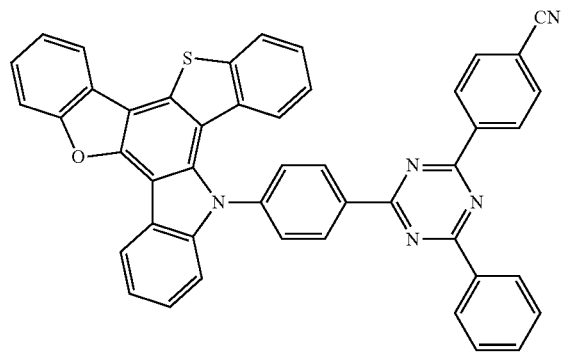
72
-continued
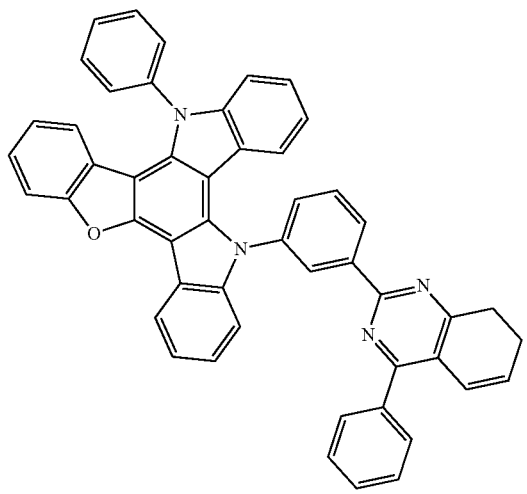
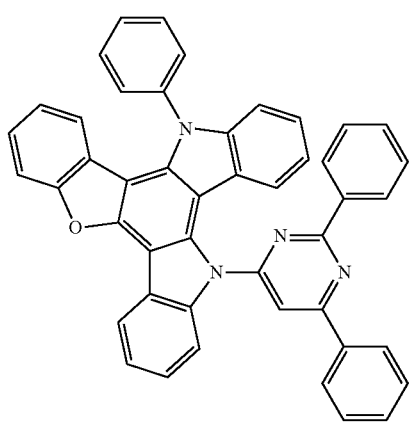
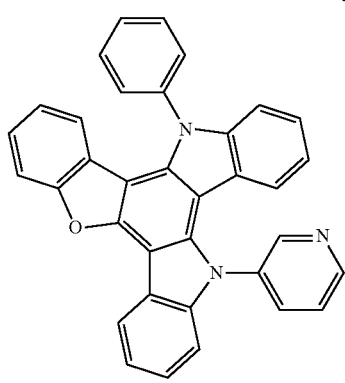
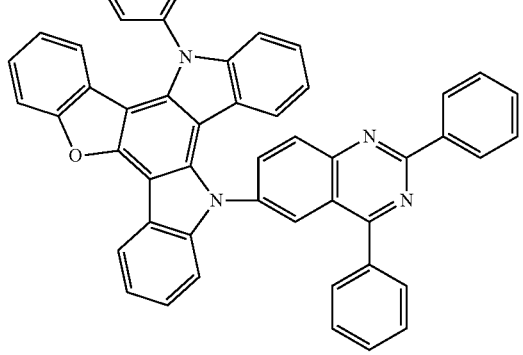

73
-continued
74
-continued
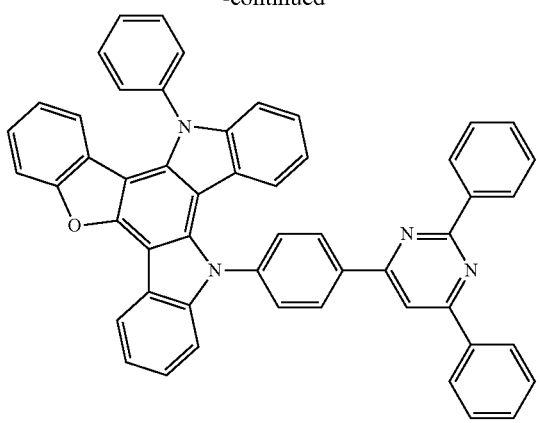
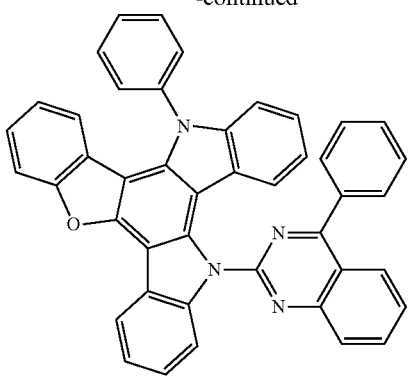
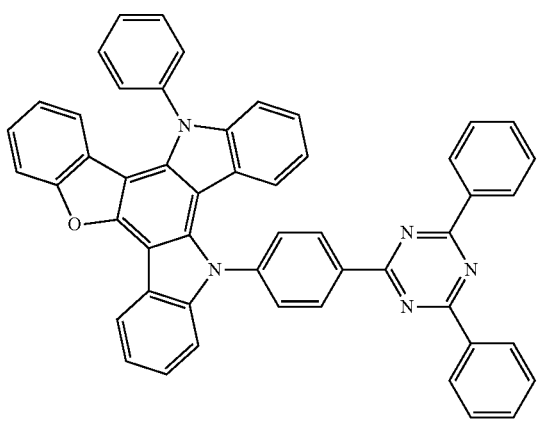
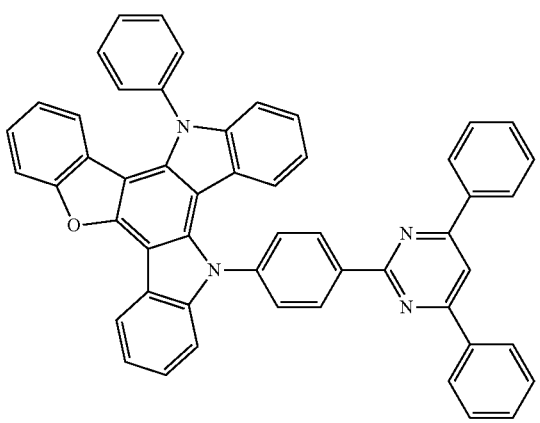
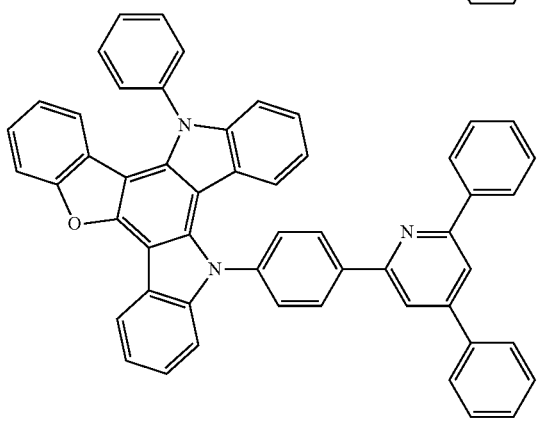
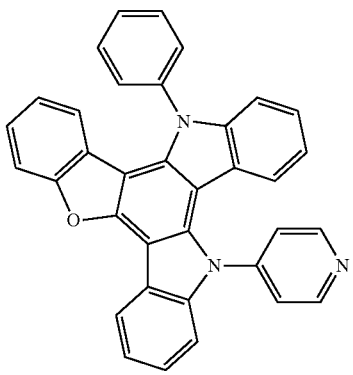
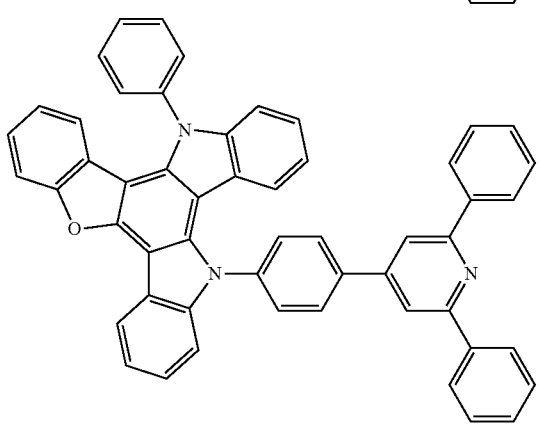
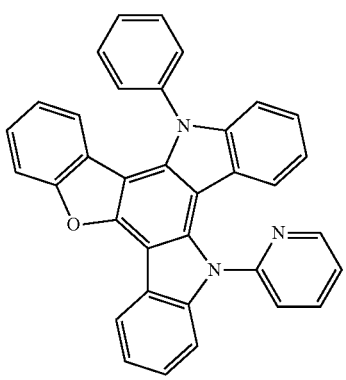

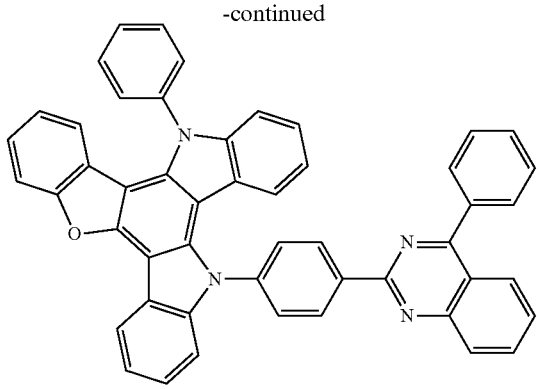
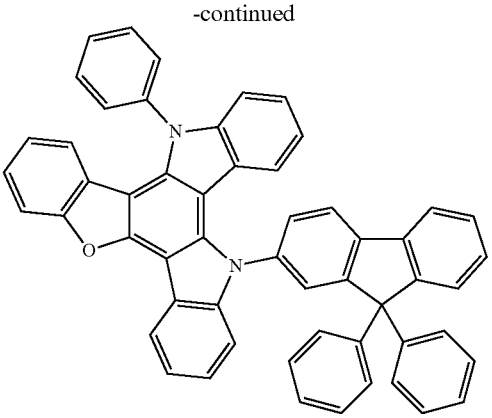
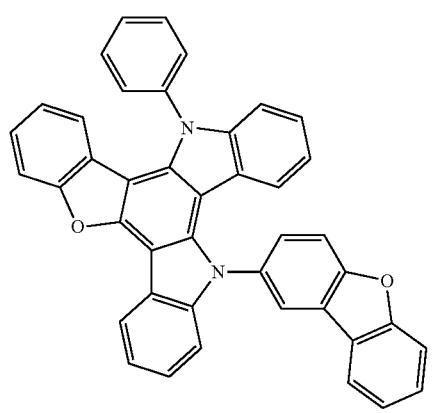
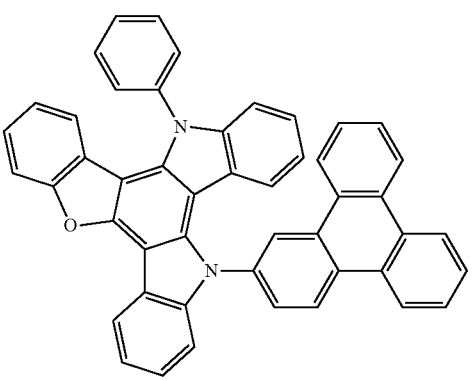
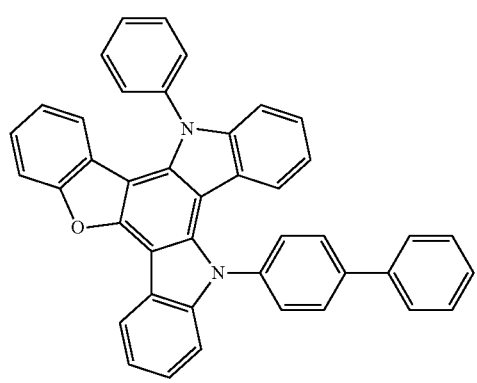
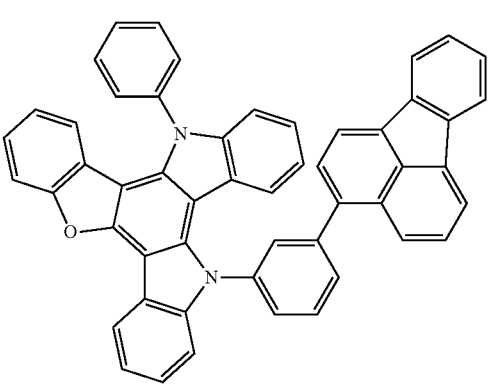
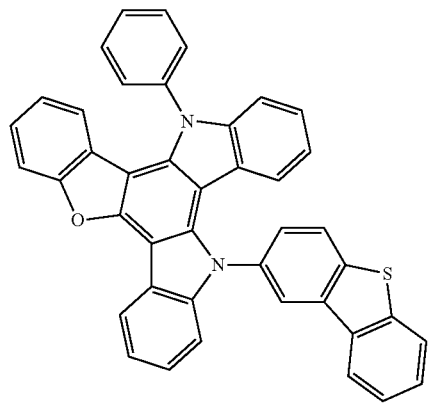
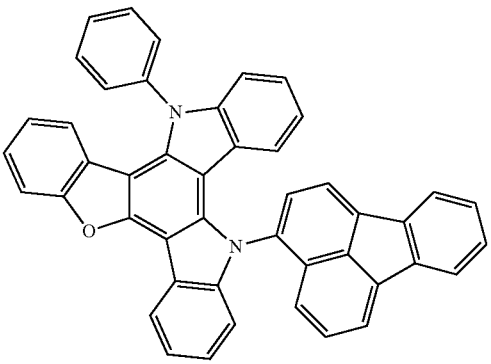

77
-continued
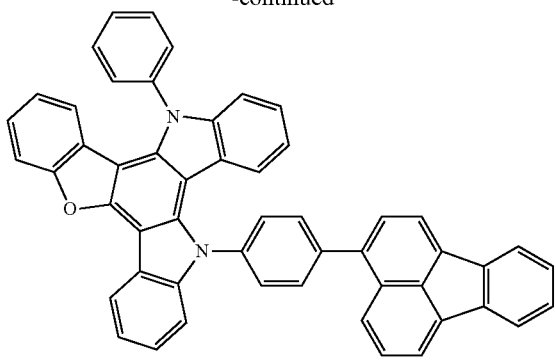
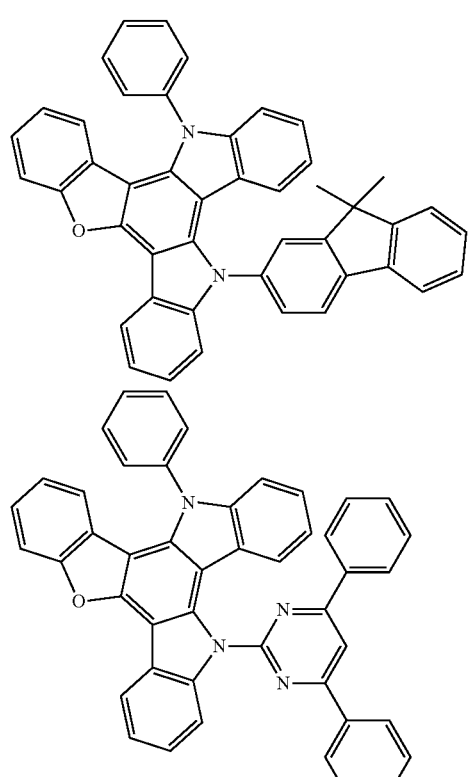
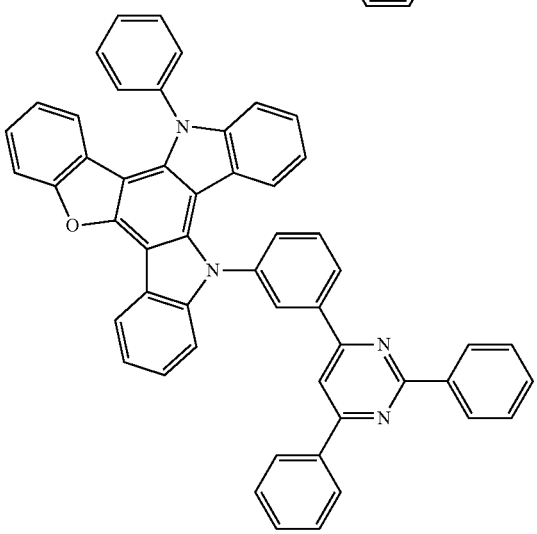
78
-continued
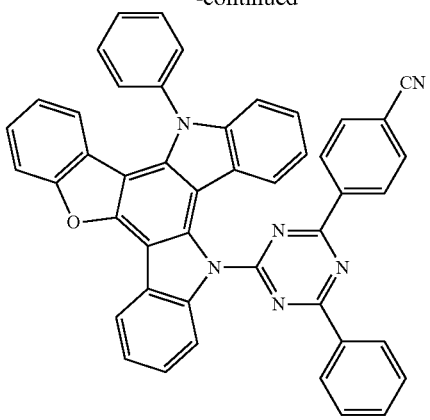
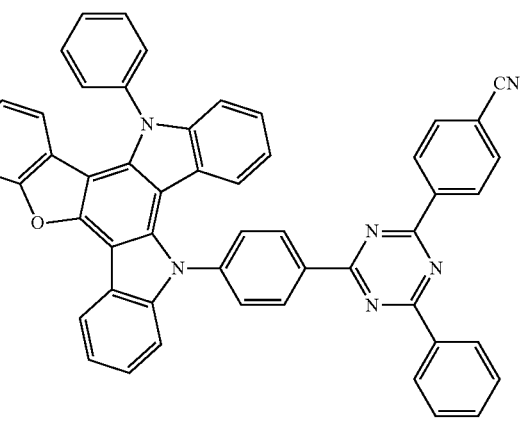
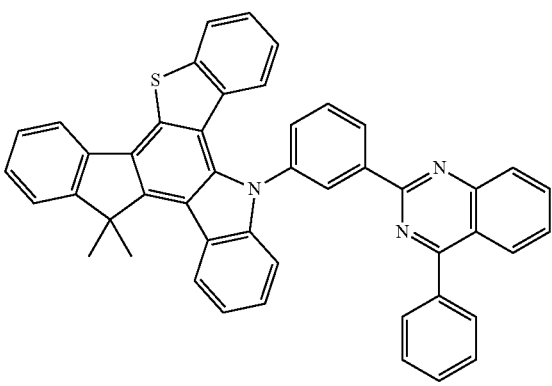

-continued
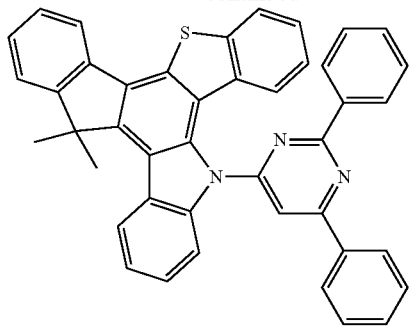
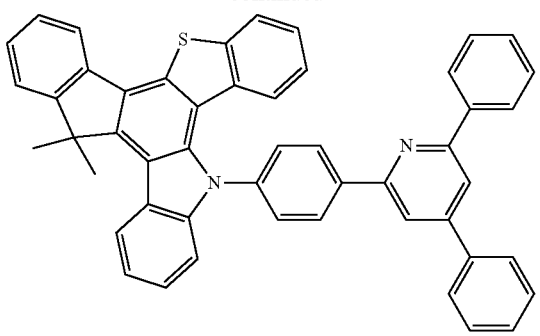
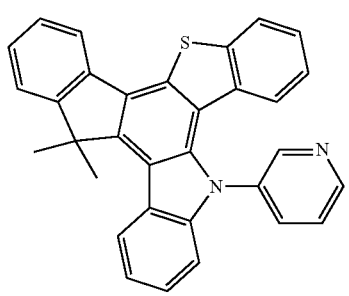
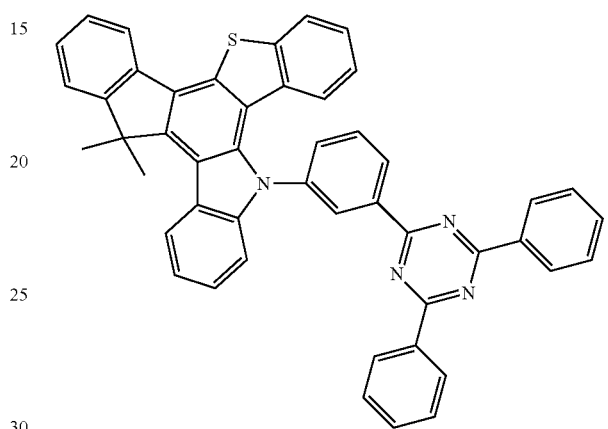
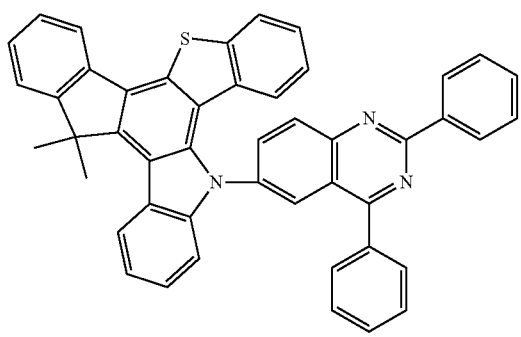
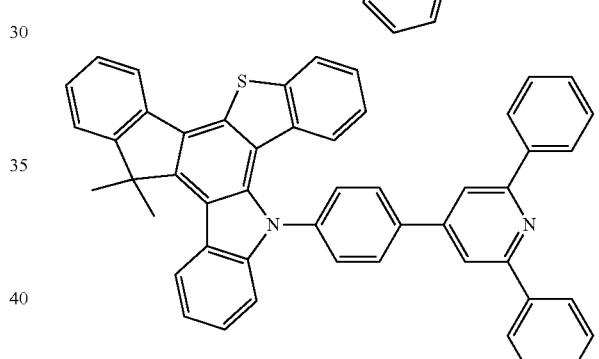
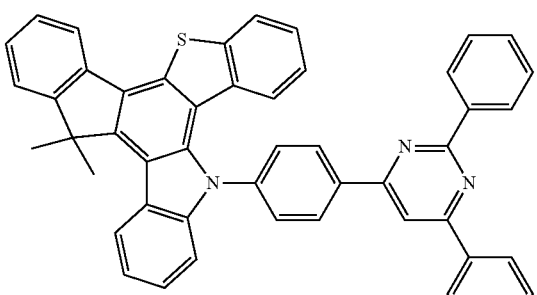
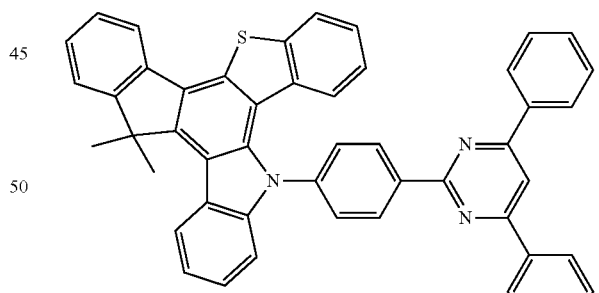
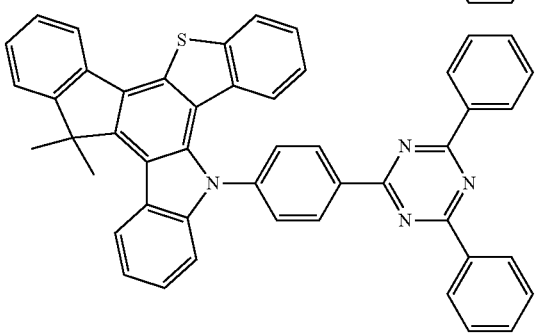
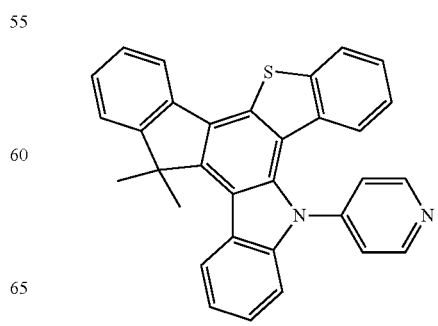

| 81 -continued | 82 -continued |
|---|---|
| 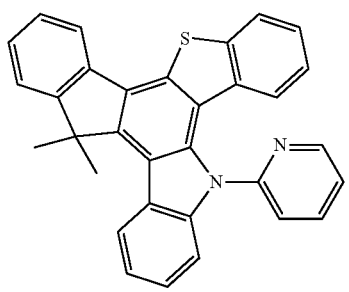 | 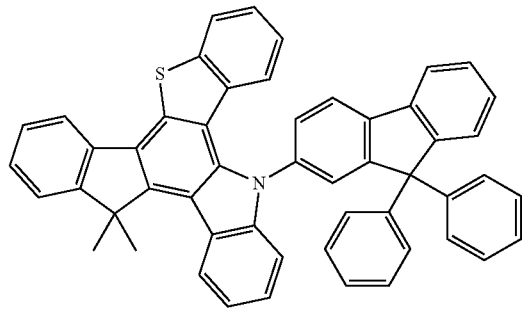 |
| 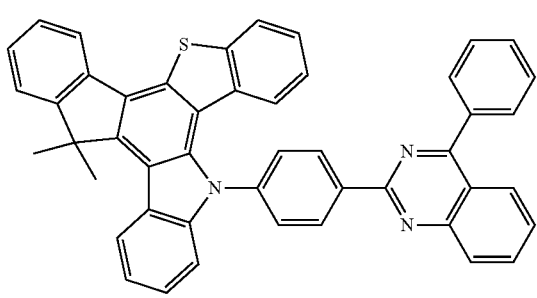 | 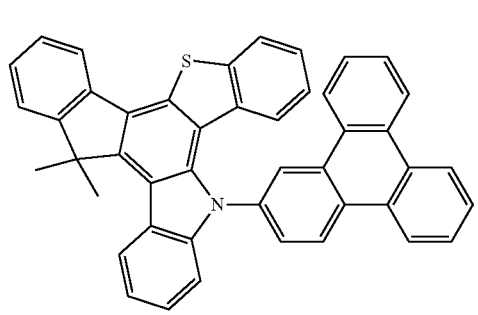 |
| 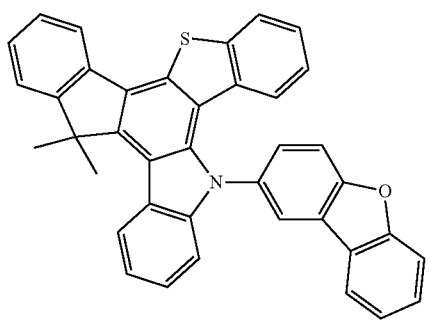 | 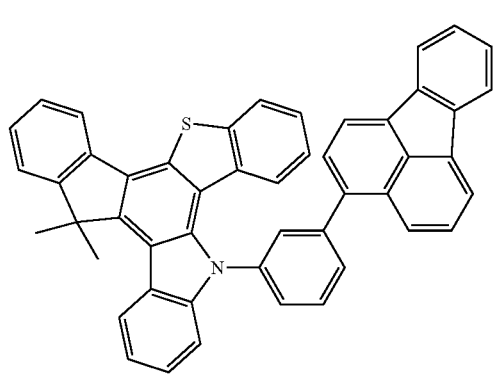 |
| 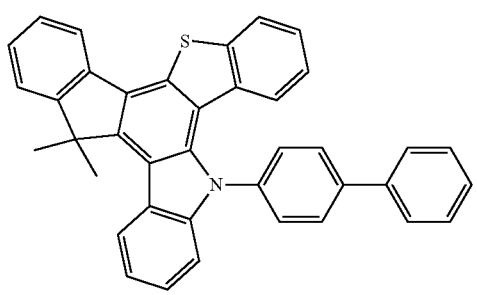 | 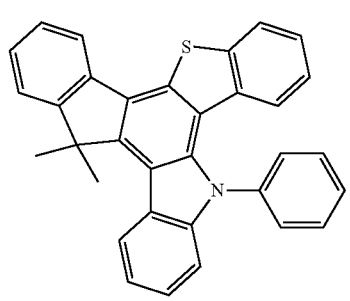 |
| 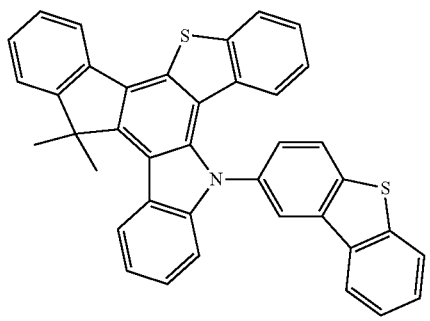 | 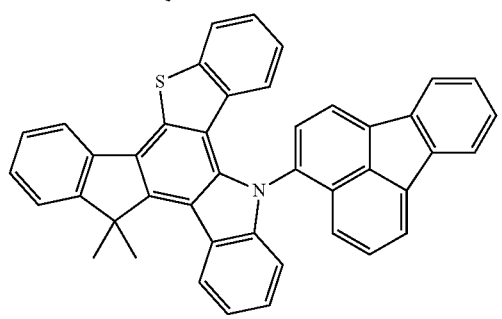 |

83
-continued
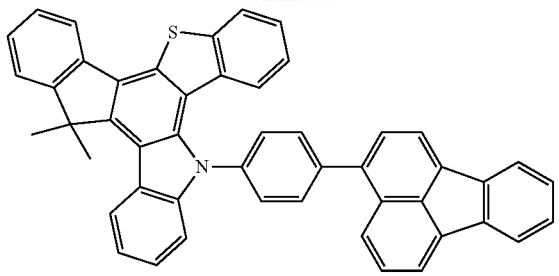
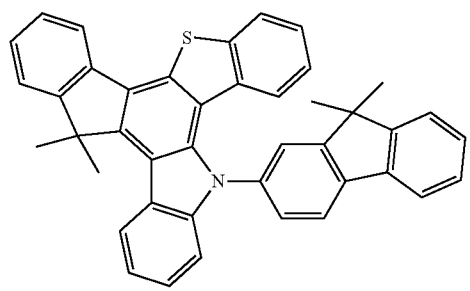
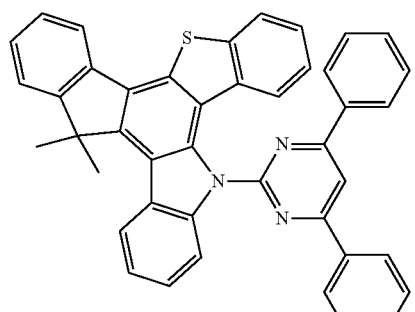
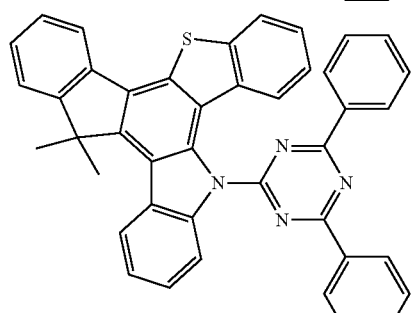
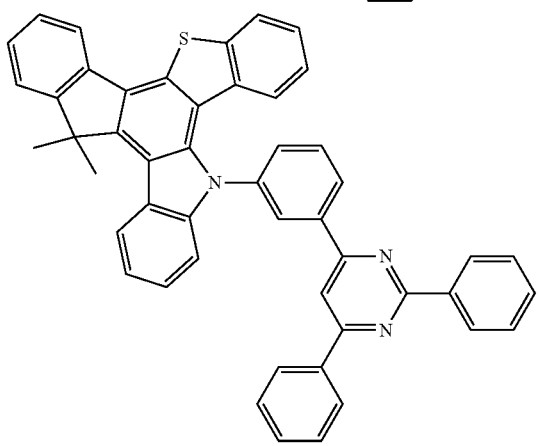
84
-continued
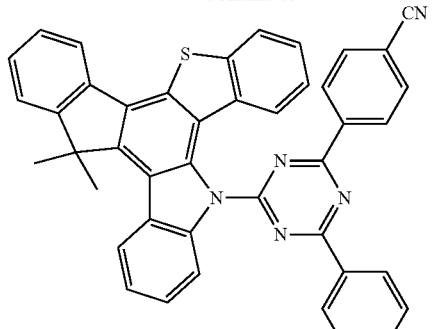
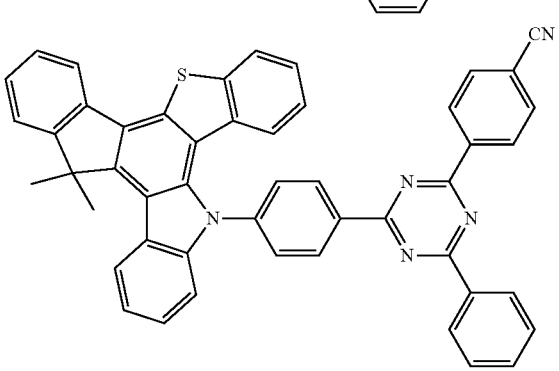
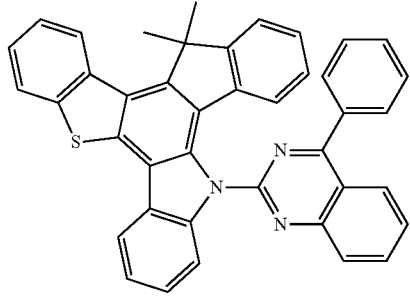
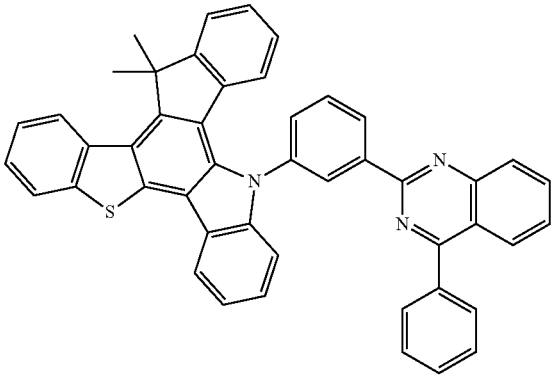
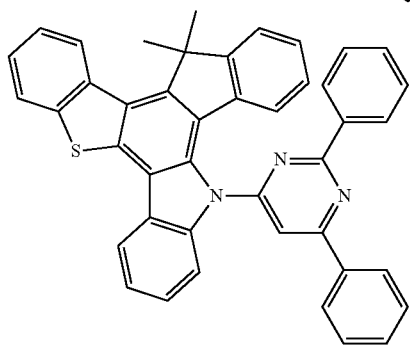

-continued
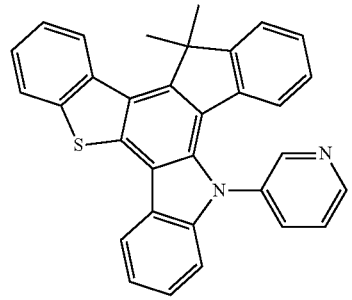
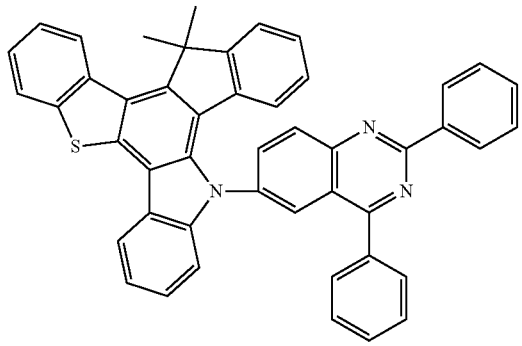
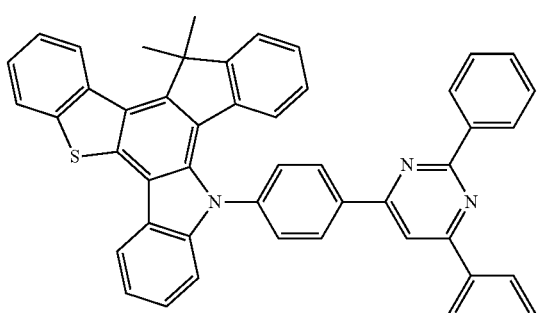
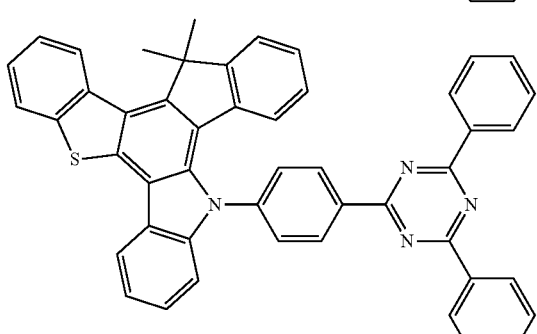
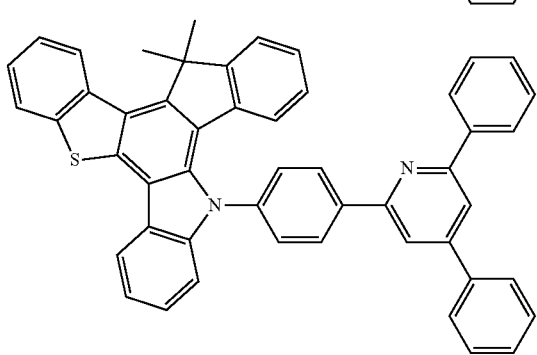
-continued
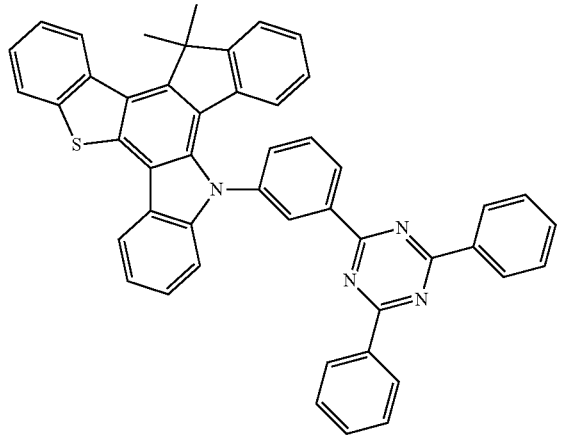
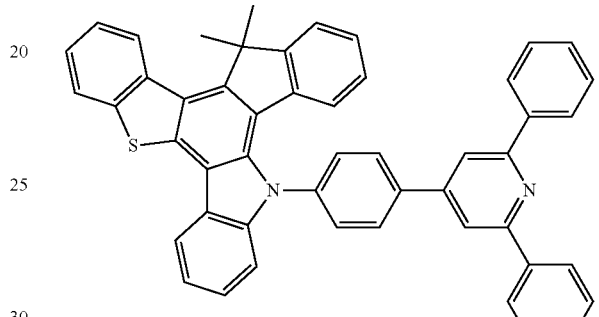
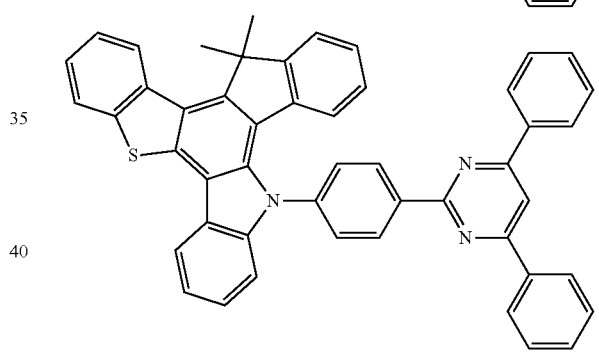
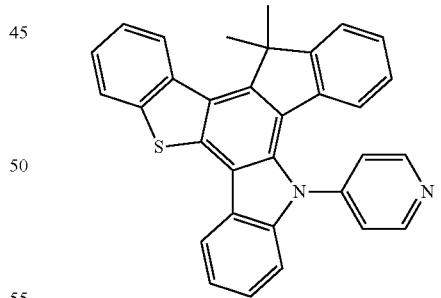
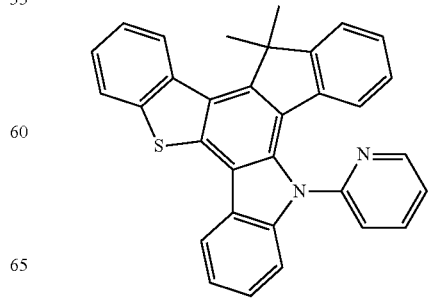

87
-continued
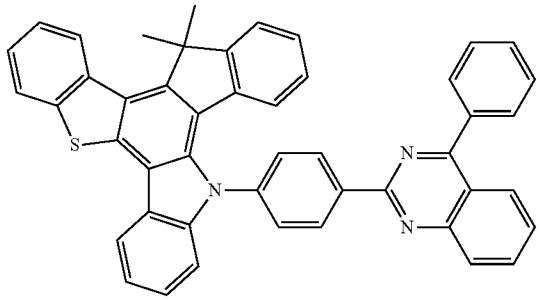
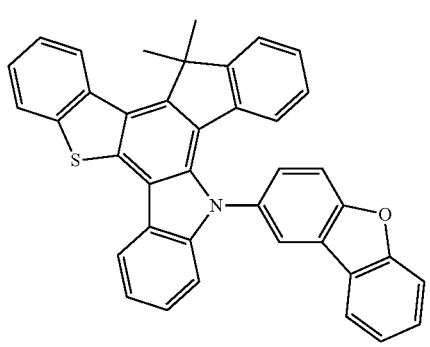
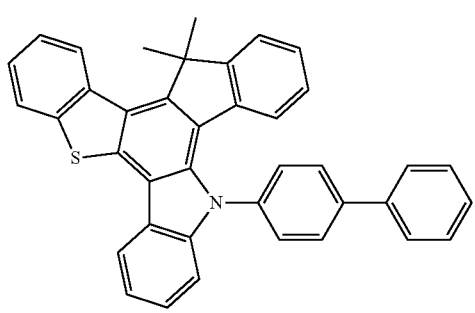
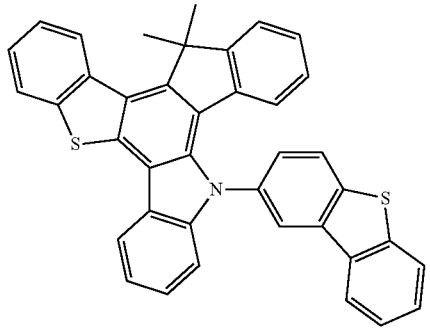
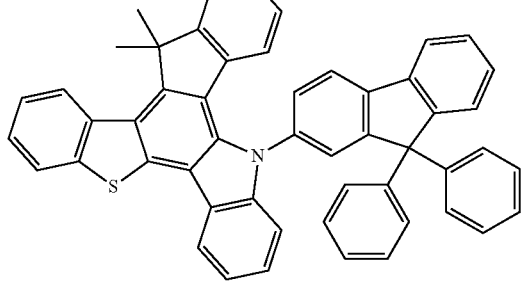
88
-continued
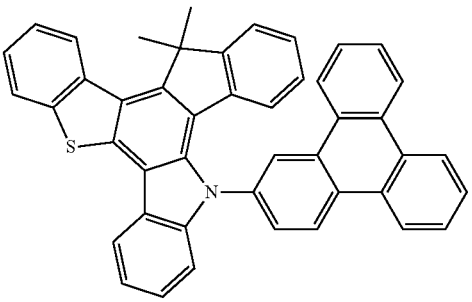
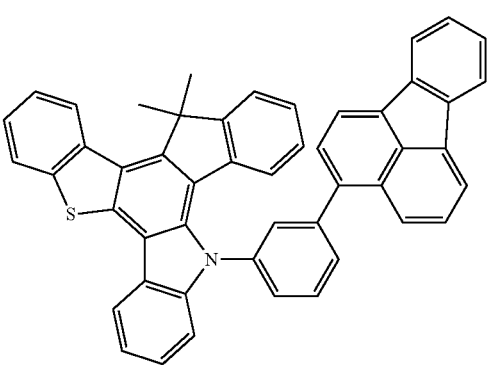
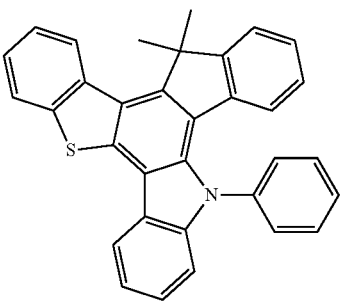
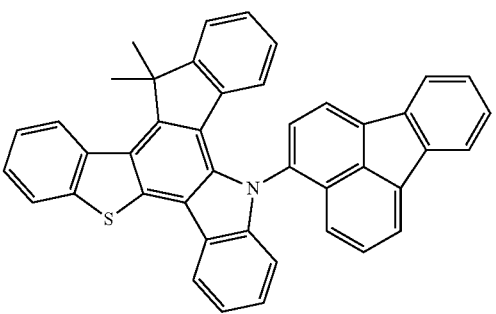
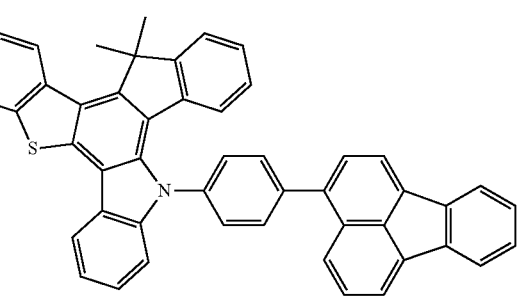

89
-continued
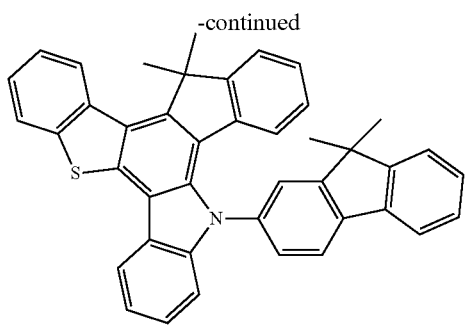
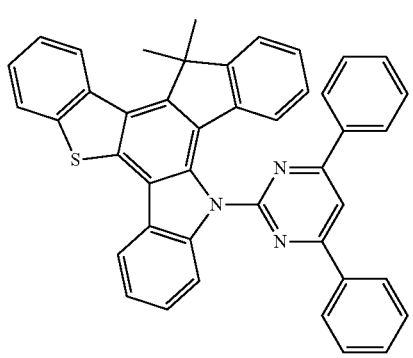
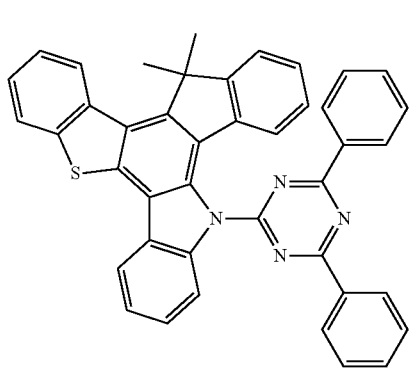
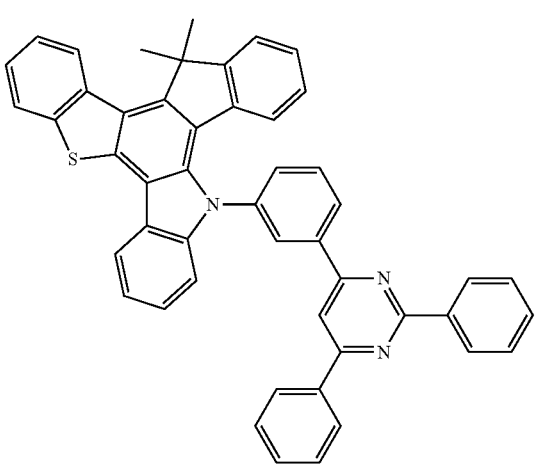
90
-continued
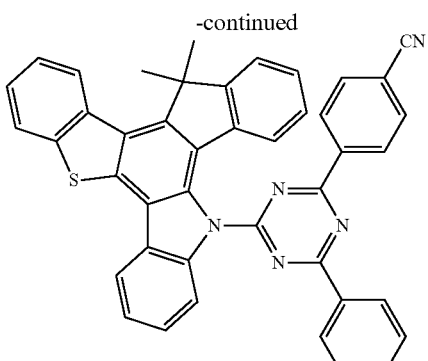
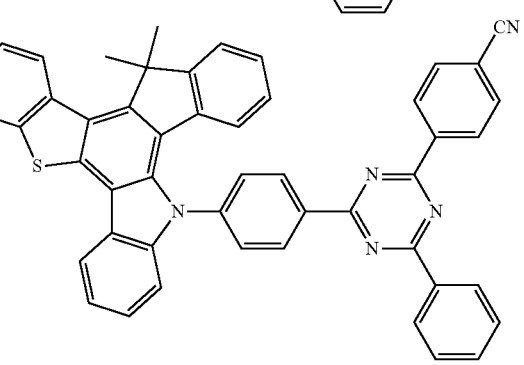
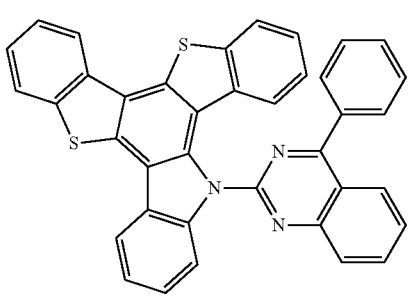
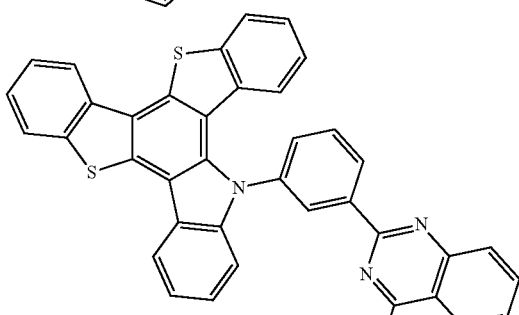
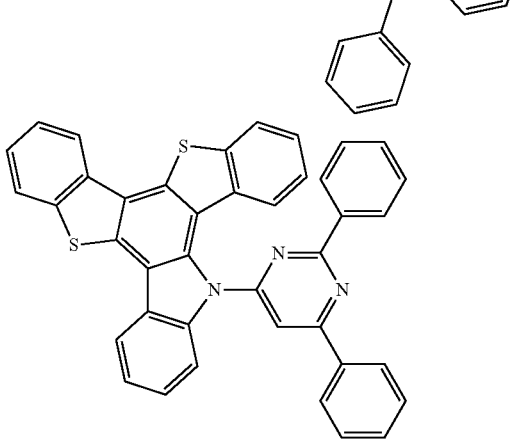

91
-continued
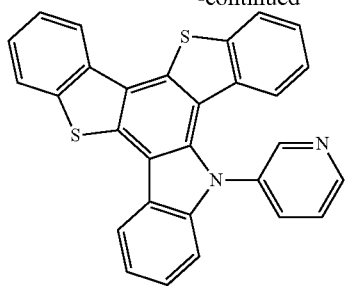
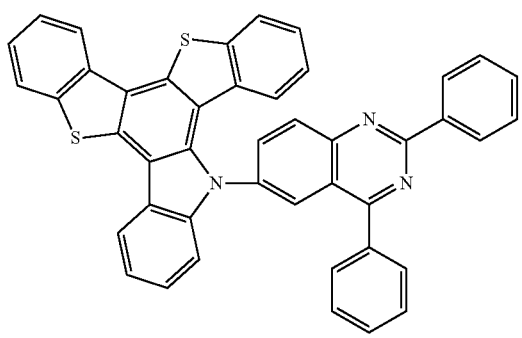
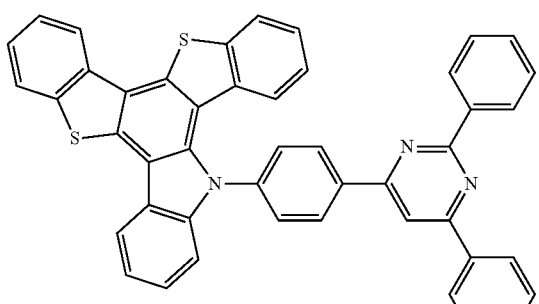
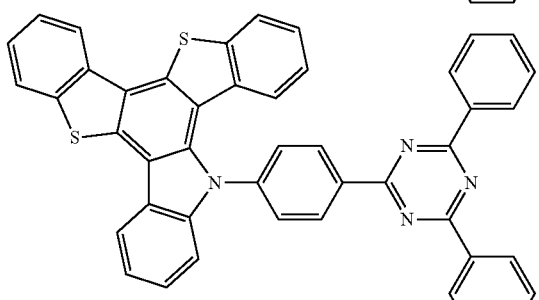
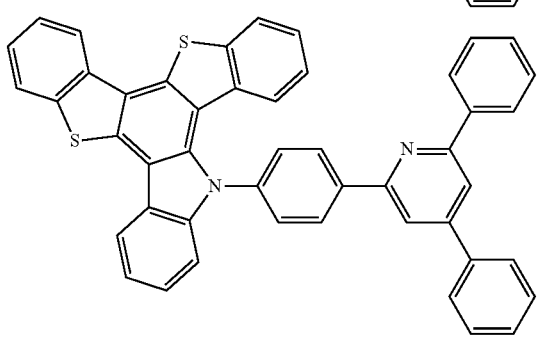
92
-continued
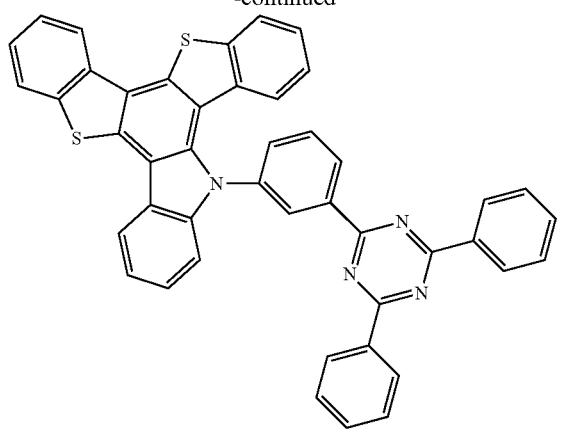
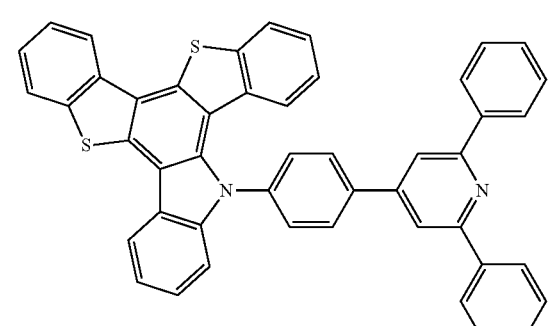
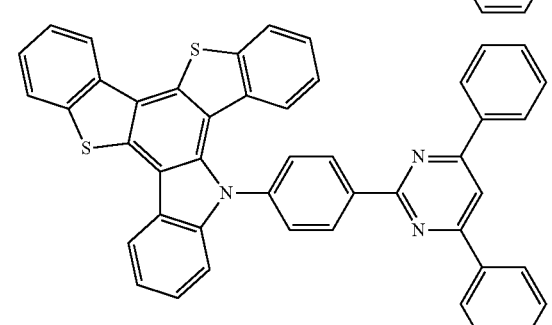
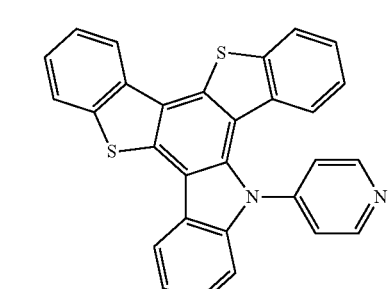
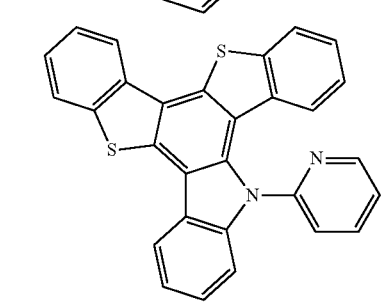

93
-continued
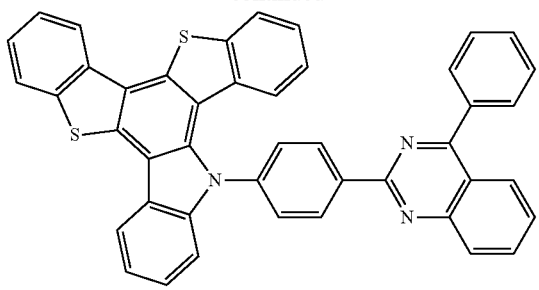
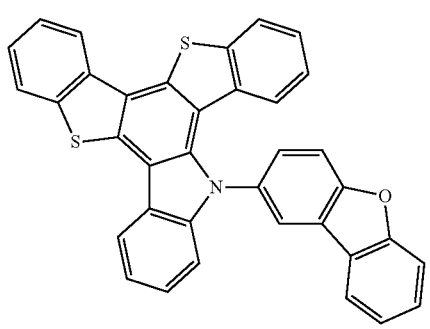
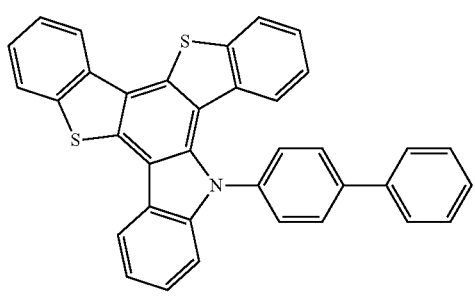
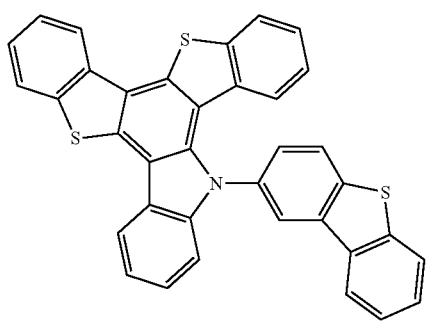
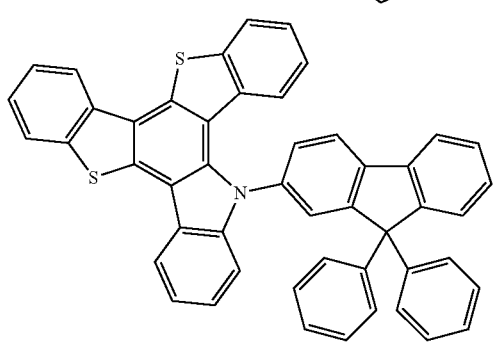
94
-continued
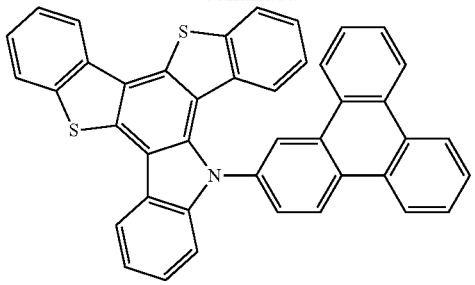
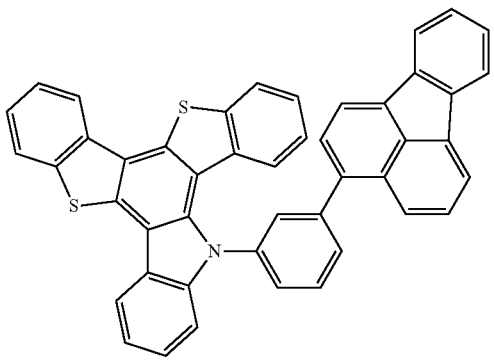
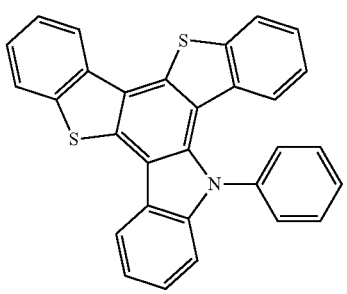
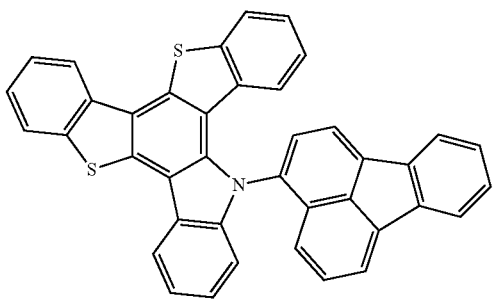
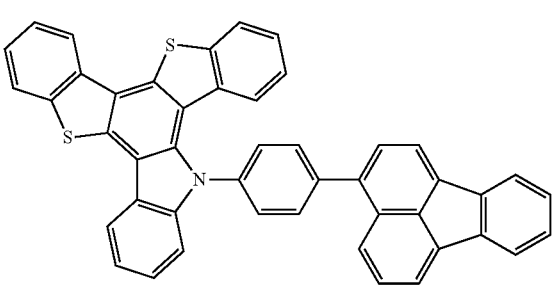

95
-continued
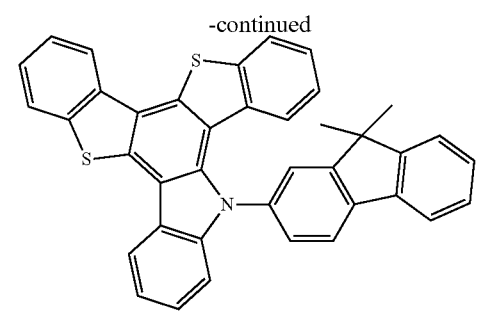
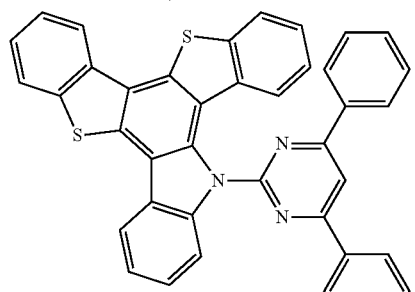
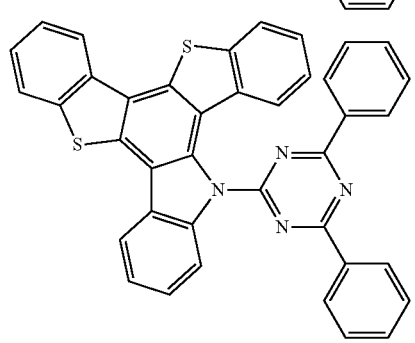
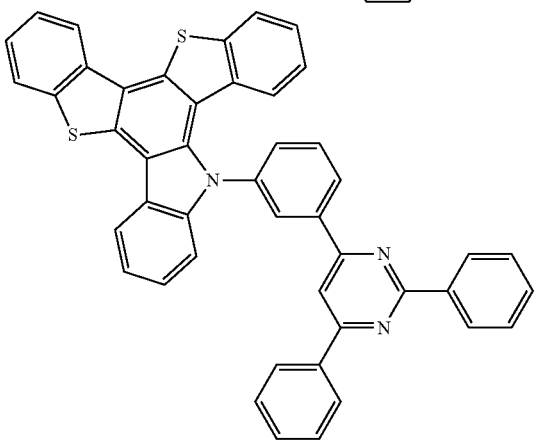
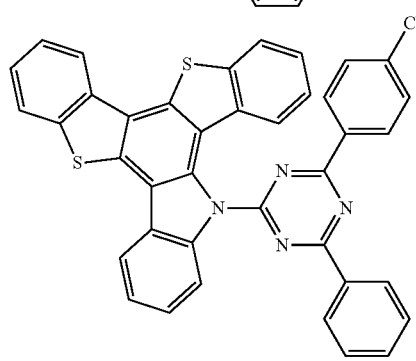
96
-continued
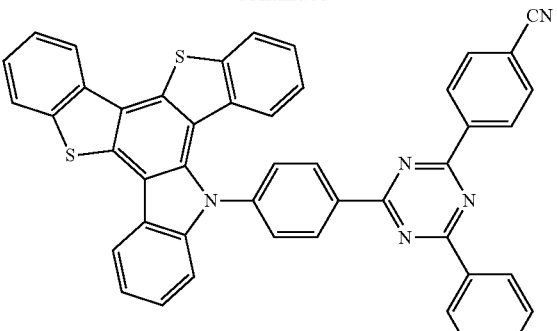
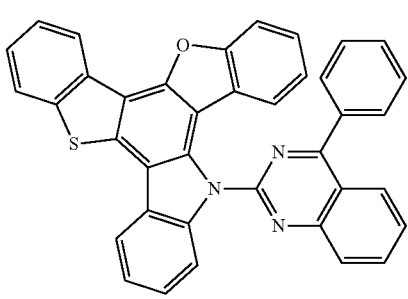
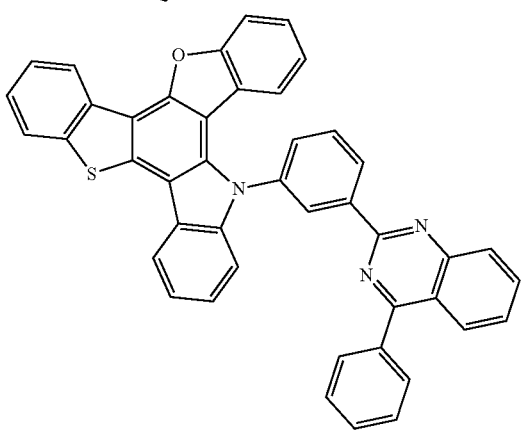
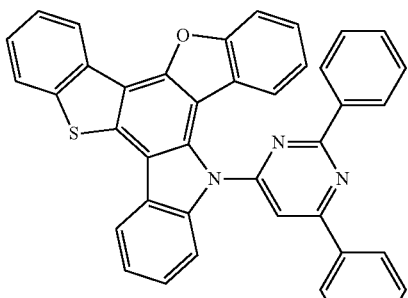
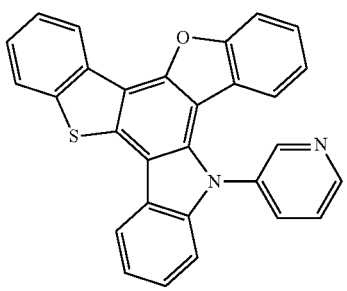

97
-continued
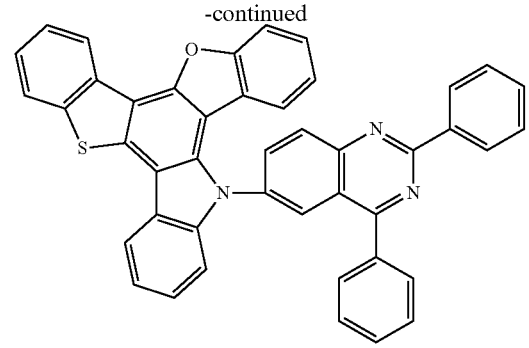
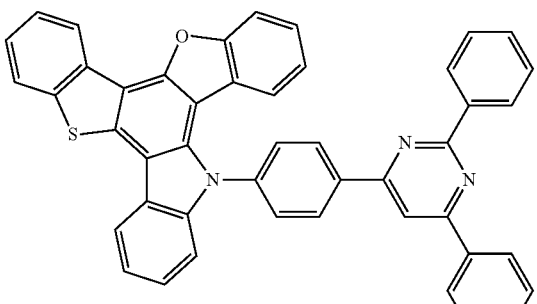
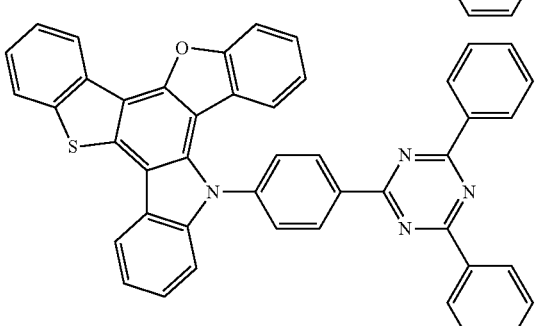
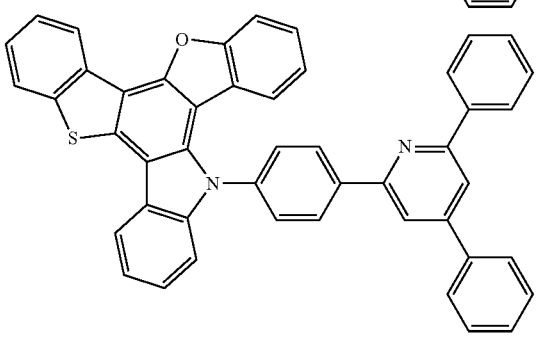
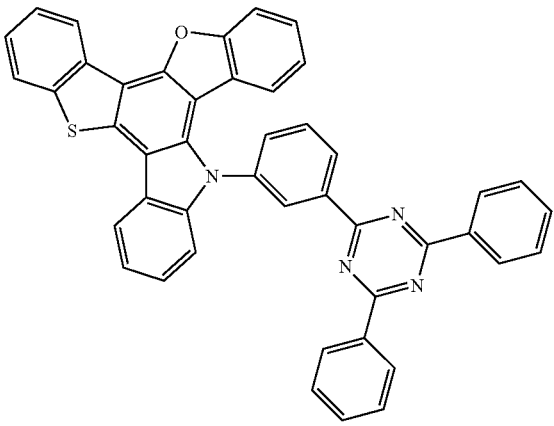
98
-continued
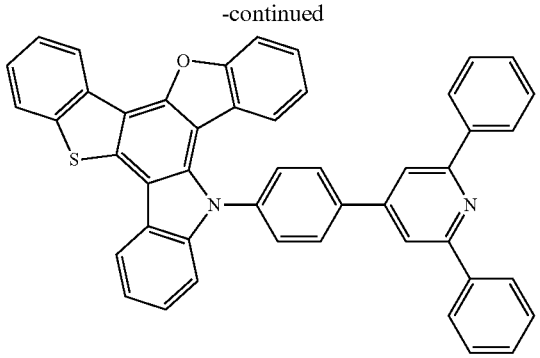
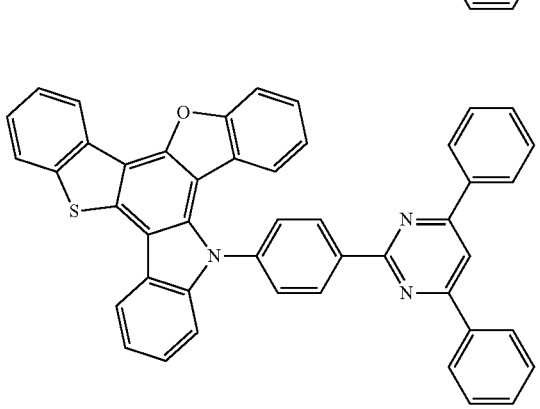
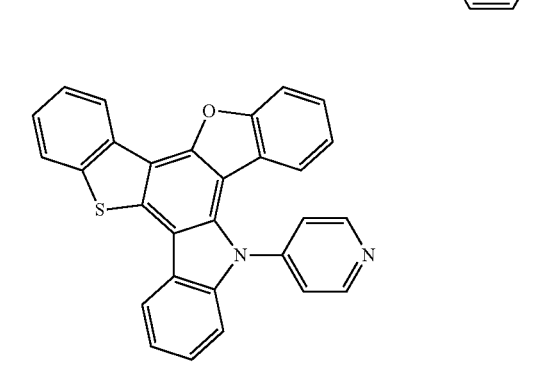
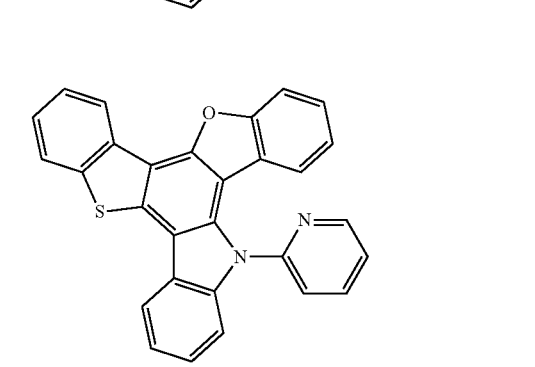
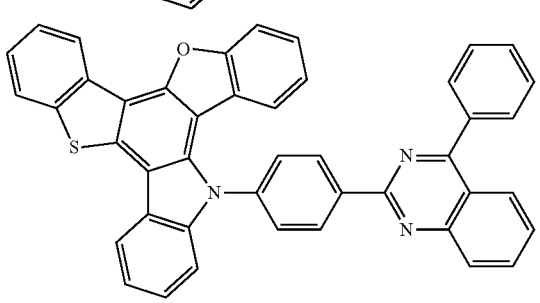

99
-continued
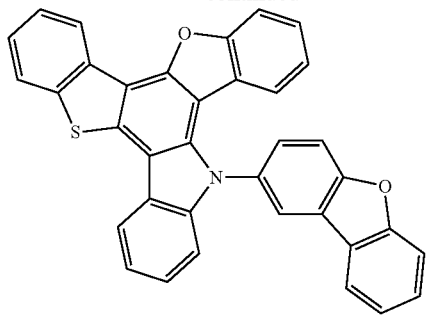
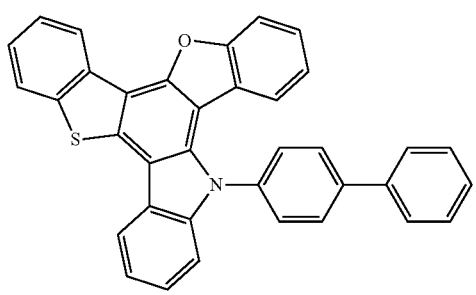
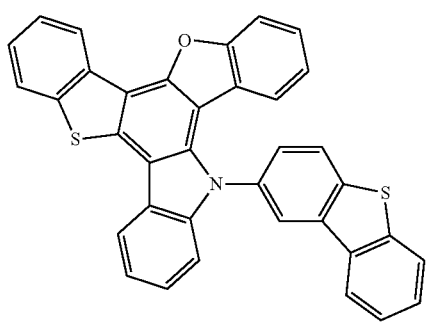
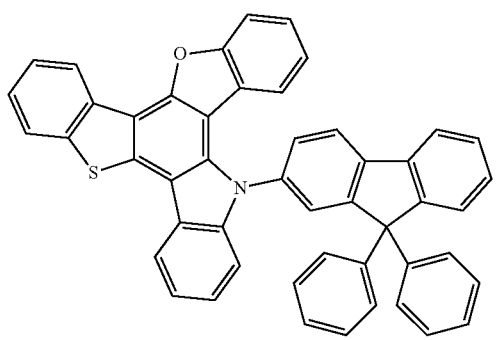
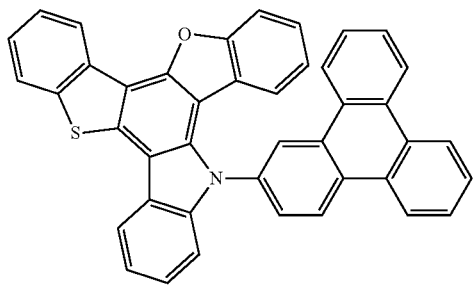
100
-continued
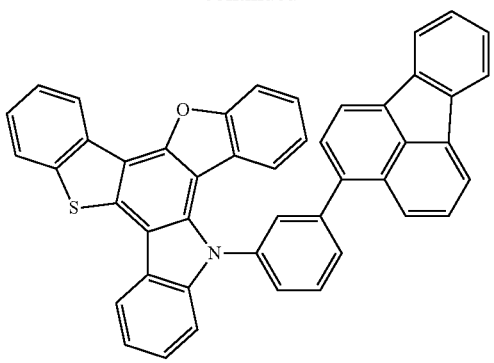
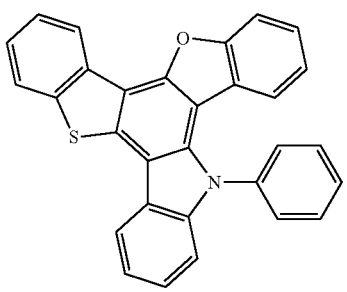
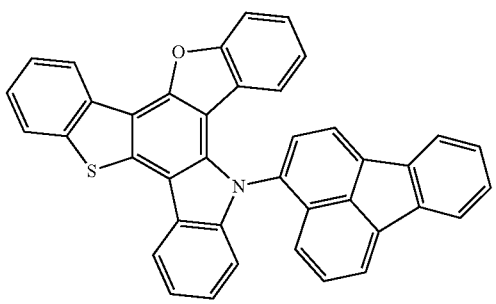
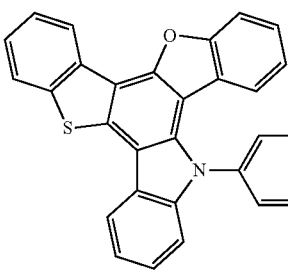
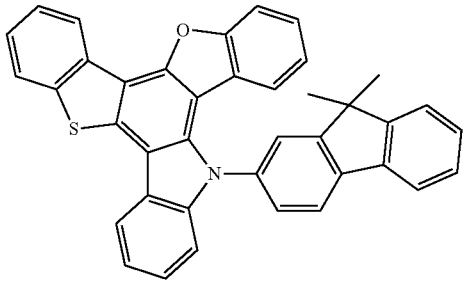

101
-continued
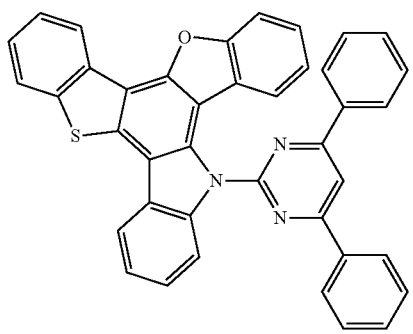
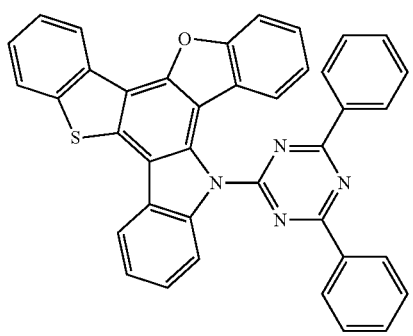
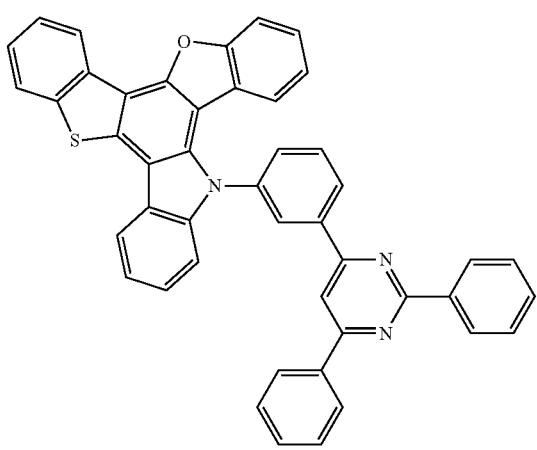
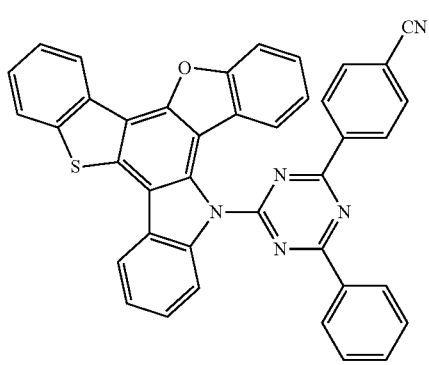
102
-continued
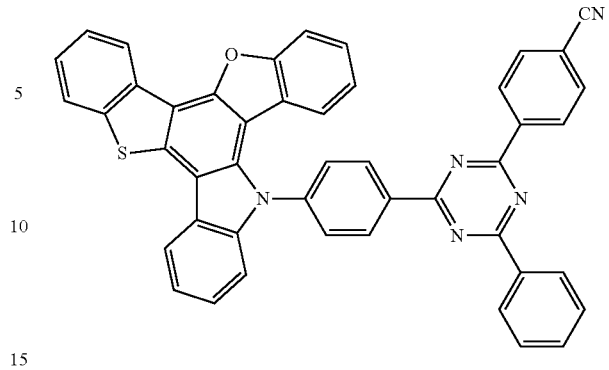
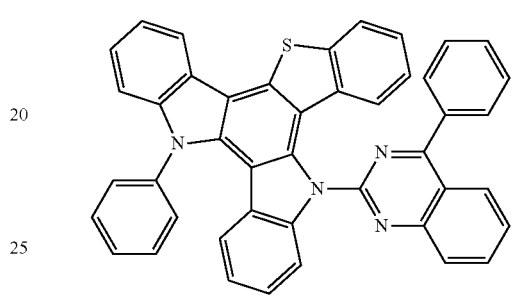
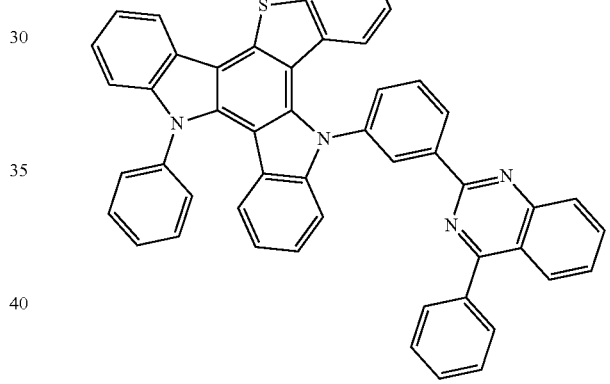
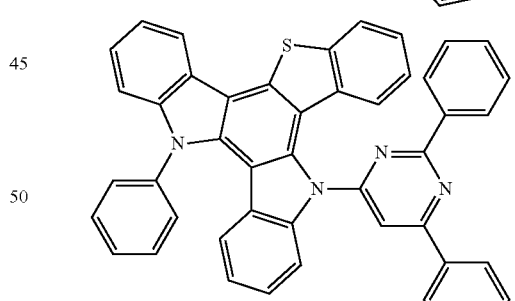
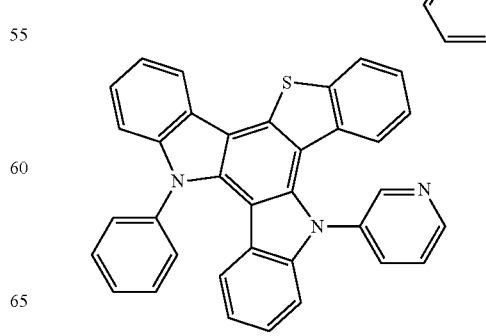

103
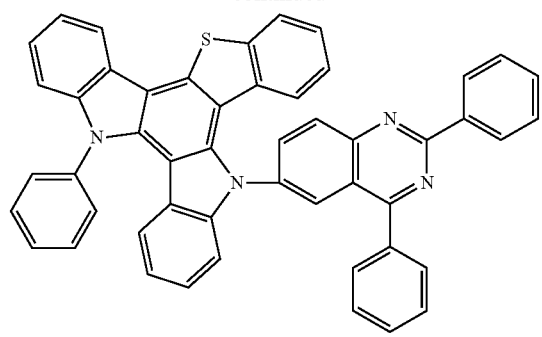
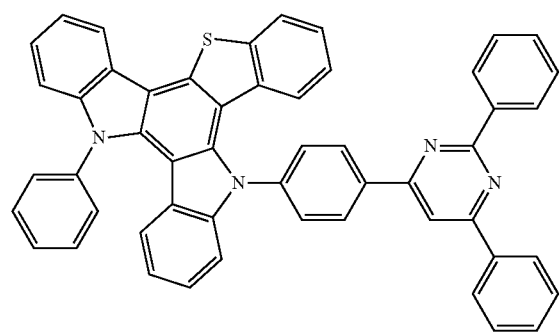
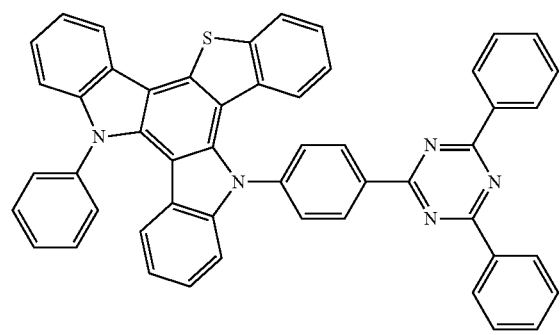
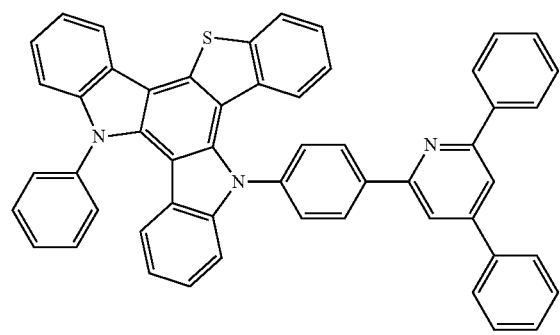
104
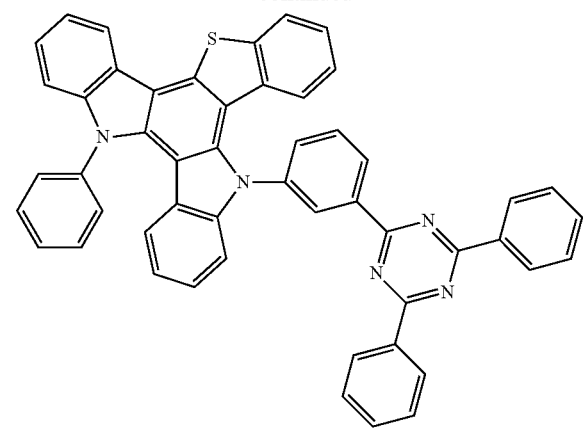
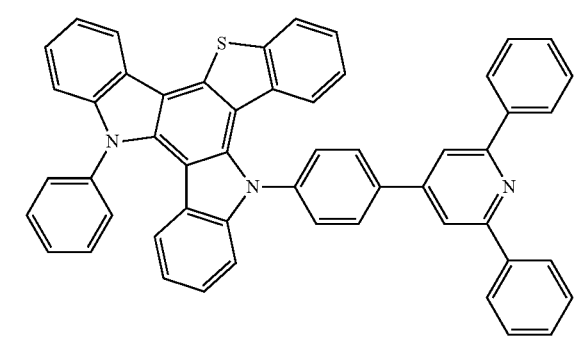 [SMILES: c1ccc(-c2cc(-c3ccc(-n4c5ccccc5c5c6c(c7ccccc7n6-c6ccccc6)c6sc7ccccc7c6c54)cc3)nc(-c3ccccc3)n2)cc1]
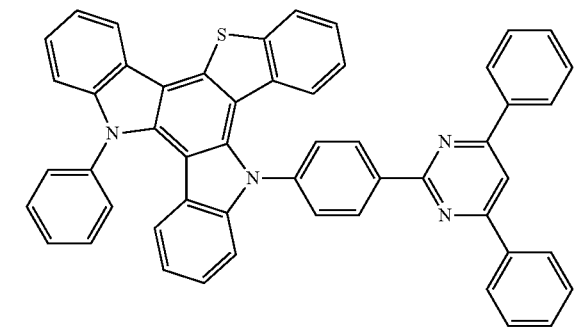
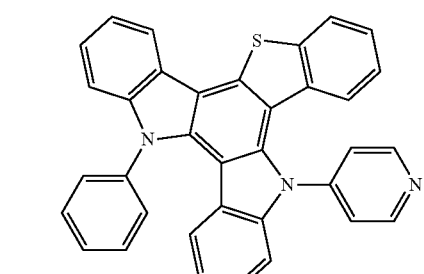
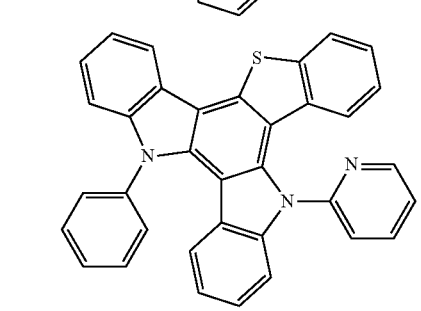

105
-continued
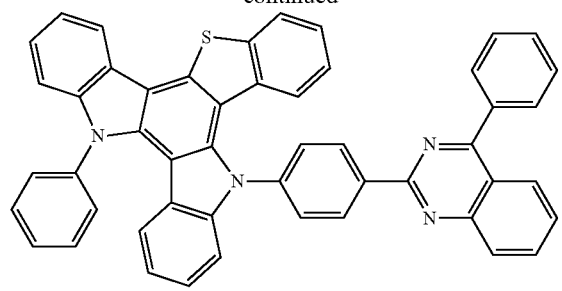
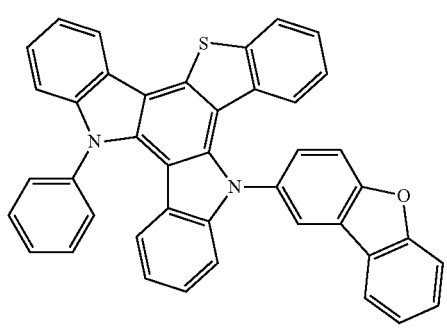
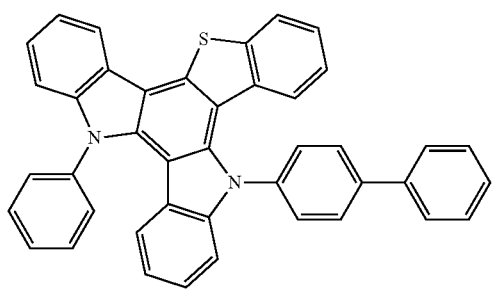
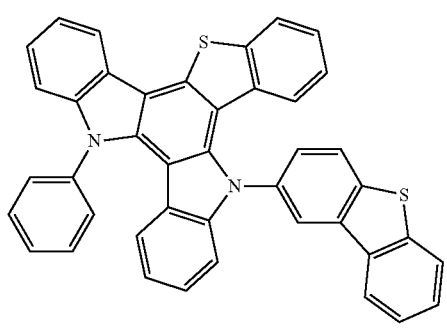
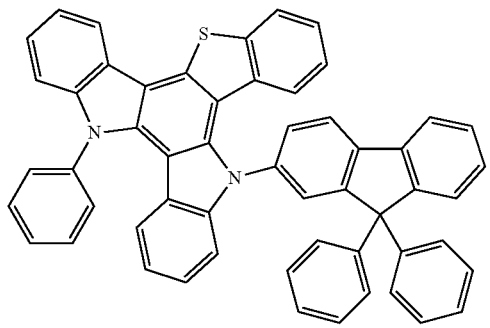
106
-continued
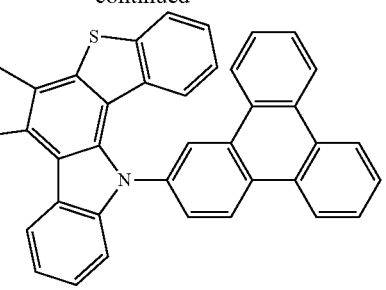
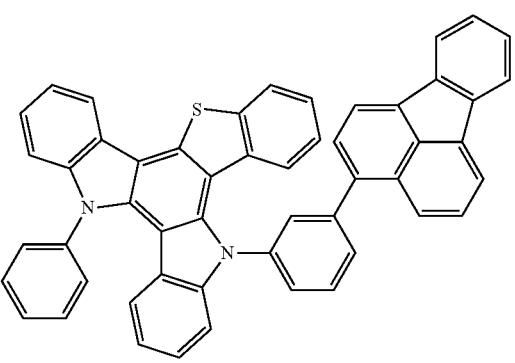
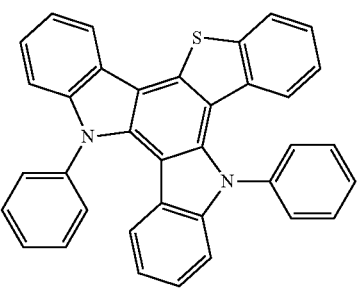
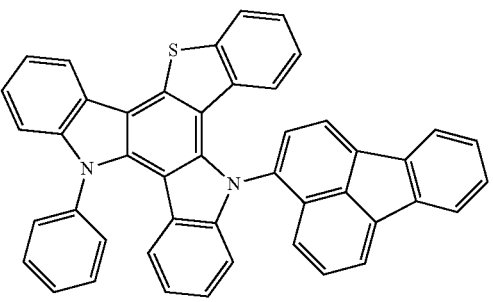
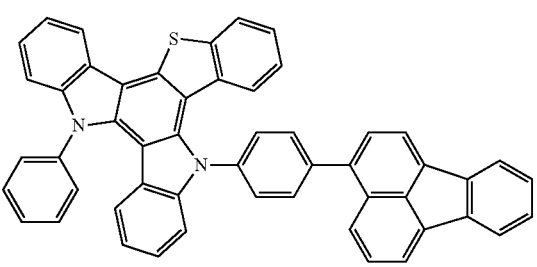

107
-continued
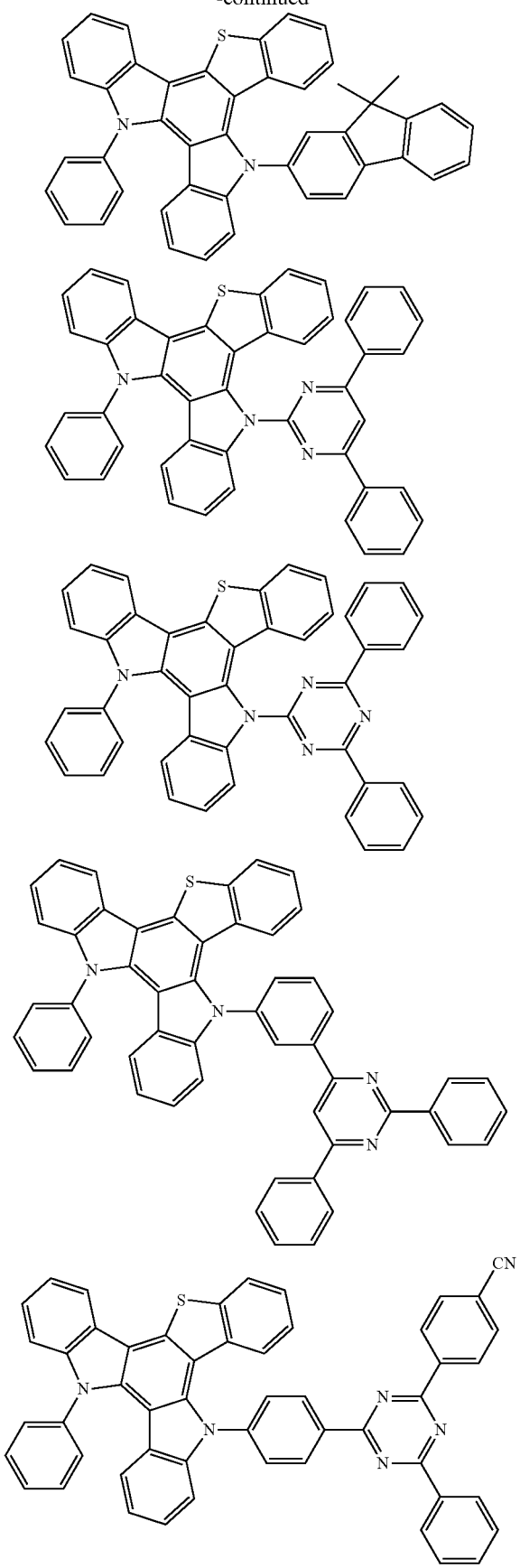
108
-continued
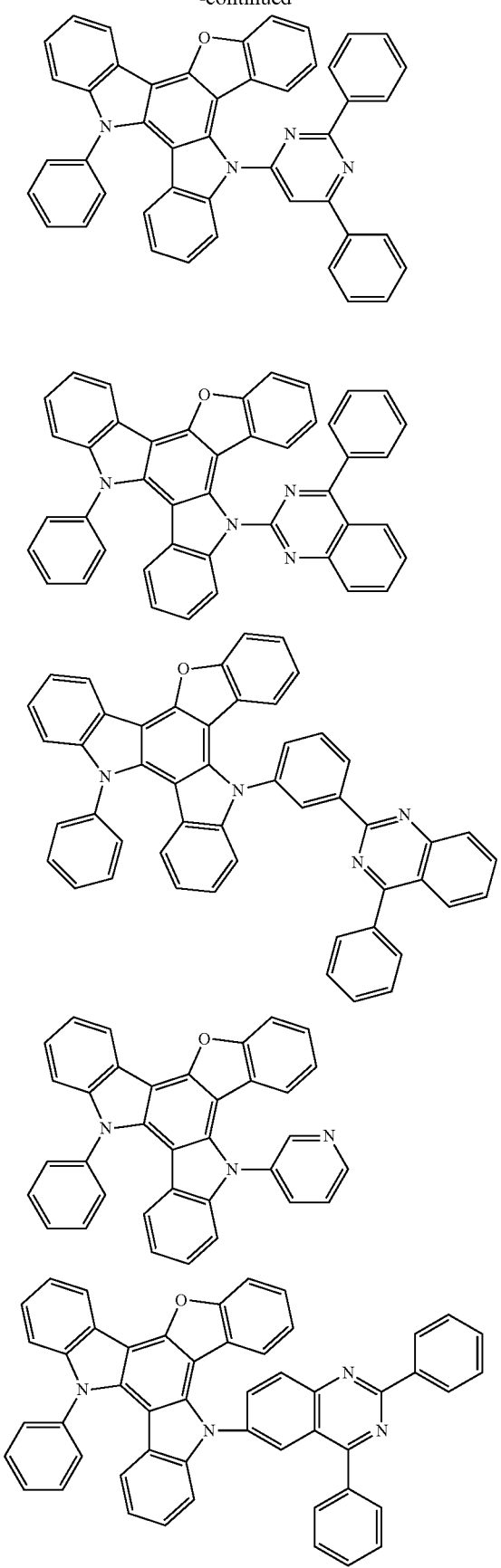

109
-continued
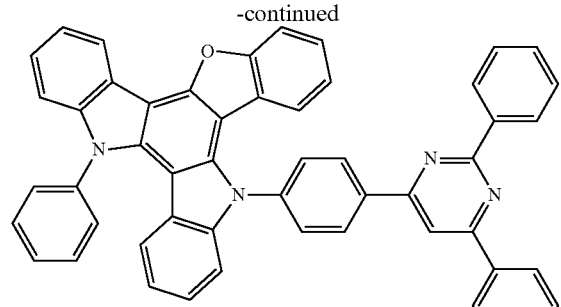
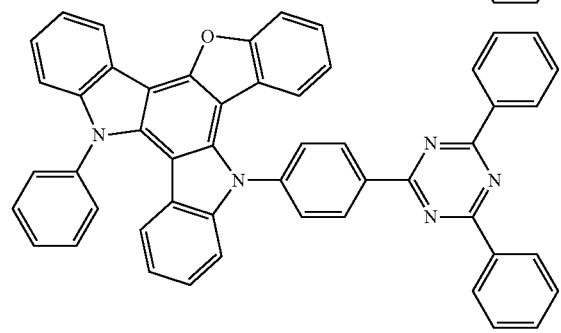
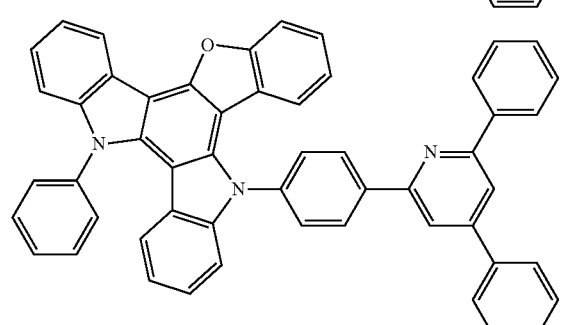
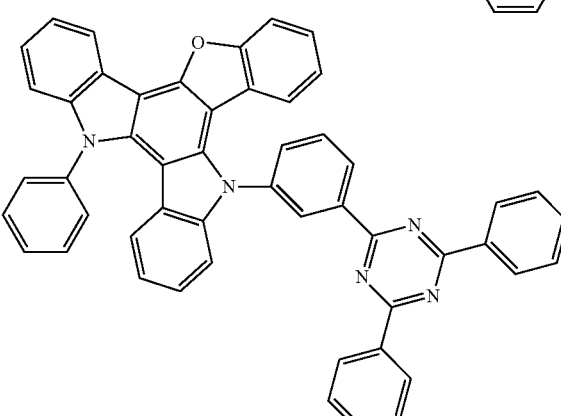
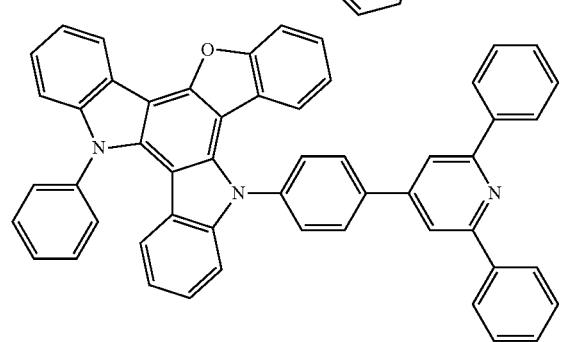
110
-continued
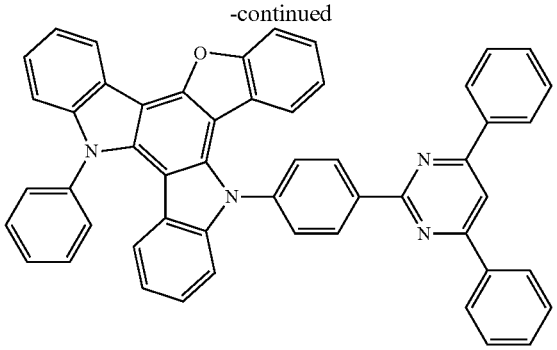
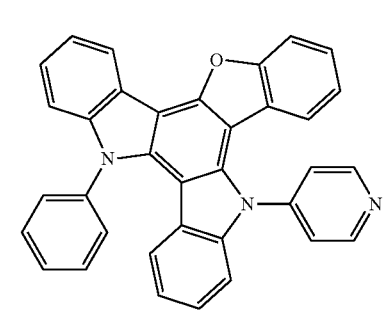
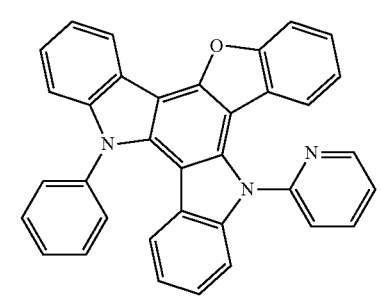
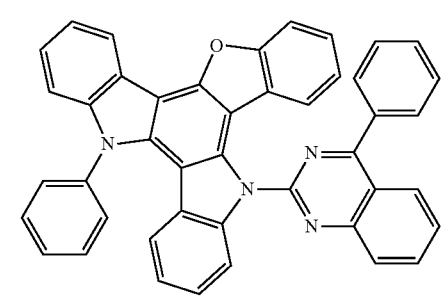
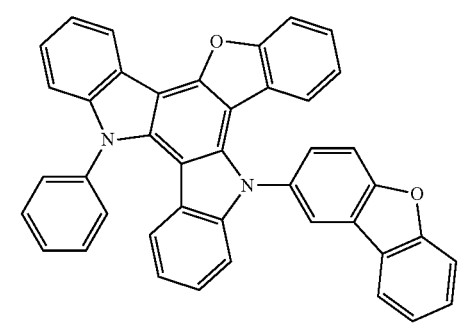

111
-continued
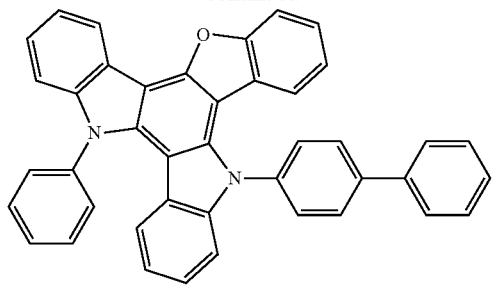
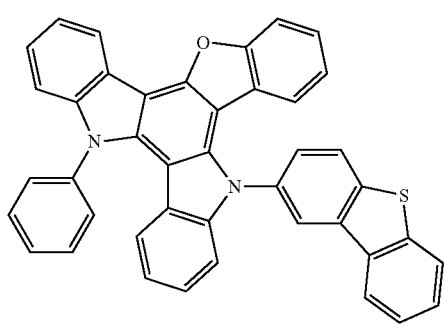
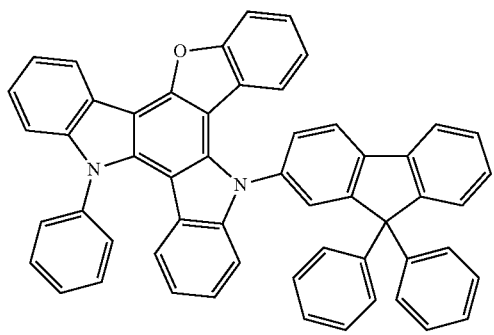
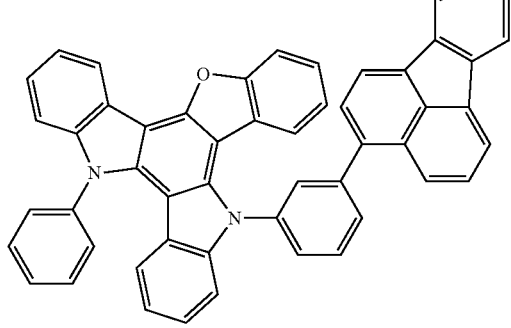
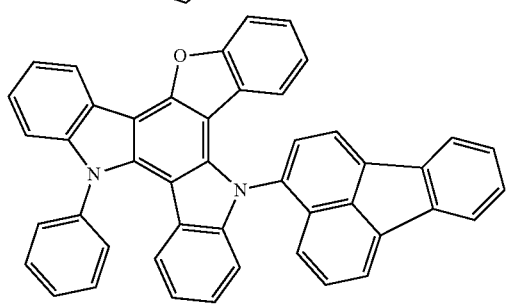
112
-continued
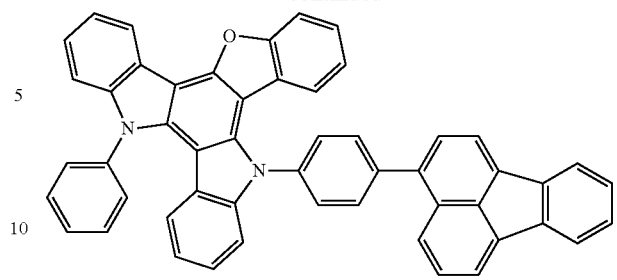
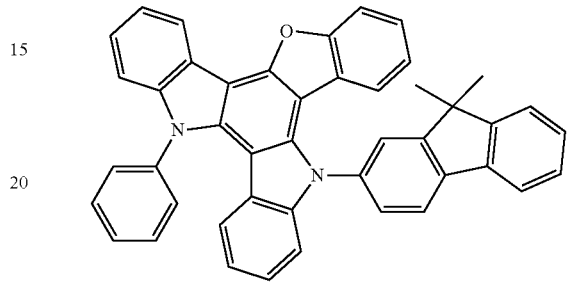
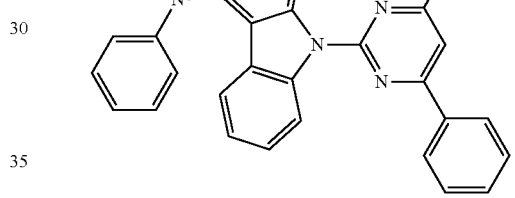
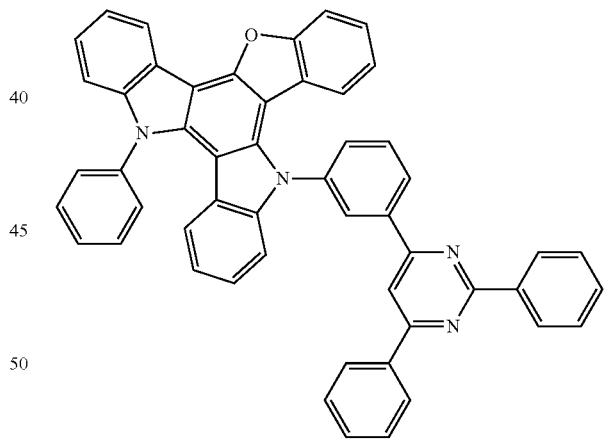
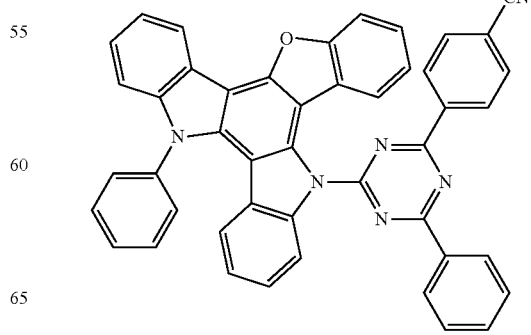

113
-continued
114
-continued
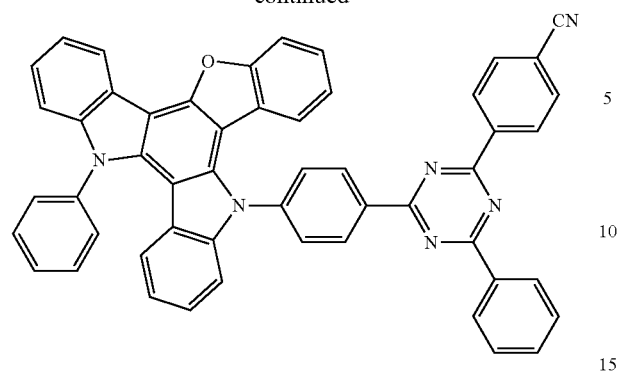
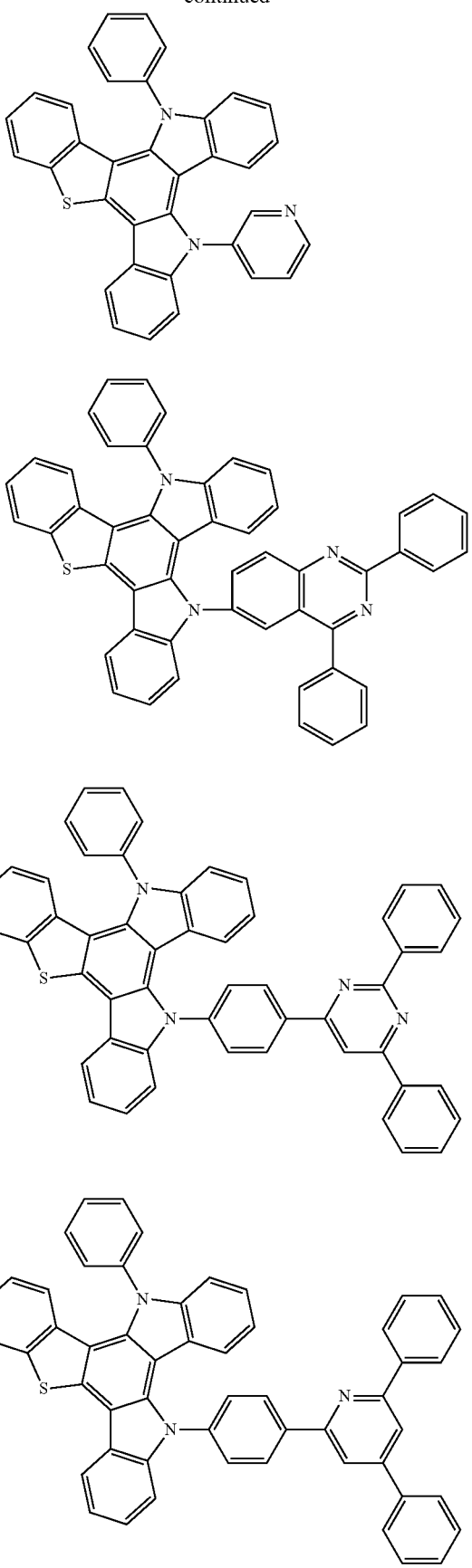

115
-continued
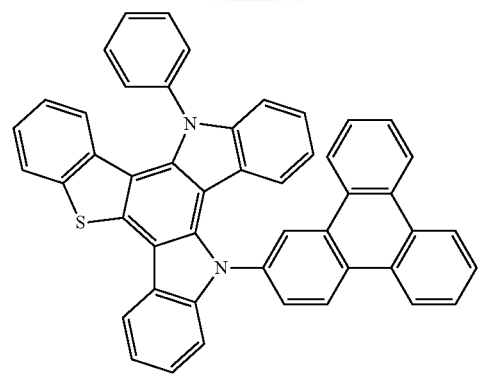
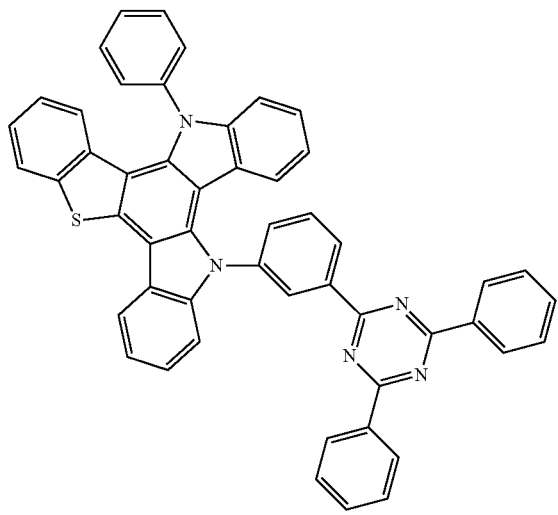
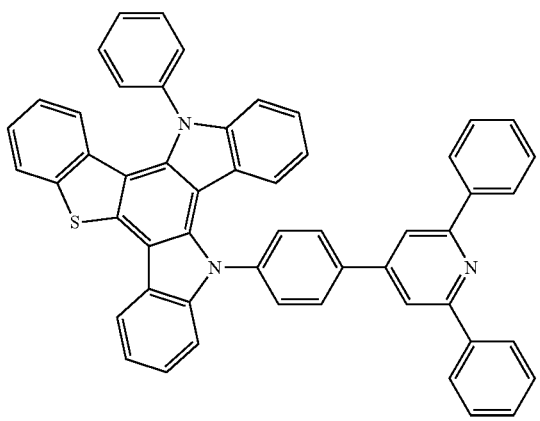
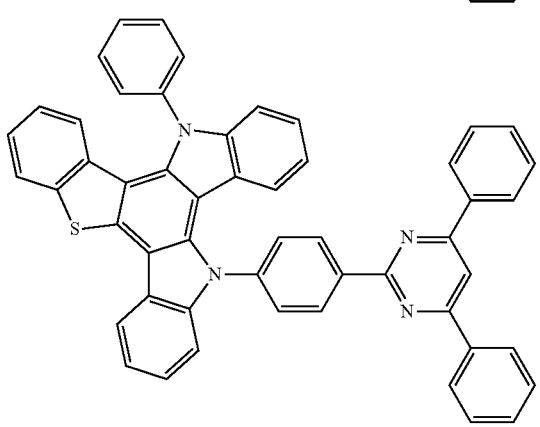
116
-continued
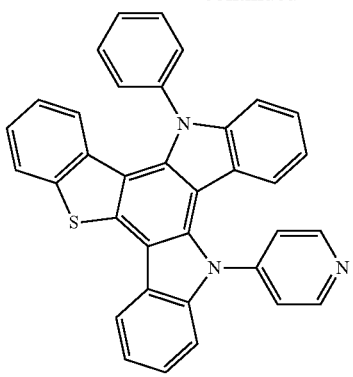
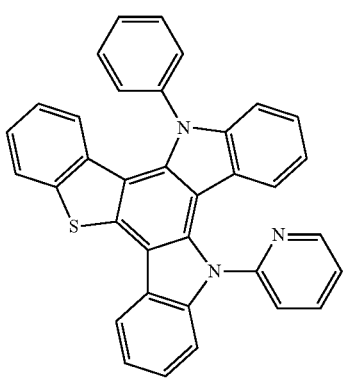
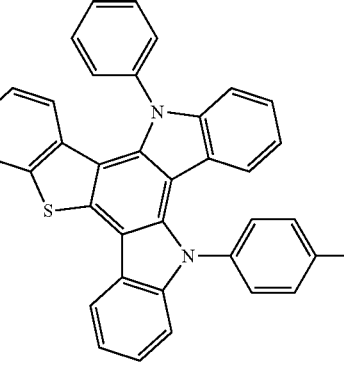
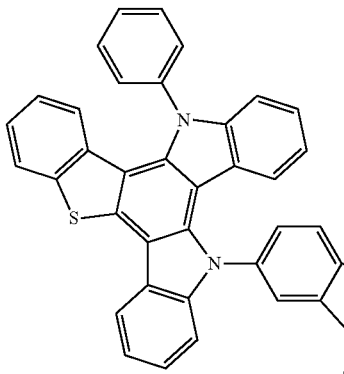

117
-continued
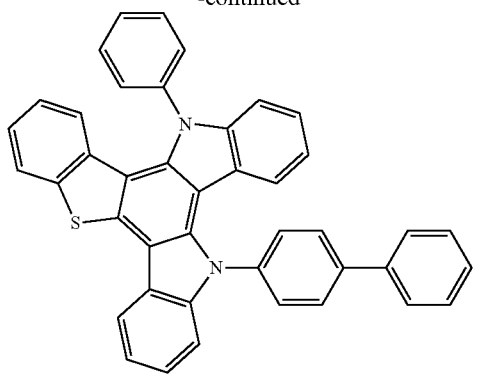
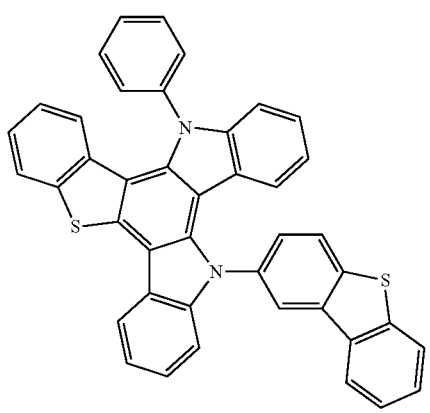
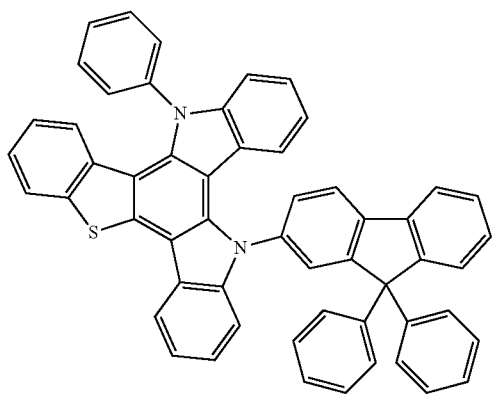
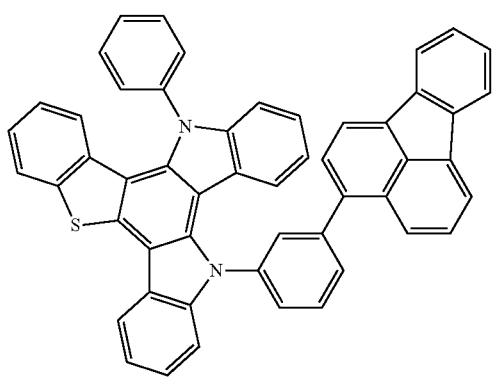
118
-continued
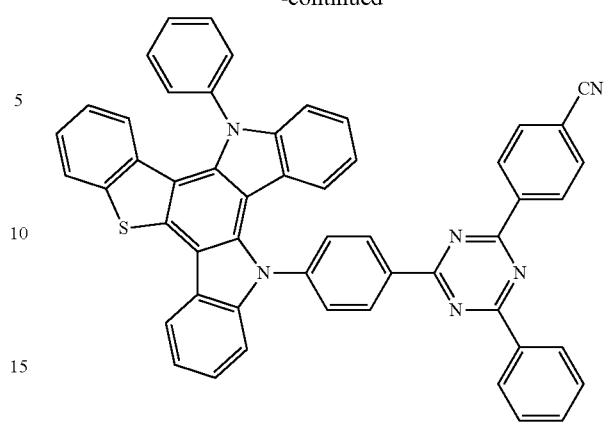
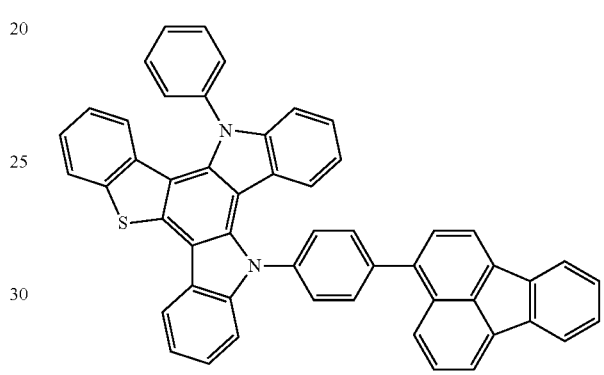
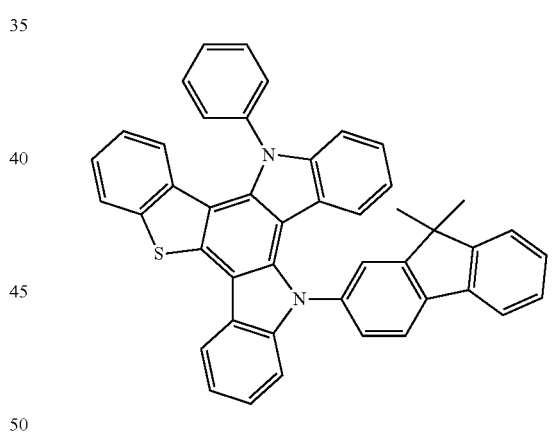
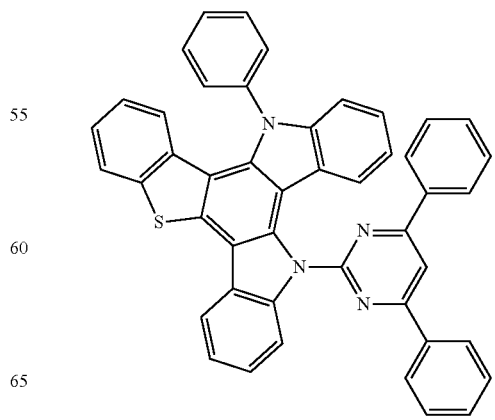

119
-continued
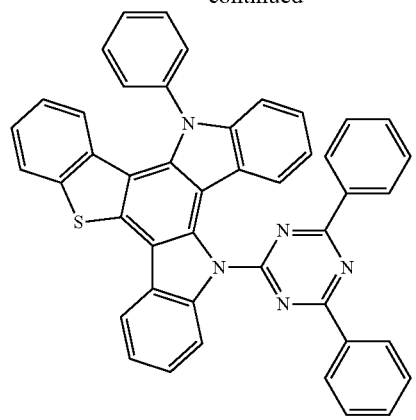
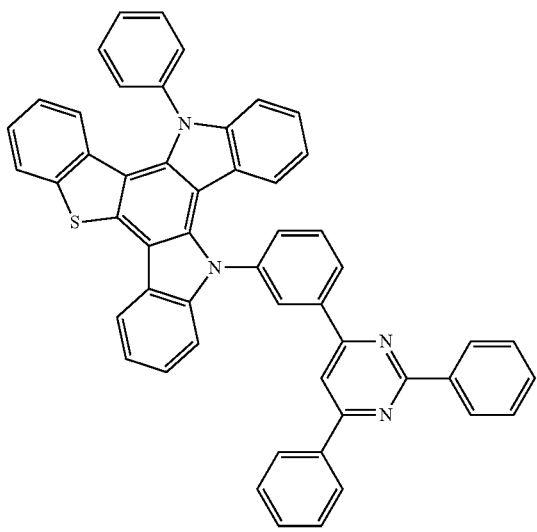
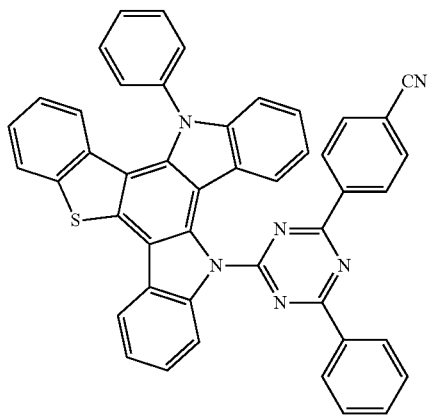
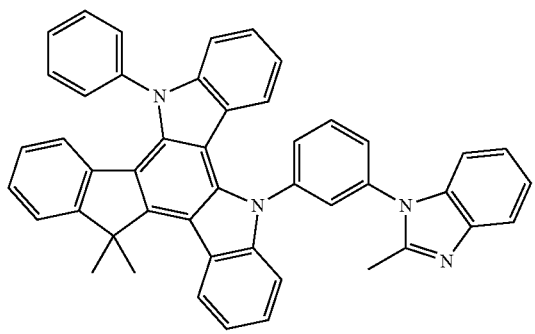
120
-continued
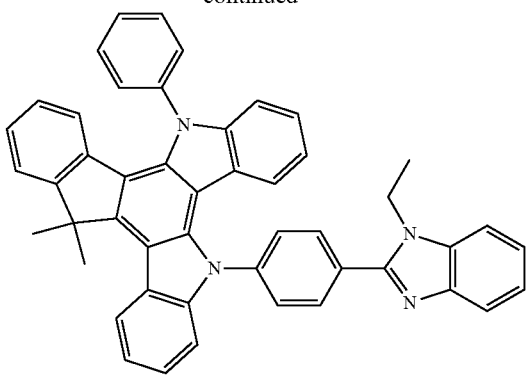
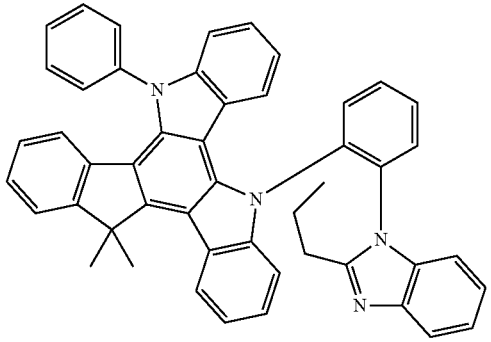
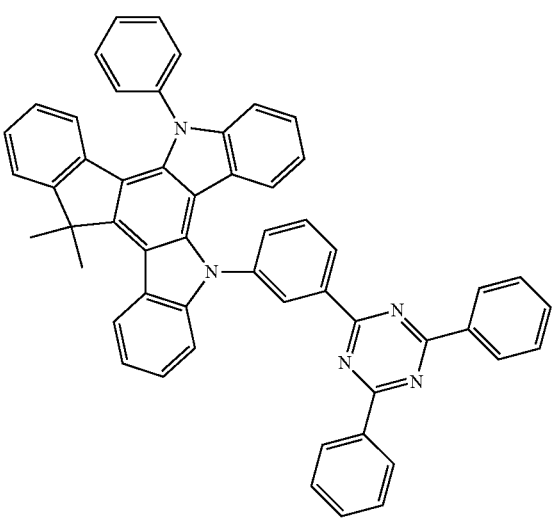
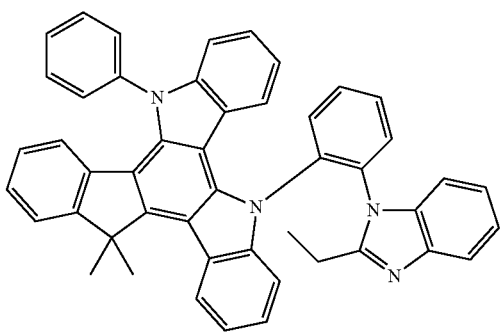

121
-continued
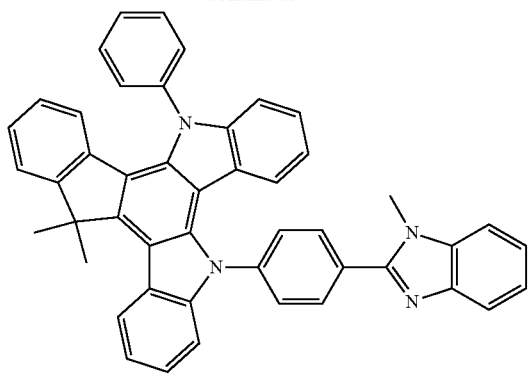
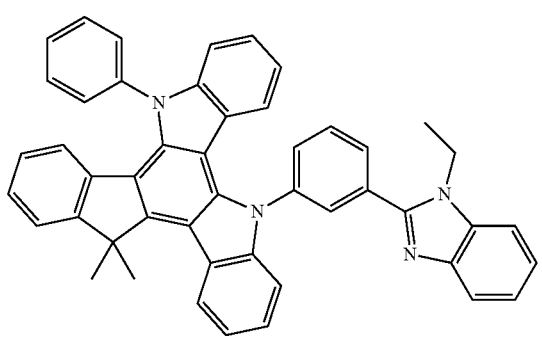
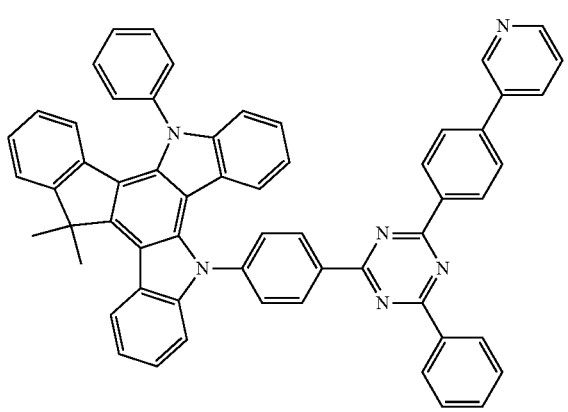
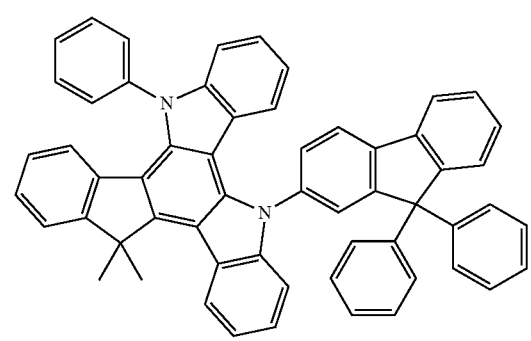
122
-continued
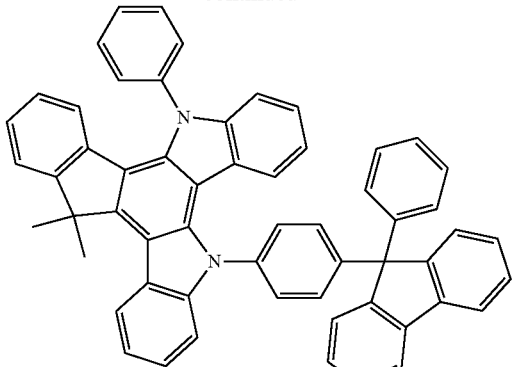
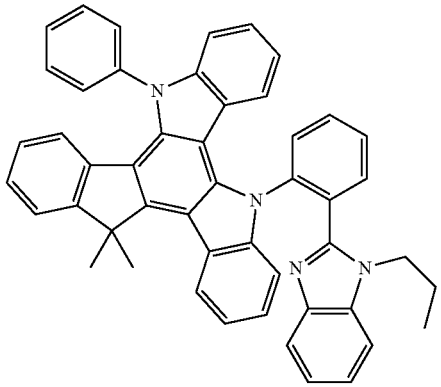
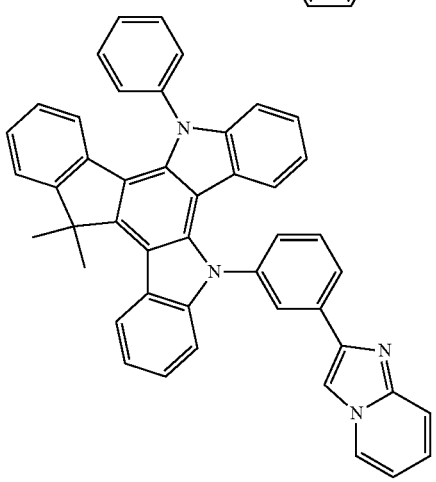
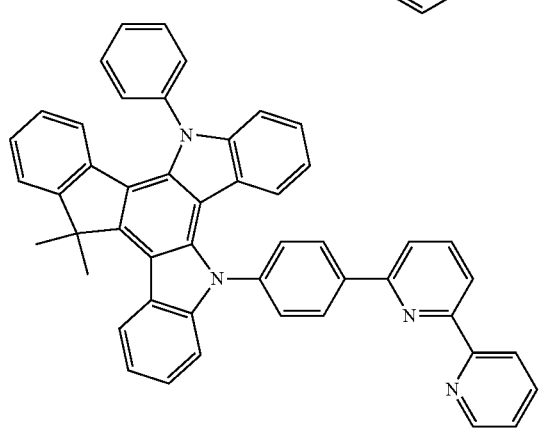

123
-continued
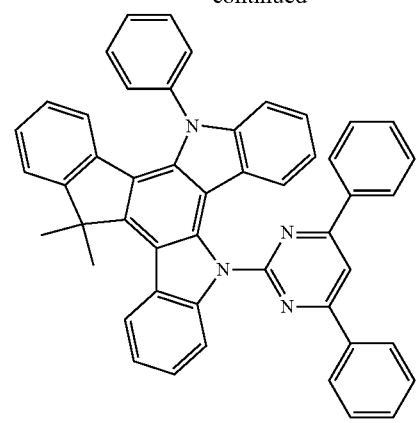
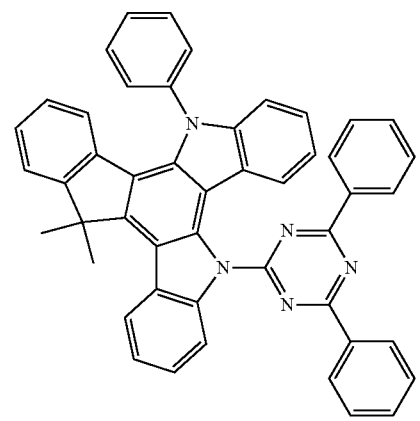
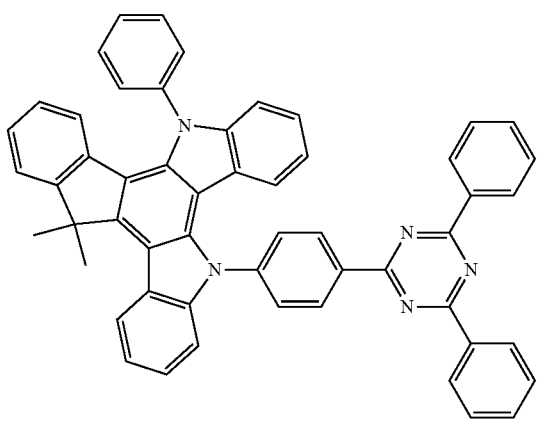
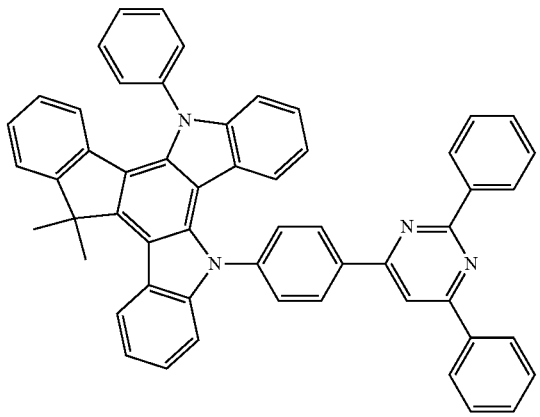
124
-continued
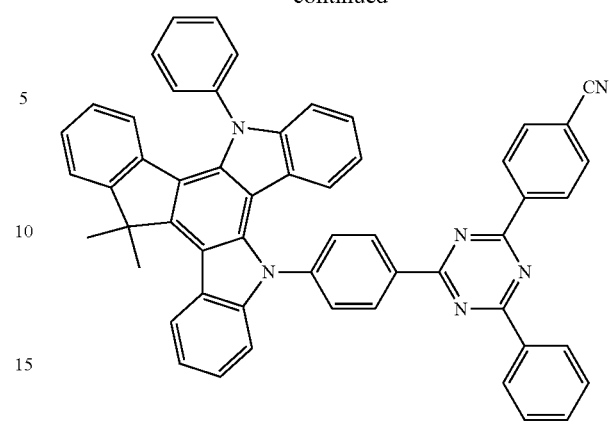
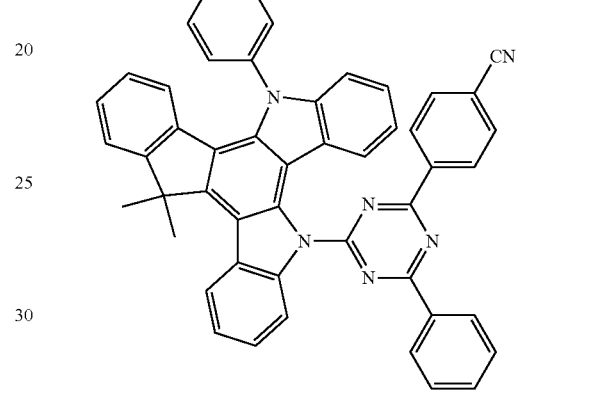
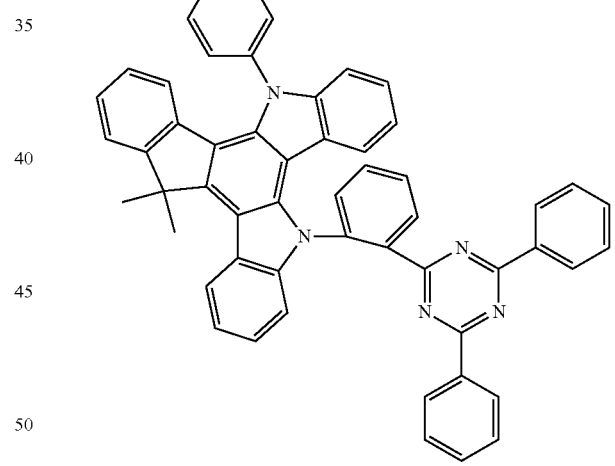
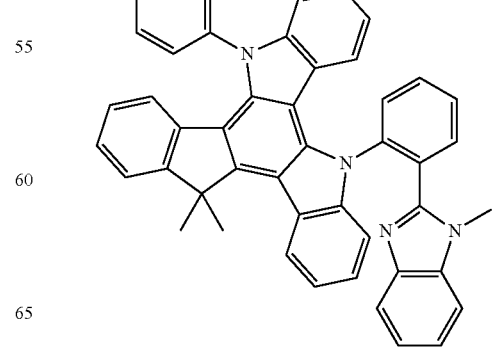

125
-continued
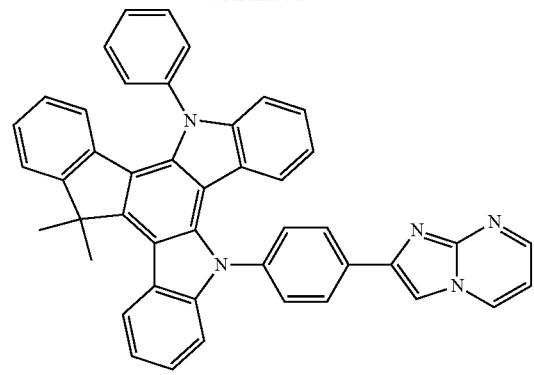
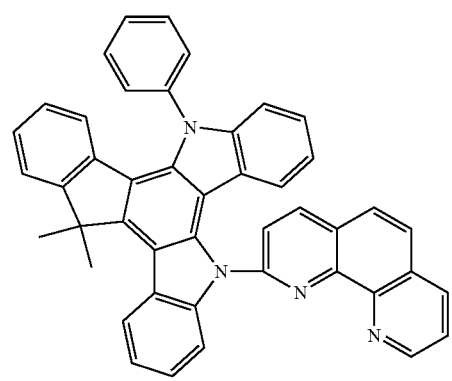
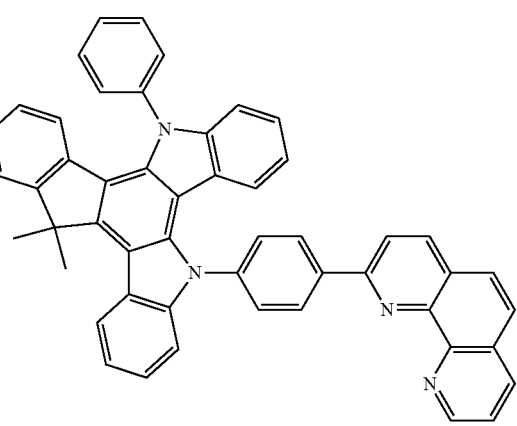
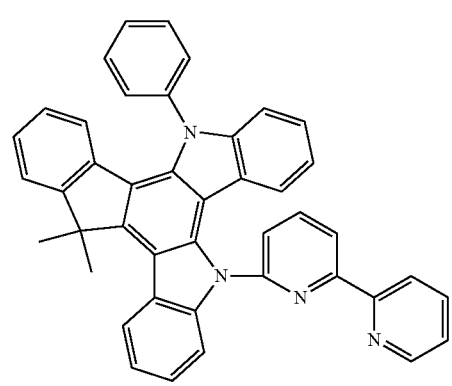
126
-continued
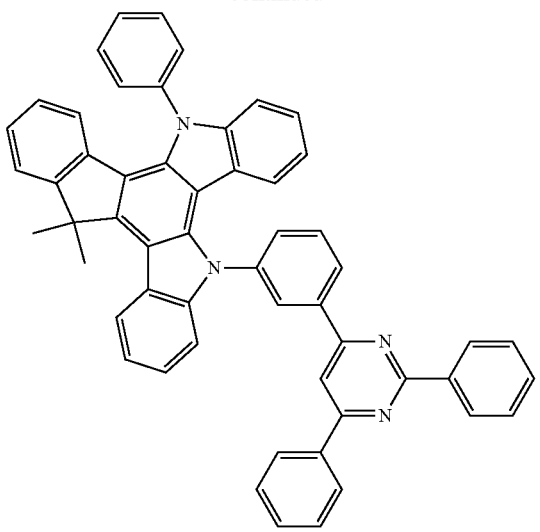
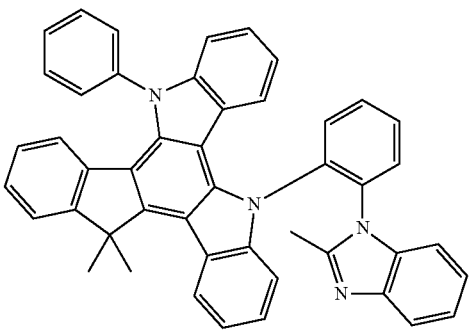
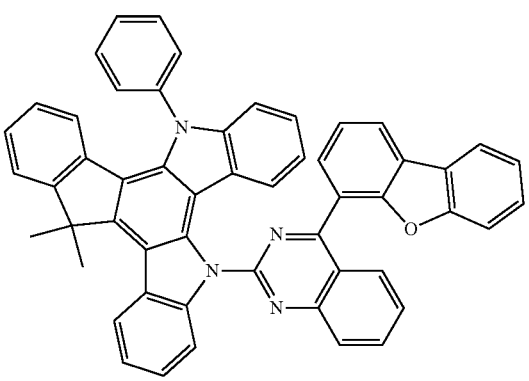
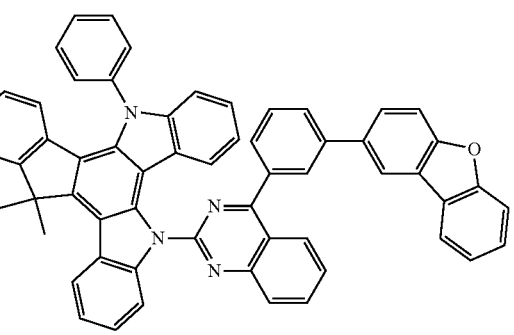

127
-continued
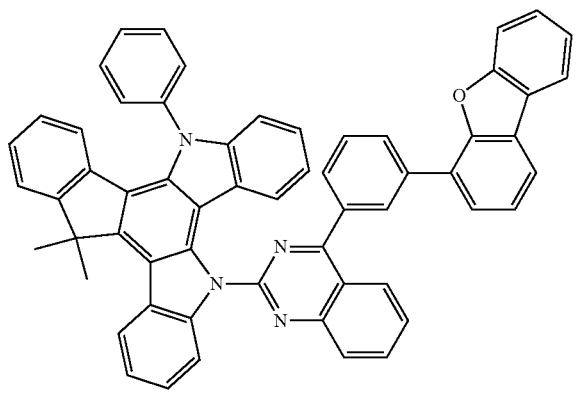
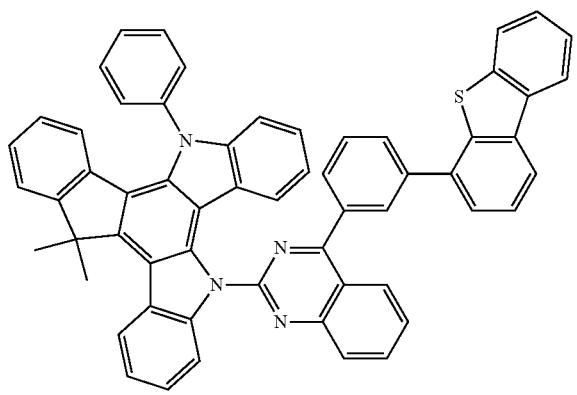
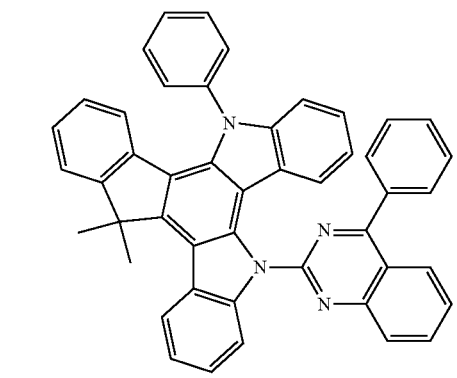
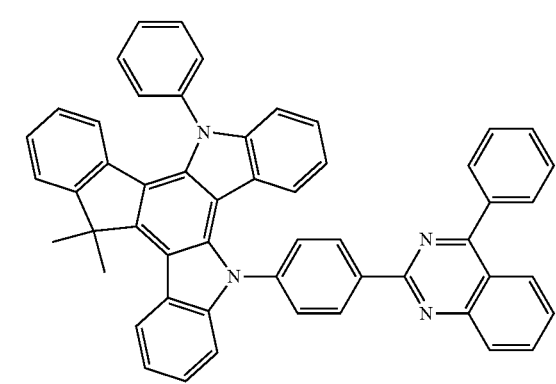
128
-continued
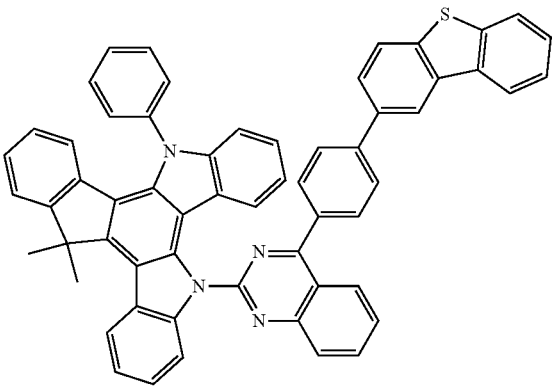
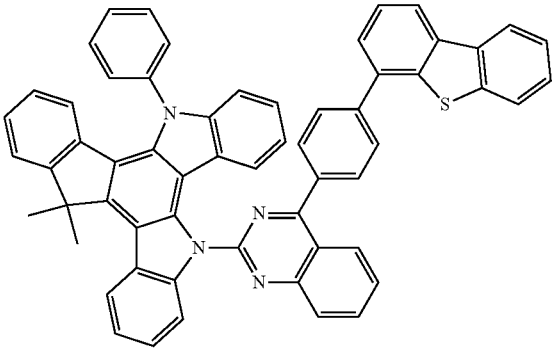
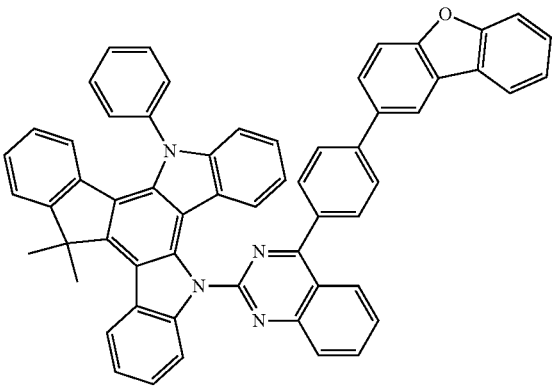
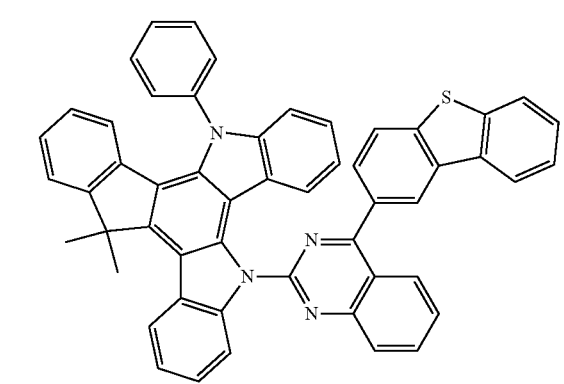

129
-continued
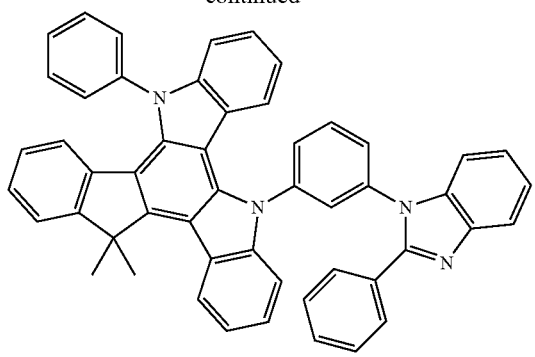
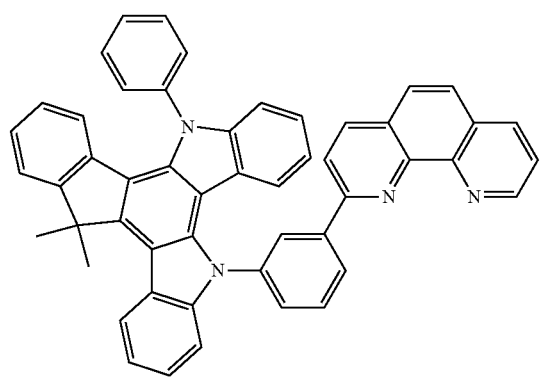
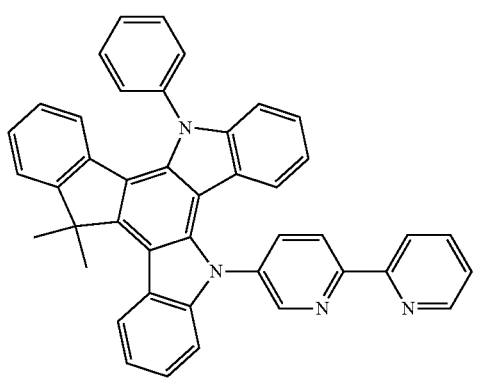
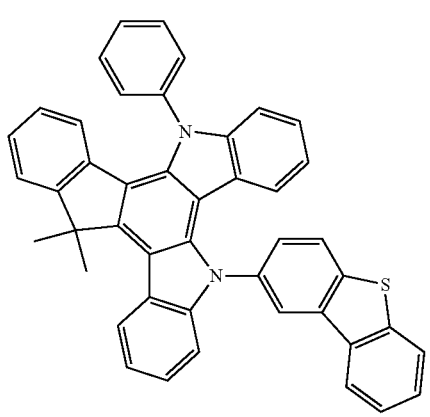
130
-continued
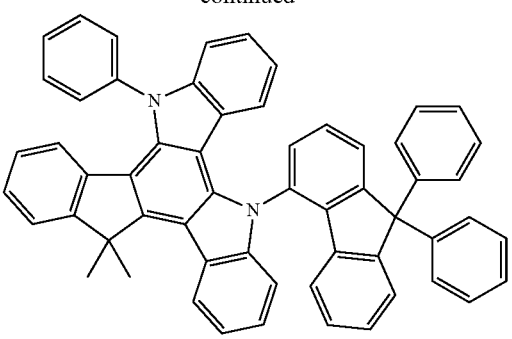
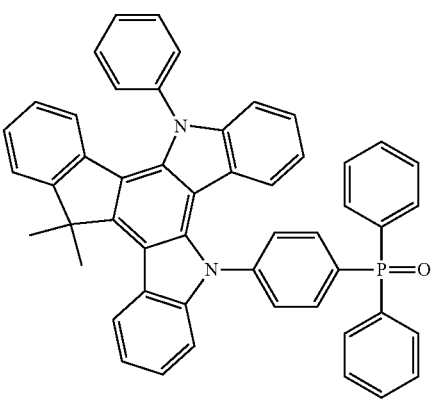
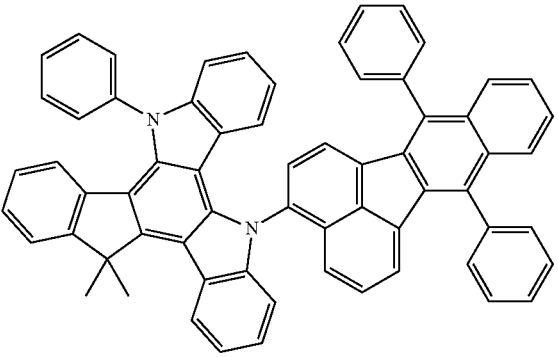

131
-continued
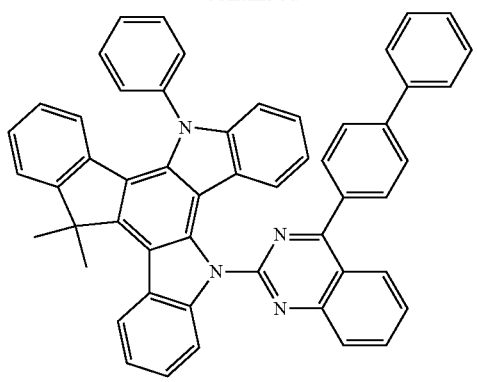
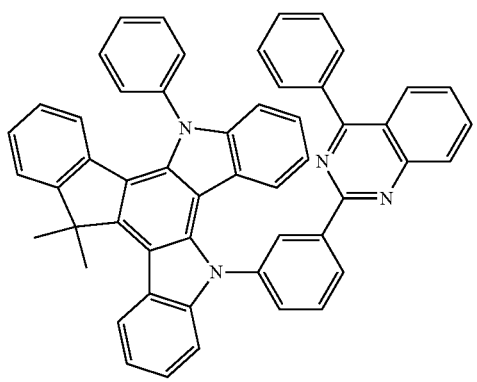
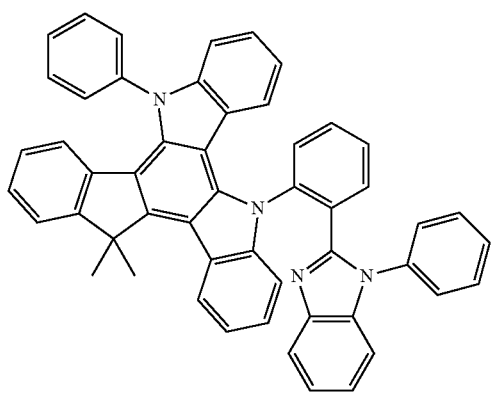
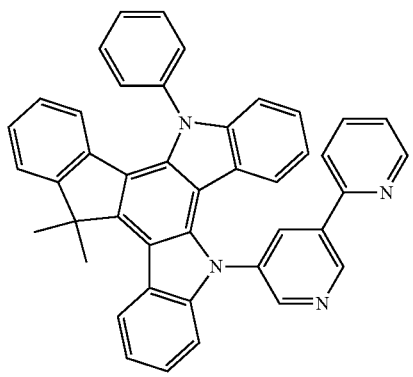
132
-continued
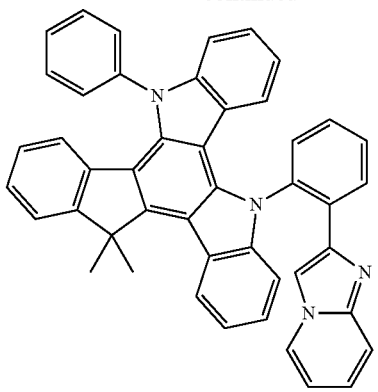
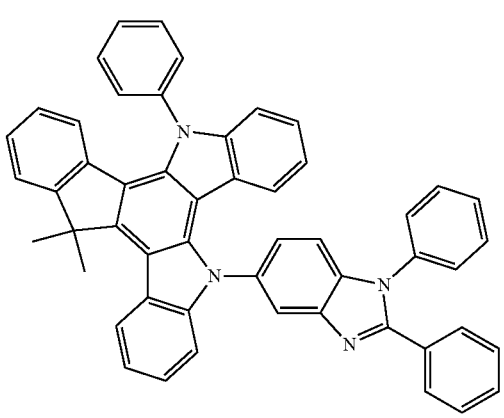
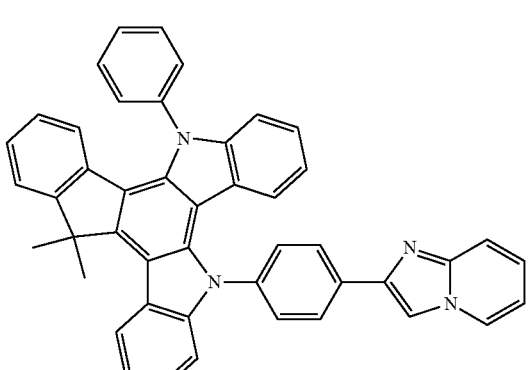
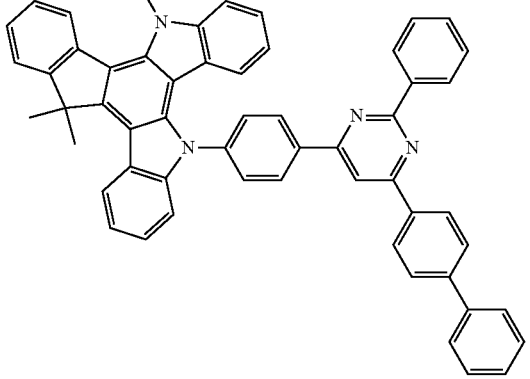

133
-continued
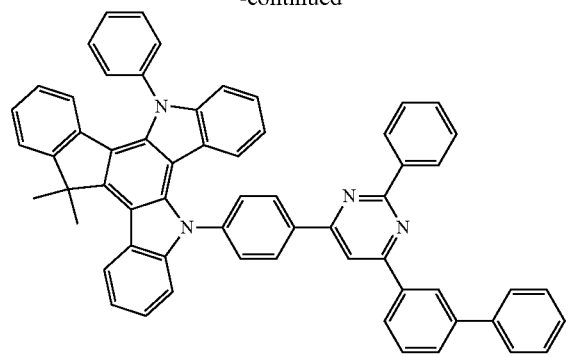
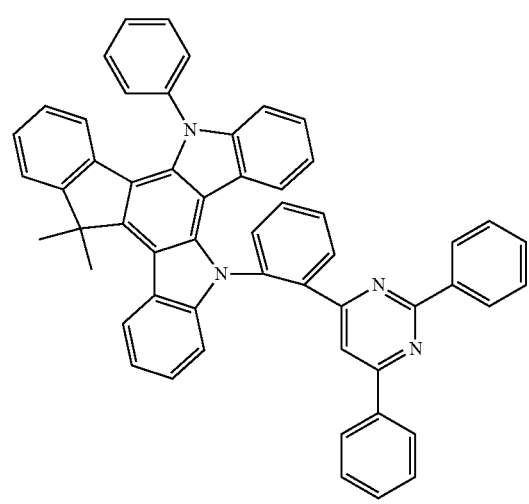
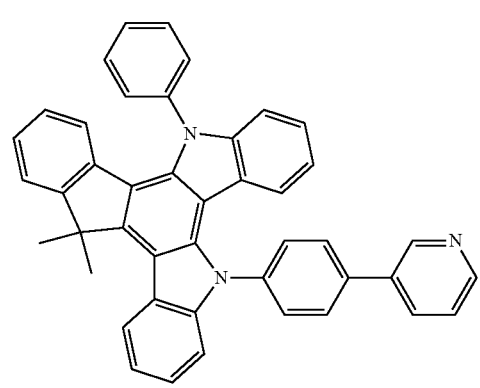
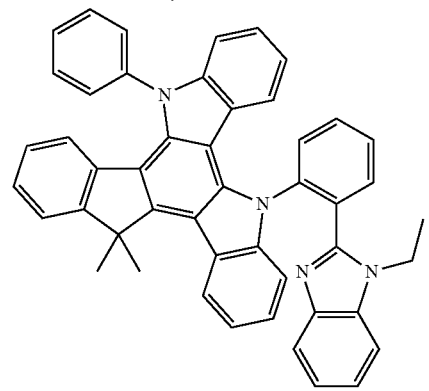
134
-continued
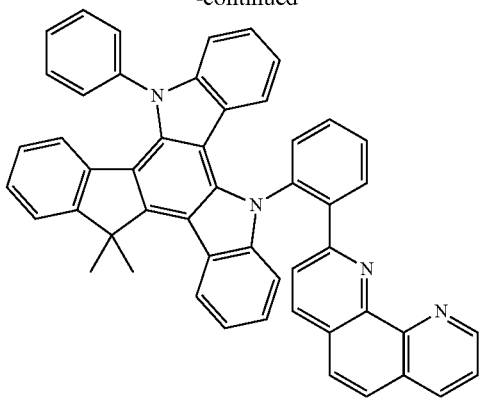
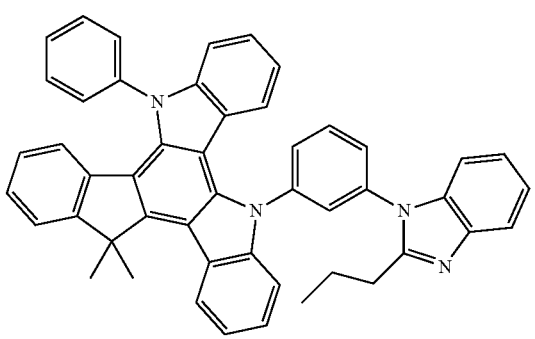
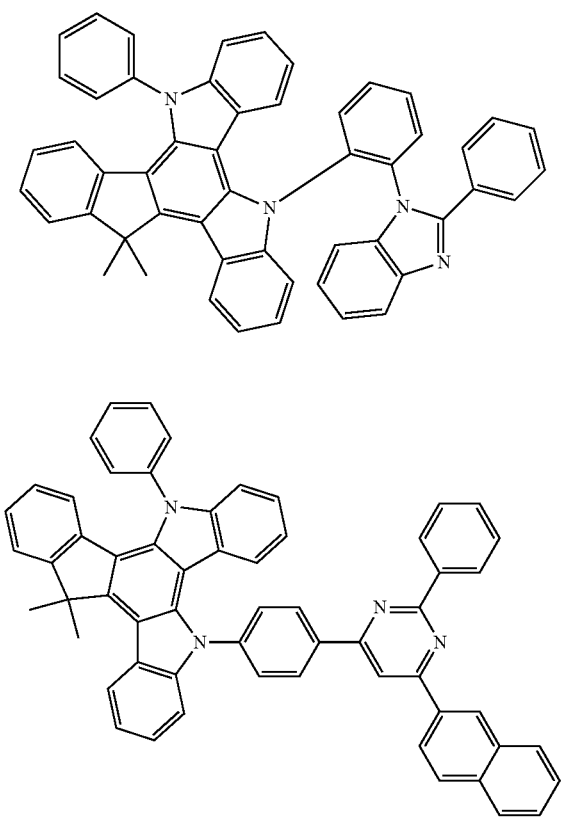

135
-continued
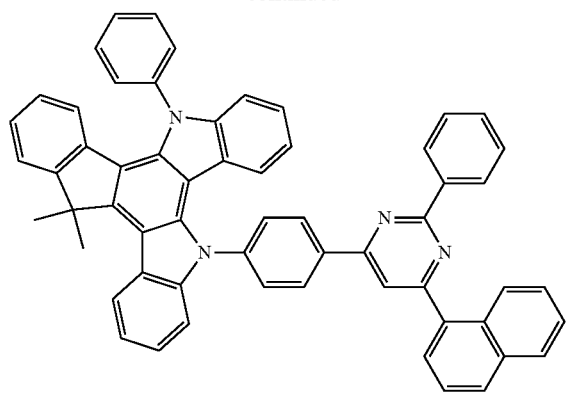
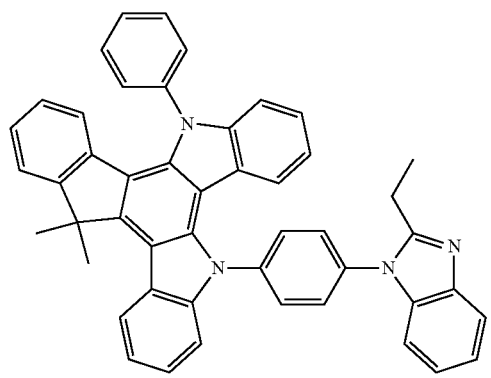
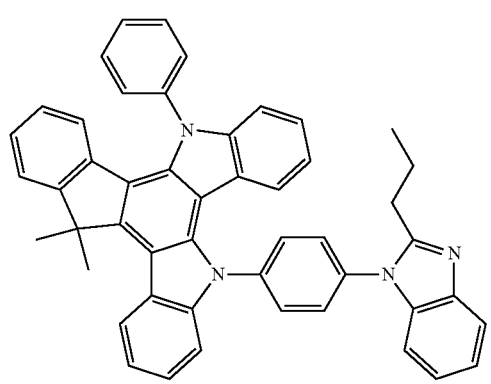
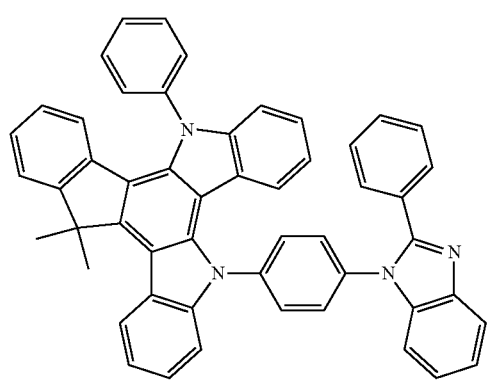
136
-continued
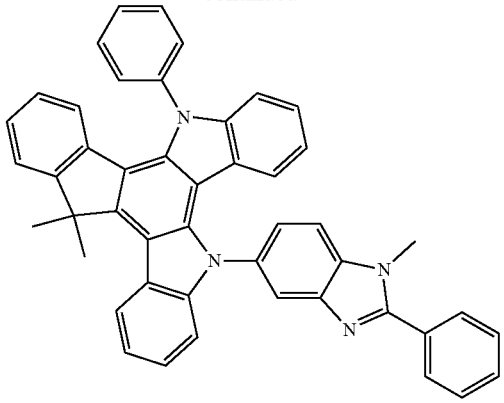
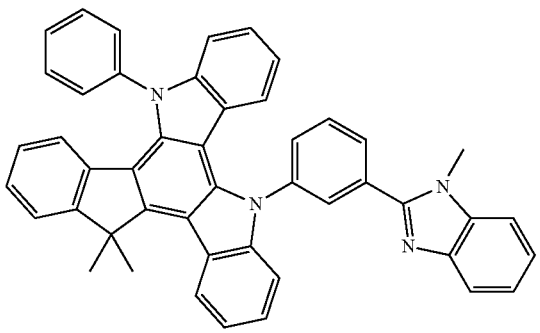
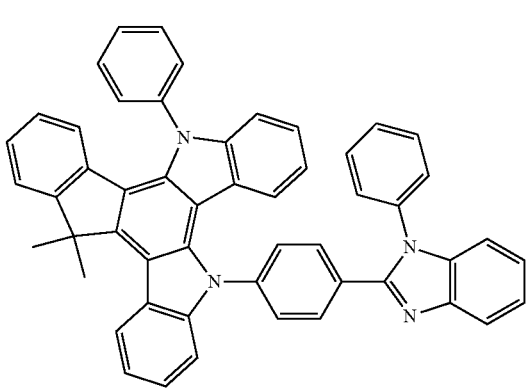
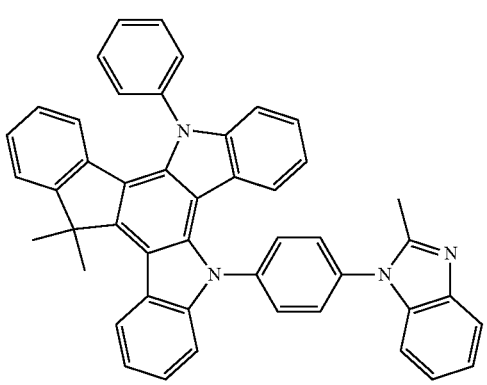

137
-continued
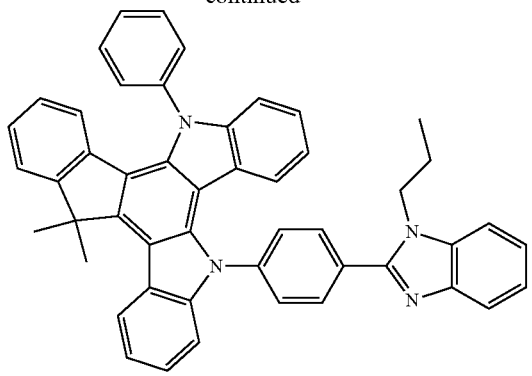
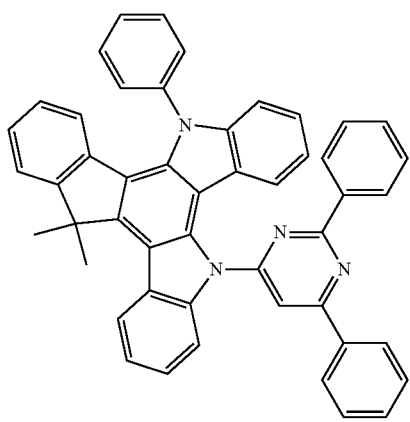
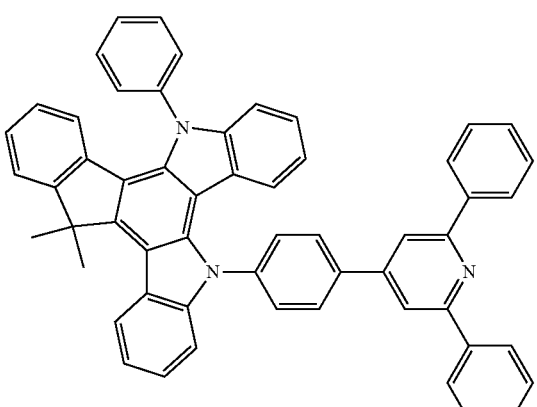
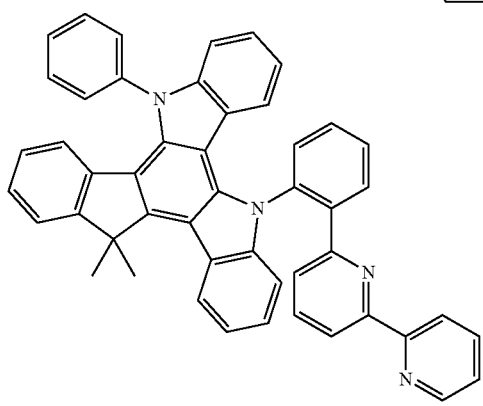
138
-continued
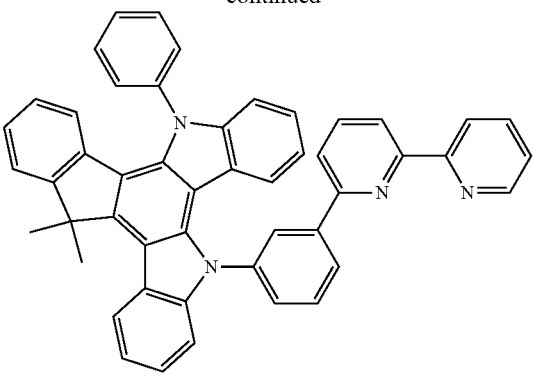
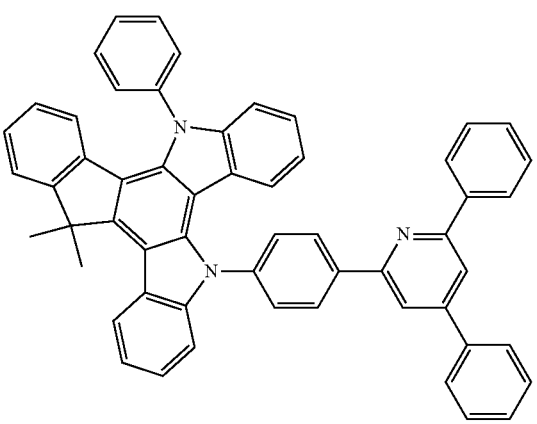
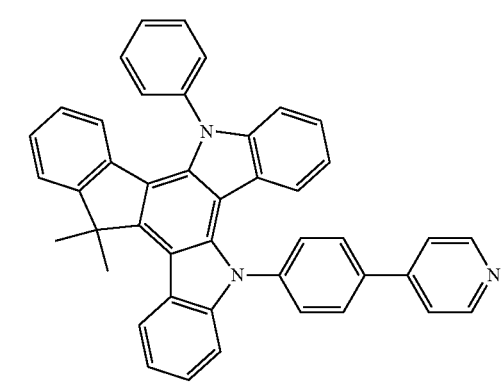
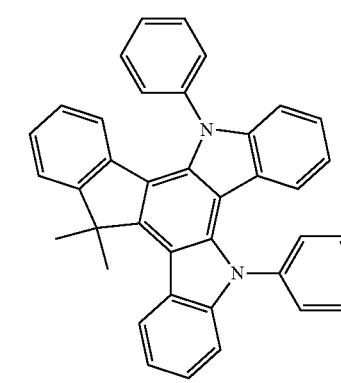

139
-continued
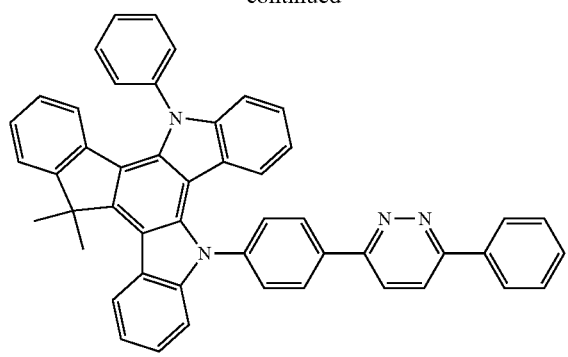
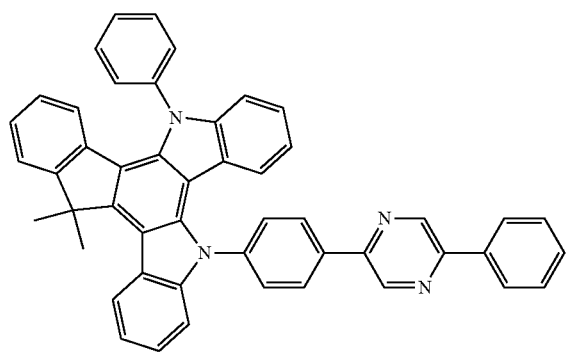
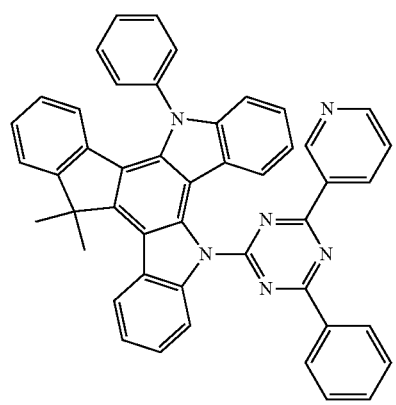
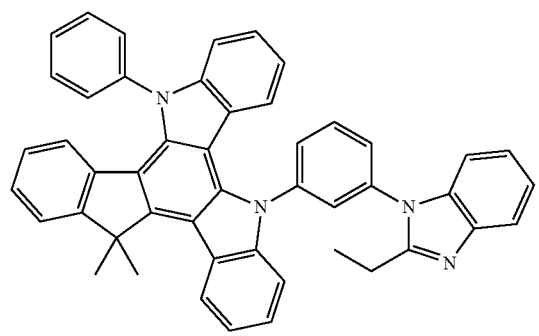
140
-continued
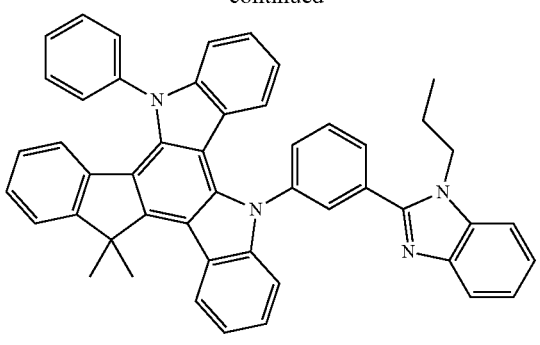
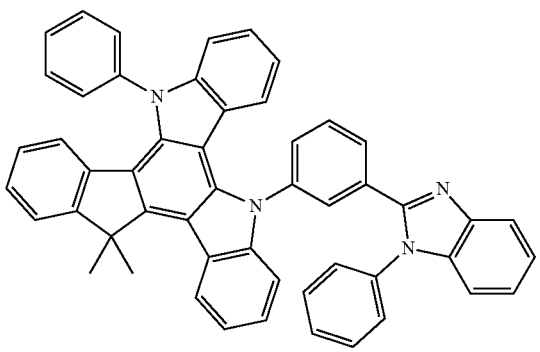
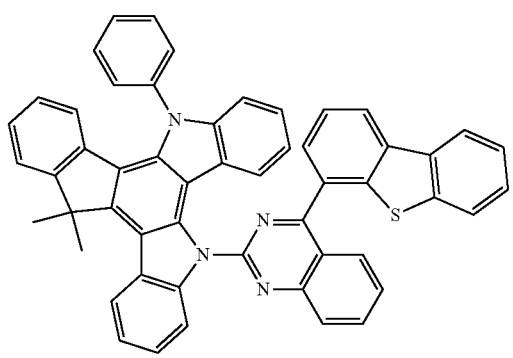
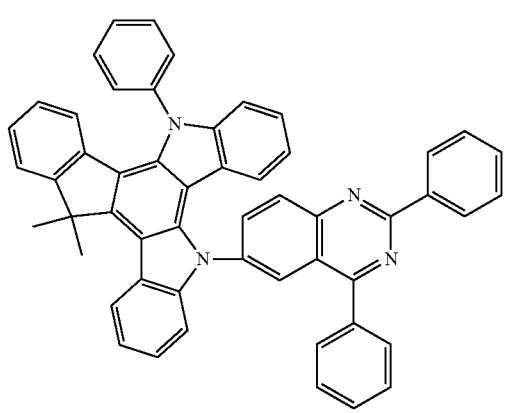

141
-continued
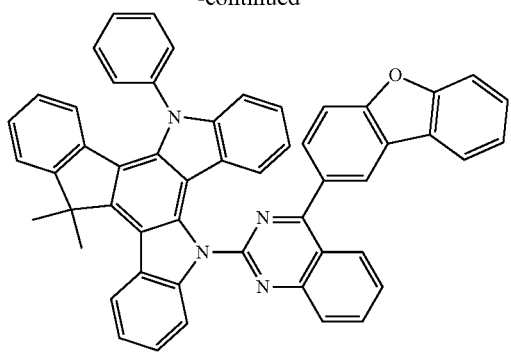
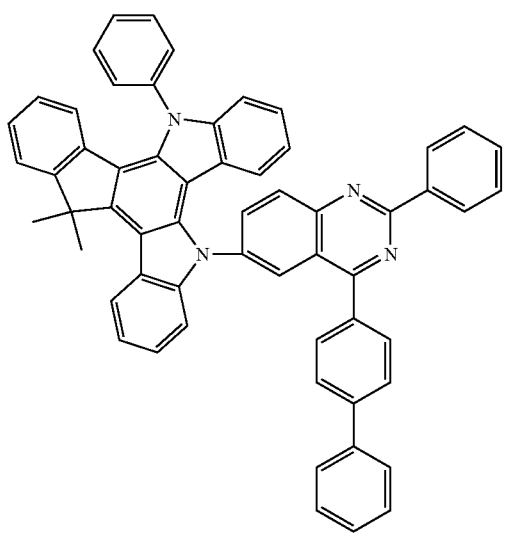
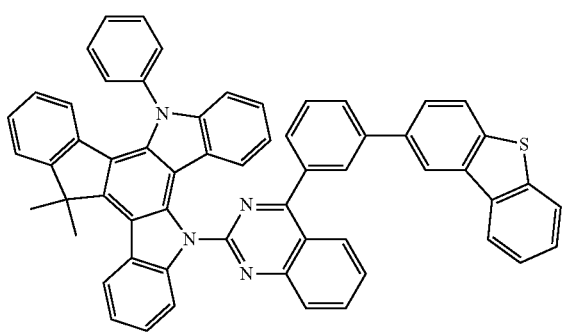
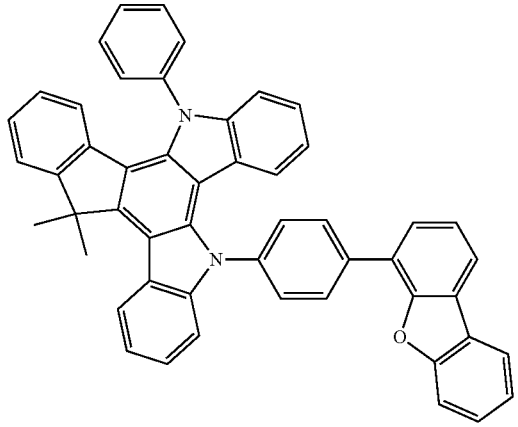
142
-continued
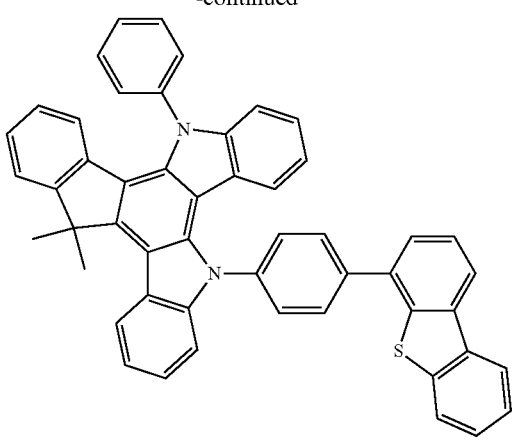
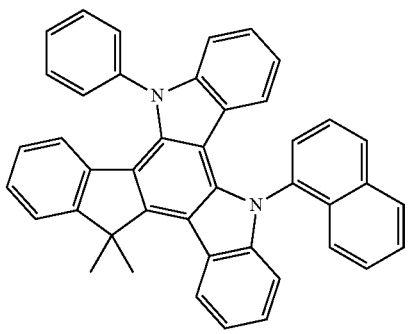
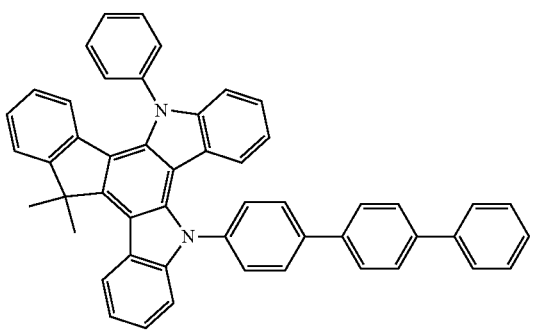
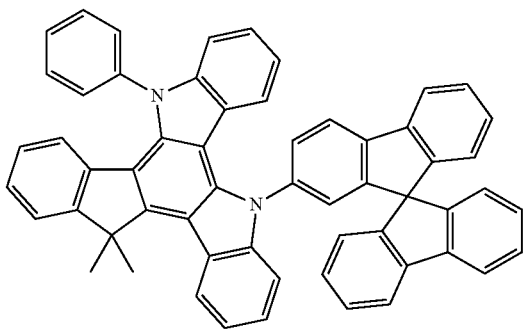

143
-continued
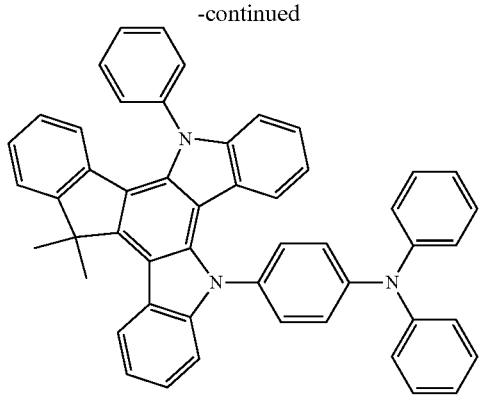
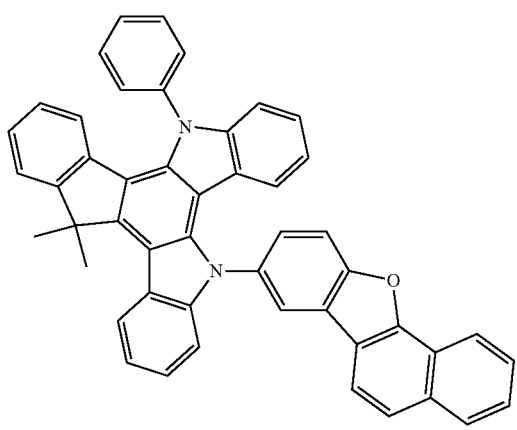
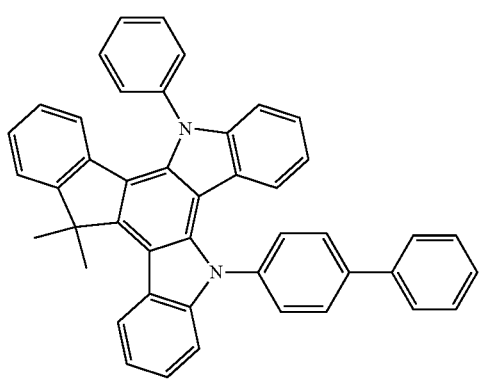
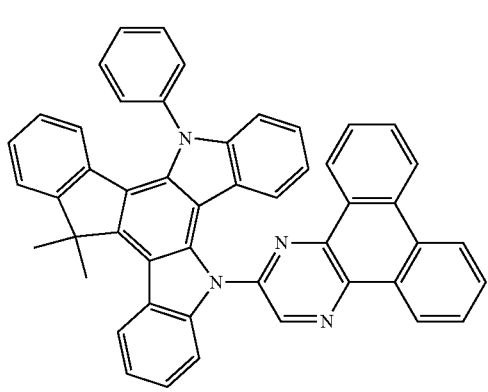
144
-continued
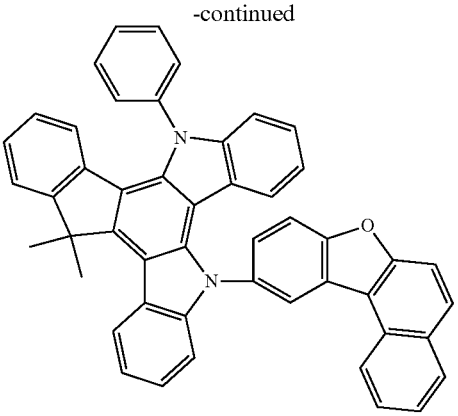
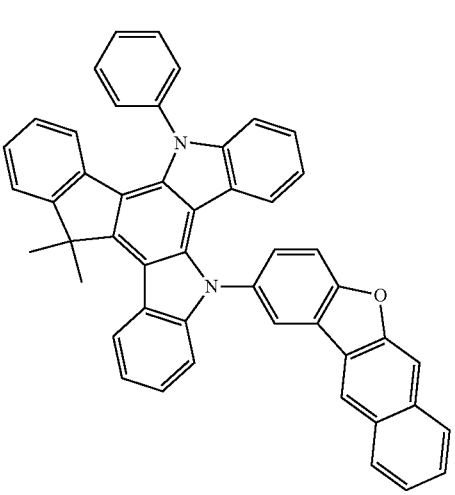
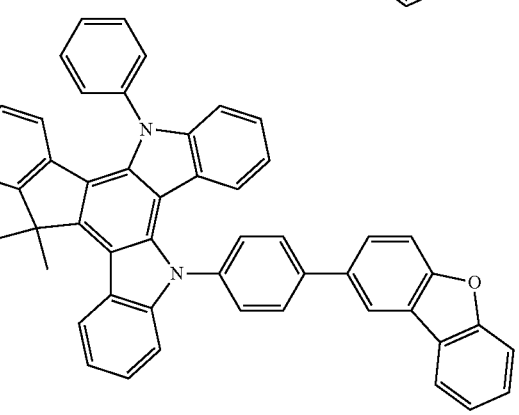
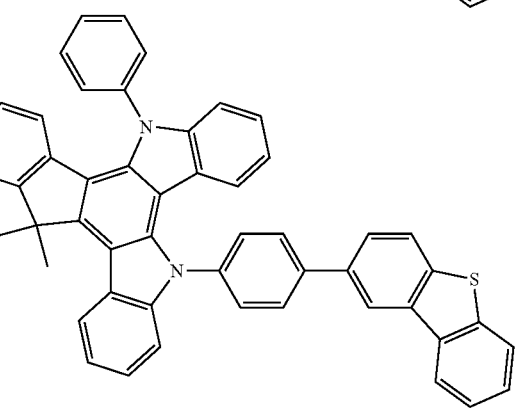

145
-continued
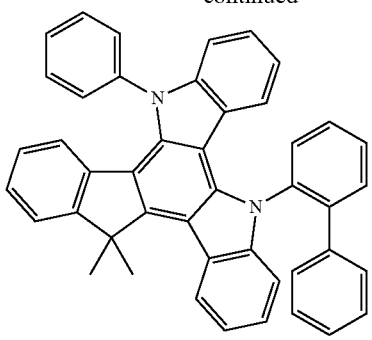
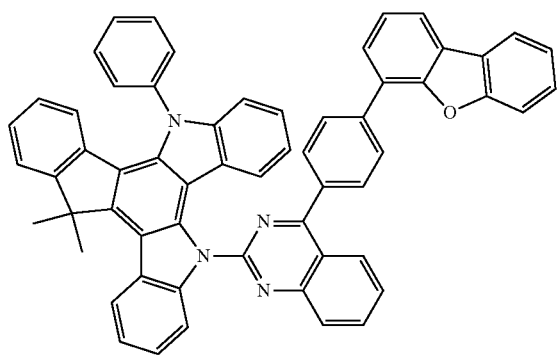
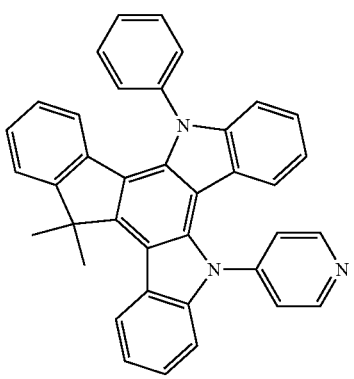
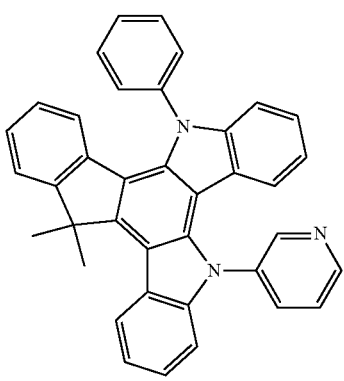
146
-continued
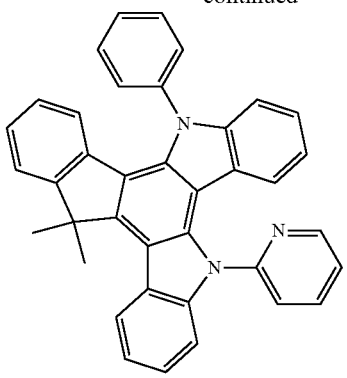
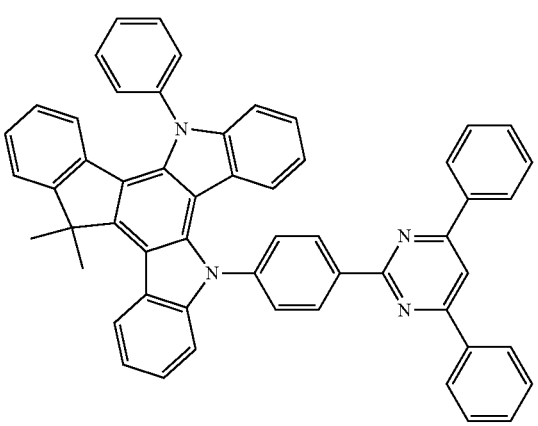
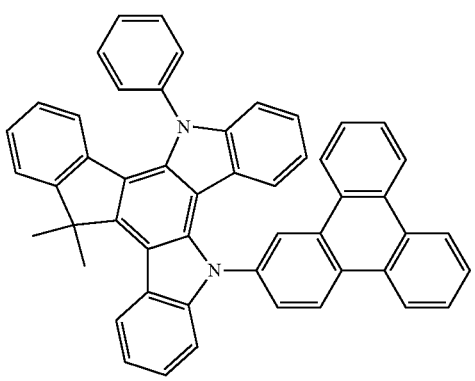
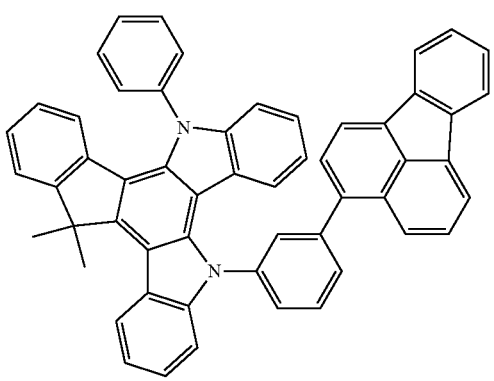

147
-continued
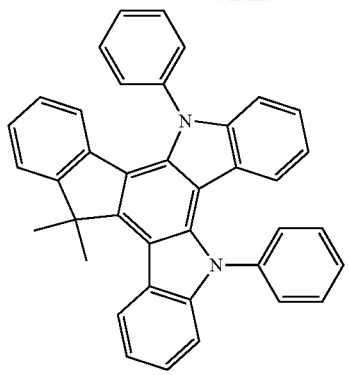
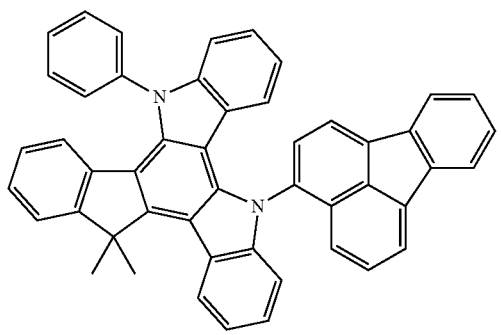
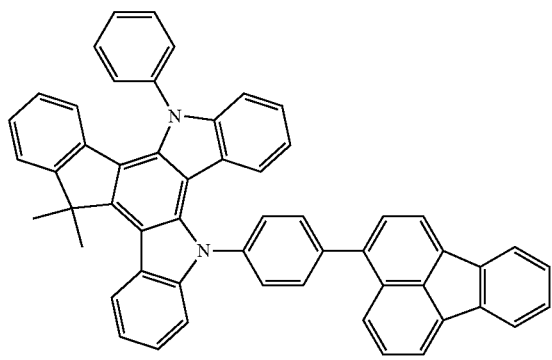
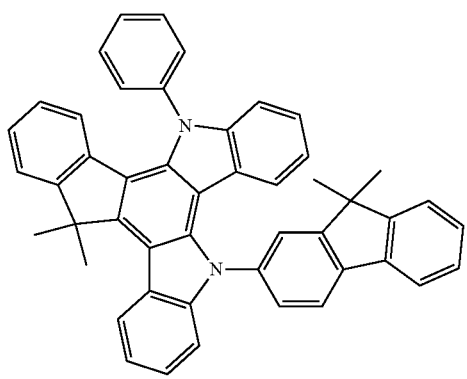
148
-continued
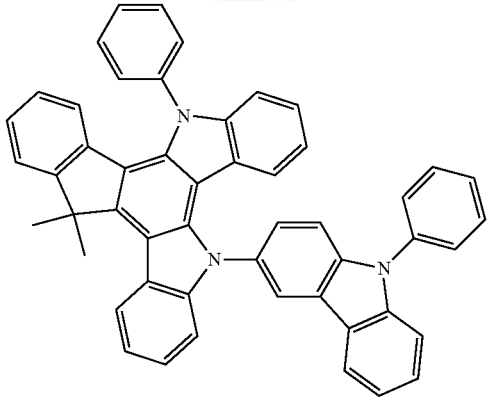
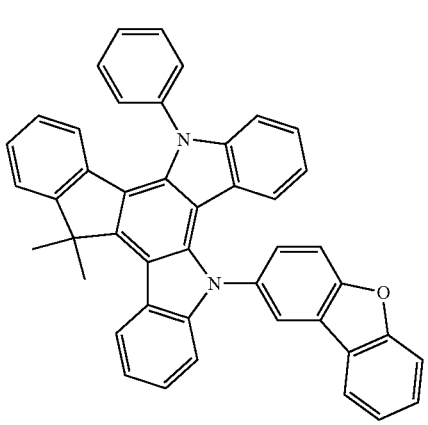
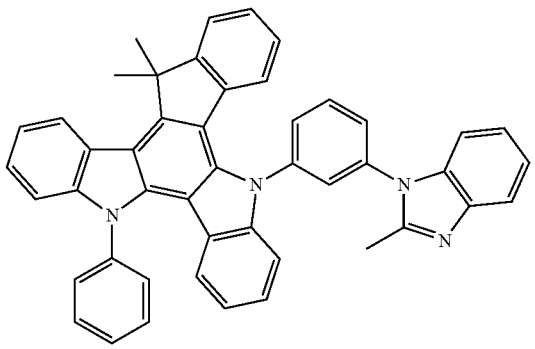
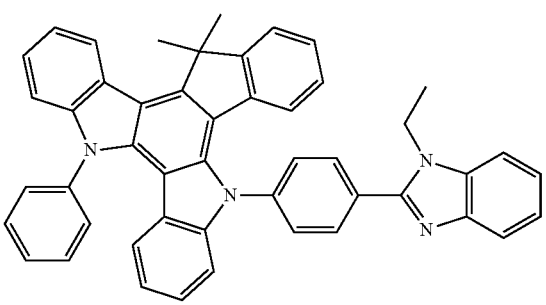

149
-continued
150
-continued
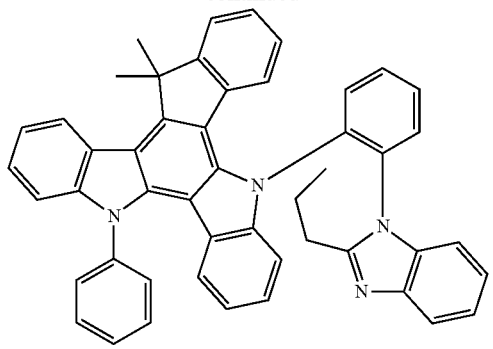
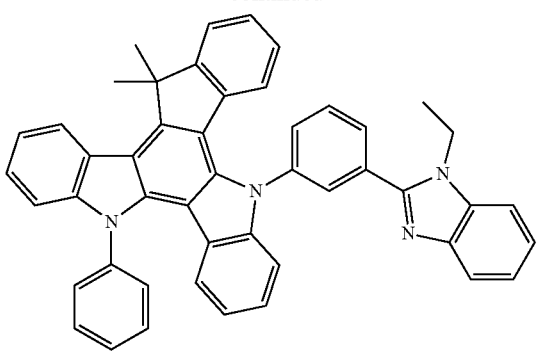
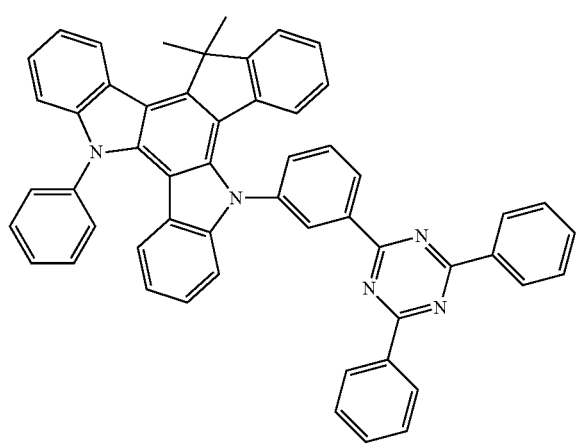
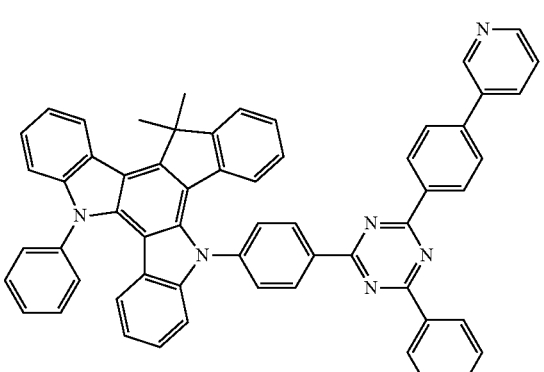
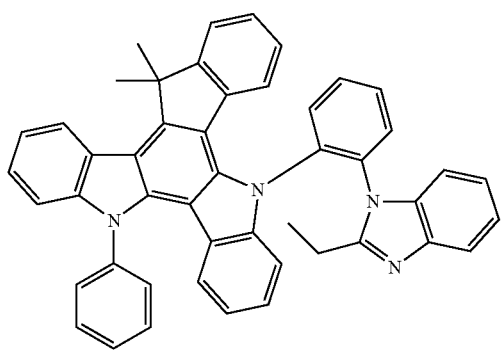
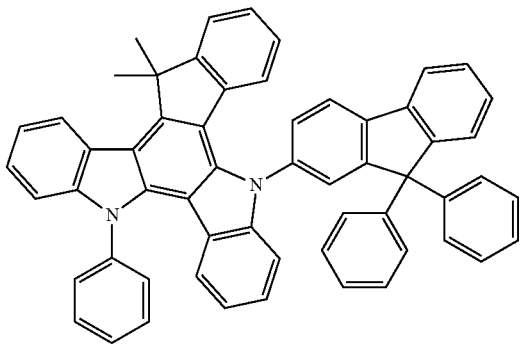
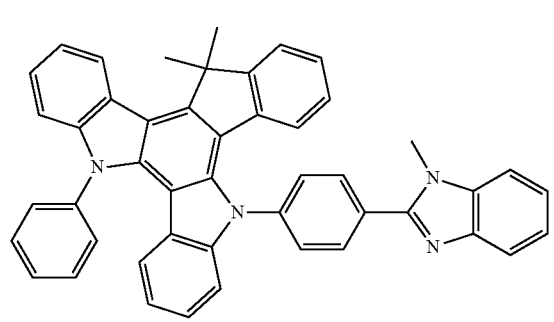
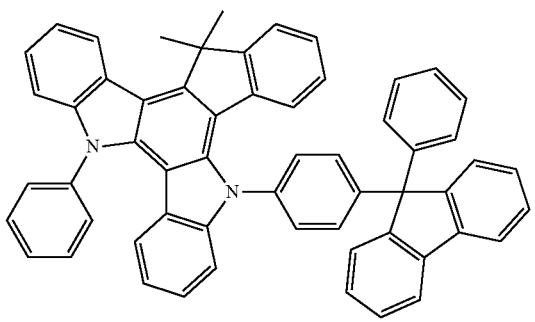

151
-continued
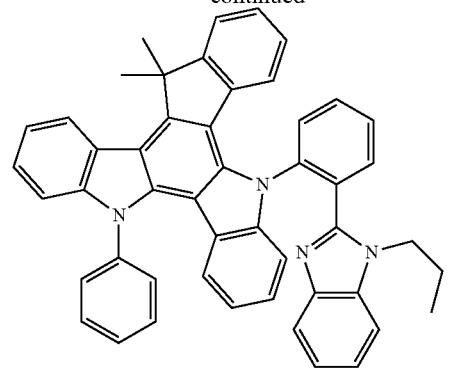
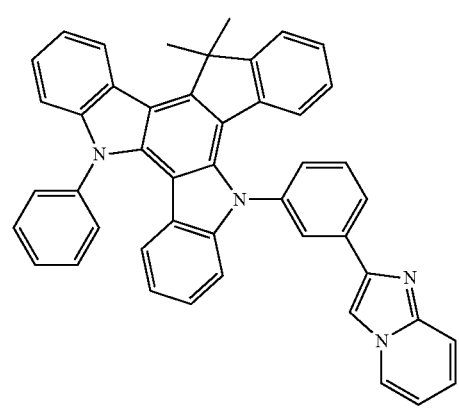
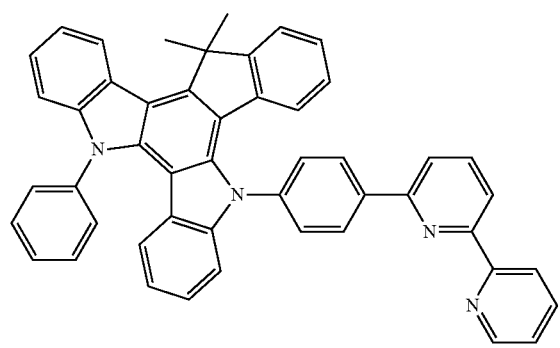
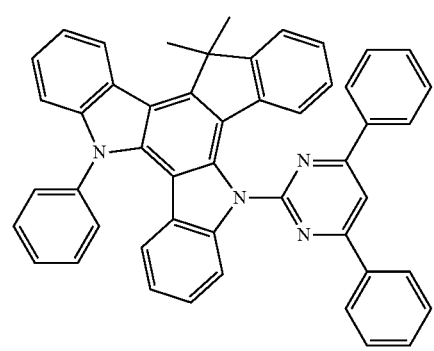
152
-continued
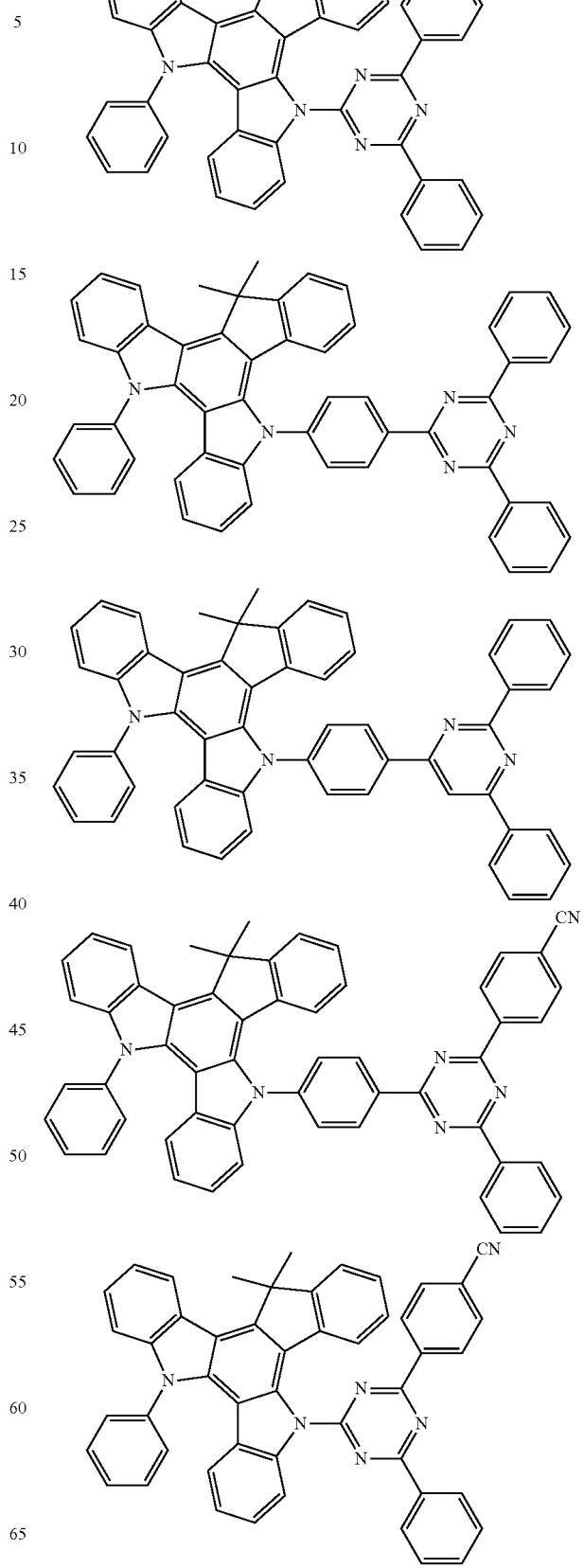

153
-continued
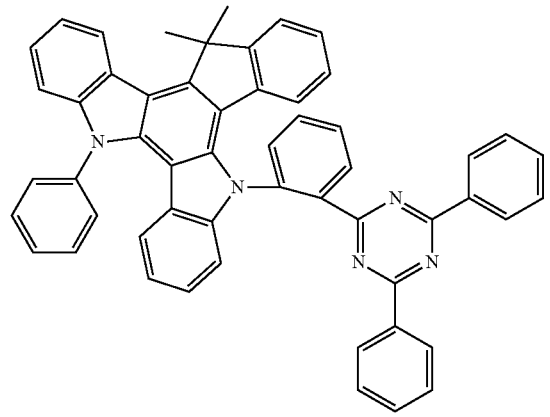
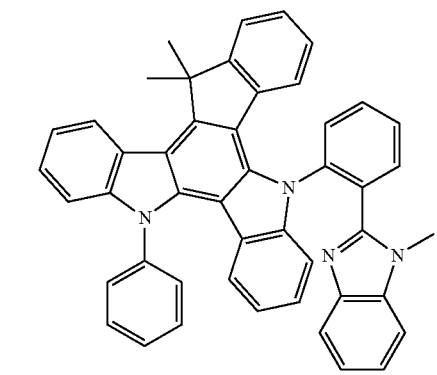
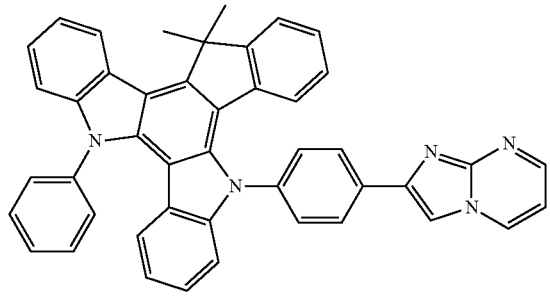
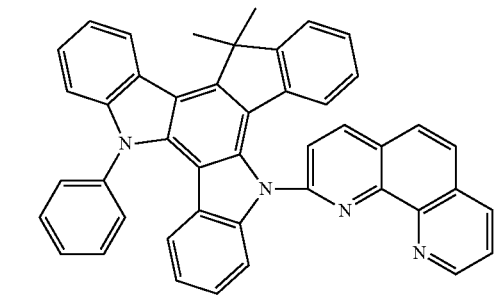
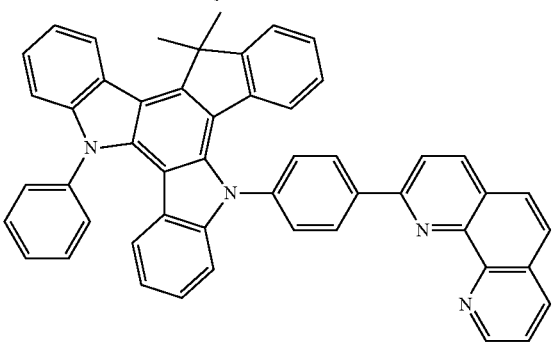
154
-continued
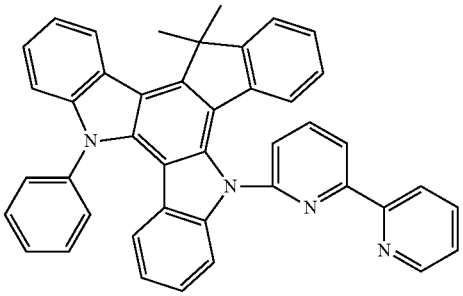
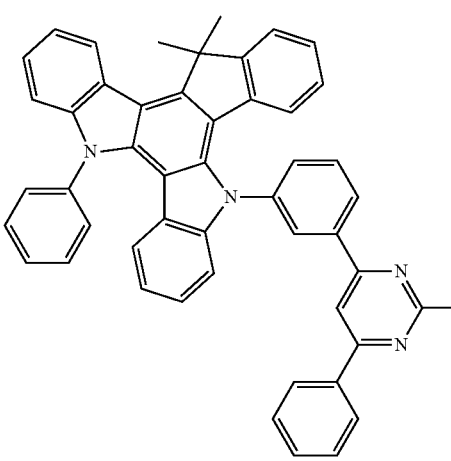
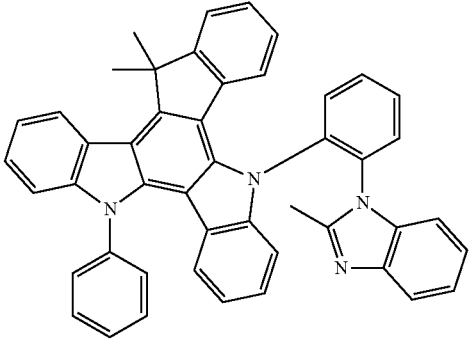
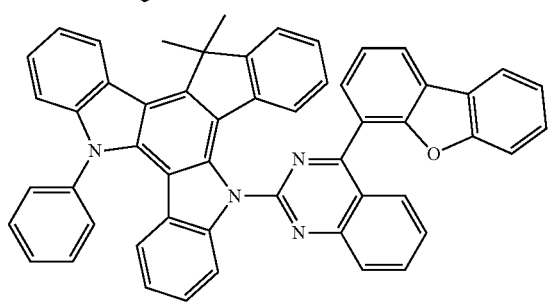
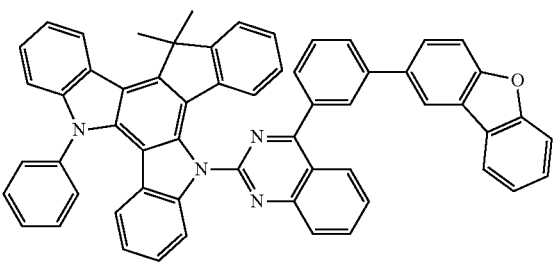

155
-continued
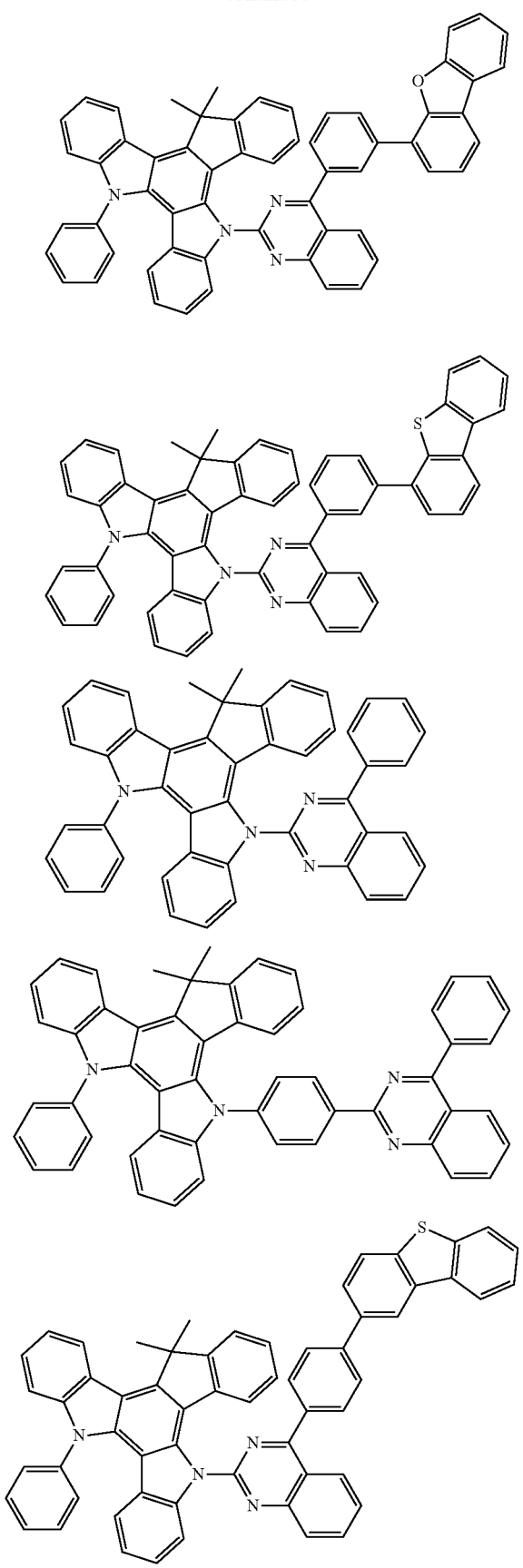
156
-continued
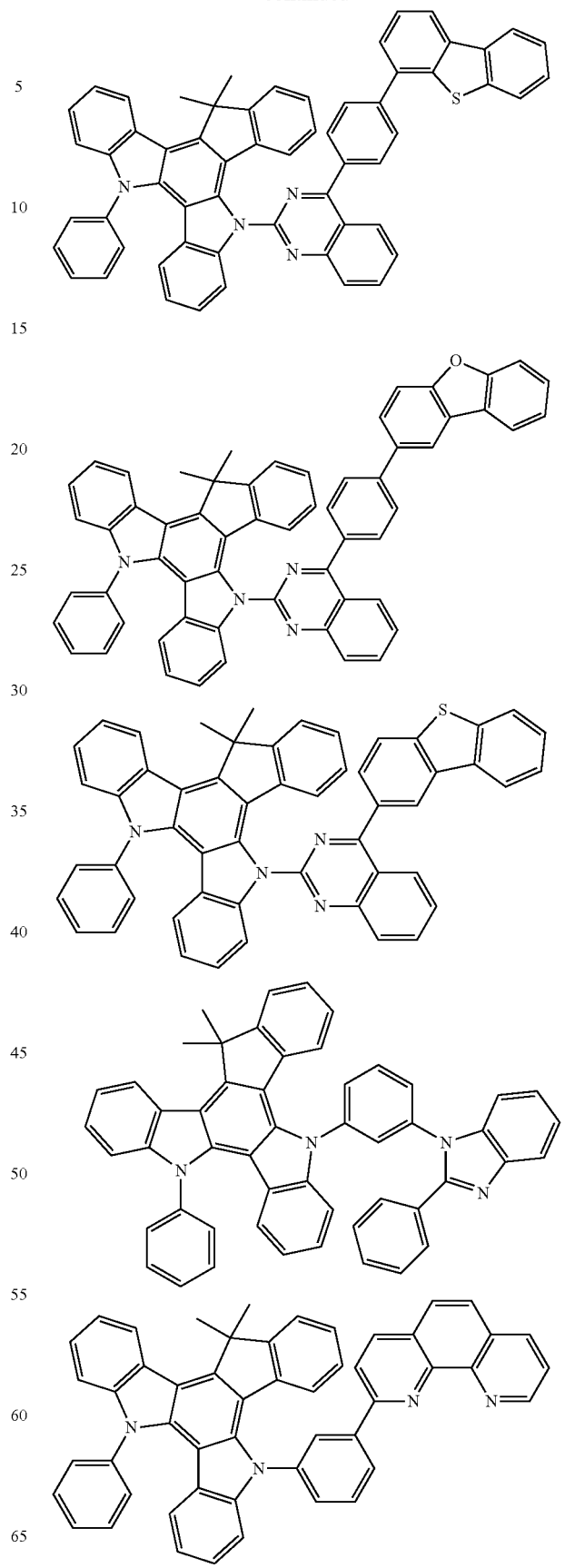

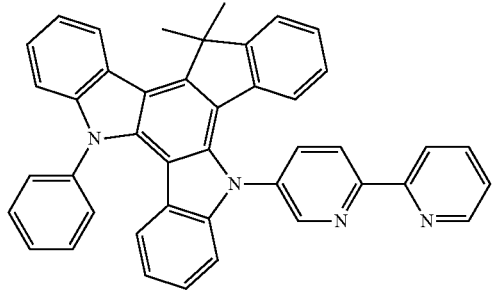
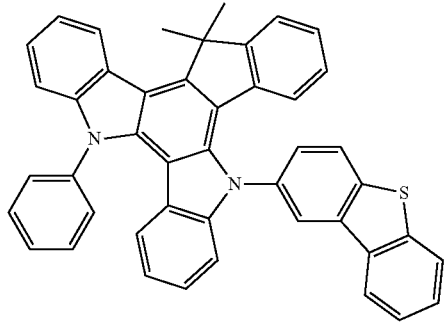
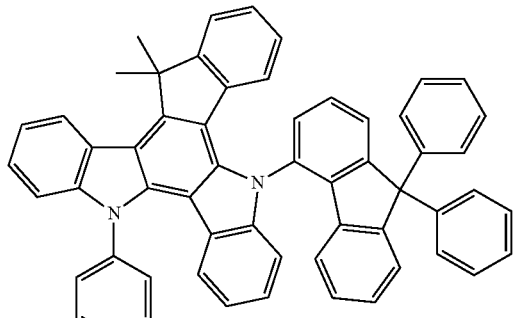
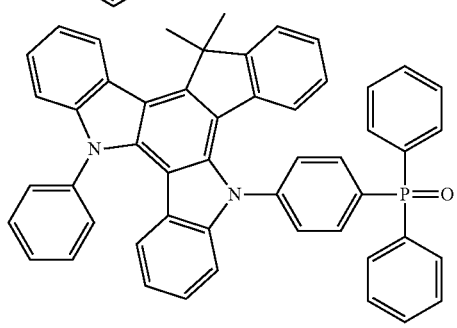
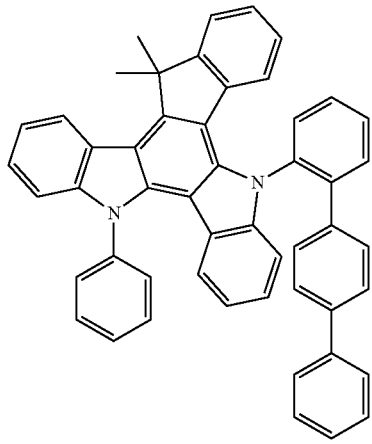
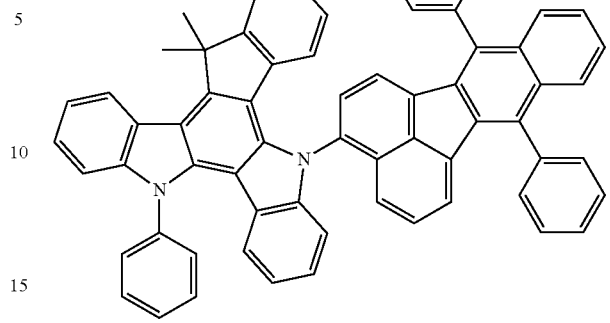
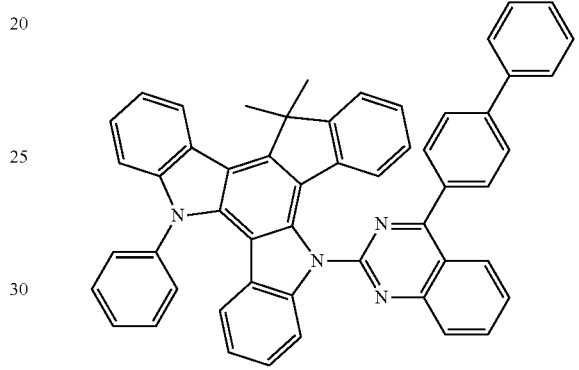
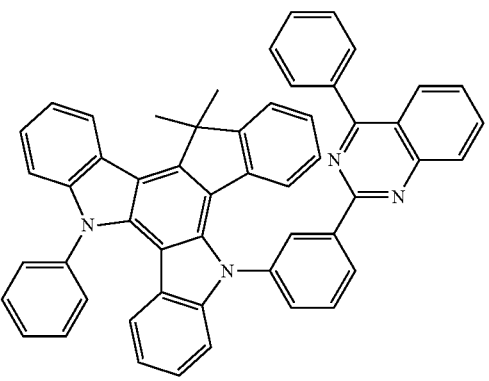
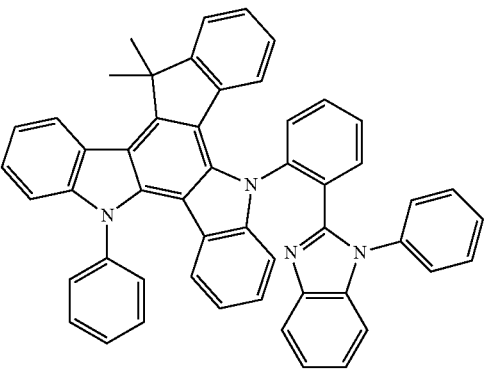

159
-continued
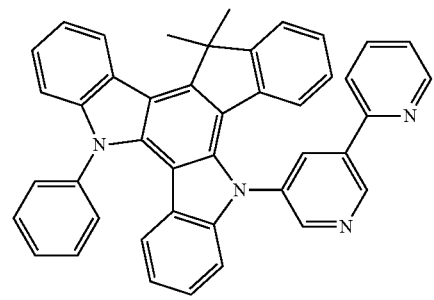
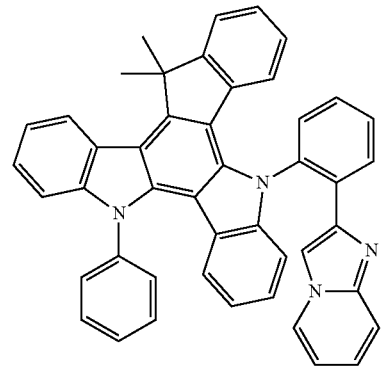
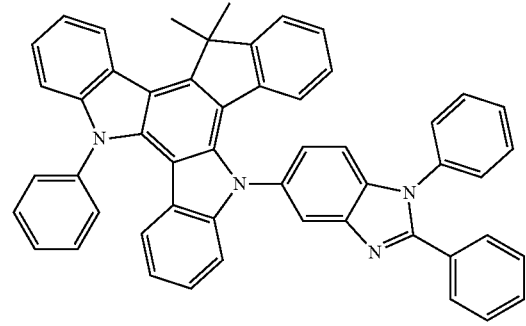
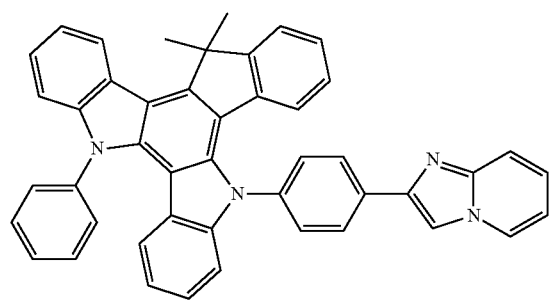
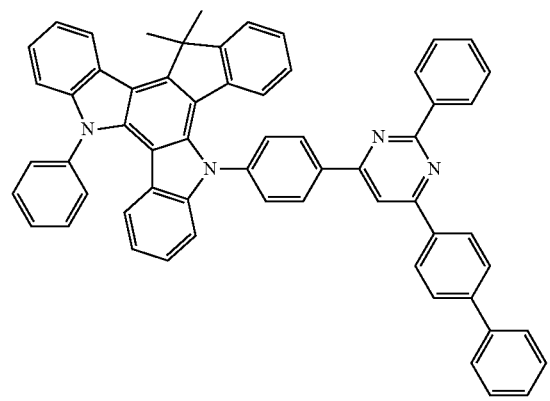
160
-continued
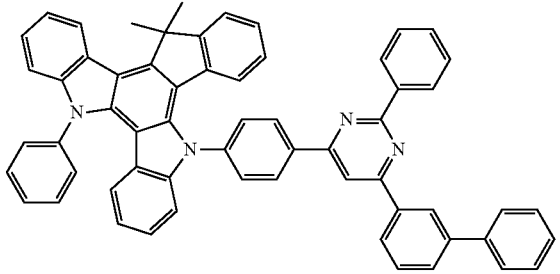
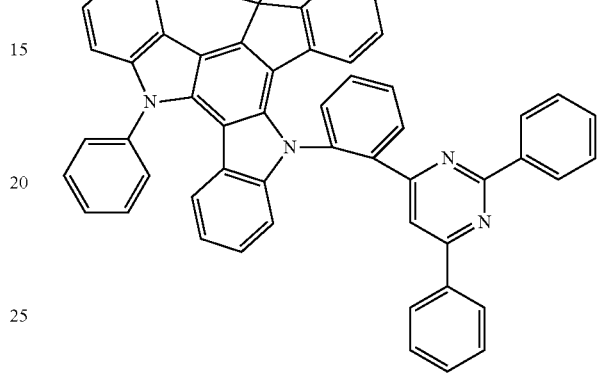
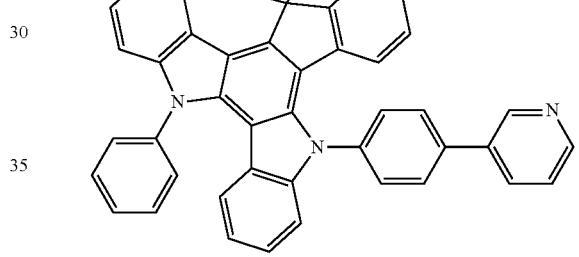
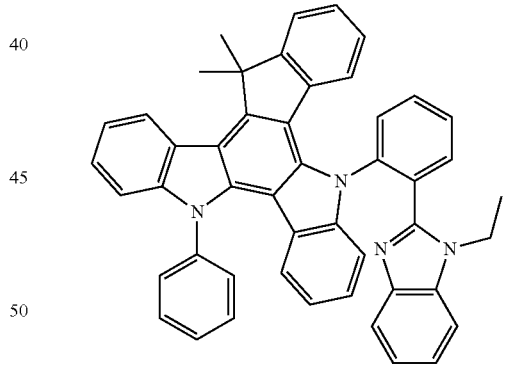
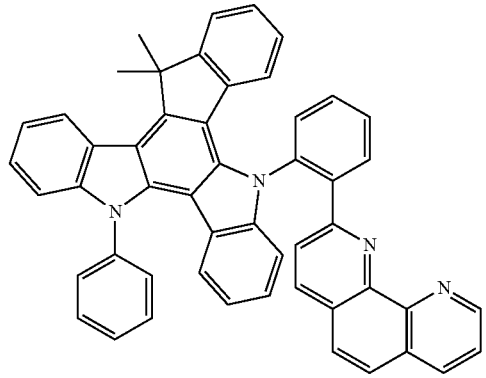

-continued
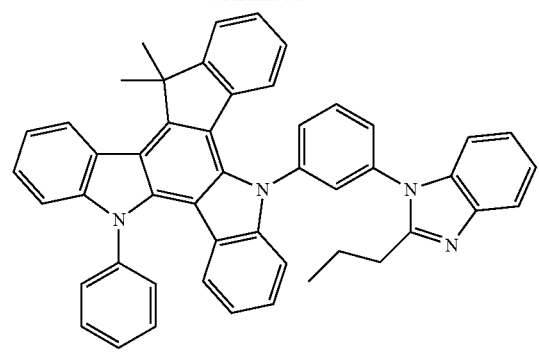
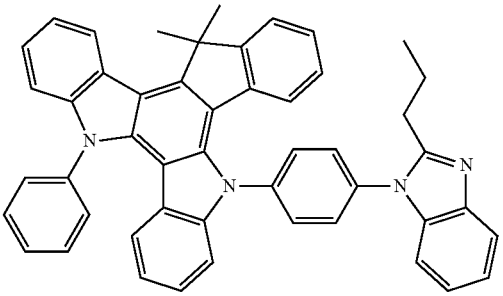
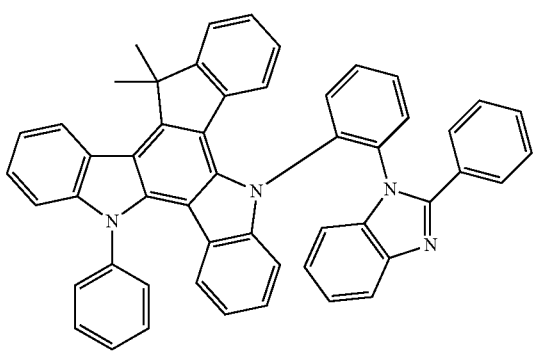
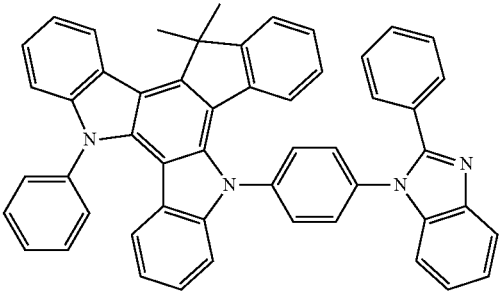
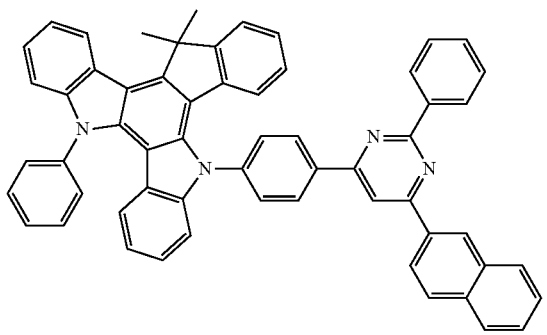
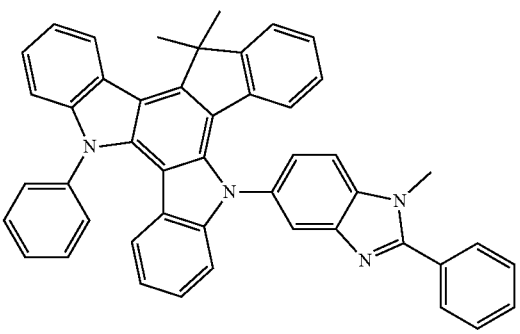
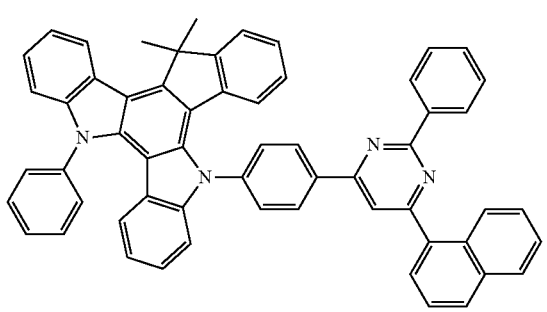
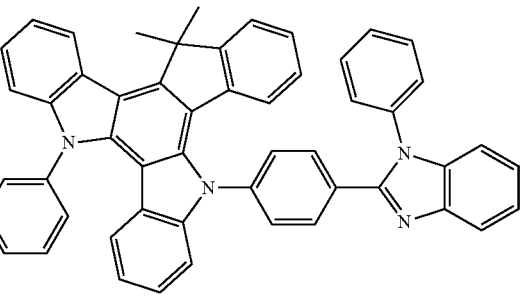
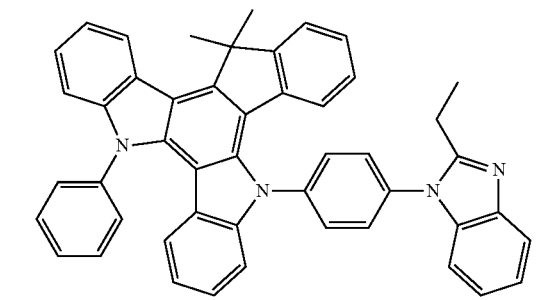
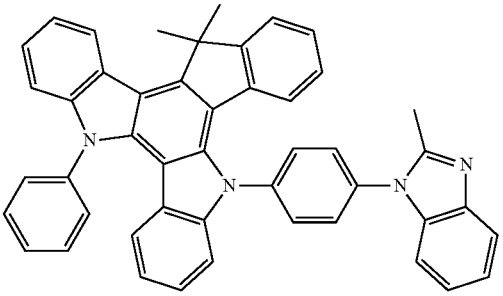

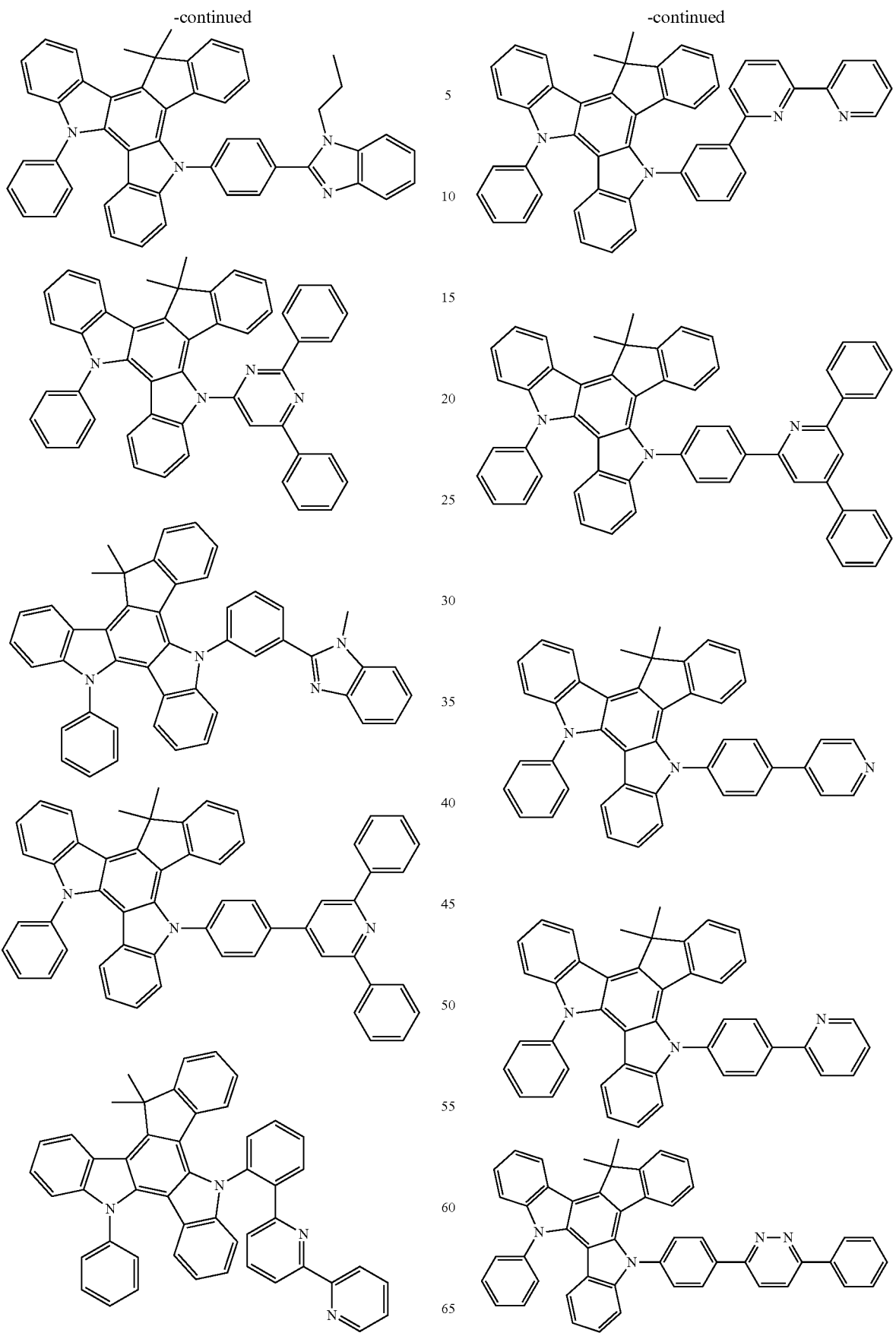

165
-continued
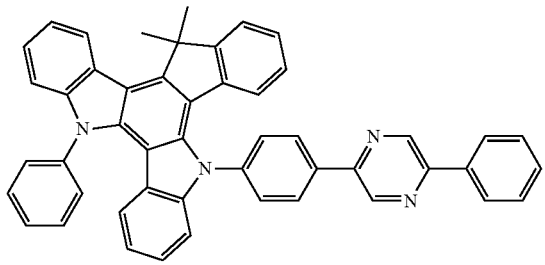
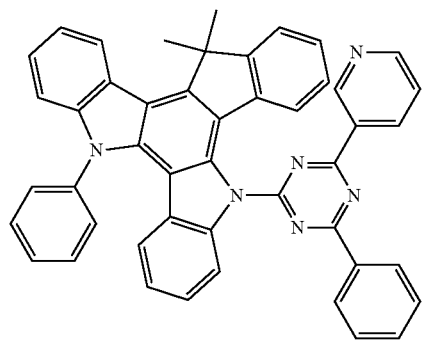
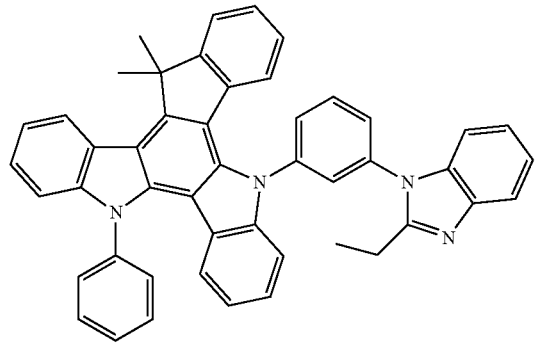
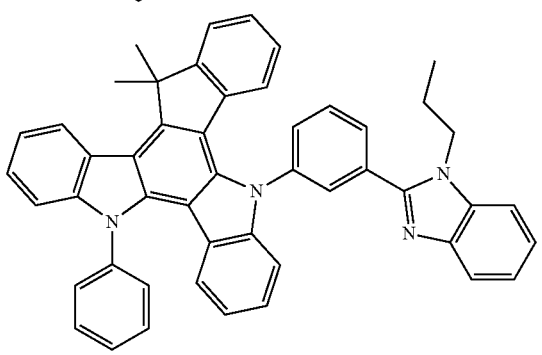
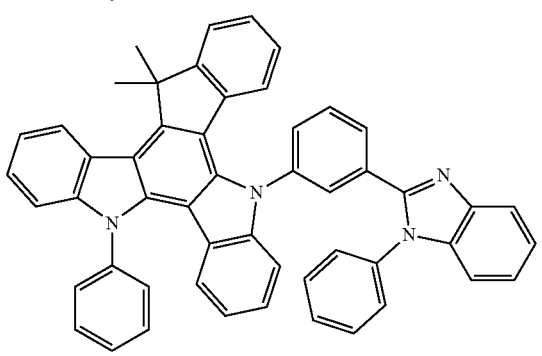
166
-continued
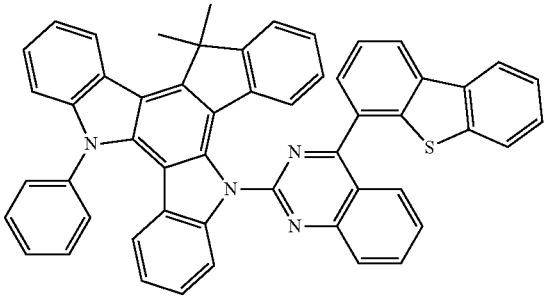
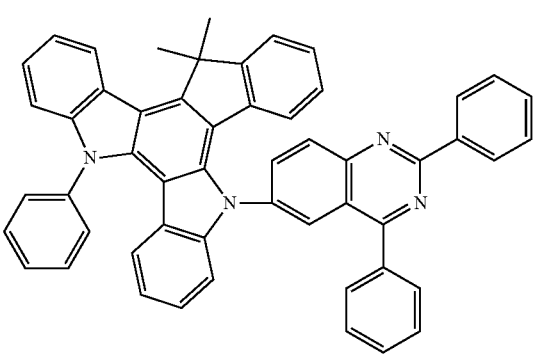
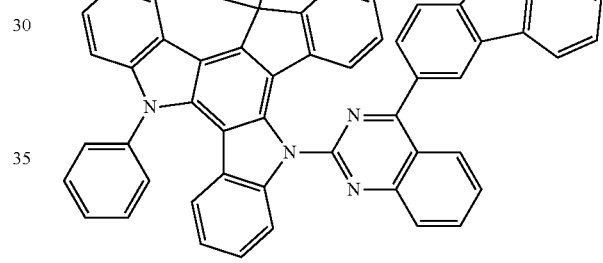
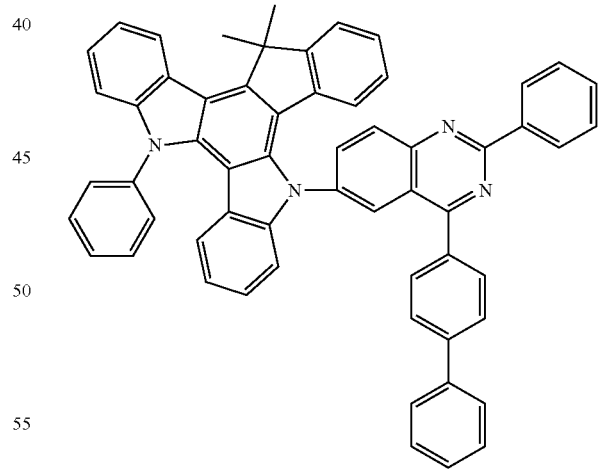
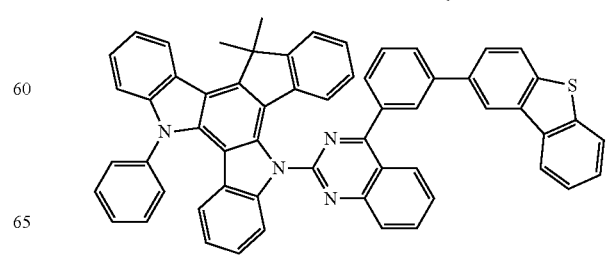

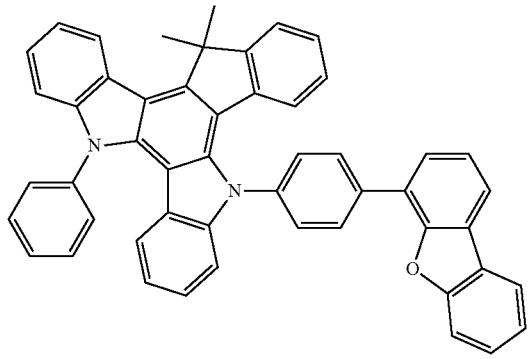
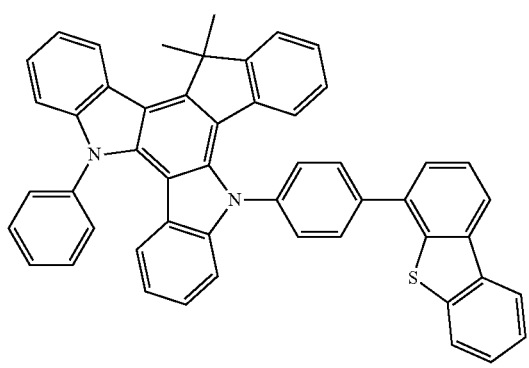
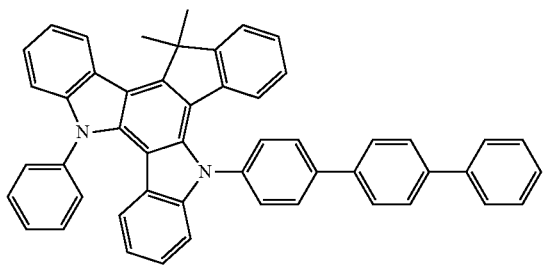
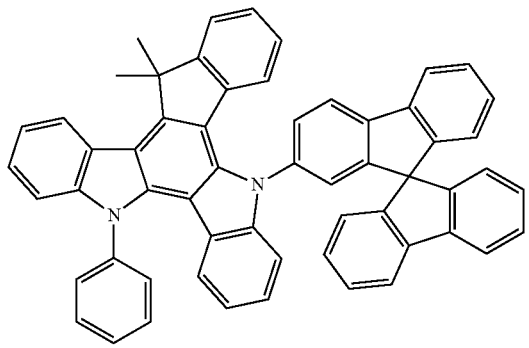
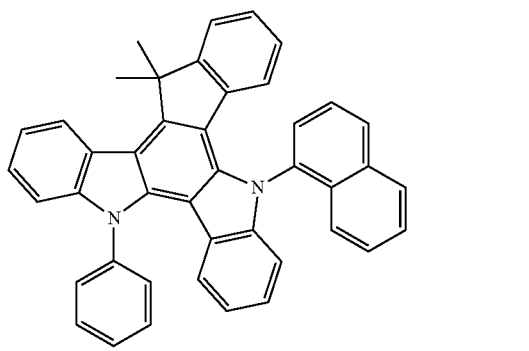
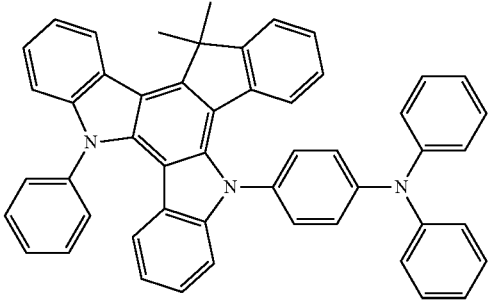
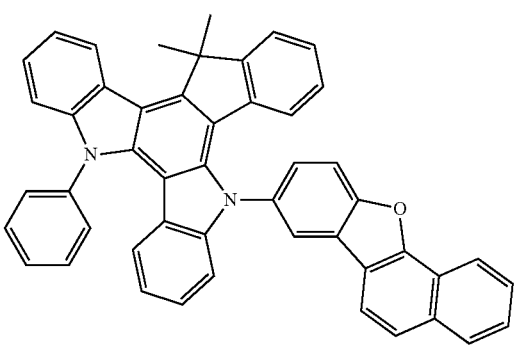
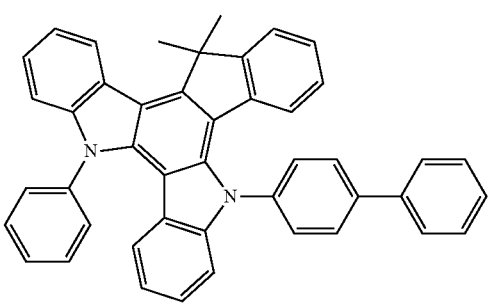
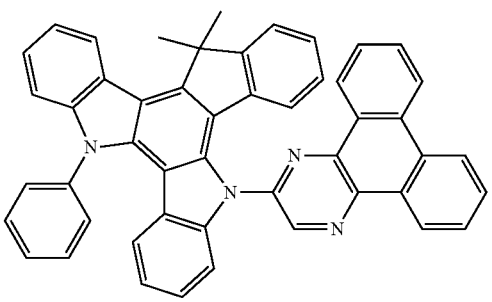
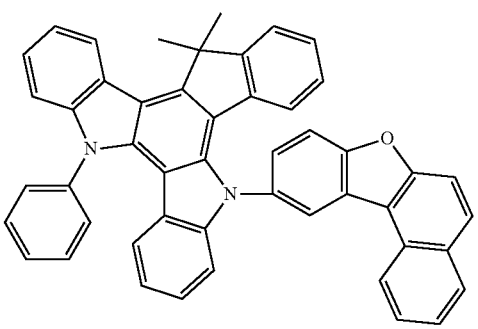

169
-continued
170
-continued
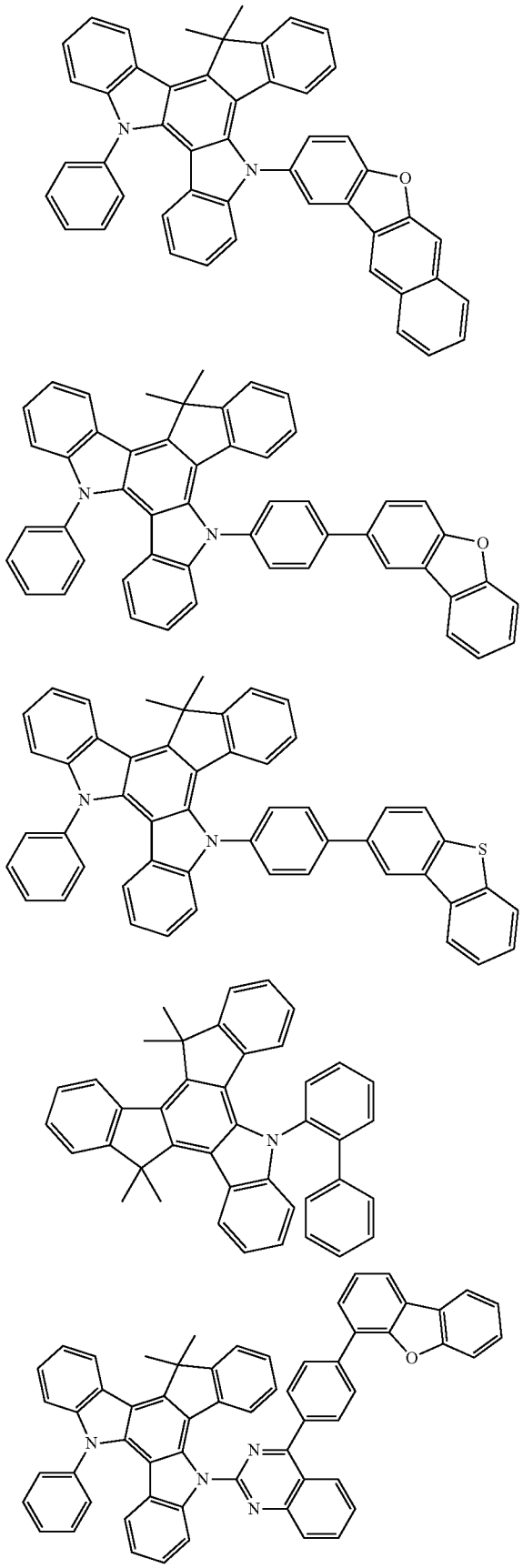
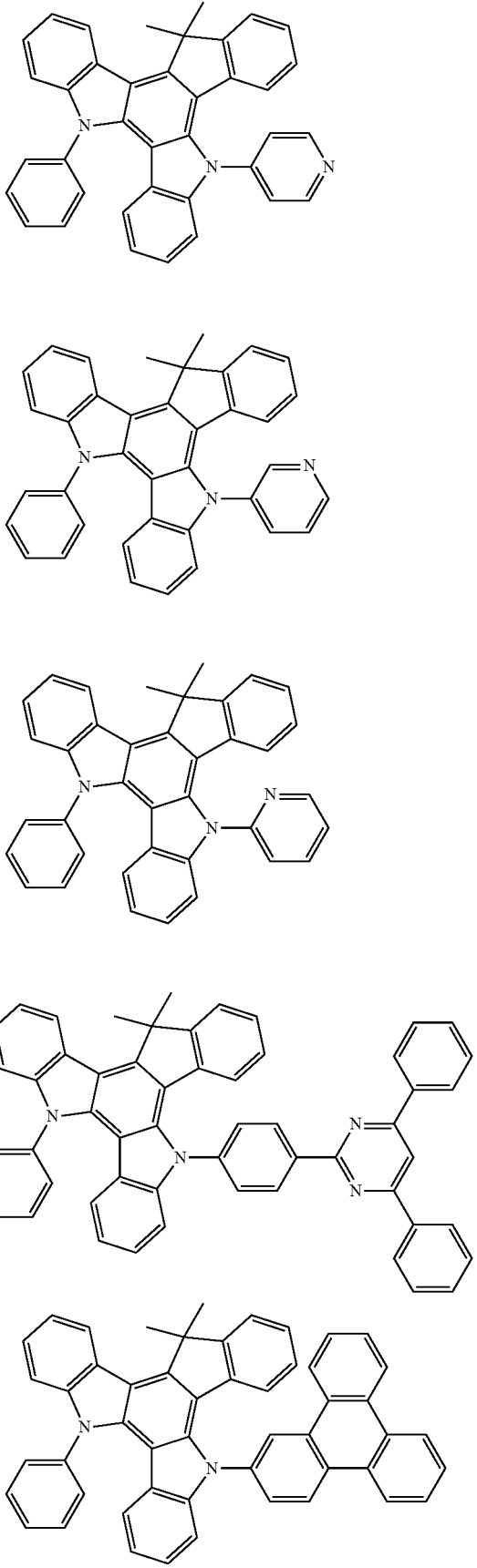

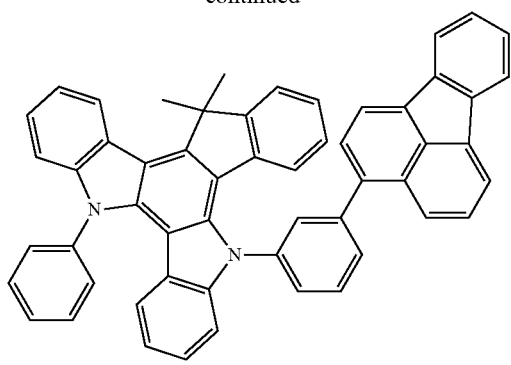
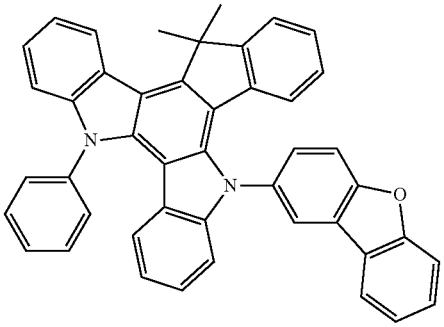
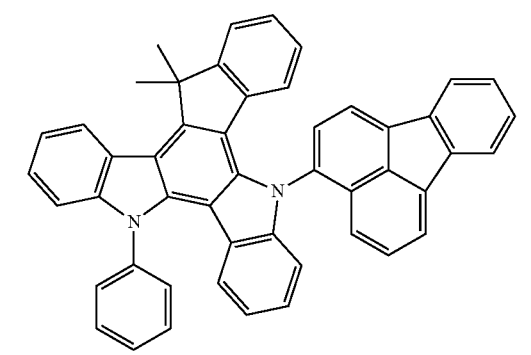
The heterocyclic compound is obtained, for example, by the following synthesis route.
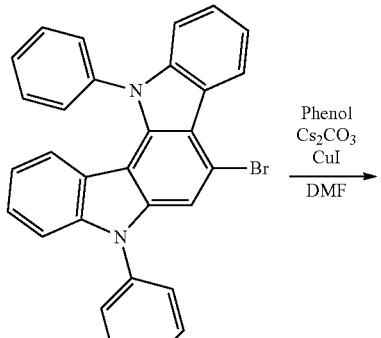
Intermediate a1
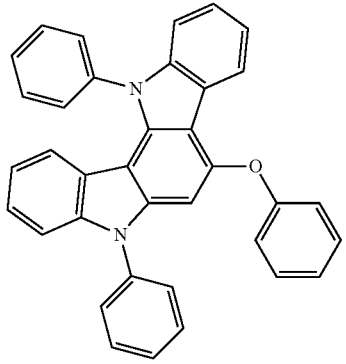
Intermediate a2
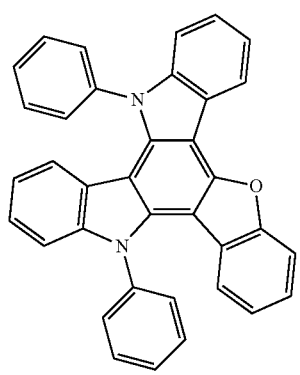
Compound a In the above synthesis method, the intermediate a2 is synthesized from the intermediate a1 by a cross-coupling reaction to form an ether bond in the presence of phenol and a copper catalyst. Then, the compound a is synthesized from the intermediate a2 by a ring closure reaction in the presence of pivalic acid and palladium.

The heterocyclic compounds within the present invention can be also synthesized by the synthesis methods described in the following examples while suitably changing the methods according to the aimed compounds.

Organic EL Device

The organic EL device of the invention will be described below.

The organic EL device comprises one or more organic thin film layers between a cathode an anode. The organic thin film layer comprises a light emitting layer and at least one layer of the organic thin film layers comprises the material for organic EL device mentioned above.

Examples of the organic thin film layer which comprises the material for organic EL device include an anode-side organic thin film layer formed between an anode and a light emitting layer (hole transporting layer, hole injecting layer, etc.), a light emitting layer, a cathode-side organic thin film layer formed between a cathode and a light emitting layer (electron transporting layer, electron injecting layer, etc.), a space layer, and a blocking layer, although not limited thereto. The material for organic EL device may be used in any of the above layers, for example, used in a light emitting layer of a fluorescent emitting unit as a host material or a dopant material, in a light emitting layer of a phosphorescent emitting unit as a host material, and in a hole transporting layer, an electron transporting layer, etc. of an emitting unit.

The organic EL device of the invention may be any of a single color emitting device of fluorescent or phosphorescent type, a white-emitting device of fluorescent-phosphorescent hybrid type, an emitting device of a simple type having a single emission unit, and an emitting device of a tandem type having two or more emission units, with the phosphorescent device being preferred. The "emission unit" referred to herein is the smallest unit for emitting light by the recombination of injected holes and injected electrons, which comprises one or more organic layers wherein at least one layer is a light emitting layer.

Representative device structures of the simple-type organic EL device are shown below.

(1) Anode/Emission Unit/Cathode

The emission unit may be a laminate comprising two or more layers selected from a phosphorescent light emitting layer and a fluorescent light emitting layer. A space layer may be disposed between the light emitting layers to prevent the diffusion of excitons generated in the phosphorescent light emitting layer into the fluorescent light emitting layer. Representative layered structures of the emission unit are shown below.

(a) hole transporting layer/light emitting layer (/electron transporting layer);
(b) hole transporting layer/first phosphorescent light emitting layer/second phosphorescent light emitting layer (/electron transporting layer);
(c) hole transporting layer/phosphorescent light emitting layer/space layer/fluorescent light emitting layer (/electron transporting layer);
(d) hole transporting layer/first phosphorescent light emitting layer/second phosphorescent light emitting layer/space layer/fluorescent light emitting layer (/electron transporting layer);
(e) hole transporting layer/first phosphorescent light emitting layer/space layer/second phosphorescent light emitting layer/space layer/fluorescent light emitting layer (/electron transporting layer);
(f) hole transporting layer/phosphorescent light emitting layer/space layer/first fluorescent light emitting layer/second fluorescent light emitting layer (/electron transporting layer);
(g) hole transporting layer/electron blocking layer/light emitting layer (/electron transporting layer);
(h) hole transporting layer/light emitting layer/hole blocking layer (/electron transporting layer); and
(i) hole transporting layer/fluorescent light emitting layer/triplet blocking layer (/electron transporting layer).

The emission color of the phosphorescent light emitting layer and that of the fluorescent light emitting layer may be different. For example, the layered structure of the laminated light emitting layer (d) may be hole transporting layer/first phosphorescent light emitting layer (red emission)/second phosphorescent light emitting layer (green emission)/space layer/fluorescent light emitting layer (blue emission)/electron transporting layer.

An electron blocking layer may be disposed between the light emitting layer and the hole transporting layer or between the light emitting layer and the space layer, if necessary. Also, a hole blocking layer may be disposed between the light emitting layer and the electron transporting layer, if necessary. With such a electron blocking layer or a hole blocking layer, electrons and holes are confined in the light emitting layer to increase the degree of charge recombination in the light emitting layer, thereby improving the lifetime.

Representative device structure of the tandem-type organic EL device is shown below.

(2) Anode/First Emission Unit/Intermediate Layer/Second Emission Unit/Cathode

The layered structure of the first emission unit and the second emission unit may be selected from those described above with respect to the emission unit.

Generally, the intermediate layer is also called an intermediate electrode, an intermediate conductive layer, a charge generation layer, an electron withdrawing layer, a connecting layer, or an intermediate insulating layer. The intermediate layer may be formed by known materials so as to supply electrons to the first emission unit and holes to the second emission unit.

A schematic structure of an example of the organic EL device of the invention is shown in the FIGURE wherein the organic EL device 1 comprises a substrate 2, an anode 3, a cathode 4, and organic thin film layers 10 (an emission unit 10) disposed between the anode 3 and the cathode 4. The emission unit 10 comprises a light emitting layer 5 which comprises at least one phosphorescent emitting layer containing a phosphorescent host material and a phosphorescent dopant material (phosphorescent emitting material). An anode-side organic thin film layer 6, such as a hole injecting/transporting layer, may be disposed between the light emitting layer 5 and the anode 3, and a cathode-side organic thin film layer 7, such as an electron injecting/transporting layer, may be disposed between the light emitting layer 5 and the cathode 4. An electron blocking layer may be disposed on the anode 3 side of the light emitting layer 5, and a hole blocking layer may be disposed on the cathode 4 side of the light emitting layer 5. With these blocking layers, electrons and holes are confined in the light emitting layer 5 to increase the degree of exciton generation in the light emitting layer 5.

In the present specification, a host is referred to as a fluorescent host when combinedly used with a fluorescent dopant (fluorescent emitting material) and as a phosphorescent host when combinedly used with a phosphorescent dopant. Therefore, the fluorescent host and the phosphorescent host are not distinguished from each other merely by the difference in their molecular structures. Namely, in the present invention, the term "phosphorescent host" means a material for constituting a phosphorescent emitting layer containing a phosphorescent dopant and does not mean a material that cannot be utilized as a material for a fluorescent emitting layer. The same applies to the fluorescent host.

Substrate

The organic EL device of the invention is formed on a light-transmissive substrate. The light-transmissive substrate serves as a support for the organic EL device and preferably a flat substrate having a transmittance of 50% or more to 400 to 700 nm visible light. Examples of the substrate include a glass plate and a polymer plate. The glass plate may include a plate made of soda-lime glass, barium-strontium-containing glass, lead glass, aluminosilicate glass, borosilicate glass, barium borosilicate glass, or quartz. The polymer plate may include a plate made of polycarbonate, acryl, polyethylene terephthalate, polyether sulfide, or polysulfone.

Anode

The anode of the organic EL device injects holes to the hole transporting layer or the light emitting layer, and an anode having a work function of 4.5 eV or more is effective. Examples of the material for anode include indium tin oxide alloy (ITO), tin oxide (NESA), indium zinc oxide alloy, gold, silver, platinum, and cupper. The anode is formed by making the electrode material into a thin film by a method, such as a vapor deposition method or a sputtering method. When getting the light emitted from the light emitting layer through the anode, the transmittance of anode to visible light is preferably 10% or more. The sheet resistance of anode is preferably several hundreds Ω/□ or less. The film thickness of anode depends upon the kind of material and generally 10 nm to 1 μm, preferably 10 to 200 nm.

Cathode

The cathode injects electrons to the electron injecting layer, the electron transporting layer or the light emitting layer, and formed preferably by a material having a small work function. Examples of the material for cathode include, but not limited to, indium, aluminum, magnesium, magnesium-indium alloy, magnesium-aluminum alloy, aluminum-lithium alloy, aluminum-scandium-lithium alloy, and magnesium-silver alloy. Like the anode, the cathode is formed by making the material into a thin film by a method, such as the vapor deposition method and the sputtering method. The emitted light may be taken through the cathode, if necessary.

Light Emitting Layer

The light emitting layer is an organic layer having a light emitting function and contains a host material and a dopant material when a doping system is employed. The major function of the host material is to promote the recombination of electrons and holes and confine excitons in the light emitting layer. The dopant material causes the excitons generated by recombination to emit light efficiently.

In case of a phosphorescent device, the major function of the host material is to confine the excitons generated on the dopant in the light emitting layer.

To control the carrier balance in the light emitting layer, the light emitting layer may be made into a double host (host/co-host) layer, for example, by combinedly using an electron transporting host and a hole transporting host.

The light emitting layer may be made into a double dopant layer, in which two or more kinds of dopant materials having high quantum yield are combinedly used and each dopant material emits light with its own color. For example, to obtain a yellow emission, a light emitting layer formed by co-depositing a host, a red-emitting dopant and a green-emitting dopant is used.

In a laminate of two or more light emitting layers, electrons and holes are accumulated in the interface between the light emitting layers, and therefore, the recombination region is localized in the interface between the light emitting layers, to improve the quantum efficiency.

The easiness of hole injection to the light emitting layer and the easiness of electron injection to the light emitting layer may be different from each other. Also, the hole transporting ability and the electron transporting ability each being expressed by mobility of holes and electrons in the light emitting layer may be different from each other.

The light emitting layer is formed, for example, by a known method, such as a vapor deposition method, a spin coating method, and LB method. The light emitting layer can be formed also by making a solution of a binder, such as resin, and the material for the light emitting layer in a solvent into a thin film by a method such as spin coating.

The light emitting layer is preferably a molecular deposit film. The molecular deposit film is a thin film formed by depositing a vaporized material or a film formed by solidifying a material in the state of solution or liquid. The molecular deposit film can be distinguished from a thin film formed by LB method (molecular build-up film) by the differences in the assembly structures and higher order structures and the functional difference due to the structural differences.

The phosphorescent dopant (phosphorescent emitting material) used in the light emitting layer is a compound which emits light by releasing the energy of excited triplet state and preferably a organometallic complex comprising at least one metal selected from Ir, Pt, Os, Au, Cu, Re, and Ru and a ligand, although not particularly limited thereto as long as emitting light by releasing the energy of excited triplet state. The ligand is preferably ortho-metallated. In view of obtaining a high phosphorescent quantum yield and further improving the external quantum efficiency of luminescent device, a metal complex comprising a metal selected from Ir, Os, and Pt is preferred, with a metal complex, particularly an ortho-metallated complex, such as an iridium complex, an osmium complex, and a platinum complex, being more preferred, an iridium complex and a platinum complex being still more preferred, and an ortho-metallated iridium complex being particularly preferred.

The content of the phosphorescent dopant in the light emitting layer is not particularly limited and selected according to the use of the device, and preferably 0.1 to 70% by mass, and more preferably 1 to 30% by mass. If being 0.1% by mass or more, the amount of light emission is sufficient. If being 70% by mass or less, the concentration quenching can be avoided.

Preferred examples of the organometallic complex for the phosphorescent dopant are shown below.

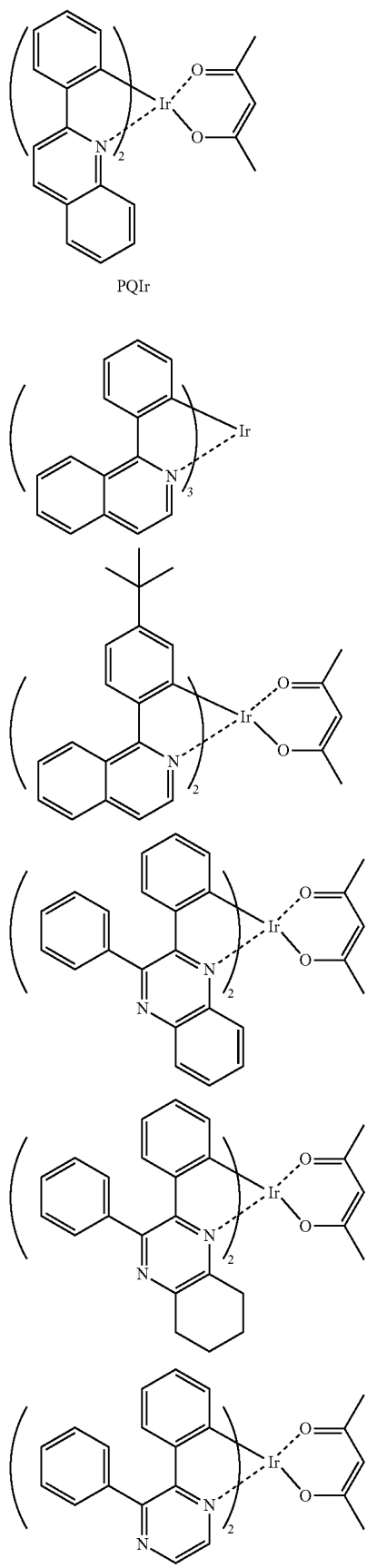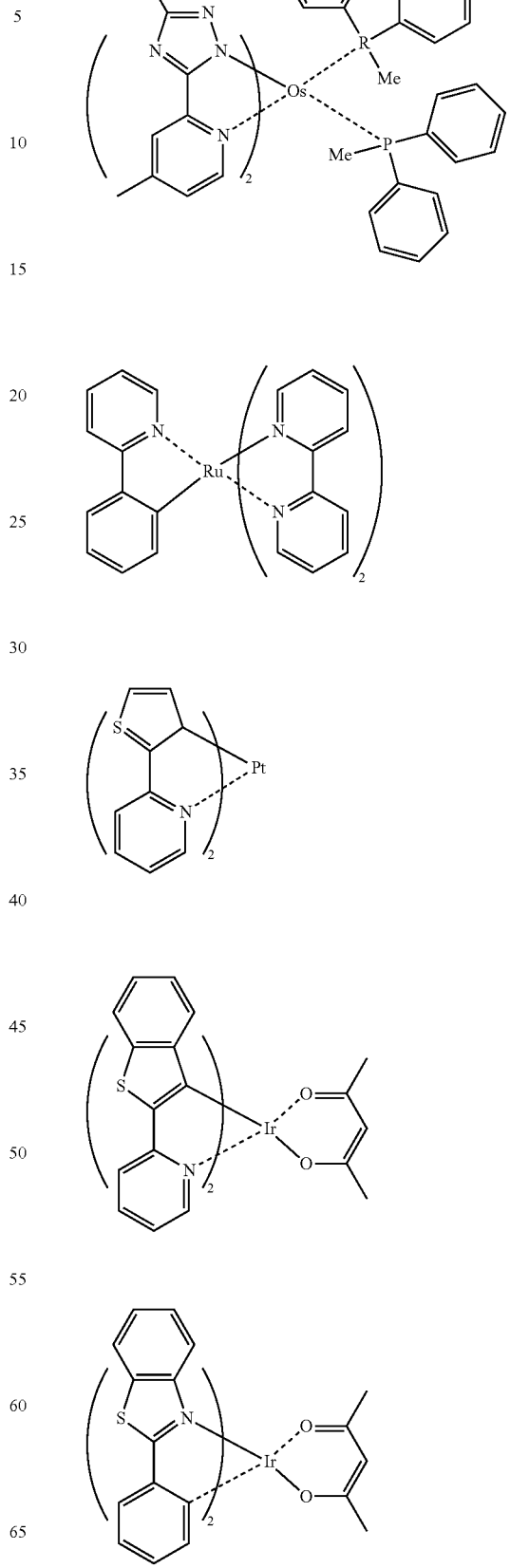

179
-continued
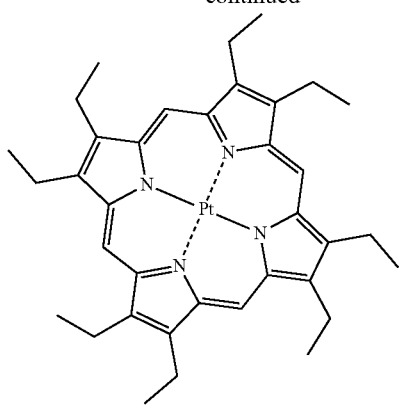
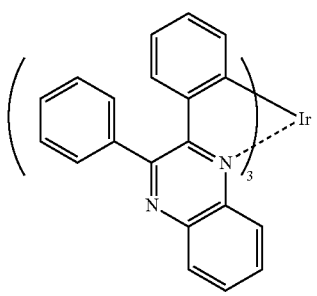
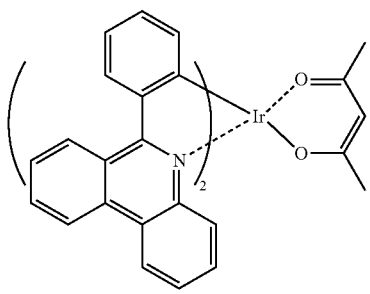
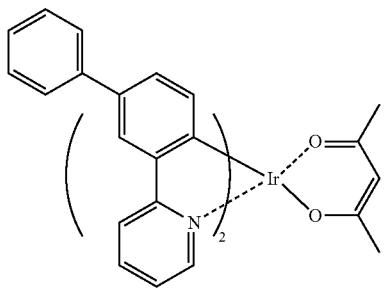
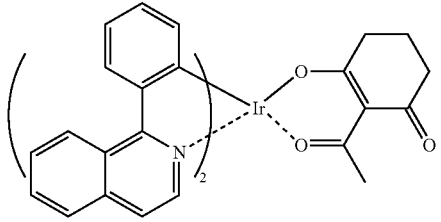
180
-continued
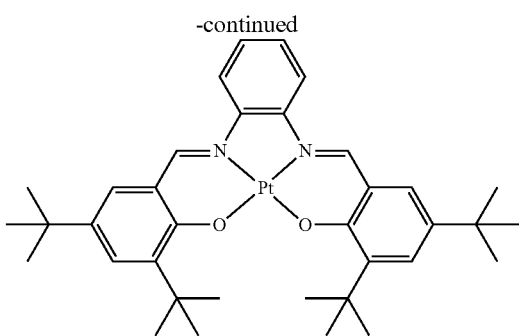
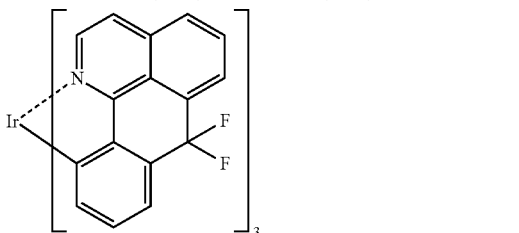
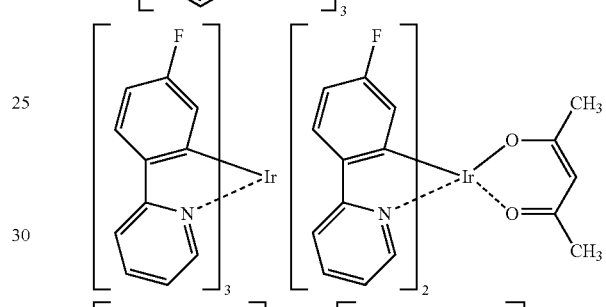
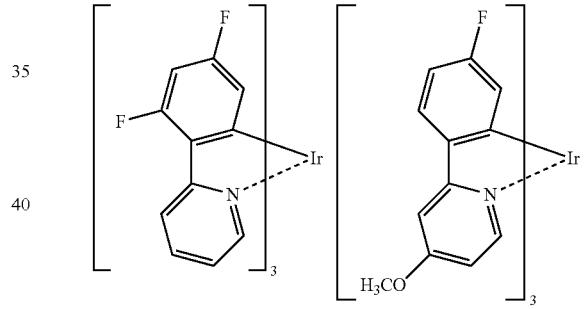
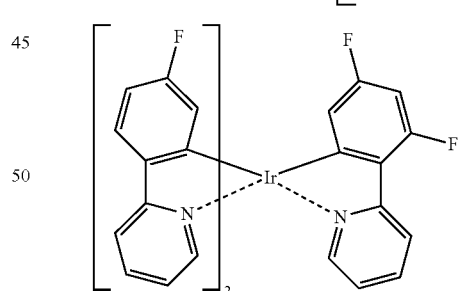
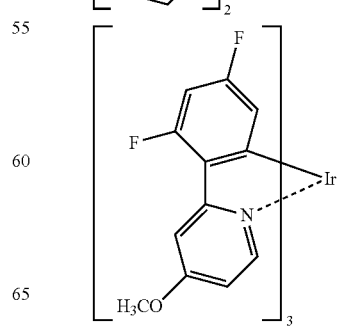

-continued
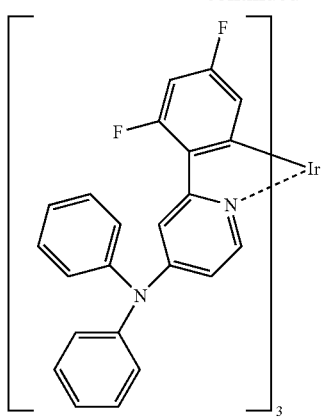
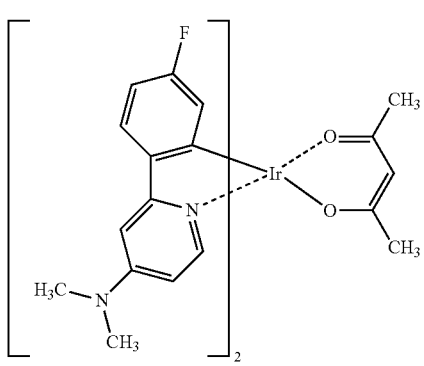
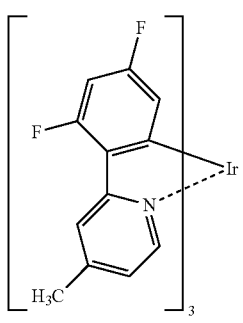
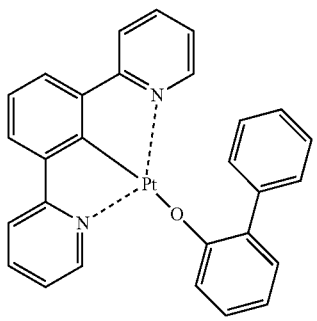
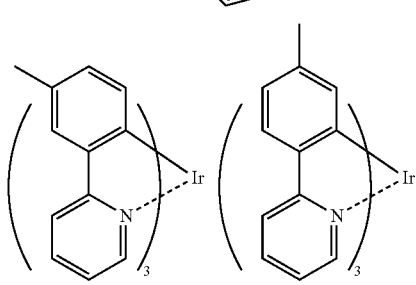
-continued
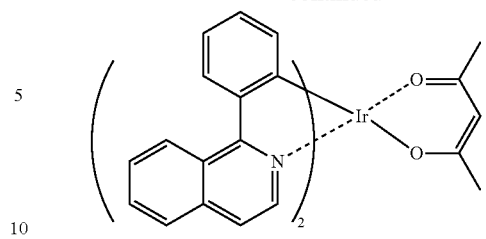
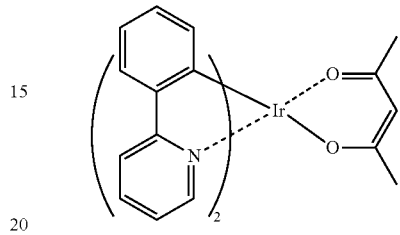
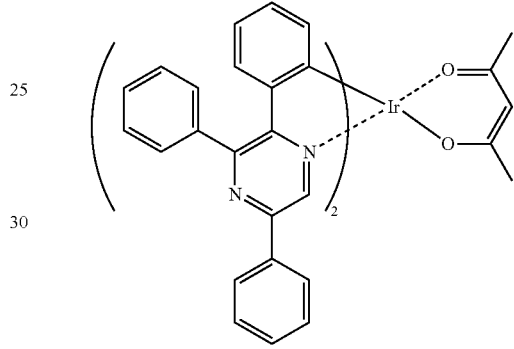
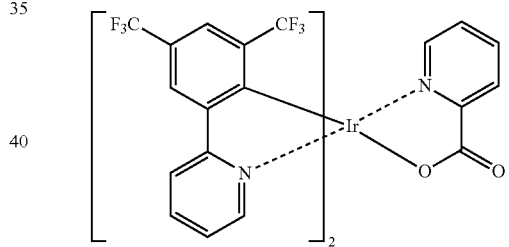
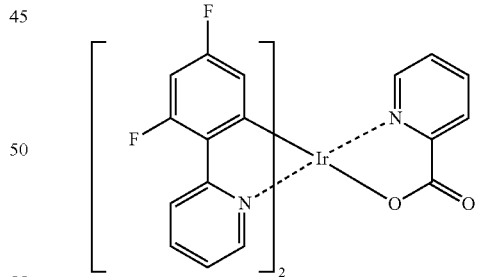
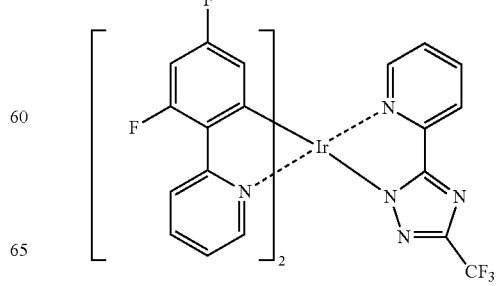

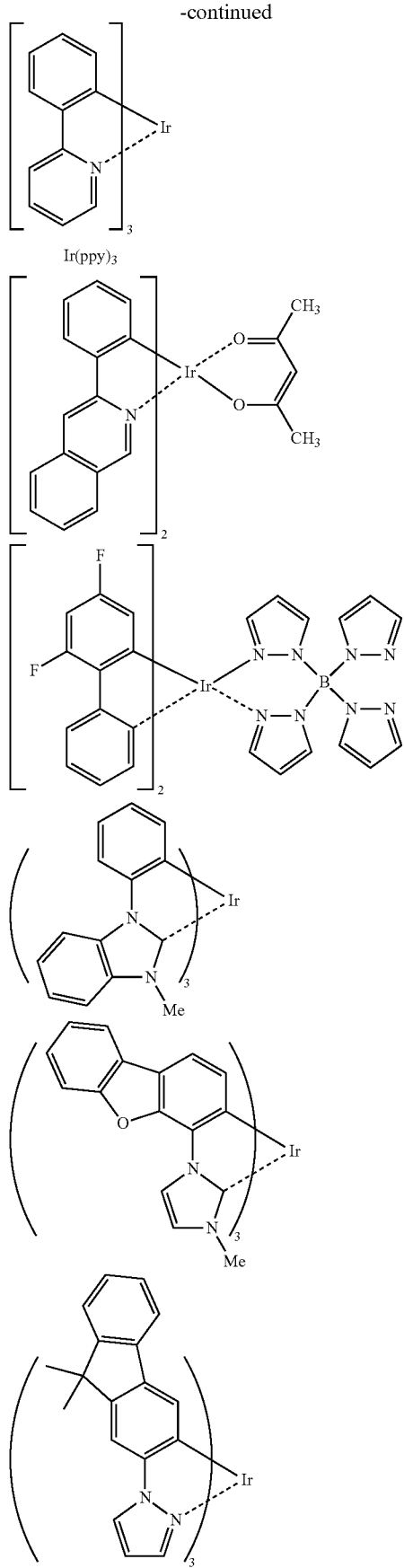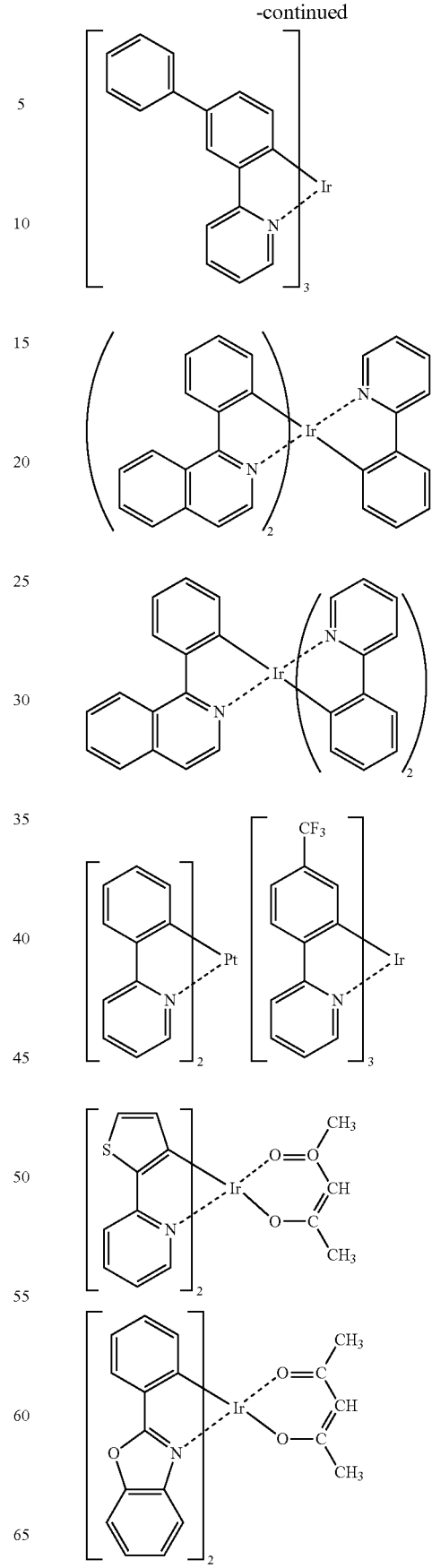

-continued

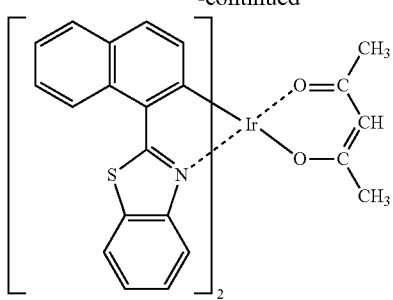

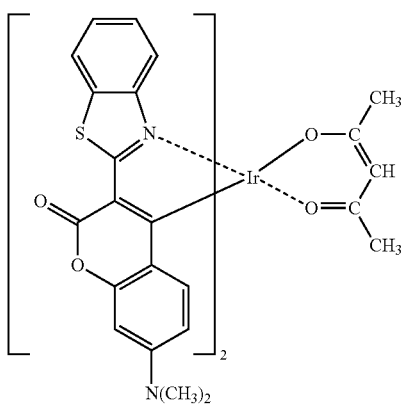

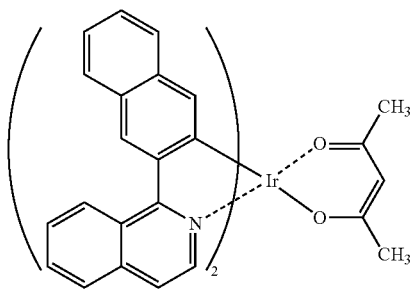

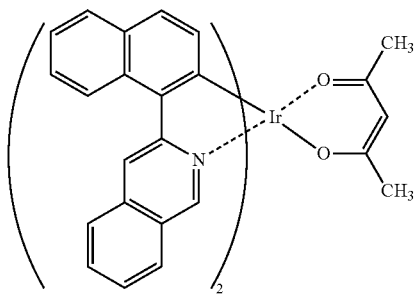

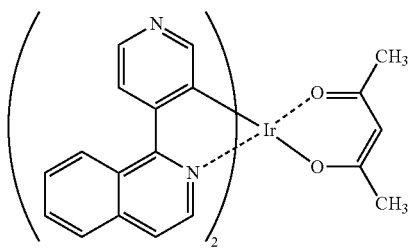

-continued

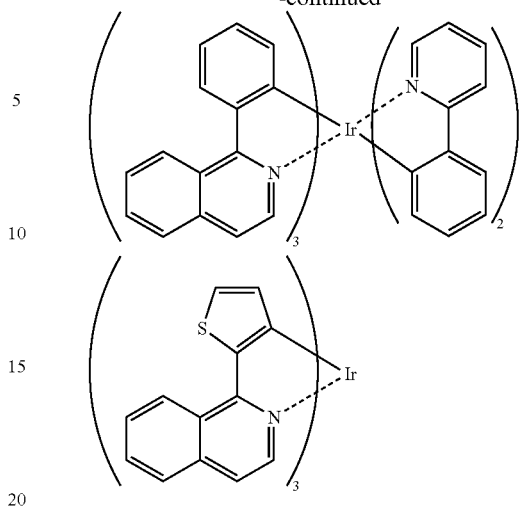

The phosphorescent host is a compound which confines the triplet energy of the phosphorescent dopant efficiently in the light emitting layer to cause the phosphorescent dopant to emit light efficiently. Although the material for organic EL device of the invention is useful as a phosphorescent host, a compound other than the material for organic EL device of the invention may be used as the phosphorescent host according to the use of the device.

The material for organic EL device of the invention and the compound other than it may be combinedly used in the same light emitting layer as the phosphorescent host material. If two or more light emitting layers are formed, the material for organic EL device of the invention can be used in one of the light emitting layers as the phosphorescent host material and a compound other than the material for organic EL device of the invention can be used in another light emitting layer as the phosphorescent host material. The material for organic EL device of the invention may be used in an organic layer other than the light emitting layer. In this case, a compound other than the material for organic EL device of the invention may be used as a phosphorescent host of the light emitting layer.

Examples of the preferred phosphorescent host other than the material for organic EL device of the invention include a carbazole derivative, a triazole derivative, a oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic methylidene compound, a porphyrin compound, an anthraquinodimethane derivative, an anthrone derivative, a diphenylquinone derivative, a thiopyran dioxide derivative, a carbodiimide derivative, a fluorenylidenemethane derivative, a distyrylpyrazine derivative, a tetracarboxylic anhydride of fused ring such as naphthalene and perylene, a phthalocyanine derivative, a metal complex of 8-quinolinol derivative, metal phthalocyanine, metal complexes having a ligand such as benzoxazole and benzothiazole, an electroconductive oligomer, such as a polysilane compound, a poly(N-vinylcarbazole) derivative, an aniline copolymer, thiophene oligomer, and a polythiophene, and a polymer such as a polythiophene derivative, a polyphenylene derivative, a polyphenylenevinylene derivative, and a polyfluorene derivative. These phosphorescent hosts may be used alone or in combination of two or more. Examples thereof are shown below.

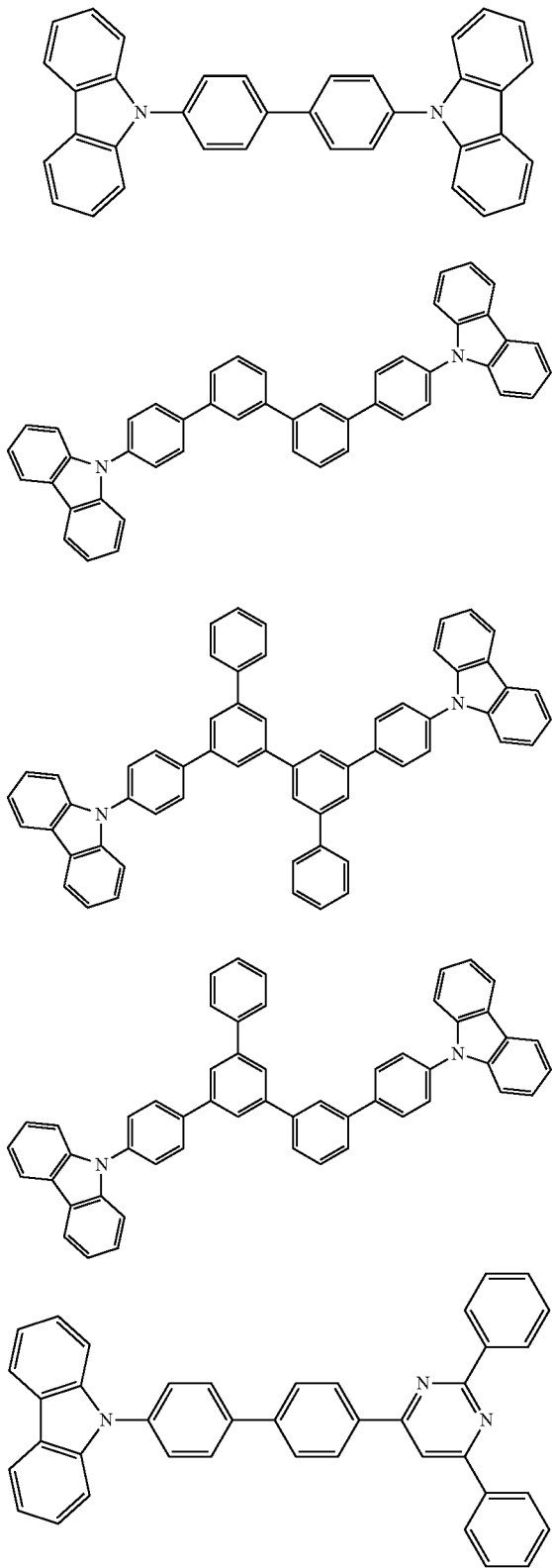

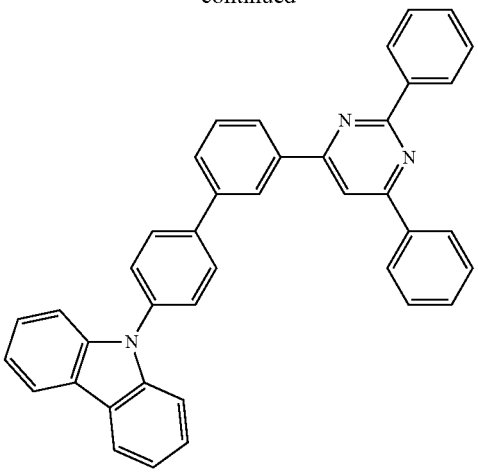

The organic EL device of the invention may comprise a light emitting layer comprising a fluorescent material, i.e., a fluorescent emitting layer. The fluorescent emitting layer may be formed from a known fluorescent material, for example, at least one material selected from an anthracene derivative, a fluoranthene derivative, a styrylamine derivative, and an arylamine derivative, with the anthracene derivative and the arylamine derivative being more preferred. In particular, the anthracene derivative is preferably used as the host material and the arylamine derivative is preferably used as the dopant. The materials described in WO 2010/134350 and WO 2010/134352 are preferably used. The material for organic EL device of the invention may be used in a fluorescent emitting layer as a fluorescent emitting material or a host material.

The anthracene derivative for use as a fluorescent material has preferably 26 to 100, more preferably 26 to 80, and still more preferably 26 to 60 ring carbon atoms. The anthracene derivative is preferably represented by formula (10):

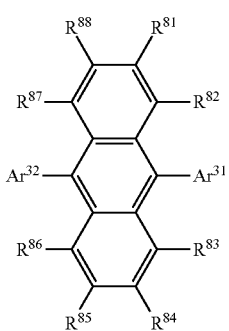

(10)

wherein:
each of $Ar^{31}$ and $Ar^{32}$ independently represents a substituted or unsubstituted aryl group having 6 to 50 ring carbon atoms or a substituted or unsubstituted heterocyclic group having 5 to 50 ring atoms; and
each of $R^{81}$ to $R^{88}$ independently represents a hydrogen atom, a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group, or a hydroxyl group.

The aryl group having 6 to 50 ring carbon atoms is preferably an aryl group having 6 to 40 ring carbon atoms and more preferably an aryl group having 6 to 30 ring carbon atoms.

The heterocyclic group having 5 to 50 ring atoms is preferably a heterocyclic group having 5 to 40 ring atoms and more preferably a heterocyclic group having 5 to 30 ring atoms.

The alkyl group having 1 to 50 carbon atoms is preferably an alkyl group having 1 to 30 carbon atoms, more preferably an alkyl group having 1 to 10 carbon atoms, and still more preferably an alkyl group having 1 to 5 carbon atoms.

The alkoxy group having 1 to 50 carbon atoms is preferably an alkoxy group having 1 to 30 carbon atoms, more preferably an alkoxy group having 1 to 10 carbon atoms, and still more preferably an alkoxy group having 1 to 5 carbon atoms.

The aralkyl group having 7 to 50 carbon atoms is preferably an aralkyl group having 7 to 30 carbon atoms and more preferably an aralkyl group having 7 to 20 carbon atoms.

The aryloxy group having 6 to 50 ring carbon atoms is preferably an aryloxy group having 6 to 40 ring carbon atoms and more preferably an aryloxy group having 6 to 30 ring carbon atoms.

The arylthio group having 6 to 50 ring carbon atoms is preferably an arylthio group having 6 to 40 ring carbon atoms and more preferably an arylthio group having 6 to 30 ring carbon atoms.

The alkoxycarbonyl group having 2 to 50 carbon atoms is preferably an alkoxycarbonyl group having 2 to 30 carbon atoms, more preferably an alkoxycarbonyl group having 2 to 10 carbon atoms, and still more preferably an alkoxycarbonyl group having 2 to 5 carbon atoms.

Examples of the halogen atom include a fluorine atom, a chlorine atom, and a bromine atom.

Each of $Ar^{31}$ and $Ar^{32}$ particularly preferably represents a substituted or unsubstituted aryl group having 6 to 50 ring carbon atoms.

The anthracene derivative represented by formula (10) is preferably represented by formula (10-1):

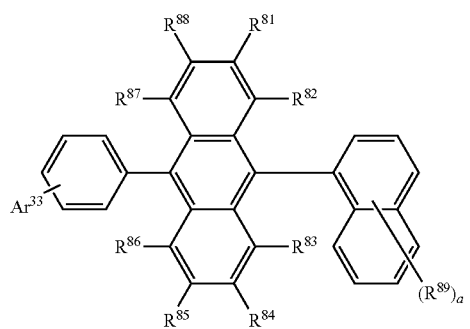

(10-1)

wherein:
$Ar^{33}$ represents a substituted or unsubstituted aryl group having 6 to 50 ring carbon atoms or a substituted or unsubstituted heterocyclic group having 5 to 50 ring atoms;
each of $R^{81}$ to $R^{88}$ is as defined above;
$R^{89}$ is defined in the same manner as in $R^{81}$ to $R^{88}$; and
a is an integer of 1 to 7.

Preferred examples of $R^{81}$ to $R^{88}$ are as described above. Preferred examples of $R^{89}$ are the same as those of $R^{81}$ to $R^{88}$. The subscript a is preferably an integer of 1 to 3 and more preferably 1 or 2.

The aryl group having 6 to 50 ring carbon atoms for $Ar^{33}$ is preferably an aryl group having 6 to 40 ring carbon atoms, more preferably an aryl group having 6 to 30 ring carbon atoms, still more preferably an aryl group having 6 to 20 ring carbon atoms, and particularly preferably an aryl group having 6 to 12 ring carbon atoms.

The arylamine derivative for use as the fluorescent material is preferably an aryldiamine derivative, more preferably an aryldiamine derivative comprising a pyrene skeleton, and still more preferably an aryldiamine derivative having a pyrene skeleton and a dibenzofuran skeleton.

The aryldiamine derivative is preferably an aryldiamine derivative represented by formula (11):

(11)

wherein:
each of $Ar^{34}$ to $Ar^{37}$ independently represents a substituted or unsubstituted aryl group having 6 to 50 ring carbon atoms or a substituted or unsubstituted heteroaryl group having 5 to 50 ring atoms; and
$L^{21}$ represents a substituted or unsubstituted arylene group having 6 to 50 ring carbon atoms or a substituted or unsubstituted heteroarylene group having 5 to 50 ring atoms.

The aryl group having 6 to 50 ring carbon atoms is preferably an aryl group having 6 to 30 ring carbon atoms, more preferably an aryl group having 6 to 20 ring carbon atoms, still more preferably an aryl group having 6 to 12 ring carbon atoms, with a phenyl group and a naphthyl group being particularly preferred.

The heteroaryl group having 5 to 50 ring atoms is preferably a heteroaryl group having 5 to 40 ring atoms, more preferably a heteroaryl group having 5 to 30 ring atoms, and still more preferably a heteroaryl group having 5 to 20 ring atoms, for example, a carbazolyl group, a dibenzofuranyl group and dibenzothiophenyl group, with a dibenzofuranyl group being preferred. Preferred examples of the substituent for the heteroaryl group include an aryl group having 6 to 30, preferably 6 to 20, and more preferably 6 to 12 ring carbon atoms, with a phenyl group and a naphthyl group being more preferred.

The arylene group having 6 to 50 ring carbon atoms is preferably an arylene group having 6 to 40 ring carbon atoms, more preferably an arylene group having 6 to 30 ring carbon atoms, and still more preferably an arylene group having 6 to 20 ring carbon atoms, with a pyrenyl group being particularly preferred.

A double host (host/co-host) system may be used for the light emitting layer. For example, to control the carrier balance in the light emitting layer, an electron transporting host and a hole transporting host may be combinedly used.

The light emitting layer may be also made into a double dopant layer. When two or more kinds of dopant materials having high quantum yield are used in the light emitting layer, each dopant emits light with its own color. For example, a yellow light emitting layer can be obtained by co-depositing a host, a red-emitting dopant and a green-emitting dopant.

The light emitting layer may further comprise a hole transporting material, a electron transporting material, and a polymer binder, if necessary.

The thickness of the light emitting layer is preferably 5 to 50 nm, more preferably 7 to 50 nm and most preferably 10 to 50 nm. If less than 5 nm, the light emitting layer may be difficult to form and the color may be difficult to control. If exceeding 50 nm, the driving voltage is likely to increase.

Electron-Donating Dopant

The organic EL device of the present invention preferably comprises an electron-donating dopant at an interfacial region between the cathode and the emitting unit. With such a construction, the organic EL device has an improved luminance and an elongated lifetime. The electron-donating dopant comprises a metal having a work function of 3.8 eV or less and examples thereof include at least one selected from alkali metal, alkali metal complex, alkali metal compound, alkaline earth metal, alkaline earth metal complex, alkaline earth metal compound, rare earth metal, rare earth metal complex, and rare earth metal compound.

Examples of the alkali metal include Na (work function: 2.36 eV), K (work function: 2.28 eV), Rb (work function: 2.16 eV), and Cs (work function: 1.95 eV), with those having a work function of 2.9 eV or less being particularly preferred. Of the above, preferred are K, Rb, and Cs, more preferred are Rb and Cs, and most preferred is Cs. Examples of the alkaline earth metal include Ca (work function: 2.9 eV), Sr (work function: 2.0 to 2.5 eV), and Ba (work function: 2.52 eV), with those having a work function of 2.9 eV or less being particularly preferred. Examples of the rare earth metal include Sc, Y, Ce, Tb, and Yb, with those having a work function of 2.9 eV or less being particularly preferred.

Examples of the alkali metal compound include alkali oxide, such as $Li_2O$, $Cs_2O$, $K_2O$, and alkali halide, such as LiF, NaF, CsF, and KF, with LiF, $Li_2O$, and NaF being preferred. Examples of the alkaline earth metal compound include BaO, SrO, CaO, and mixture thereof, such as $Ba_xSr_{1-x}O$ (0<x<1) and $Ba_xCA^1_{1-x}O$ (0<x<1), with BaO, SrO, and CaO being preferred. Examples of the rare earth metal compound include $YbF_3$, $ScF_3$, $ScO_3$, $Y_2O_3$, $Ce_2O_3$, $GdF_3$, and $TbF_3$, with $YbF_3$, $ScF_3$, and $TbF_3$ being preferred.

Examples of the alkali metal complex, alkaline earth metal complex, and rare earth metal are not particularly limited as long as containing at least one metal ion selected from alkali metal ions, alkaline earth metal ions, rare earth metal ions, respectively. The ligand is preferably, but not limited to, quinolinol, benzoquinolinol, acridinol, phenanthridinol, hydroxyphenyloxazole, hydroxyphenylthiazole, hydroxydiaryloxadiazole, hydroxydiarylthiadiazole, hydroxyphenylpyridine, hydroxyphenylbenzimidazole, hydroxybenzotriazole, hydroxyfulborane, bipyridyl, phenanthroline, phthalocyanine, porphyrin, cyclopentadiene, β-diketones, azomethines, and derivative thereof.

The electron-donating dopant is added to the interfacial region preferably into a form of layer or island. The electron-donating dopant is added preferably by co-depositing the electron-donating dopant with the organic compound (light emitting material, electron injecting material) for forming the interfacial region by a resistance heating deposition method, thereby dispersing the electron-donating dopant into the organic material. The disperse concentration expressed by the molar ratio of the organic material and the electron-donating dopant is 100:1 to 1:100 and preferably 5:1 to 1:5.

When the electron-donating dopant is formed into a form of layer, a light emitting material or an electron injecting material is made into a layer which serves as an organic layer in the interface, and then, the electron-donating dopant alone is deposited by a resistance heating deposition method into a layer having a thickness preferably 0.1 to 15 nm. When the electron-donating dopant is formed into a form of island, a light emitting material or an electron injecting material is made into a form of island which serves as an organic layer in the interface, and then, the electron-donating dopant alone is deposited by a resistance heating deposition method into a form of island having a thickness preferably 0.05 to 1 nm.

The molar ratio of the main component and the electron-donating dopant in the organic electroluminescence device of the invention is preferably 5:1 to 1:5 and more preferably 2:1 to 1:2.

Electron Transporting Layer

The electron transporting layer is an organic layer disposed between the light emitting layer and the cathode and transports electrons from the cathode to the light emitting layer. If two or more electron transporting layers are provided, the organic layer closer to the cathode may be called an electron injecting layer in some cases. The electron injecting layer injects electrons from the cathode to the organic layer unit efficiently. The material for organic EL device of the invention may be used in the electron transporting layer as the electron transporting material.

An aromatic heterocyclic compound having one or more heteroatoms in a molecule thereof is preferably used as an electron transporting material used in the electron transporting layer, and a nitrogen-containing ring derivative is particularly preferred. In addition, the nitrogen-containing ring derivative is preferably an aromatic ring compound having a nitrogen-containing, 6- or 5-membered ring, or a fused aromatic ring compound having a nitrogen-containing, 6- or 5-membered ring.

The nitrogen-containing ring derivative is preferably, for example, a metal chelate complex of a nitrogen-containing ring represented by formula (A):

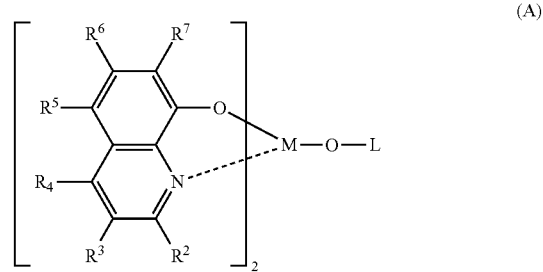

(A)

wherein each of $R^2$ to $R^7$ independently represents a hydrogen atom, a heavy hydrogen atom, a halogen atom, a hydroxyl group, an amino group, a hydrocarbon group having 1 to 40 carbon atoms, an alkoxy group having 1 to 40 carbon atoms, an aryloxy group having 6 to 50 carbon atoms, an alkoxycarbonyl group, or an aromatic heterocyclic group having 5 to 50 ring carbon atoms, each being optionally substituted.

The halogen atom may include fluorine, chlorine, bromine, and iodine.

The substituted amino group may include an alkylamino group, an arylamino group, and an aralkylamino group.

The alkylamino group and the aralkylamino group are represented by $-NQ^1Q^2$. Each of $Q^1$ and $Q^2$ independently represents an alkyl group having 1 to 20 carbon atoms or an aralkyl group having 1 to 20 carbon atoms. One of $Q^1$ and $Q^2$ may be a hydrogen atom or a heavy hydrogen atom.

The arylamino group is represented by $-NAr^1Ar^2$, wherein each of $Ar^1$ and $Ar^2$ independently represents a non-fused aromatic hydrocarbon groups or a fused aromatic hydrocarbon groups, each having 6 to 50 carbon atoms. One of $Ar^1$ and $Ar^2$ may be a hydrogen atom or a heavy hydrogen atom.

Examples of the hydrocarbon group having 1 to 40 carbon atoms include an alkyl group, an alkenyl group, a cycloalkyl group, an aryl group, and an aralkyl group.

The alkoxycarbonyl group is represented by $-COMY'$, wherein Y' is an alkyl group having 1 to 20 carbon atoms.

M is aluminum (Al), gallium (Ga), or indium (In), with In being preferred.

L is a group represented by formula (A') or (A"):

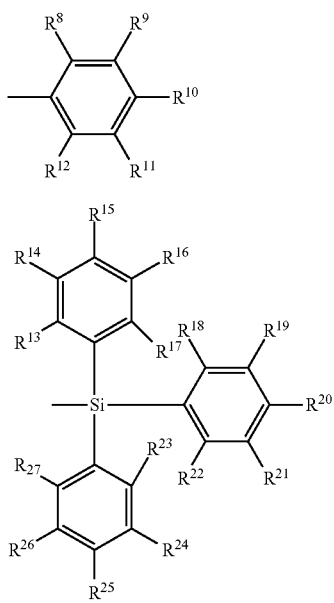

wherein each $R^8$ to $R^{12}$ independently represents a hydrogen atom, a heavy hydrogen atom or a substituted or unsubstituted hydrocarbon group having 1 to 40 carbon atoms. The adjacent two groups may form a ring structure. Each of $R^{13}$ to $R^{27}$ independently represents a hydrogen atom, a heavy hydrogen atom or a substituted or unsubstituted hydrocarbon group having 1 to 40 carbon atoms. The adjacent two groups may form a ring structure.

Examples of the hydrocarbon group having 1 to 40 carbon atoms for $R^8$ to $R^{12}$ and $R^{13}$ to $R^{27}$ in formulae (A') and (A") are the same as those described above with respect to $R^2$ to $R^7$ of formula (A). Examples of the divalent group formed by the adjacent two groups of $R^8$ to $R^{12}$ and $R^{13}$ to $R^{27}$ which completes the ring structure include tetramethylene group, pentamethylene group, hexamethylene group, diphenylmethane-2,2'-diyl group, diphenylethane-3,3'-diyl group, and diphenylpropane-4,4'-diyl group.

The electron transporting compound for the electron transporting layer is preferably a metal complex including 8-hydroxyquinoline or its derivative, an oxadiazole derivative, and a nitrogen-containing heterocyclic derivative. Examples of the metal complex including 8-hydroxyquinoline or its derivative include a metal chelate oxinoid including a chelated oxine (generally, 8-quinolinol or 8-hydroxyquinoline), for example, tris(8-quinolinol)aluminum. Examples of the oxadiazole derivative are shown below:

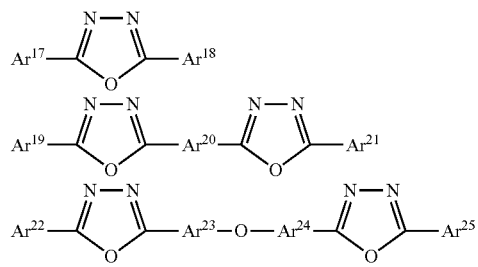

wherein each of $Ar^{17}$, $Ar^{18}$, $Ar^{19}$, $Ar^{21}$, $Ar^{22}$, and $Ar^{25}$ is a substituted or unsubstituted aromatic hydrocarbon group or a substituted or unsubstituted fused aromatic hydrocarbon group each having 6 to 50 carbon atoms, and $Ar^{17}$ and $Ar^{18}$, $Ar^{19}$ and $Ar^{21}$, and $Ar^{22}$ and $Ar^{25}$ may be the same or different. Examples of the aromatic hydrocarbon group and the fused aromatic hydrocarbon group include phenyl group, naphthyl group, a biphenyl group, anthranyl group, perylenyl group, and pyrenyl group. The optional substituent may be an alkyl group having 1 to 10 carbon atoms, an alkoxyl group having 1 to 10 carbon atoms or a cyano group.

Each of $Ar^{20}$, $Ar^{23}$, and $Ar^{24}$ is a substituted or unsubstituted bivalent aromatic hydrocarbon group or a substituted or unsubstituted bivalent fused aromatic hydrocarbon group each having 6 to 50 carbon atoms, and $Ar^{23}$ and $Ar^{24}$ may be the same or different. Examples of the bivalent aromatic hydrocarbon group or the bivalent fused aromatic hydrocarbon group include phenylene group, naphthylene group, biphenylene group, anthranylene group, perylenylene group, and pyrenylene group. The optional substituent may be an alkyl group having 1 to 10 carbon atoms, an alkoxyl group having 1 to 10 carbon atoms or a cyano group.

Electron transporting compounds which have a good thin film-forming property are preferably used. Examples of the electron transporting compound are shown below.

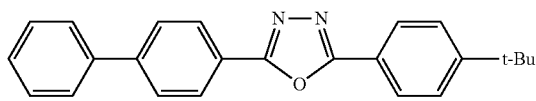
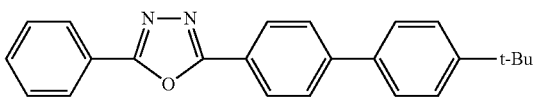

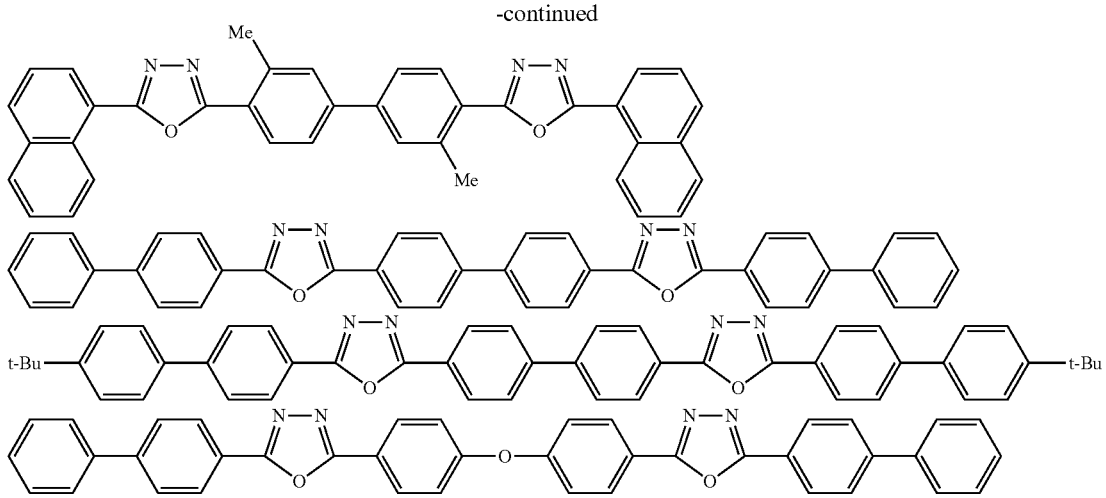

Examples of the nitrogen-containing heterocyclic derivative for use as the electron transporting compound include a nitrogen-containing heterocyclic derivative having the following formulae but exclusive of metal complex, for example, a compound having a 5- or 6-membered ring which has the skeleton represented by formula (B) or having the structure represented by formula (C):

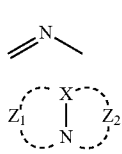

wherein X is a carbon atom or a nitrogen atom and each of $Z_1$ and $Z_2$ independently represents a group of atoms for completing the nitrogen-containing heteroring.

The nitrogen-containing heterocyclic derivative is more preferably an organic compound which has a nitrogen-containing aromatic polycyclic ring comprising a 5-membered ring or a 6-membered ring. If two or more nitrogen atoms are included, the nitrogen-containing aromatic polycyclic compound preferably has a skeleton of a combination of (B) and (C) or a combination of (B) and (D):

The nitrogen-containing group of the nitrogen-containing aromatic polycyclic compound is selected, for example, from the nitrogen-containing heterocyclic groups shown below:

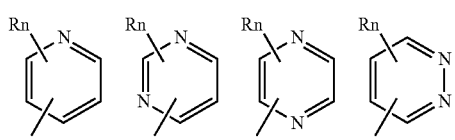

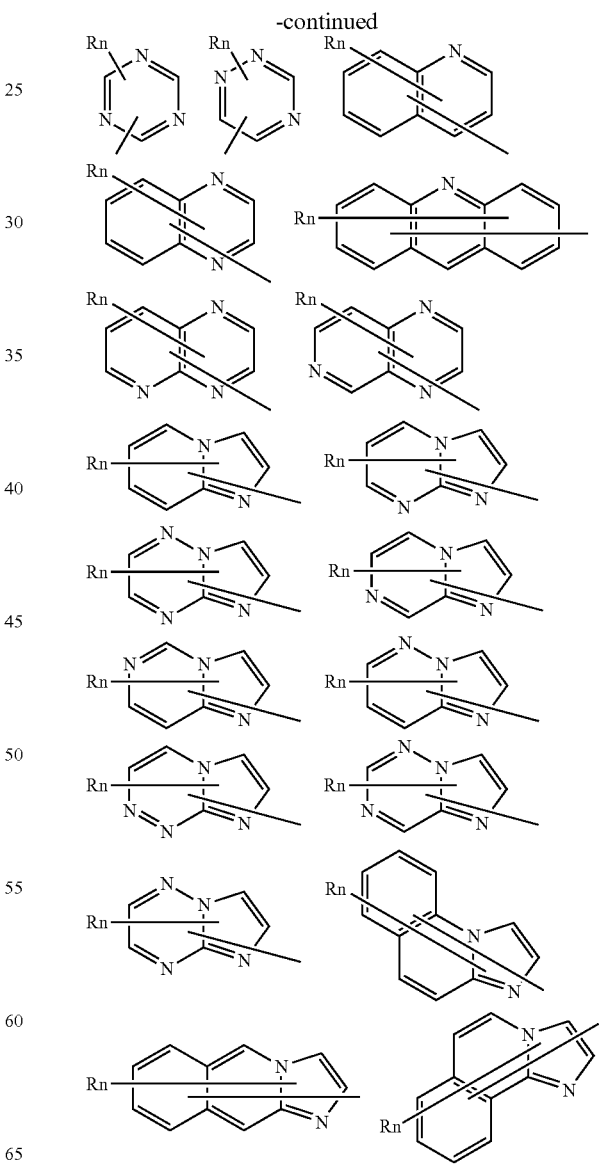

wherein R is an aromatic hydrocarbon group or a fused aromatic hydrocarbon group each having 6 to 40 carbon atoms, an aromatic heterocyclic group or a fused aromatic heterocyclic group each having 3 to 40 carbon atoms, an alkyl group having 1 to 20 carbon atoms, or an alkoxy group having 1 to 20 carbon atoms; and n is an integer of 0 to 5. If n is an integer of 2 or more, R groups may be the same or different.

More preferred is a nitrogen-containing heterocyclic derivative represented by formula (D1):

wherein HAr is a substitute or unsubstituted nitrogen-containing heterocyclic group having 3 to 40 carbon atoms; $L^1$ is a single bond, a substituted or unsubstituted aromatic hydrocarbon group or fused aromatic hydrocarbon group each having 6 to 40 carbon atoms, or a substituted or unsubstituted aromatic heterocyclic group or fused aromatic heterocyclic group each having 3 to 40 carbon atoms; $Ar^1$ is a substitute or unsubstituted divalent aromatic hydrocarbon group having 6 to 40 carbon atoms; and $Ar^2$ is a substitute or unsubstituted aromatic hydrocarbon group or fused aromatic hydrocarbon group each having 6 to 40 carbon atoms or a substituted or unsubstituted aromatic heterocyclic group or fused aromatic heterocyclic group each having 3 to 40 carbon atoms.

HAr is selected, for example, from the following groups:

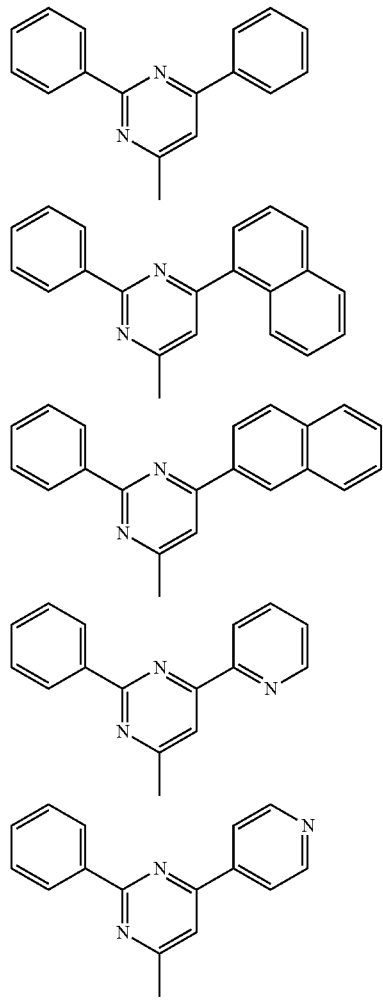

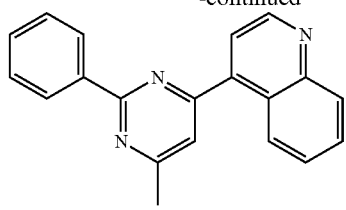

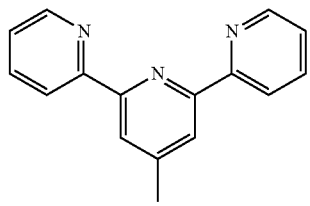

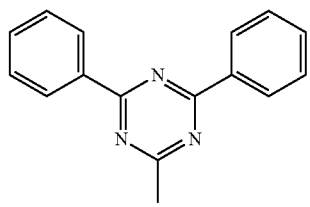

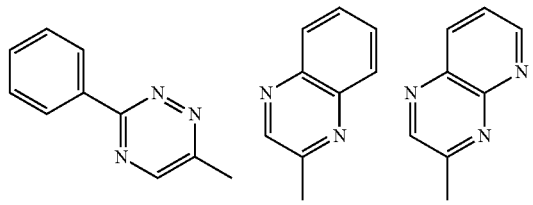

-continued

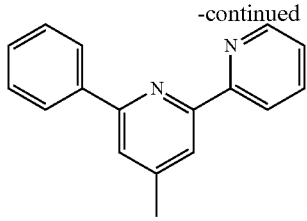

$L^1$ is selected, for example, from the following groups:

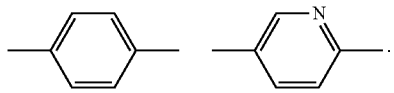

$Ar^1$ is selected, for example, from the following groups represented by formula (D2) or (D3):

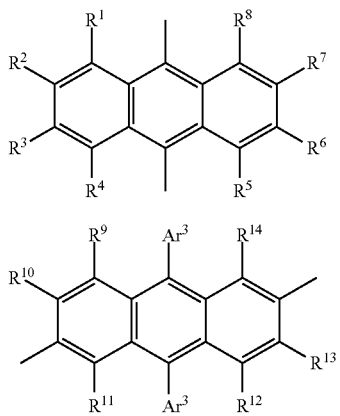

(D2)

(D3)

wherein $R^1$ to $R^{14}$ are each independently a hydrogen atom, a halogen atom, an alkyl group having 1 to 20 carbon atoms, an alkoxy group having 1 to 20 carbon atoms, an aryloxy group having 6 to 40 carbon atoms, a substituted or unsubstituted aromatic hydrocarbon group or fused aromatic hydrocarbon group each having 6 to 40 carbon atoms, or a substituted or unsubstituted aromatic heterocyclic group or fused aromatic heterocyclic group each having 3 to 40 carbon atoms; and $Ar^3$ is a substituted or unsubstituted aromatic hydrocarbon group or fused aromatic hydrocarbon group each having 6 to 40 carbon atoms or a substituted or unsubstituted aromatic heterocyclic group or fused aromatic heterocyclic group each having 3 to 40 carbon atoms. Each of $R^1$ to $R^8$ may be selected from a hydrogen atom and a heavy hydrogen atom.

$Ar^2$ is selected, for example, from the following groups:

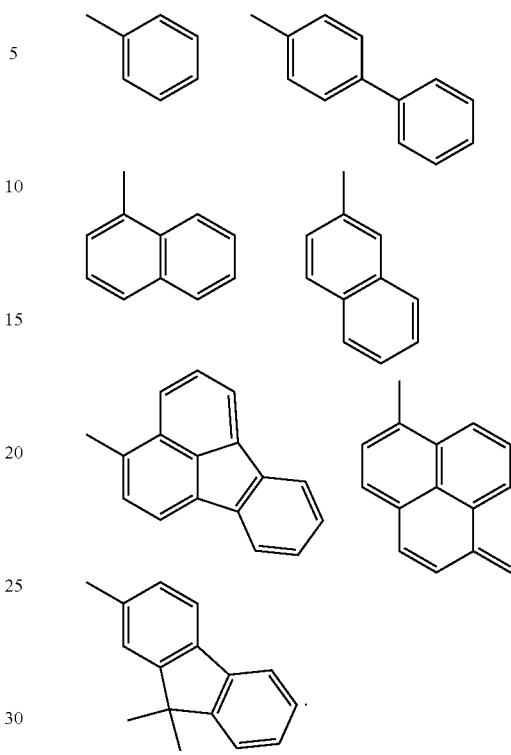

In addition, the following compound is preferably used as the nitrogen-containing aromatic polycyclic compound for use as the electron transporting compound:

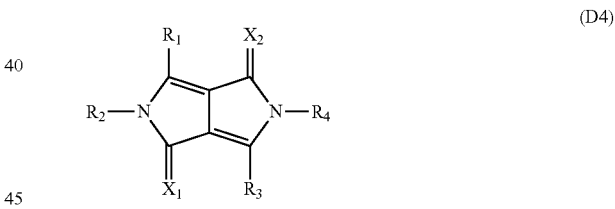

(D4)

wherein $R_1$ to $R_4$ each independently represent a hydrogen atom, a heavy hydrogen atom, a substituted or unsubstituted aliphatic group having 1 to 20 carbon atoms, a substituted or unsubstituted alicyclic group having 3 to 20 carbon atoms, a substituted or unsubstituted aromatic ring group having 6 to 50 carbon atoms, or a substituted or unsubstituted heterocyclic group having 3 to 50 carbon atoms; and $X_1$ and $X_2$ each independently represent an oxygen atom, a sulfur atom, or a dicyanomethylene group.

Further, the following compound is also suitable as the electron transporting compound:

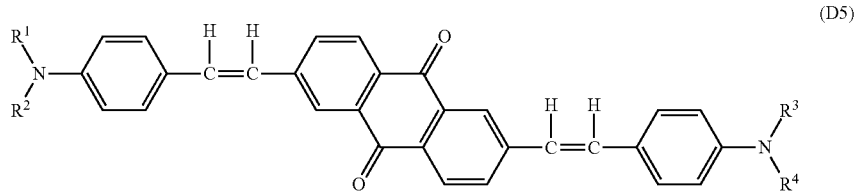

(D5)

wherein $R^1$, $R^2$, $R^3$, and $R^4$ may be the same or different and each represents an aromatic hydrocarbon group or a fused aromatic hydrocarbon group each represented by formula (D6);

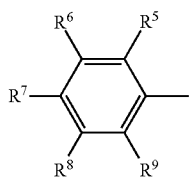

wherein $R^5$, $R^6$, $R^7$, $R^8$, and $R^9$ may be the same or different and each represents a hydrogen atom, a heavy hydrogen atom, a saturated or unsaturated alkoxyl group having 1 to 20 carbon atoms, a saturated or unsaturated alkyl group having 1 to 20 carbon atoms, an amino group, or an alkylamino group having 1 to 20 carbon atoms. At least one of $R^5$, $R^6$, $R^7$, $R^8$, and $R^9$ represents a group other than a hydrogen atom and a heavy hydrogen atom.

Further, a polymer having the nitrogen-containing heterocyclic group or the nitrogen-containing heterocyclic derivative is also usable as the electron transporting compound.

The electron transporting layer in the organic EL device of the invention preferably comprises at least one compound selected from the nitrogen-containing heterocyclic derivatives represented by formulae (E) to (G):

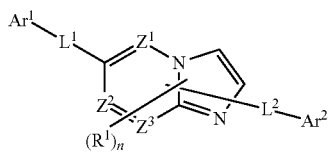

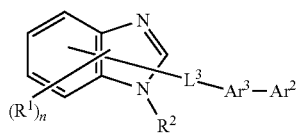

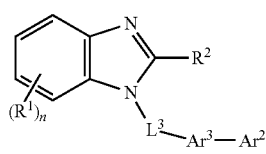

wherein $Z^1$, $Z^2$, and $Z^3$ each independently represent a nitrogen atom or a carbon atom;

$R^1$ and $R^2$ each independently represent a substituted or unsubstituted aryl group having 6 to 50 ring carbon atoms, a substituted or unsubstituted heteroaryl group having 5 to 50 ring atoms, a substituted or unsubstituted alkyl group having 1 to 20 carbon atoms, a substituted or unsubstituted haloalkyl group having 1 to 20 carbon atoms, or a substituted or unsubstituted alkoxyl group having 1 to 20 carbon atoms;

n is an integer of 0 to 5, when n is an integer of 2 or more, $R^1$ groups may be the same or different, and the adjacent two $R^1$ groups may bond to each other to form a substituted or unsubstituted hydrocarbon ring;

$Ar^1$ represents a substituted or unsubstituted aryl group having 6 to 50 ring carbon atoms or a substituted or unsubstituted heteroaryl group having 5 to 50 ring atoms;

$Ar^2$ represents a hydrogen atom, a substituted or unsubstituted alkyl group having 1 to 20 carbon atoms, a substituted or unsubstituted haloalkyl group having 1 to 20 carbon atoms, a substituted or unsubstituted alkoxyl group having 1 to 20 carbon atoms, a substituted or unsubstituted aryl group having 6 to 50 ring carbon atoms, or a substituted or unsubstituted heteroaryl group having 5 to 50 ring atoms;

provided that one of $Ar^1$ and $Ar^2$ is a substituted or unsubstituted condensed aromatic hydrocarbon ring group having 10 to 50 ring carbon atoms or a substituted or unsubstituted condensed aromatic heterocyclic group having 9 to 50 ring atoms;

$Ar^3$ represents a substituted or unsubstituted arylene group having 6 to 50 ring carbon atoms or a substituted or unsubstituted heteroarylene group having 5 to 50 ring atoms; and $L^1$, $L^2$, and $L^3$ each independently represent a single bond, a substituted or unsubstituted arylene group having 6 to 50 ring carbon atoms or a substituted or unsubstituted divalent condensed aromatic heterocyclic group having 9 to 50 ring atoms.

Examples of the aryl group having 6 to 50 ring carbon atoms include phenyl group, naphthyl group, anthryl group, phenanthryl group, naphthacenyl group, chrysenyl group, pyrenyl group, a biphenyl group, terphenyl group, tolyl group, fluoranthenyl group, and fluorenyl group.

Examples of the heteroaryl group having 5 to 50 ring atoms include pyrrolyl group, furyl group, thiophenyl group, silolyl group, pyridyl group, quinolyl group, isoquinolyl group, benzofuryl group, imidazolyl group, pyrimidyl group, carbazolyl group, selenophenyl group, oxadiazolyl group, triazolyl group, pyrazinyl group, pyridazinyl group, triazinyl group, quinoxalinyl group, acridinyl group, imidazo[1,2-a]pyridinyl group, and imidazo[1,2-a]pyrimidinyl.

Examples of the alkyl group having 1 to 20 carbon atoms include methyl group, ethyl group, propyl group, butyl group, pentyl group, and hexyl group.

Examples of the haloalkyl group having 1 to 20 carbon atoms include the groups obtained by replacing one or more hydrogen atoms of the alkyl group mentioned above with at least one halogen atom selected from fluorine, chlorine, iodine, and bromine.

Examples of the alkyl moiety of the alkoxyl group having 1 to 20 carbon atoms include the alkyl group mentioned above.

Examples of the arylene groups include the groups obtained by removing one hydrogen atom from the aryl group mentioned above.

Examples of the divalent condensed aromatic heterocyclic group having 9 to 50 ring atoms include the groups obtained by removing one hydrogen atom from the condensed aromatic heterocyclic group mentioned above as the heteroaryl group.

The thickness of the electron transporting layer is preferably, but not particularly limited to, 1 to 100 nm.

Preferred examples of the material for a electron injecting layer optionally formed adjacent to the electron transporting layer include, in addition to the nitrogen-containing ring derivative, an inorganic compound, such as an insulating material and a semiconductor. The electron injecting layer containing the insulating material or the semiconductor effectively prevents the leak of electric current to enhance the electron injecting properties.

The insulating material is preferably at least one metal compound selected from the group consisting of alkali metal chalcogenides, alkaline earth metal chalcogenides, alkali metal halides and alkaline earth metal halides. The alkali metal chalcogenide, etc. mentioned above are preferred because the electron injecting properties of the electron injecting layer are further enhanced. Examples of preferred alkali metal chalcogenide include Li$_2$O, K$_2$O, Na$_2$S, Na$_2$Se and Na$_2$O, and examples of preferred alkaline earth metal chalcogenide include CaO, BaO, SrO, BeO, BaS and CaSe. Examples of preferred alkali metal halide include LiF, NaF, KF, LiCl, KCl and NaCl. Examples of the alkaline earth metal halide include fluorides, such as CaF$_2$, BaF$_2$, SrF$_2$, MgF$_2$ and BeF$_2$, and halides other than fluorides.

Examples of the semiconductor include oxides, nitrides or oxynitrides of at least one element selected from the group consisting of Ba, Ca, Sr, Yb, Al, Ga, In, L$^1$, Na, Cd, Mg, Si, Ta, Sb and Zn. The semiconductor may be used alone or in combination of two or more. The inorganic compound included in the electron injecting layer preferably forms a microcrystalline or amorphous insulating thin film. If the electron injecting layer is formed from such an insulating thin film, the pixel defects, such as dark spots, can be decreased because a more uniform thin film is formed. Examples of such inorganic compound include the alkali metal chalcogenide, the alkaline earth metal chalcogenide, the alkali metal halide and the alkaline earth metal halide.

When using the insulating material or the semiconductor, the thickness of its layer is preferably about 0.1 to 15 nm. The electron injecting layer in the invention may contain the electron-donating dopant mentioned above.

Hole Transporting Layer

The hole injecting/transporting layer is an organic layer formed between the light emitting layer and the anode and has a function of transporting holes from the anode to the light emitting layer. When the hole transporting layer is formed by two or more layers, the layer closer to the anode may be defined as the hole injecting layer in some cases. The hole injecting layer has a function of efficiently injecting holes from the anode to the organic layer unit. The material for organic EL device of the invention may be used in the hole transporting layer as a hole transporting material.

Another preferred material for the hole transporting layer may include an aromatic amine compound, for example, an aromatic amine derivative represented by formula (H):

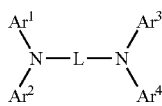

(H)

wherein each of Ar$^1$ to Ar$^4$ represents a substituted or unsubstituted aromatic hydrocarbon group or fused aromatic hydrocarbon group having 6 to 50 ring carbon atoms, a substituted or unsubstituted aromatic heteroaryl group or fused aromatic heteroaryl group having 5 to 50 ring atoms, or a group wherein the aromatic hydrocarbon group or fused aromatic hydrocarbon group is bonded to the aromatic heteroaryl group or fused aromatic heteroaryl group.

L represents a substituted or unsubstituted aromatic hydrocarbon group or fused aromatic hydrocarbon group having 6 to 50 ring carbon atoms or a substituted or unsubstituted aromatic heteroaryl group or fused aromatic heteroaryl group having 5 to 50 ring atoms.

Examples of the compound represented by formula (H) are shown below.

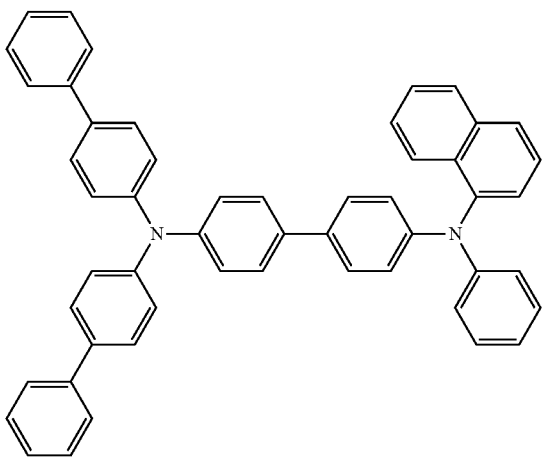

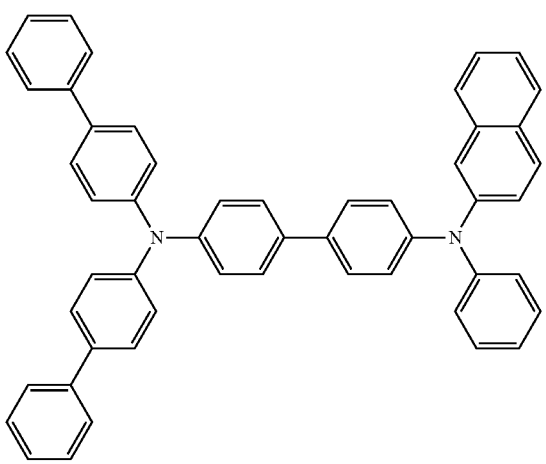

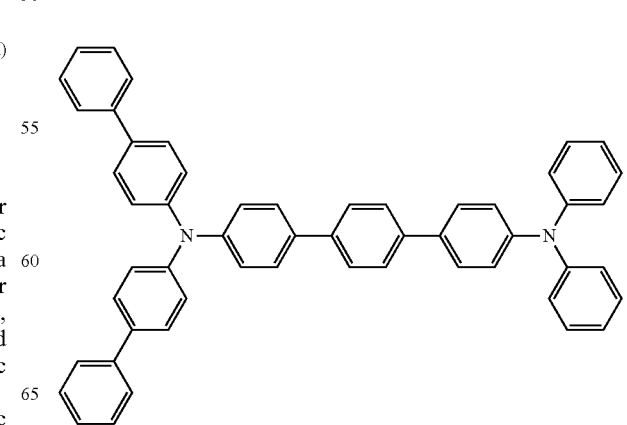

205
-continued
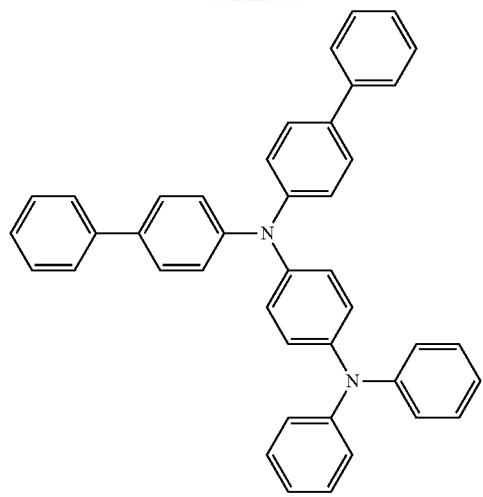
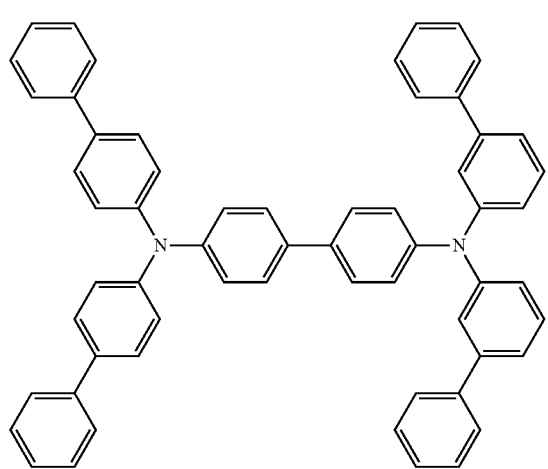
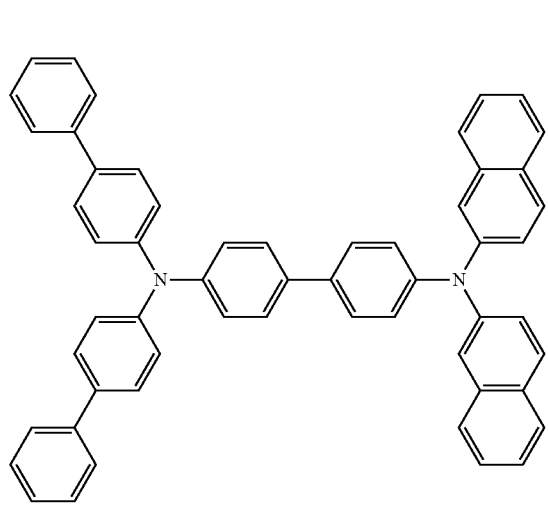
206
-continued
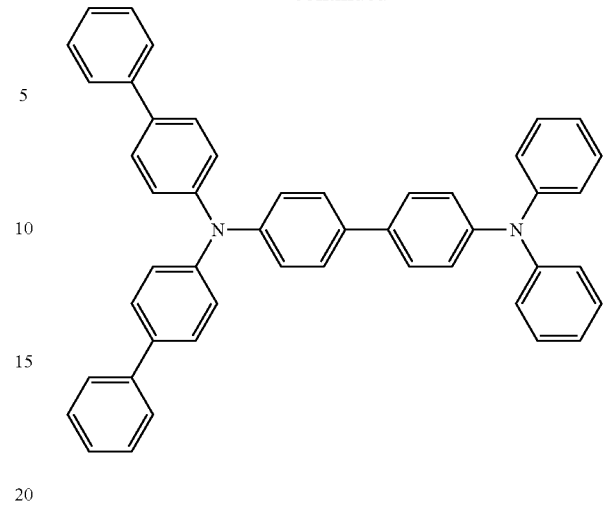
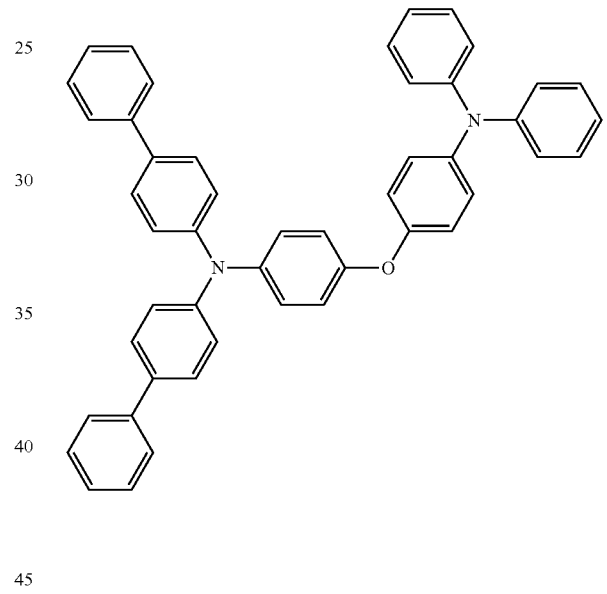
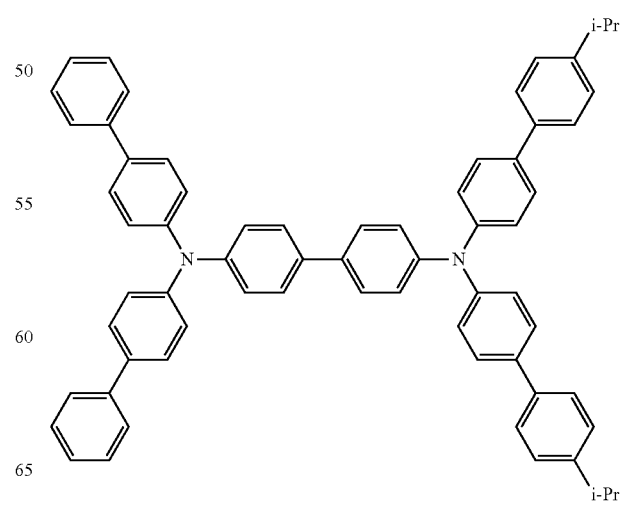

207
-continued
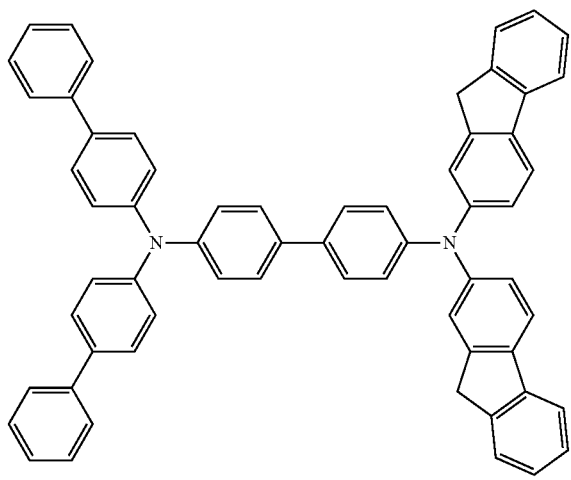
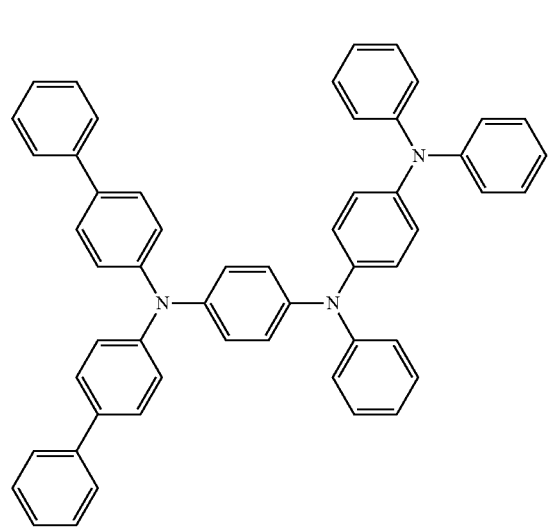
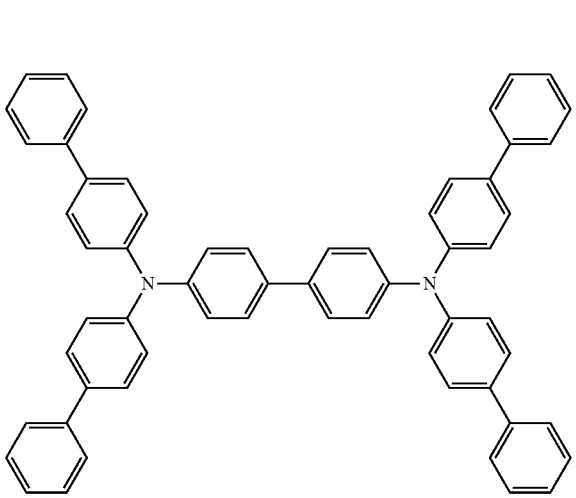
208
-continued
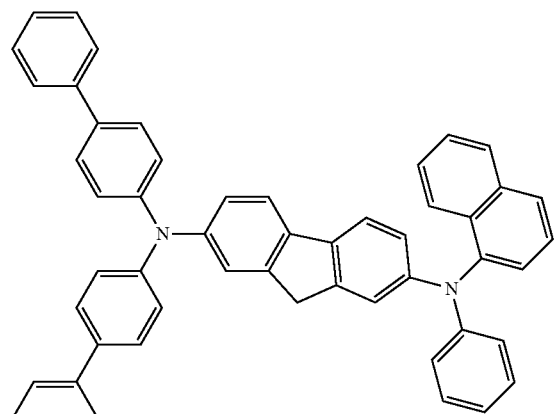
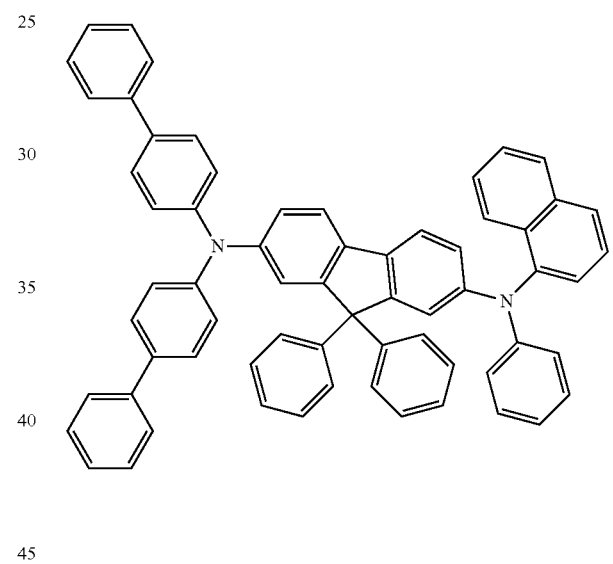
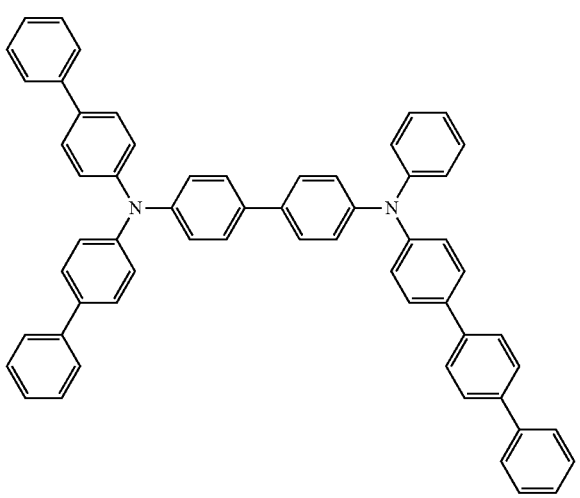

209
-continued
210
-continued
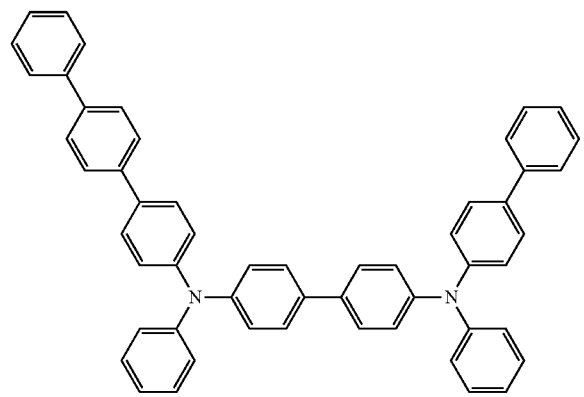
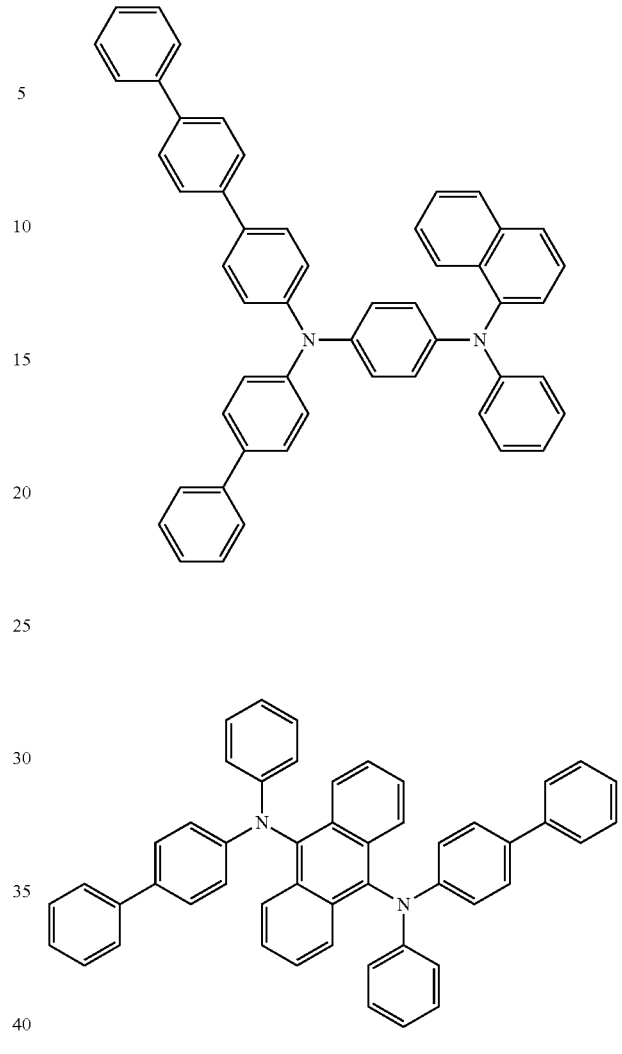
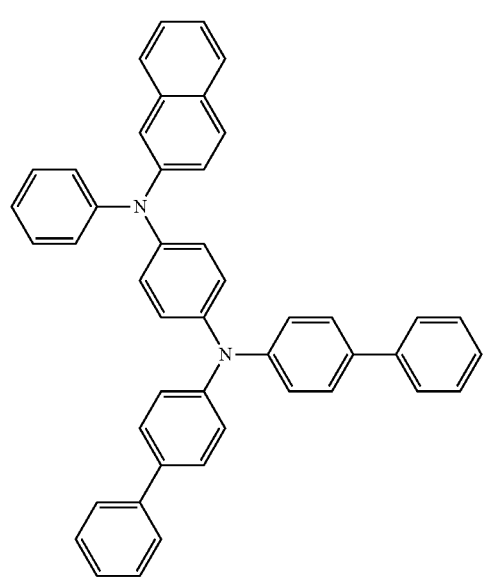
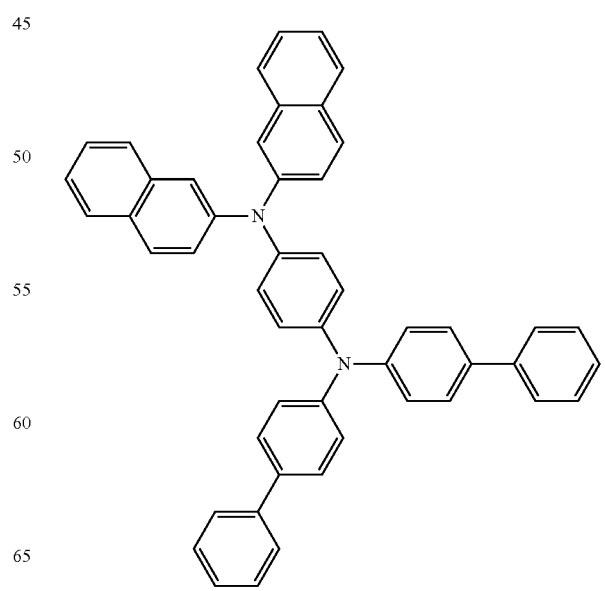

211
-continued
212
-continued
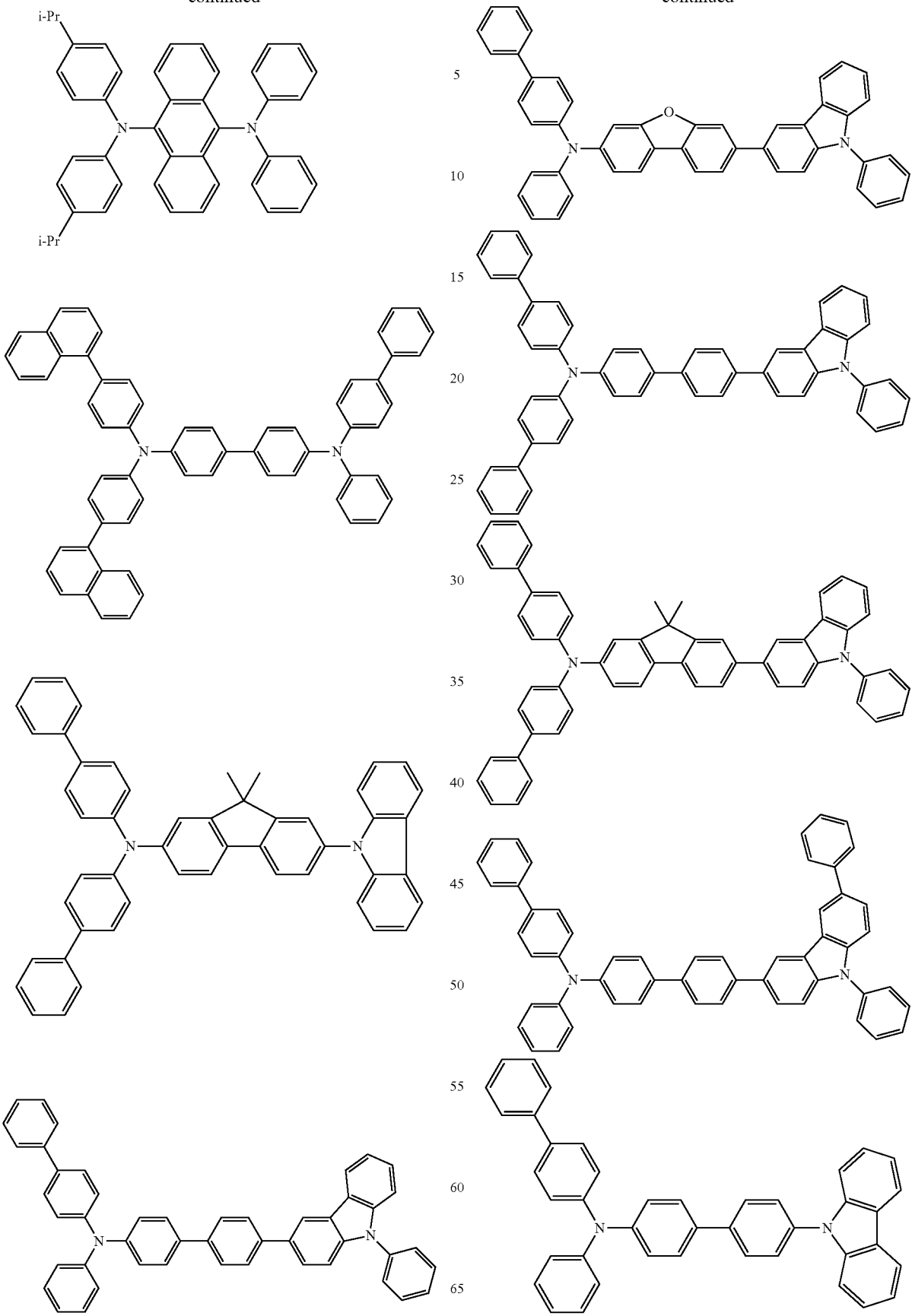

-continued
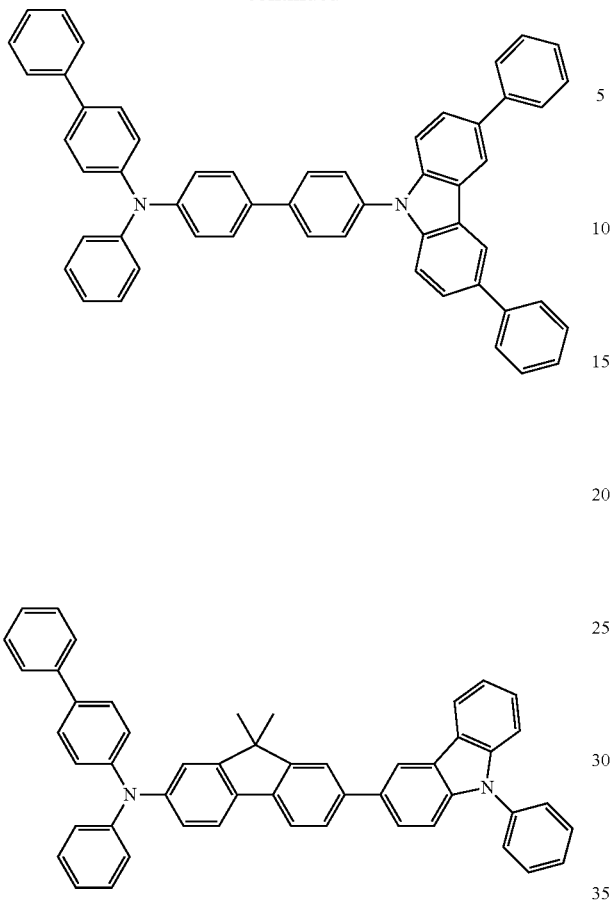
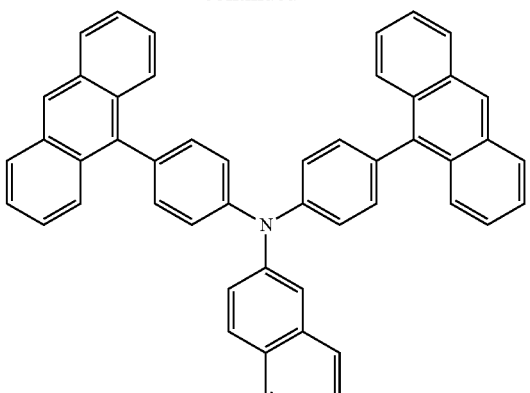
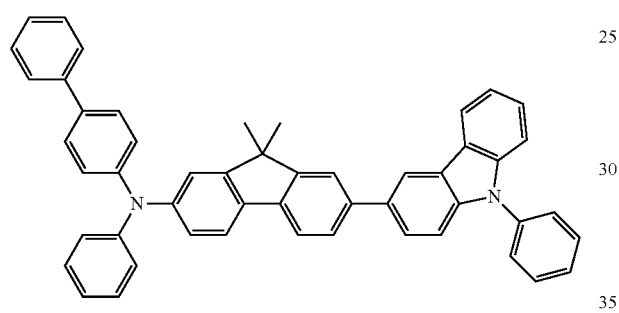
An aromatic amine represented by formula (J) is also preferably used to form the hole transporting layer:
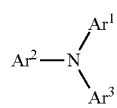
(J)
wherein $Ar^1$ to $Ar^3$ are the same as defined with respect to $Ar^1$ to $Ar^4$ of formula (H). Examples of the compound represented by formula (J) are shown below, although not limited thereto.
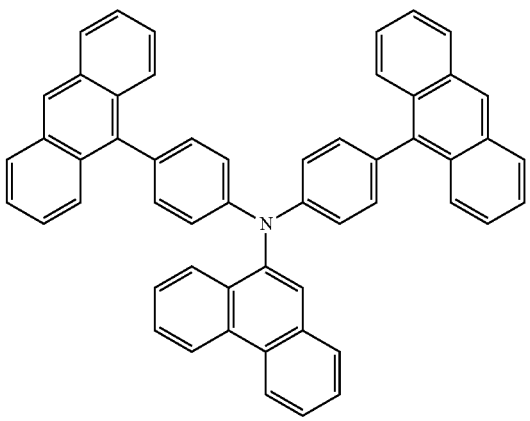
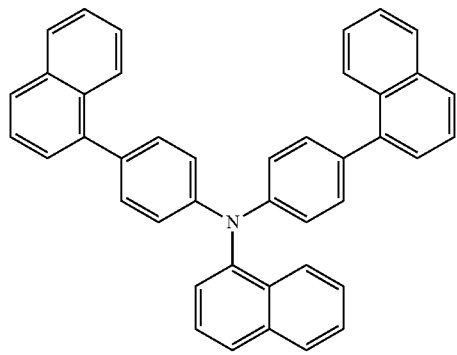
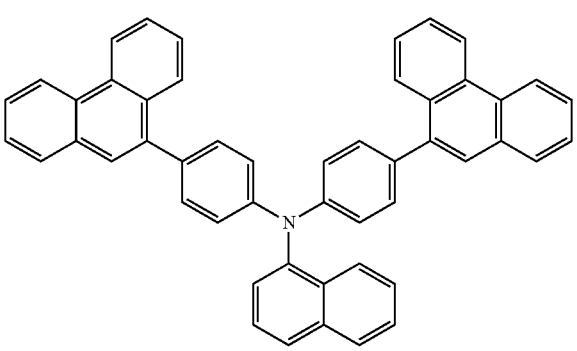

215
-continued
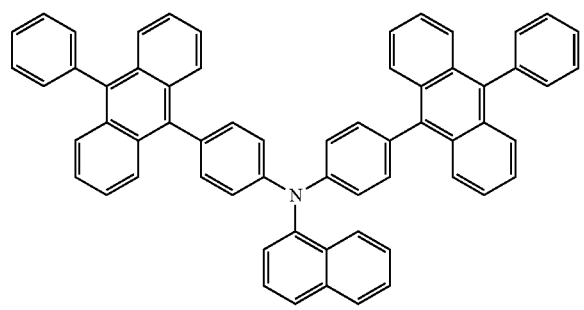
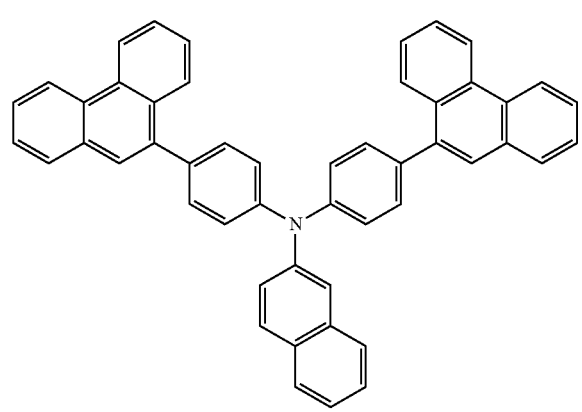
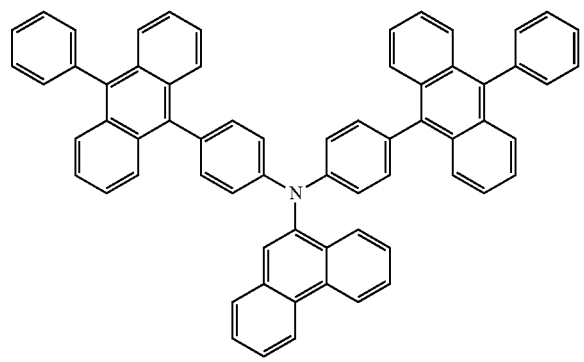
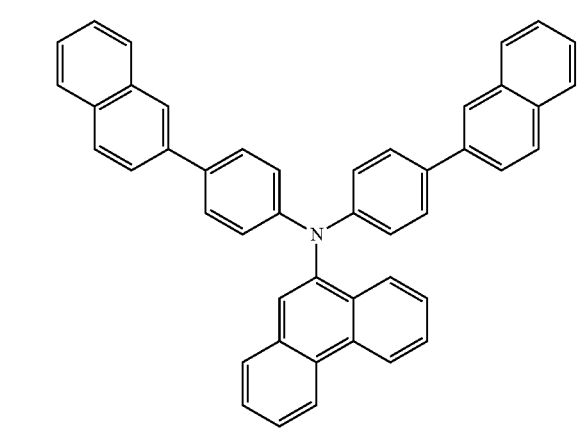
216
-continued
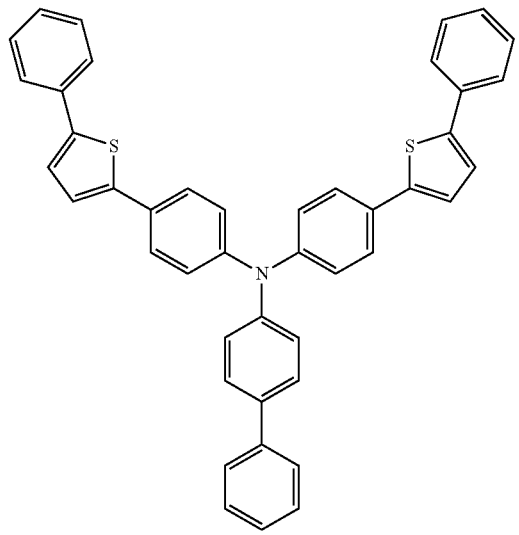
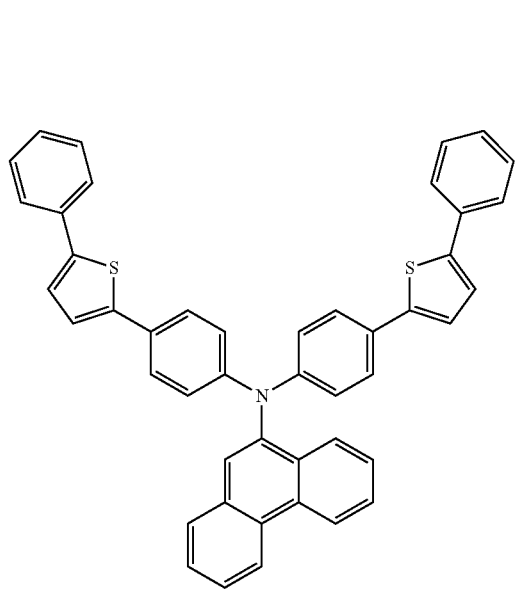

217
-continued

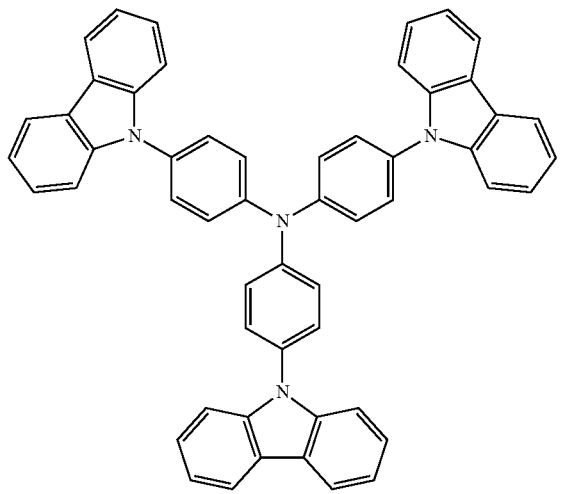

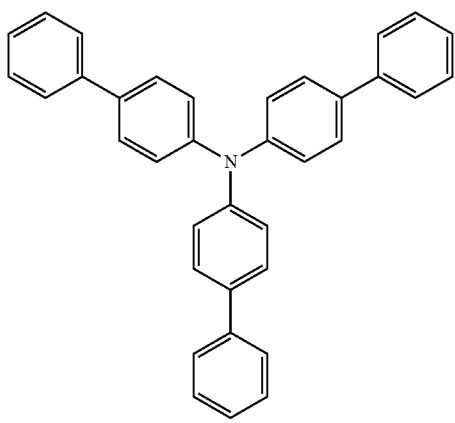

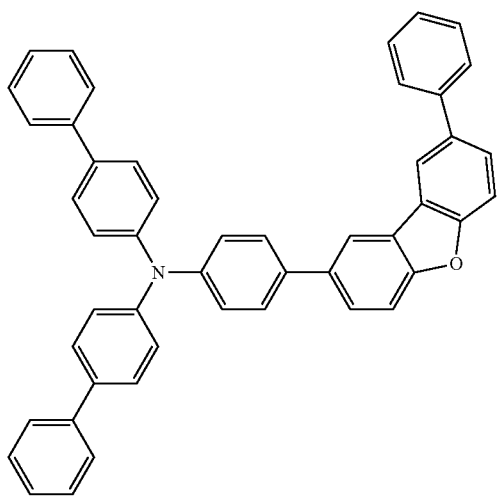

218
-continued

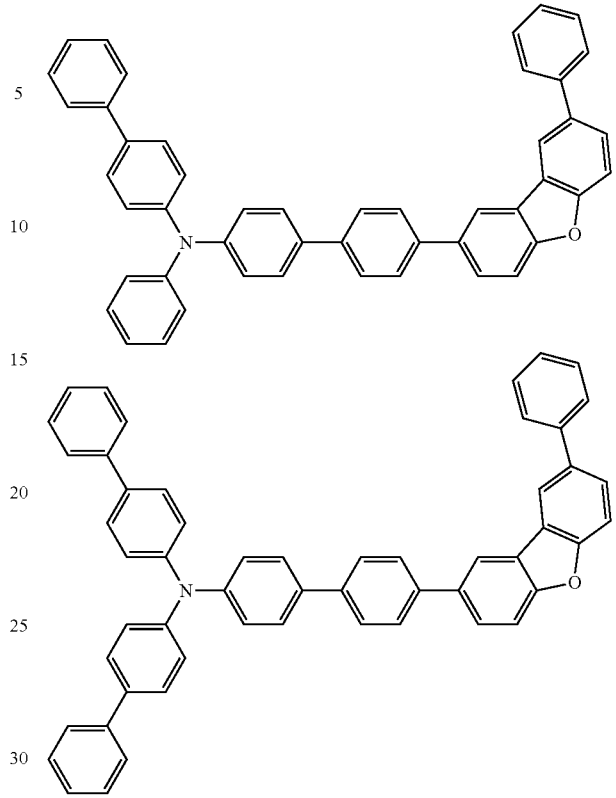

The hole transporting layer may be made into two-layered structure of a first hole transporting layer (anode side) and a second hole transporting layer (cathode side).

The thickness of the hole transporting layer is preferably 10 to 200 nm, although not particularly limited thereto.

The organic EL device of the invention may have a layer comprising an acceptor material which is disposed in contact with the anode side of each of the hole transporting layer and the first hole transporting layer. With such a layer, it is expected that the driving voltage is lowered and the production cost is reduced.

The acceptor material is preferably a compound represented by formula (K):

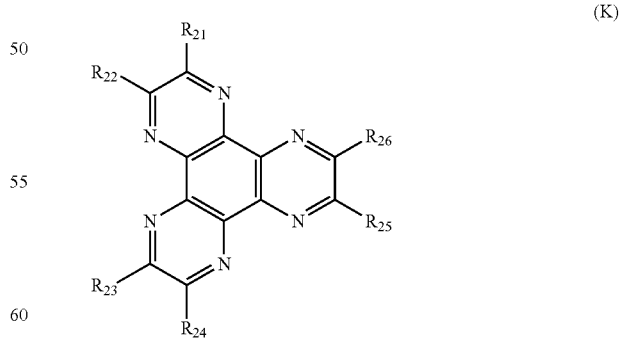

(K)

wherein $R_{21}$ to $R_{26}$ may be the same or different and each independently represent a cyano group, —$CONH_2$, a carboxyl group, or —$COOR_{27}$ wherein $R_{27}$ represents an alkyl group having 1 to 20 carbon atoms or a cycloalkyl group having 3 to 20 carbon atoms. One or more of a pair of $R_{21}$ and $R_{22}$, a pair of $R_{23}$ and $R_{24}$, and a pair of $R_{25}$ and $R_{26}$ may bond to each other to form a group represented by —CO—O—CO—.

Examples of $R_{27}$ include methyl group, ethyl group, n-propyl group, isopropyl group, n-butyl group, isobutyl group, t-butyl group, cyclopentyl group, and cyclohexyl group.

The thickness of the layer comprising the acceptor material is preferably 5 to 20 nm, although not particularly limited thereto.

N/P Doping

The carrier injecting properties of the hole transporting layer and the electron transporting layer can be controlled by, as described in JP 3695714B, the doping (n) with a donor material or the doping (p) with an acceptor material.

A typical example of the n-doping is an electron transporting material doped with a metal, such as Li and Cs, and a typical example of the p-doping is a hole transporting material doped with an acceptor material, such as $F_4TCNQ$ (2,3,5,6-Tetrafluoro-7,7,8,8-tetracyanoquinodimethane).

Space Layer

For example, in an organic EL device wherein a fluorescent light emitting layer and a phosphorescent light emitting layer are laminated, a space layer is disposed between the fluorescent light emitting layer and the phosphorescent light emitting layer to prevent the diffusion of excitons generated in the phosphorescent light emitting layer to the fluorescent light emitting layer or to control the carrier balance. The space layer may be disposed between two or more phosphorescent light emitting layers.

Since the space layer is disposed between the light emitting layers, a material combining the electron transporting ability and the hole transporting ability is preferably used for forming the space layer. To prevent the diffusion of triplet energy in the adjacent phosphorescent light emitting layer, the triplet energy of the material for the space layer is preferably 2.6 eV or more. The materials described with respect to the hole transporting layer are usable as the material for the space layer. The material for organic EL device of the invention may be used as the material for the space layer.

Blocking Layer

The organic EL device of the invention preferably has a blocking layer, such as an electron blocking layer, a hole blocking layer, and a triplet blocking layer, which is disposed adjacent to the light emitting layer. The electron blocking layer is a layer which prevents the diffusion of electrons from the light emitting layer to the hole transporting layer. The hole blocking layer is a layer which prevents the diffusion of holes from the light emitting layer to the electron transporting layer. The material for organic EL device of the invention may be used as the material for the hole blocking layer.

The triplet blocking layer prevents the diffusion of triplet excitons generated in the light emitting layer to adjacent layers and has a function of confining the triplet excitons in the light emitting layer, thereby preventing the deactivation of energy on molecules other than the emitting dopant of triplet excitons, for example, on molecules in the electron transporting layer.

If a phosphorescent device having a triplet blocking layer satisfies the following energy relationship:

$$E^T_d < E^T_{TB}$$

wherein $E^T_{TB}$ is the triplet energy of the phosphorescent dopant in the light emitting layer and $E^T_{TB}$ is the triplet energy of the compound forming the triplet blocking layer, the triplet excitons of phosphorescent dopant are confined (not diffuse to other molecules). Therefore, the energy deactivation process other than the emission on the phosphorescent dopant may be prevented to cause the emission with high efficiency. However, even in case of satisfying the relationship of $E^T_d < E^T_{TB}$, the triplet excitons may move into other molecules if the energy difference ($\Delta E^T = E^T_{TB} - E^T_d$) is small, because the energy difference $\Delta E^T$ may be overcome by the absorption of ambient heat energy when driving a device at around room temperature as generally employed in practical drive of device. As compared with the fluorescent emission, the phosphorescent emission is relatively likely to be affected by the diffusion of excitons due to the heat absorption because the lifetime of triplet excitons is longer. Therefore, as for the energy difference $\Delta E^T$, the larger as compared with the heat energy of room temperature, the better. The energy difference $\Delta E^T$ is more preferably 0.1 eV or more and particularly preferably 0.2 eV or more. In fluorescent devices, the material for organic EL device of the invention is usable as the material for triplet blocking layer of the TTF device described in WO 2010/134350A$_1$.

The electron mobility of the material for the triplet blocking layer is preferably $10^{-6}$ cm$^2$/Vs or more at an electric field strength in a range of 0.04 to 0.5 MV/cm. There are several methods for measuring the electron mobility of organic material, for example, Time of Flight method. In the present invention, the electron mobility is determined by impedance spectroscopy.

The electron mobility of the electron injecting layer is preferably $10^{-6}$ cm$^2$/Vs or more at an electric field strength in a range of 0.04 to 0.5 MV/cm. Within the above range, the injection of electrons from the cathode to the electron transporting layer is promoted and the injection of electrons to the adjacent blocking layer and light emitting layer is also promoted, thereby enabling to drive a device at lower voltage.

The organic electroluminescence device of the invention can be used in electronic equipment, for example, as display parts, such as organic EL panel module, display devices of television sets, mobile phones, personal computer, etc., and light emitting sources of lighting equipment and vehicle lighting equipment.

EXAMPLES

The present invention will be described in more detail with reference to the examples. However, it should be noted that the scope of the invention is not limited to the following examples.

Example 1: Synthesis of Compound 1

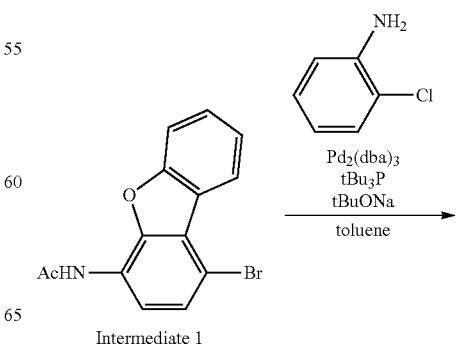

Intermediate 1

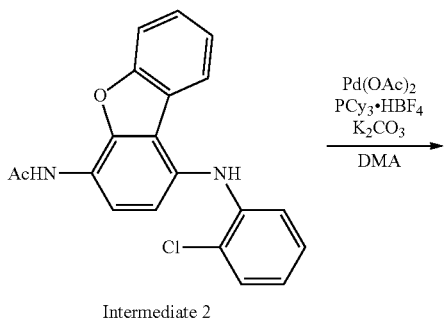

Intermediate 2

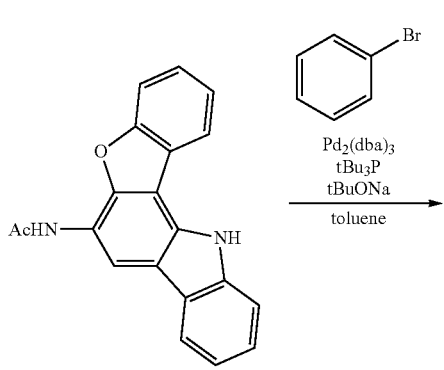

Intermediate 3

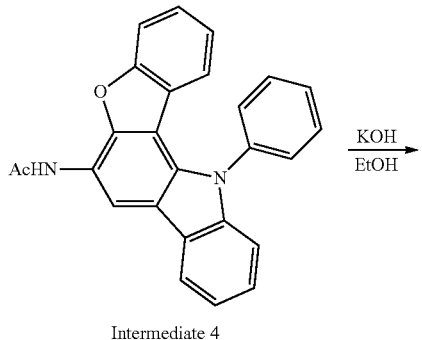

Intermediate 4

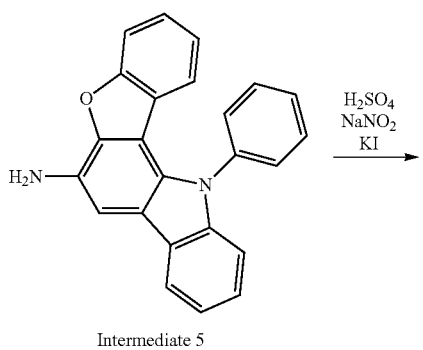

Intermediate 5

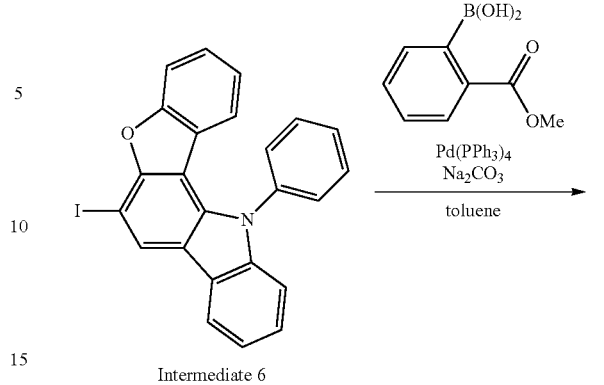

Intermediate 6

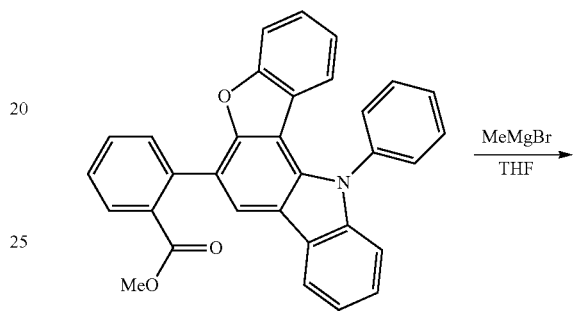

Intermediate 7

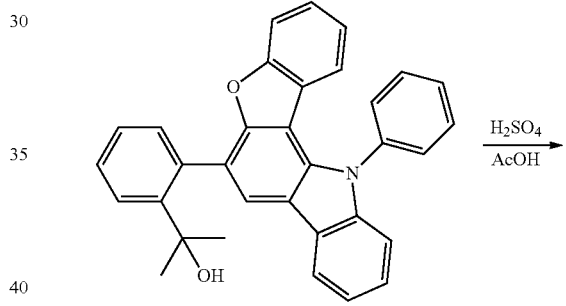

Intermediate 8

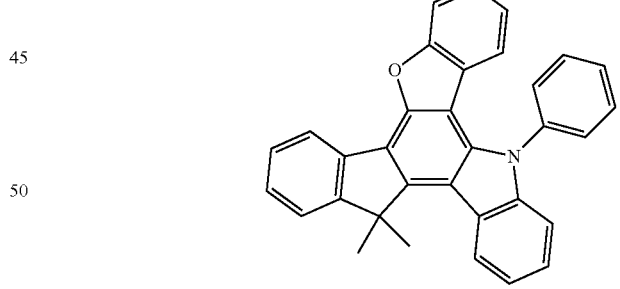

Compound 1

Synthesis of Intermediate 2

In an argon atmosphere, a mixture of a known intermediate 1 (15.3 g), 2-chloroaniline (12.8 g), tris(dibenzylideneacetone) dipalladium(0) (457 mg), tri-t-butylphosphine (202.3 mg), sodium t-butoxide (6.7 g), and toluene (200 mL) was stirred at 40° C. for 7 h. The obtained reaction mixture was cooled to room temperature and filtered through Celite® pad, and then, the solvent was removed by evaporation. The obtained residue was purified by silica gel column chromatography and recrystallization to obtain the intermediate 2 (8.59 g). The yield was 49%.

Synthesis of Intermediate 3

In an argon atmosphere, the intermediate 2 (3.05 g), palladium acetate (58 mg), potassium carbonate (2.4 g), tricyclohexylphosphine tetrafluorohydroborate (192 mg), and N,N-dimethylacetamide (75 mL) were charged into a flask, and the resulting mixture was stirred at 130° C. for 24 h under heating. The obtained reaction mixture was cooled to room temperature and extracted with toluene. Insolubles were removed by filtration. The filtrate was evaporated under reduced pressure, and the obtained residue was purified by silica gel column chromatography to obtain the intermediate 3 (1.09 g). The yield was 40%.

Synthesis of Intermediate 4

In an argon atmosphere, a mixture of the intermediate 3 (2.10 g), bromobenzene (771 µL), tris(dibenzylideneacetone) dipalladium(0) (122 mg), tri-t-butylphosphine (54 mg), sodium t-butoxide (899 mg), and toluene (27 mL) was stirred for 7 h by refluxing under heating. The obtained reaction mixture was cooled to room temperature and filtered through Celite® pad, and then, the solvent was removed by evaporation. The obtained residue was purified by silica gel column chromatography and recrystallization to obtain the intermediate 4 (1.83 g). The yield was 70%.

Synthesis of Intermediate 5

A mixture of the intermediate 4 (2.9 g) and potassium hydroxide (2.5 g) in 100 mL of ethanol was stirred at room temperature for 48 h. The obtained reaction mixture was neutralized with hydrochloric acid under ice cooling and extracted with toluene. The toluene layer was washed with brine and dried over anhydrous sodium sulfate, and then, the solvent was removed by evaporation under reduced pressure. The obtained residue was purified by silica gel chromatography to obtain the intermediate 5 (1.89 g). The yield was 73%.

Synthesis of Intermediate 6

Into a mixture of the intermediate 5 (3.98 g) and water (80 mL) in a flask, a concentrated sulfuric acid (1.22 mL) was added dropwise under stirring and the resulting mixture was stirred at 100° C. for 3 h. After standing to cool and adding a solution of sodium nitrite (1.73 g) in 8 mL of water dropwise over an iced water bath, the obtained reaction mixture was stirred for one hour. A solution of potassium iodide (11.37 g) in 20 mL of water was further added dropwise while maintaining the temperature at 5 to 6° C. and the reaction solution was stirred for one hour, and then, the temperature was returned to room temperature. The obtained reaction mixture was extracted with toluene. The toluene layer was washed with an aqueous solution of sodium hydrogen sulfite and an aqueous solution of sodium hydrogen carbonate and dried over anhydrous sodium sulfate, and then, the solvent was removed by evaporation under reduced pressure. The residue was purified by silica gel column chromatography to obtain the intermediate 6 (3.14 g). The yield was 60%.

Synthesis of Intermediate 7

In an argon atmosphere, a mixture of the intermediate 6 (3.14 g), 2-methoxycarbonylphenylboronic acid (1.46 g), tetrakis(triphenylphosphine) palladium (0) (158 mg), a 2 M aqueous solution of sodium carbonate (10 mL), and toluene (27 mL) was stirred at 100° C. for 20 h. The obtained reaction mixture was cooled to room temperature, filtered through Celite® pad, and extracted with toluene. The toluene layer was washed with brine and dried over anhydrous sodium sulfate, and then, the solvent was removed by evaporation under reduced pressure. The obtained residue was purified by silica gel chromatography to obtain the intermediate 7 (2.37 g). The yield was 72%.

Synthesis of Intermediate 8

In an argon atmosphere, the intermediate 7 (2.1 g) was dissolved in THF (20 mL). After adding a 1 M THF solution of methylmagnesium bromide (10.9 mL) dropwise, the solution was stirred at 40° C. for hone hour under heating. The obtained reaction mixture was neutralized with an aqueous solution of ammonium chloride under ice cooling and extracted with toluene. The toluene layer was washed with brine and dried over anhydrous sodium sulfate, and then, the solvent was removed by evaporation under reduced pressure. The obtained residue was purified by silica gel chromatography to obtain the intermediate 8 (1.12 g). The yield was 55%.

Synthesis of Compound 1

A concentrated sulfuric acid (350 µL) was added to a solution of the intermediate 8 (0.9 g) in acetic acid (1.5 mL), and then, the solution was stirred for 3 h. The obtained reaction mixture was cooled to room temperature and diluted with dichloromethane, and then, an aqueous solution of sodium hydroxide was added dropwise. The organic layer was washed with an aqueous solution of sodium hydroxide and brine and dried over anhydrous sodium sulfate, and then, the solvent was removed by evaporation under reduced pressure. The obtained residue was purified by silica gel chromatography and recrystallization to obtain compound 1 (414 mg). The yield was 48%. The obtained compound was identified by mass spectrometry. The result was m/e=449 to the molecular weight of 449.18.

Example 2: Synthesis of Compound 2

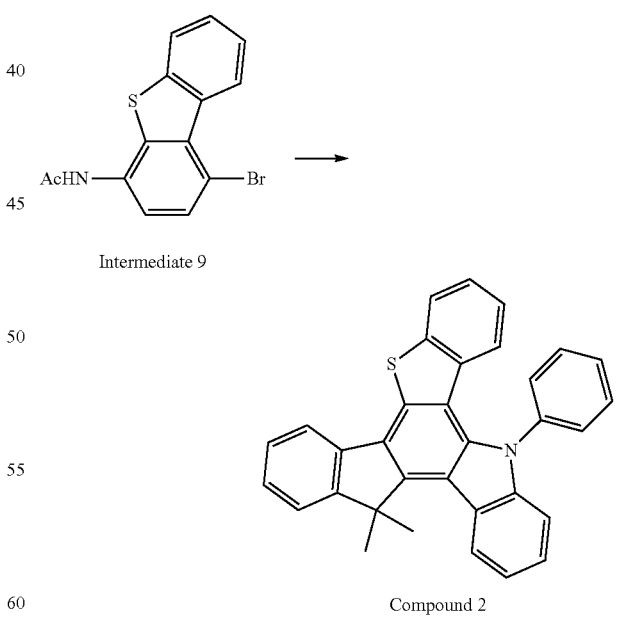

Intermediate 9

Compound 2

The compound 2 was obtained in the same manner as in Example 1 except for using a known intermediate 9 in place of the intermediate 1. The obtained compound was identified by mass spectrometry. The result was m/e=465 to the molecular weight of 465.16.

Example 3: Synthesis of Compound 3

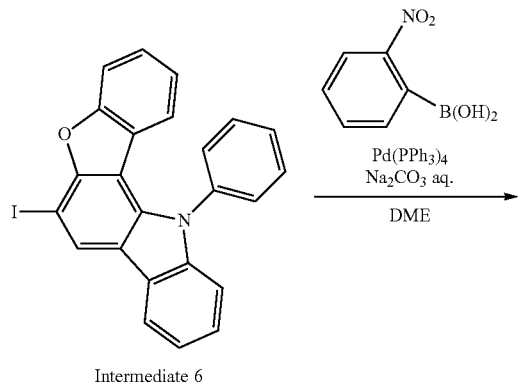

Intermediate 6

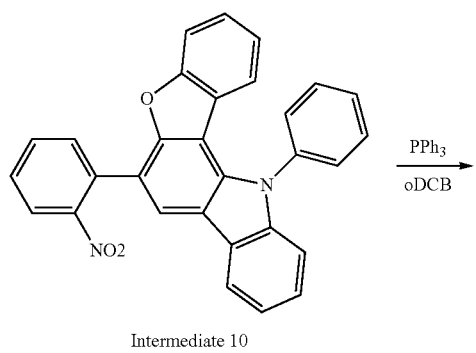

Intermediate 10

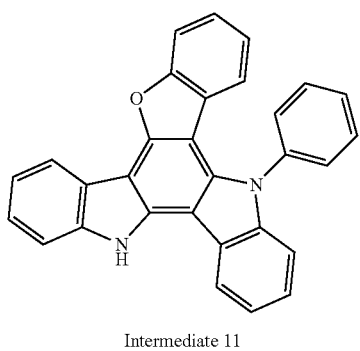

Intermediate 11

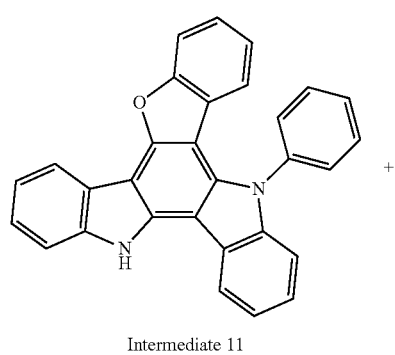

Intermediate 11

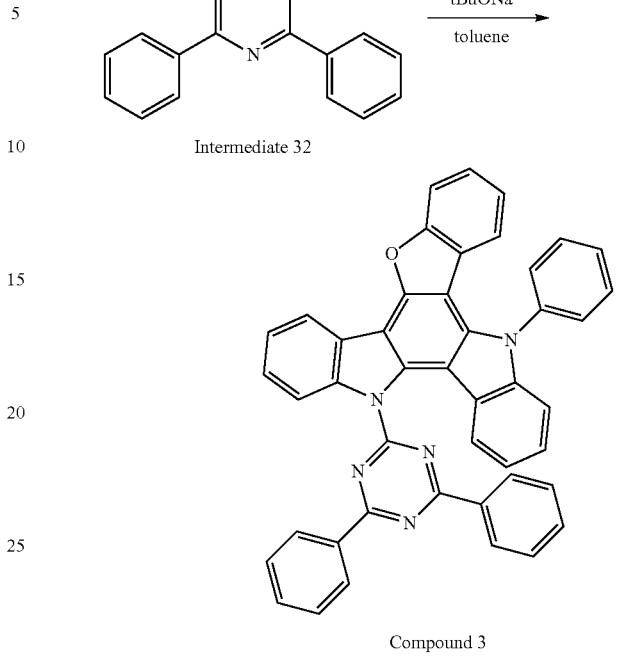

Compound 3

Synthesis of Intermediate 10

In an argon atmosphere, a mixture of the intermediate 6 (8.6 g), 2-nitrophenylboronic acid (3.44 g), tetrakis(triphenylphosphine) palladium (0) (648 mg), a 2 M aqueous solution of sodium carbonate (18 mL), and DME (75 mL) was stirred at 100° C. for 14 h. The obtained reaction mixture was cooled to room temperature, filtered through Celite® pad, and extracted with toluene. The toluene layer was washed with brine and dried over anhydrous sodium sulfate, and then, the solvent was removed by evaporation under reduced pressure. The obtained residue was purified by silica gel chromatography to obtain the intermediate 10 (5.69 g). The yield was 67%.

Synthesis of Intermediate 11

In an argon atmosphere, a mixture of the intermediate 10 (3.32 g), triphenylphosphine (4.79 g), and o-dichlorobenzene (15 mL) was stirred for 20 h by refluxing under heating. The reaction mixture was cooled to room temperature and hexane was added, and then, the precipitated crystals were collected by filtration. The obtained solid was recrystallized from toluene to obtain the intermediate 11 (1.23 g). The yield was 40%.

Synthesis of Compound 3

In an argon atmosphere, a mixture of the intermediate 11 (2.09 g), the intermediate 32 (1.46 g) synthesized by a known method, tris(dibenzylideneacetone) dipalladium(0) (90.7 mg), tri-t-butylphosphine tetrafluorohydroborate (115 mg), sodium t-butoxide (713 mg), and dehydrated toluene (70 ml) was stirred for 8 h by refluxing under heating. The obtained reaction mixture was cooled to room temperature, filtered through Celite® pad, and extracted with toluene. The toluene layer was washed with brine and dried over anhydrous sodium sulfate, and then, the solvent was removed by evaporation under reduced pressure. The obtained residue was purified by silica gel chromatography and recrystallization to obtain the compound 3 (2.04 g). The yield was 63%. The obtained compound was identified by mass spectrometry. The result was m/e=653 to the molecular weight of 653.22.

The intermediate 13 (intermediate 11 wherein —O— is changed to —S—) can be synthesized in the same manner as above except for using the intermediate 12 in place of the intermediate 6.

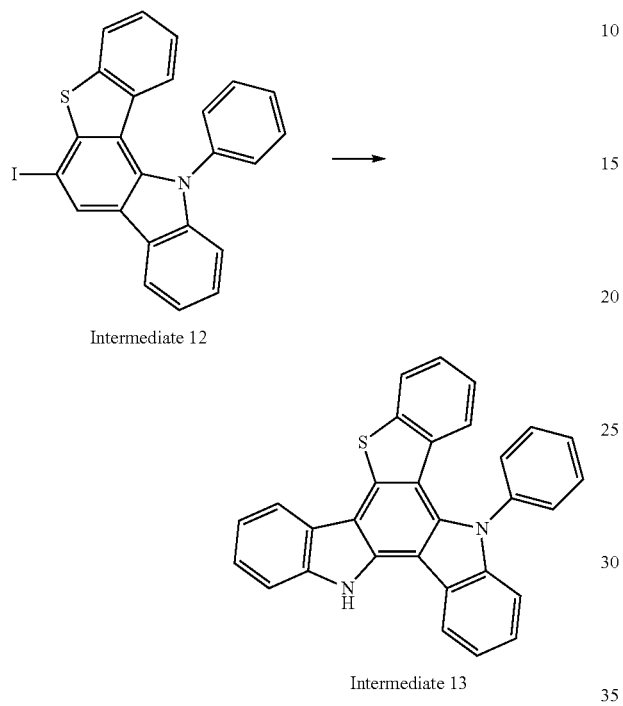

Example 4: Synthesis of Compound 4

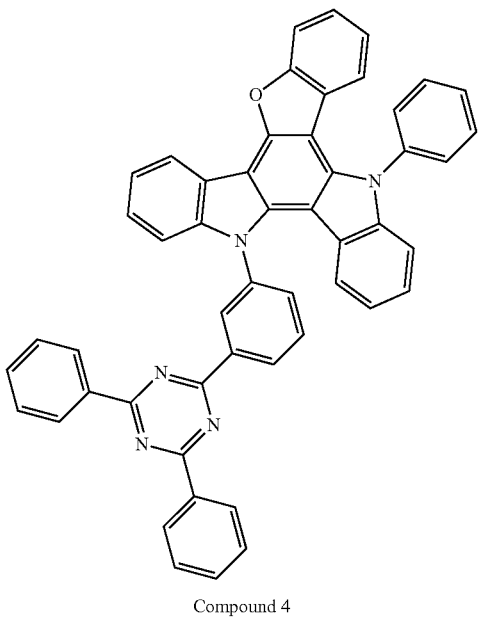

Compound 4

The compound 4 was obtained in the same manner as in Example 3 except for using the intermediate 33 synthesized by a known method in place of the intermediate 32. The obtained compound was identified by mass spectrometry. The result was m/e=729 to the molecular weight of 729.25.

Example 5: Synthesis of Compound 5

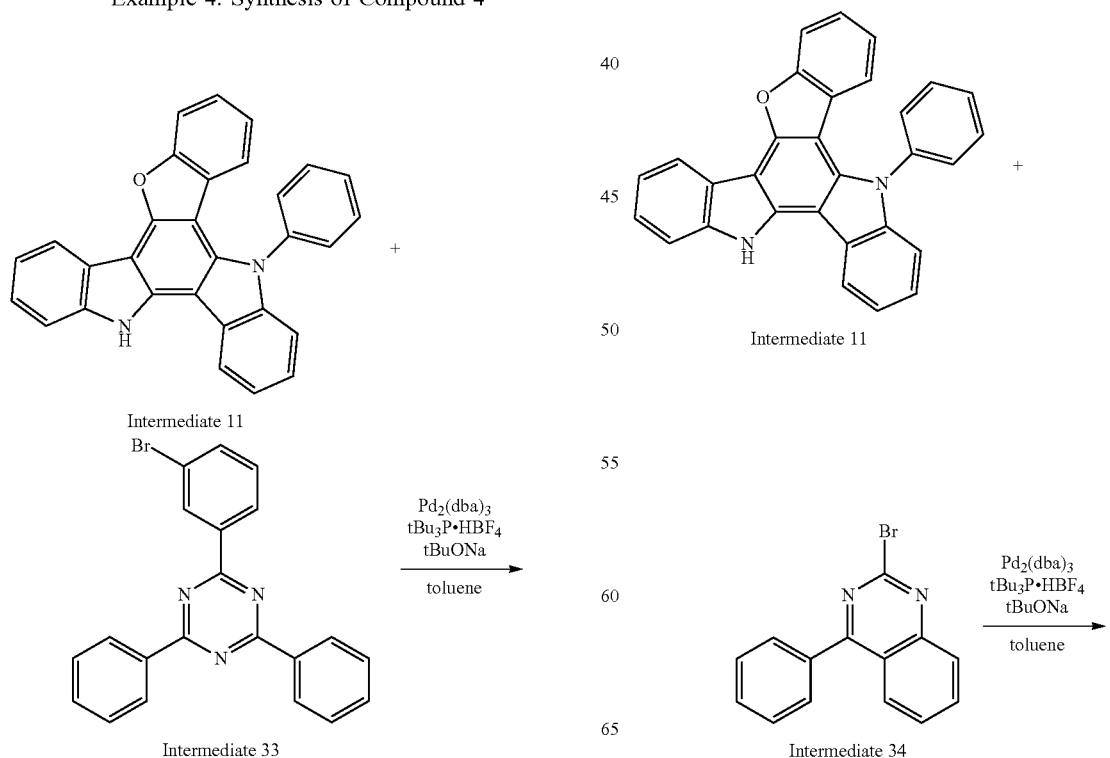

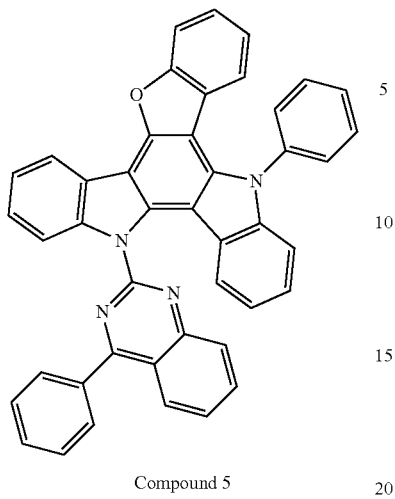

Compound 5

The compound 5 was obtained in the same manner as in Example 3 except for using the intermediate 34 synthesized by a known method in place of intermediate 32. The obtained compound was identified by mass spectrometry. The result was m/e=626 to the molecular weight of 626.21.

Example 6: Synthesis of Compound 6

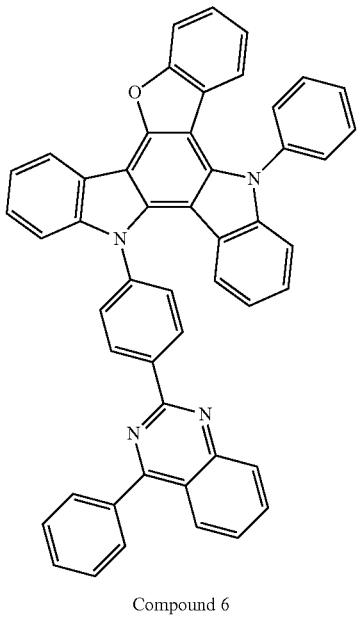

Compound 6

The compound 6 was obtained in the same manner as in Example 3 except for using the intermediate 35 synthesized by a known method in place of the intermediate 32. The obtained compound was identified by mass spectrometry. The result was m/e=702 to the molecular weight of 702.24.

Example 7: Synthesis of Compound 7

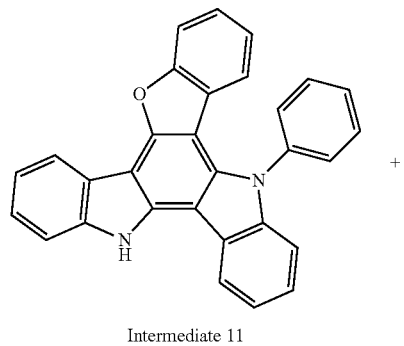

Intermediate 11

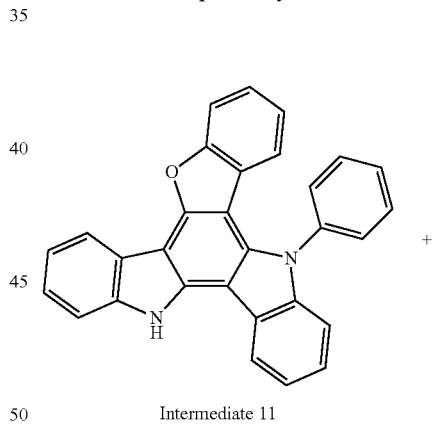

Intermediate 11

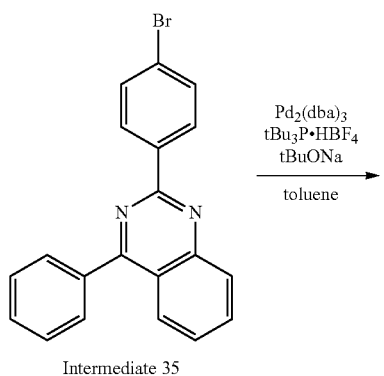

Intermediate 35

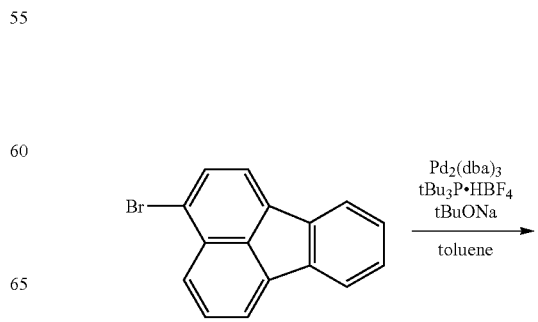

-continued

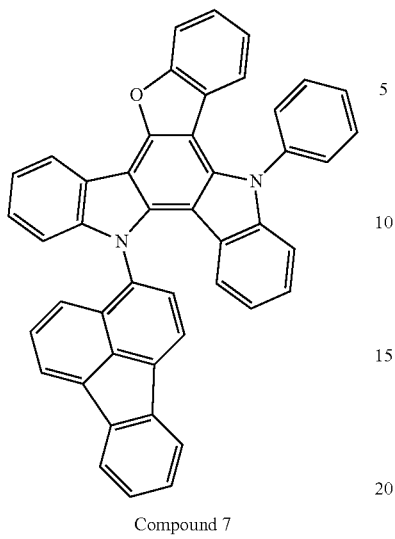

Compound 7

The compound 7 was obtained in the same manner as in Example 3 except for using 3-bromofluoranthene in place of the intermediate 32. The obtained compound was identified by mass spectrometry. The result was m/e=622 to the molecular weight of 622.20.

Example 8: Synthesis of Compound 8

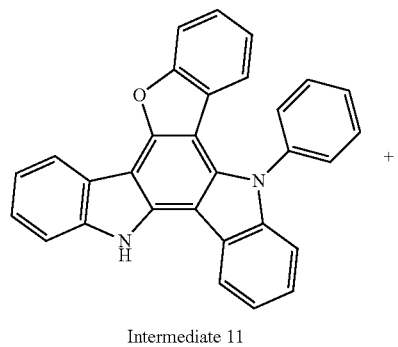

Intermediate 11

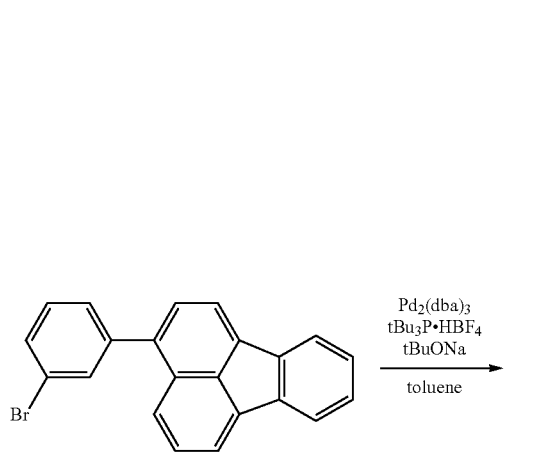

-continued

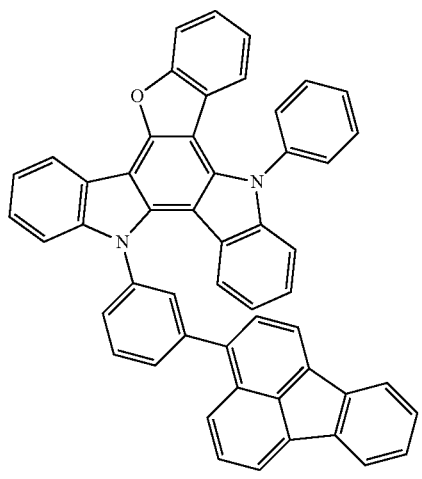

Compound 8

The compound 8 was obtained in the same manner as in Example 3 except for using 3-β-bromophenyl)fluoranthene in place of the intermediate 32. The obtained compound was identified by mass spectrometry. The result was m/e=698 to the molecular weight of 698.24.

Example 9: Synthesis of Compound 9

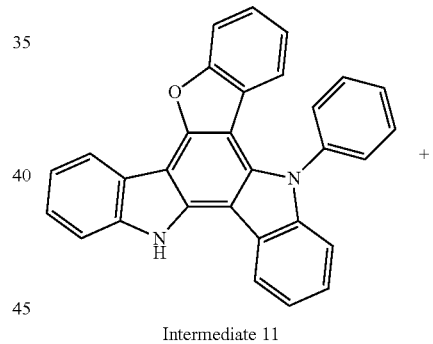

Intermediate 11

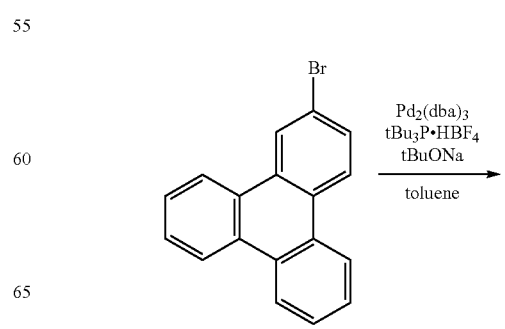

233

-continued

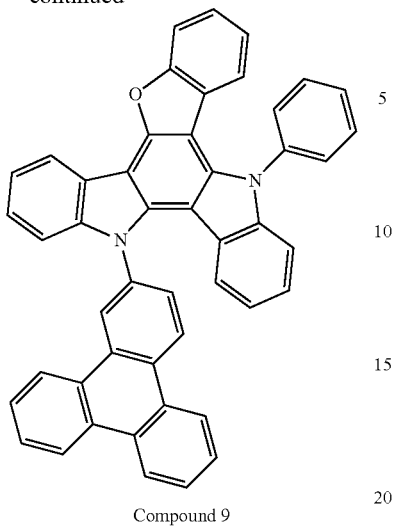
Compound 9

The compound 9 was obtained in the same manner as in Example 3 except for using 2-bromotriphenylene in place of the intermediate 32. The obtained compound was identified by mass spectrometry. The result was m/e=648 to the molecular weight of 648.22.

Example 10: Synthesis of Compound 10

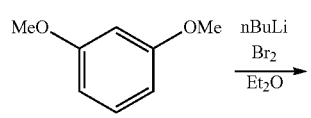

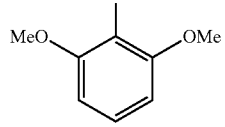
Intermediate 14

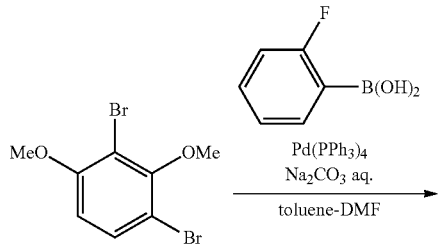
Intermediate 15

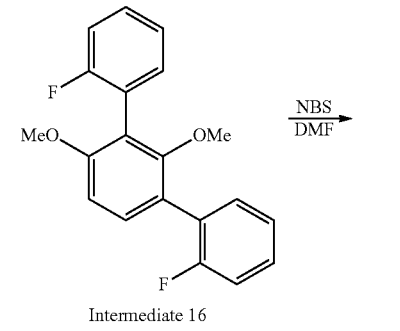
Intermediate 16

234

-continued

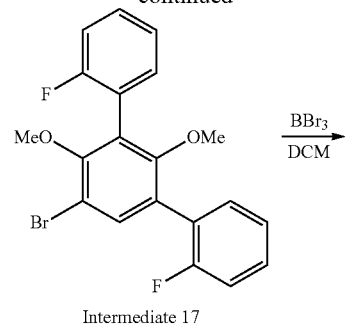
Intermediate 17

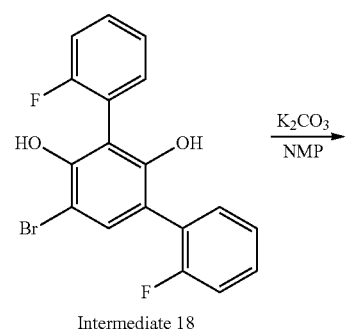
Intermediate 18

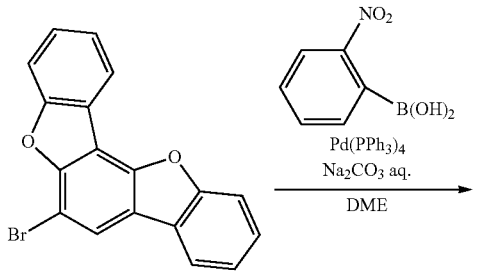
Intermediate 19

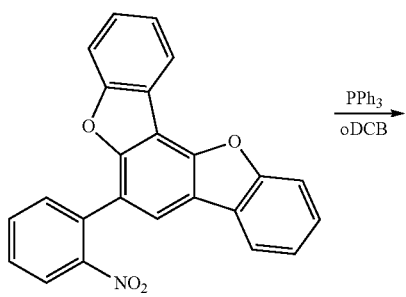
Intermediate 20

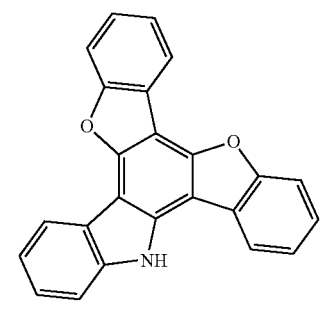
Intermediate 21

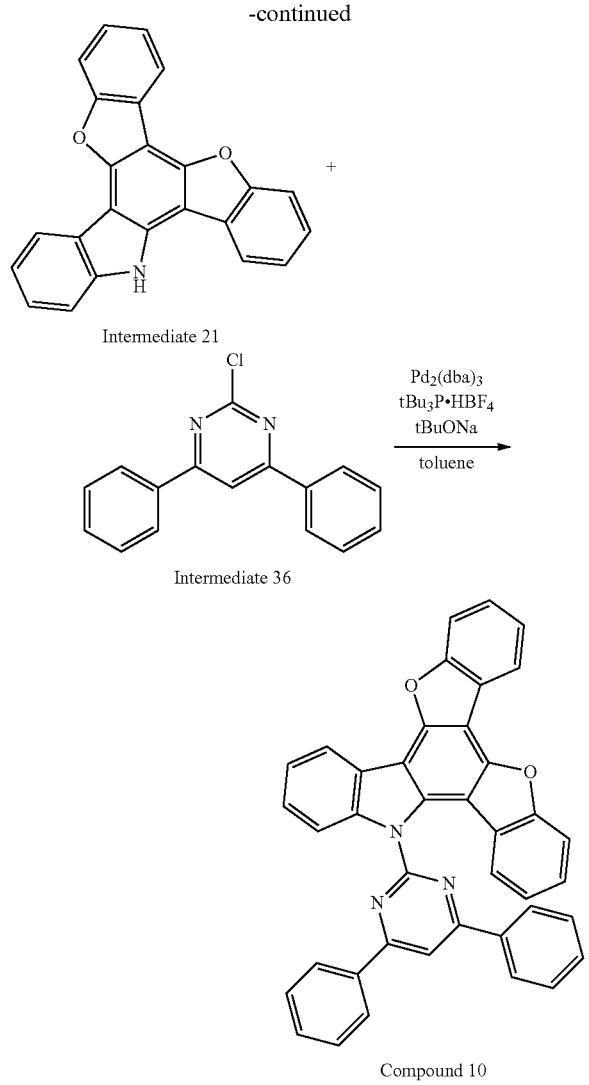

Synthesis of Intermediate 14

In an argon atmosphere, 1,3-dimethoxybenzene (19.3 g) and anhydrous diethyl ether (500 mL) were charged in a flask. After adding a 1.6 M hexane solution of n-butyllithium (105 mL), the resulting mixture was stirred for 4 h under heating. After standing the mixture to cool to room temperature while continuing the stirring, the mixture was cooled to −50° C. and then bromine (25 g) was added dropwise. The reaction solution was stirred for 2 h while elevating the temperature to room temperature. After adding a 10% aqueous solution of sodium thiosulfate (300 mL), the stirring was continued for one hour. The reaction solution was extracted with ether. After removing the water layer, the organic layer was washed with brine, dried over magnesium sulfate, and concentrated. The residue was purified by silica gel chromatography, and the obtained crystals were washed with hexane to obtain the intermediate 14 (17.9 g). The yield was 52%.

Synthesis of Intermediate 15

Into a flask, the intermediate 14 (17.9 g) and acetonitrile (200 mL) were charged. After cooling over ice, N-bromosuccinimide (14.7 g) was added. The solution was stirred for 8 h while elevating the temperature to room temperature. After further adding N-bromosuccinimide (2.39 g), the stirring was continued at room temperature for 7 h. After stopping the stirring, the solvent was removed by evaporation. The residue was dissolved in dichloromethane and washed with sodium thiosulfate and brine successively. The organic layer was dried over magnesium sulfate and concentrated. The residue was purified by silica gel chromatography to obtain the intermediate 15 (23.2 g). The yield was 95%.

Synthesis of Intermediate 16

In an argon atmosphere, a mixture of the intermediate 15 (23.2 g), 2-fluorophenylboronic acid (32.9 g), tetrakis(triphenylphosphine) palladium (0) (5.43 g), toluene (150 mL), 1,2-dimethoxyethane (150 mL), and a 2 M aqueous solution of sodium carbonate (150 mL) in a flask was stirred for 24 h by refluxing under heating. After cooling to room temperature, the water layer was removed. The organic layer was washed with brine, dried over magnesium sulfate, and concentrated. The residue was purified by silica gel chromatography, and the obtained crystals were recrystallized from hexane to obtain the intermediate 16 (11.6 g). The yield was 45%.

Synthesis of Intermediate 17

Into a mixture of the intermediate 16 (11.6 g) and N,N-dimethylformamide (480 mL) charged in a flask, a solution of N-bromosuccinimide (6.31 g) in N,N-dimethylformamide (20 mL) was added. The solution was continuously stirred at 40° C. for 5 h. After further adding N-bromosuccinimide (2.20 g), the stirring was continued at 50° C. for 8 h. After cooling to room temperature, water (300 mL) was added and the organic substance was extracted with toluene. The toluene solution was washed with sodium thiosulfate and brine successively, dried over magnesium sulfate, and concentrated. The residue was purified by silica gel chromatography to obtain the intermediate 17 (14.1 g). The yield was 98%.

Synthesis of Intermediate 18

In an argon atmosphere, a mixture of the intermediate 17 (14.1 g) and anhydrous dichloromethane (300 mL) charged in a flask was cooled to −78° C. under stirring, and then, a 1 M solution of boron tribromide in dichloromethane (90 mL) was added. The resulting solution was continuously stirred for 3 h while elevating the temperature to room temperature. The reaction solution was cooled over ice and then water (150 mL) was added. After removing the water layer, the organic layer was dried over magnesium sulfate and concentrated. The residue was purified by a short column to obtain the intermediate 18 (12.5 g). The yield was 95%.

Synthesis of Intermediate 19

In an argon atmosphere, a mixture of the intermediate 18 (12.5 g), potassium carbonate (18.3 g), and anhydrous N-pyrrolidinone (200 mL) charged in a flask was stirred at 200° C. for 5 h. After cooling to room temperature and adding water (200 mL), the mixture was diluted with toluene. After removing the water layer, the organic layer was dried over magnesium sulfate and concentrated. The residue was purified by silica gel chromatography to obtain the intermediate 19 (1.20 g). The yield was 11%.

Synthesis of Intermediate 20

In an argon atmosphere, a mixture of the intermediate 19 (5.9 g), 2-nitrophenylboronic acid (3.2 g), tetrakis(triphenylphosphine) palladium (0) (607 mg), a 2 M aqueous solution of sodium carbonate (17 mL), and DMF (70 mL) was stirred at 100° C. for 14 h. The obtained reaction mixture was cooled to room temperature, filtered through Celite® pad, and extracted with toluene. The toluene layer was washed with brine and dried over anhydrous sodium sulfate, and then, the solvent was removed by evaporation under reduced pressure. The obtained residue was purified by silica gel chromatography to obtain the intermediate 20 (4.58 g). The yield was 69%.

Synthesis of Intermediate 21

In an argon atmosphere, a mixture of the intermediate 20 (4.03 g), triphenylphosphine (6.97 g), and o-dichlorobenzene (42 mL) was stirred for 15 h by refluxing under heating. The reaction mixture was cooled to room temperature and then hexane was added. The precipitated crystals were collected by filtration. The obtained solid was recrystallized from toluene to obtain the intermediate 21 (1.44 g). The yield was 39%.

Synthesis of Compound 10

The compound 10 was obtained in the same manner as in Example 3 except for using the intermediate 21 in place of the intermediate 11 and using the intermediate 36 synthesized by a known method in place of the intermediate 32. The obtained compound was identified by mass spectrometry. The result was m/e=577 to the molecular weight of 577.18.

Example 11: Synthesis of Compound 11

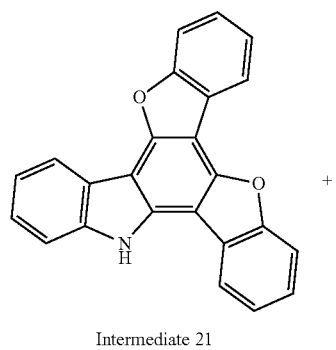

Intermediate 21

+

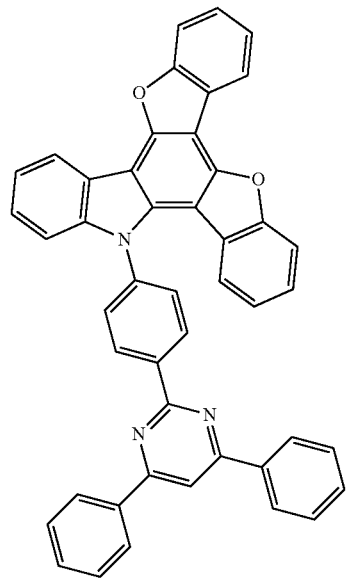

Compound 11

The compound 11 was obtained in the same manner as in Example 10 except for using the intermediate 37 synthesized by a known method in place of the intermediate 36. The obtained compound was identified by mass spectrometry. The result was m/e=653 to the molecular weight of 653.21.

Example 12: Synthesis of Compound 12

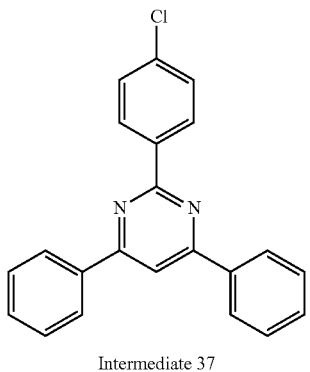

Intermediate 37

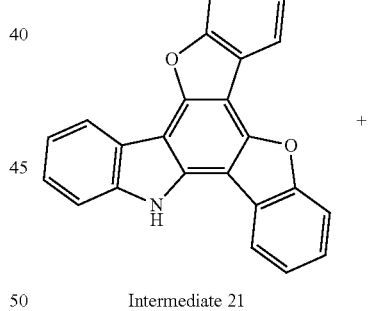

Intermediate 21

+

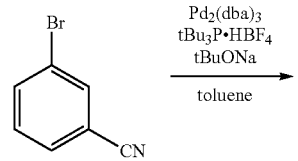

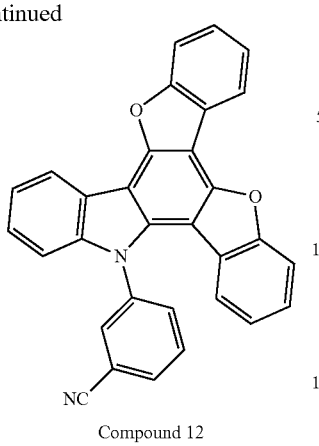

Compound 12

The compound 12 was obtained in the same manner as in Example 10 except for using 3-bromobenzonitrile in place of the intermediate 36. The obtained compound was identified by mass spectrometry. The result was m/e=448 to the molecular weight of 448.12.

Example 13: Synthesis of Compound 13

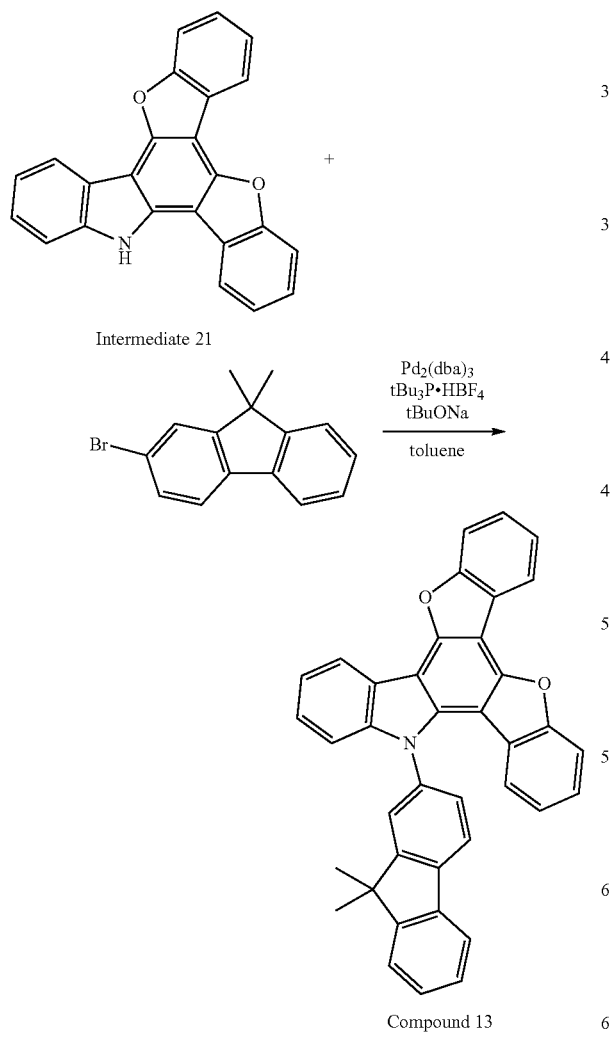

The compound 13 was obtained in the same manner as in Example 10 except for using 2-bromo-9,9-dimethylfluorene in place of the intermediate 36. The obtained compound was identified by mass spectrometry. The result was m/e=539 to the molecular weight of 539.19.

Example 14: Synthesis of Compound 14

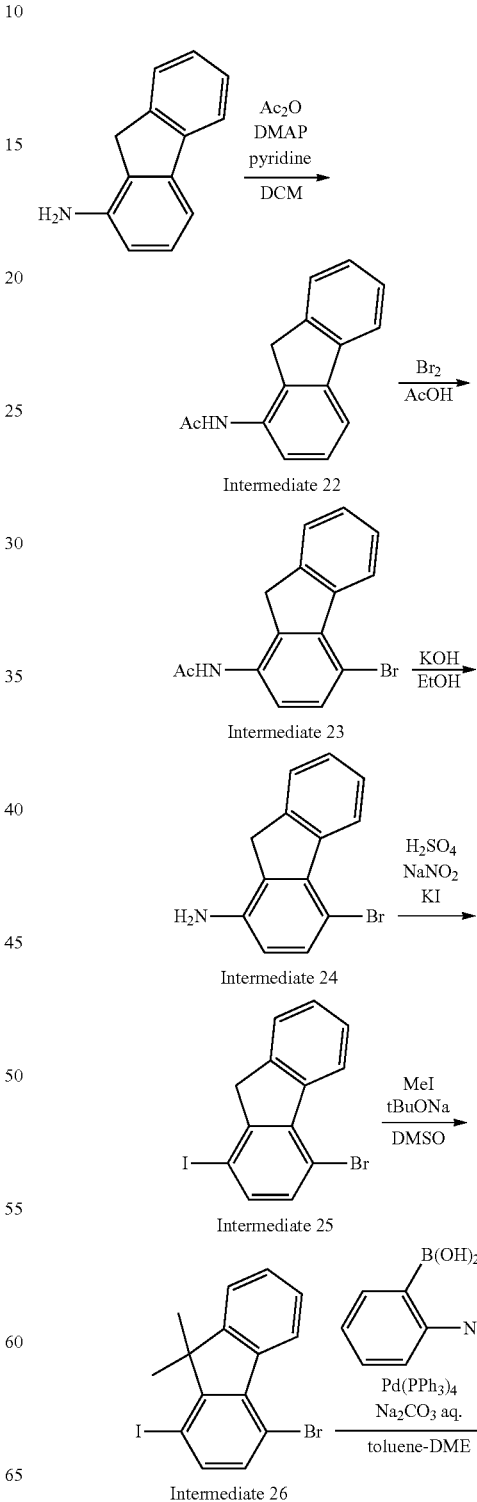

-continued

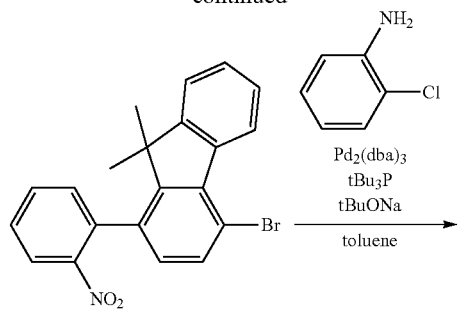

Intermediate 27

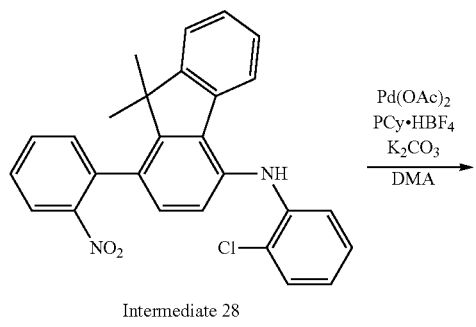

Intermediate 28

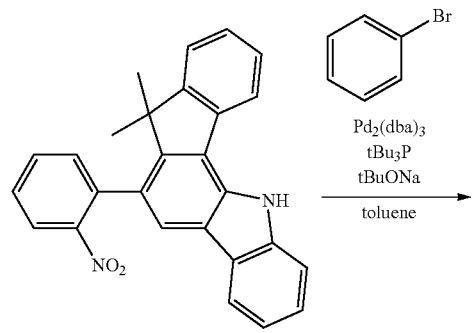

Intermediate 29

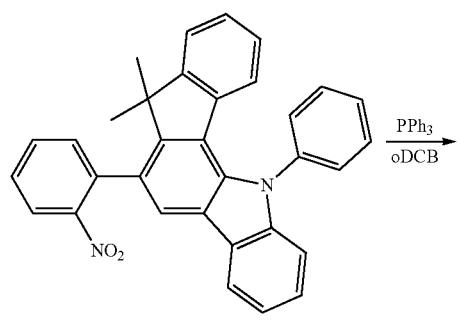

Intermediate 30

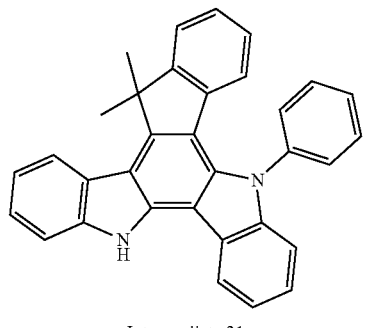

Intermediate 31

-continued

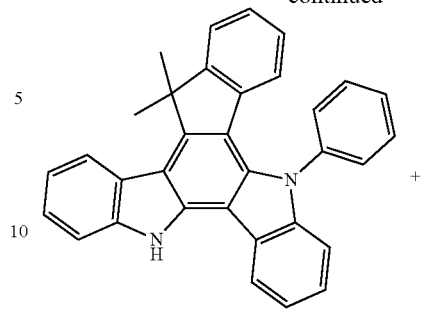

Intermediate 31

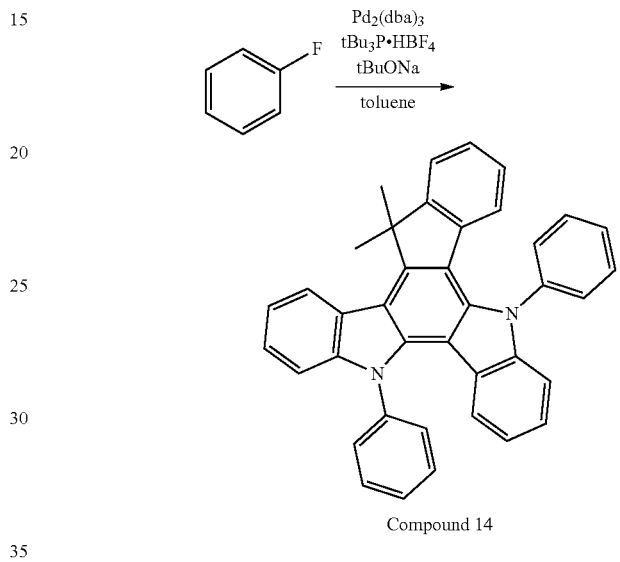

Compound 14

Synthesis of Intermediate 22

A mixture of 1-aminofluorene (500 mg), acetic anhydride (10 mL), N,N-dimethylamino-4-pyridine (67 mg), and pyridine (10 mL) in dichloromethane was stirred at room temperature for 14 h. The obtained reaction mixture was extracted with toluene. The toluene layer was washed with brine and dried over anhydrous sodium sulfate, and then, the solvent was removed by evaporation under reduced pressure. The obtained residue was purified by silica gel chromatography to obtain the intermediate 22 (557 mg). The yield was 90%.

Synthesis of Intermediate 23

In an argon atmosphere, bromine (4.99 mL) was added dropwise to a mixture of acetic acid (220 mL) and the intermediate 22 (11.45 g). The reaction mixture was stirred at room temperature for 30 min and then an aqueous solution of sodium sulfate was added under ice cooling. The obtained crystals are collected by filtration and purified by recrystallization to obtain the intermediate 23 (13.95 g). The yield was 90%.

Synthesis of Intermediate 24

A mixture of the intermediate 23 (13.95 g) and potassium hydroxide (12.5 g) in 500 mL of ethanol was stirred at room temperature for 48 h. The obtained reaction mixture was neutralized with hydrochloric acid under ice cooling and extracted with toluene. The toluene layer was washed with brine and dried over anhydrous sodium sulfate, and then, the solvent was removed by evaporation under reduced pressure. The obtained residue was purified by silica gel chromatography to obtain the intermediate 24 (8.4 g). The yield was 70%.

Synthesis of Intermediate 25

Into a mixture of the intermediate 24 (2.0 g) and water (40 mL) in a flask, a concentrated sulfuric acid (0.7 mL) was added dropwise under stirring and then the mixture was stirred at 100° C. for 3 h. After standing the obtained mixture to cool, a solution of sodium nitrite (0.8 g) in 4 mL water was added dropwise and stirred for one hour while cooling over an iced water bath. After adding a solution of potassium iodide (5.9 g) in 10 mL of water, the obtained solution was stirred for one hour while maintaining the temperature at 5 to 6° C., and then, the temperature was returned to room temperature. The obtained reaction mixture was extracted with toluene. The toluene layer was washed with an aqueous solution of sodium hydrogen sulfite and an aqueous solution of sodium hydrogen carbonate and dried over anhydrous sodium sulfate, and then, the solvent was removed by evaporation under reduced pressure. The residue was purified by silica gel column chromatography to obtain the intermediate 25 (1.57 g). The yield was 55%.

Synthesis of Intermediate 26

After dissolving the intermediate 25 (2.7 g) and sodium t-butoxide (770 mg) in DMSO (15 mL), methyl iodide (986 mL) was added dropwise at −30° C. The mixture was stirred for 10 h while elevating the reaction temperature to room temperature. The obtained reaction mixture was neutralized with hydrochloric acid under ice cooling and extracted with toluene. The toluene layer was washed with brine and dried over anhydrous sodium sulfate, and then, the solvent was removed by evaporation under reduced pressure. The obtained residue was purified by silica gel chromatography to obtain the intermediate 26 (2.33 g). The yield was 81%.

Synthesis of Intermediate 27

In an argon atmosphere, a mixture of the intermediate 26 (6.5 g), 2-nitrophenylboronic acid (2.85 g), tetrakis(triphenylphosphine) palladium (0) (188 mg), toluene (5 mL), 1,2-dimethoxyethane (5 mL), and a 2 M aqueous solution of sodium carbonate (5 mL) charged in a flask was stirred for 16 h by refluxing under heating. After cooling to room temperature, the water layer was removed. The organic layer was washed with brine, dried over magnesium sulfate, and concentrated. The residue was purified by silica gel chromatography and the obtained crystals were recrystallized from hexane to obtain the intermediate 27 (2.06 g). The yield was 32%.

Synthesis of Intermediate 28

In an argon atmosphere, a mixture of the intermediate 27 (9.8 g), 2-chloroaniline (6.34 g), tris(dibenzylideneacetone) dipalladium(0) (228 mg), tri-t-butylphosphine (100 mg), sodium t-butoxide (3.34 g), and toluene (120 mL) was stirred at 40° C. for 10 h. The obtained reaction mixture was cooled to room temperature and filtered through Celite® pad, and then, the solvent was removed by evaporation. The obtained residue was purified by silica gel column chromatography and recrystallization to obtain the intermediate 28 (5.59 g). The yield was 51%.

Synthesis of Intermediate 29

In an argon atmosphere, a mixture of the intermediate 28 (1.78 g), palladium acetate (27.2 mg), potassium carbonate (7.5 g), tricyclohexylphosphine tetrafluorohydroborate (89 mg), and N,N-dimethylacetamide (20 mL) charged in a flask was stirred at 130° C. for 24 h under heating. The obtained reaction mixture was cooled to room temperature and extracted with toluene. After removing the insolubles by filtration, the filtrate was evaporated under reduced pressure. The obtained residue was purified by silica gel column chromatography to obtain the intermediate 29 (637 mg). The yield was 39%.

Synthesis of Intermediate 30

In an argon atmosphere, a mixture of the intermediate 29 (3.8 g), bromobenzene (1.08 mL), tris(dibenzylideneacetone) dipalladium(0) (172 mg), tri-t-butylphosphine (76 mg), sodium t-butoxide (1.26 g), and toluene (47 mL) was stirred for 7 h by refluxing under heating. The obtained reaction mixture was cooled to room temperature and filtered through Celite® pad, and then, the solvent was removed by evaporation. The obtained residue was purified by silica gel column chromatography and recrystallization to obtain the intermediate 30 (3.4 g). The yield was 76%.

Synthesis of Intermediate 31

In an argon atmosphere, a mixture of the intermediate 30 (3.4 g), triphenylphosphine (4.64 g), and o-dichlorobenzene (14 mL) was stirred for 24 h by refluxing under heating. The reaction mixture was cooled to room temperature and then hexane was added, and the precipitated crystals were collected by filtration. The obtained solid was recrystallized from toluene to obtain the intermediate 31 (1.08 g). The yield was 34%.

Synthesis of Compound 14

The compound 14 was obtained in the same manner as in Example 3 except for using the intermediate 31 in place of the intermediate 11 and using bromobenzene in place of the intermediate 32. The obtained compound was identified by mass spectrometry. The result was m/e=524 to the molecular weight of 524.23.

Example 15: Synthesis of Compound 15

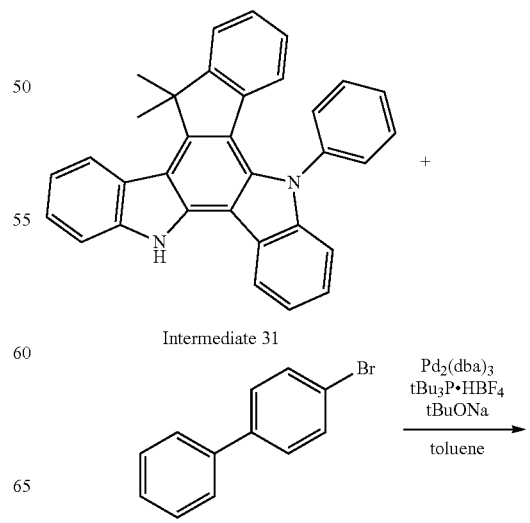

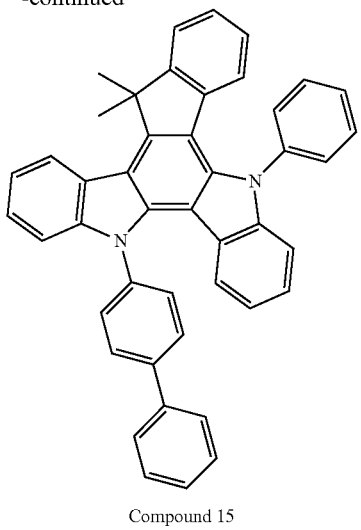

Compound 15

The compound 15 was obtained in the same manner as in Example 14 except for using 4-bromobiphenyl in place of bromobenzene. The obtained compound was identified by mass spectrometry. The result was m/e=600 to the molecular weight of 600.26.

Example 16: Synthesis of Compound 16

Compound 16

The compound 16 was obtained in the same manner as in Example 14 except for using 4-bromobenzonitrile in place of bromobenzene. The obtained compound was identified by mass spectrometry. The result was m/e=549 to the molecular weight of 549.22.

Example 17: Synthesis of Compound 17

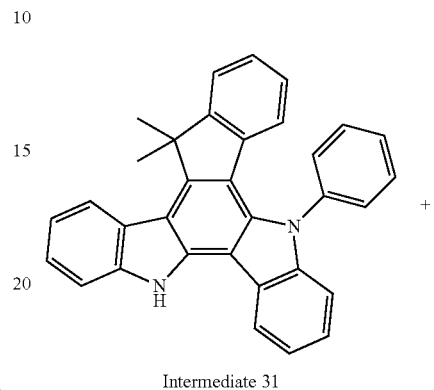

Intermediate 31

Intermediate 32

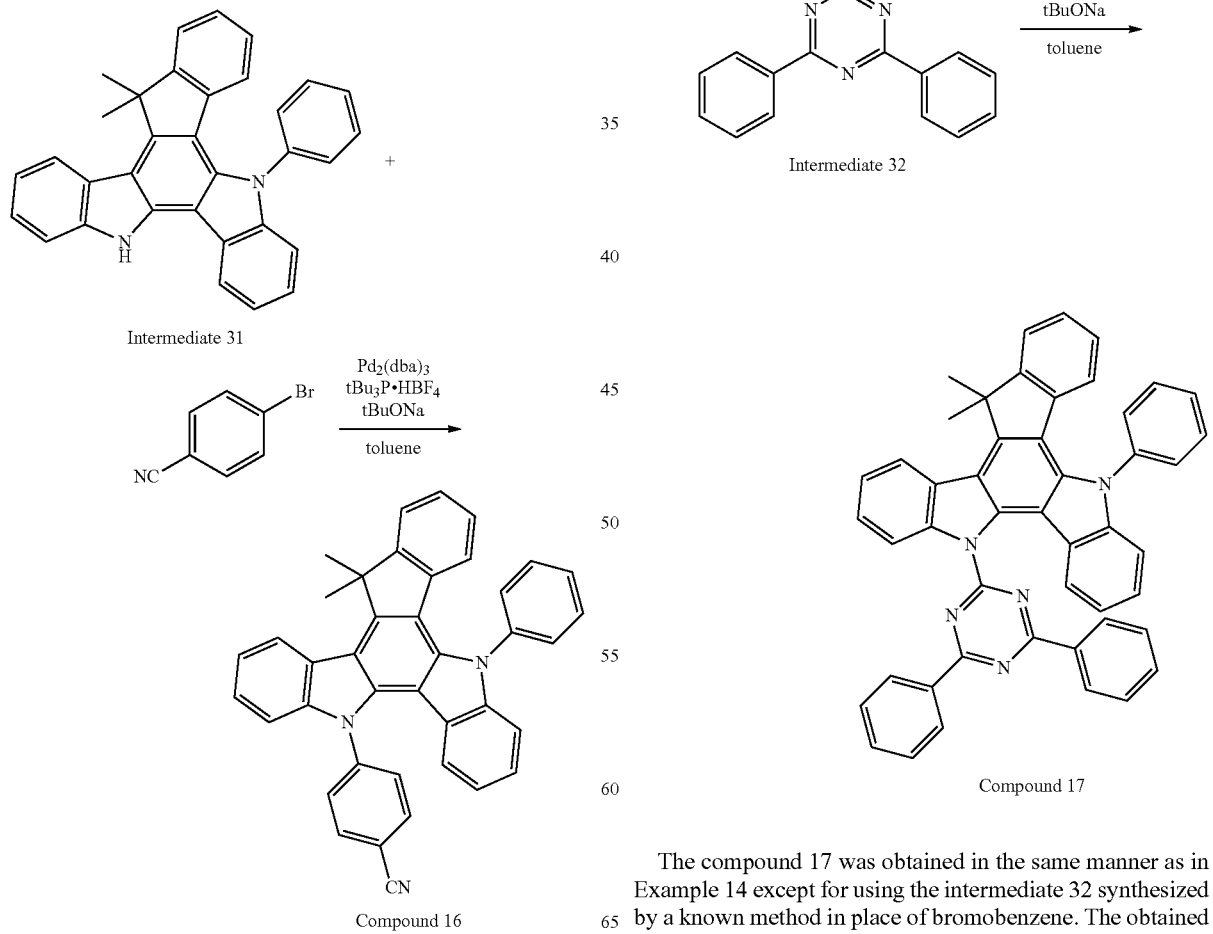

Compound 17

The compound 17 was obtained in the same manner as in Example 14 except for using the intermediate 32 synthesized by a known method in place of bromobenzene. The obtained compound was identified by mass spectrometry. The result was m/e=679 to the molecular weight of 679.27.

Example 18: Synthesis of Compound 18

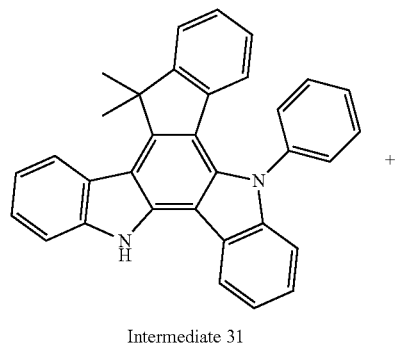

Intermediate 31

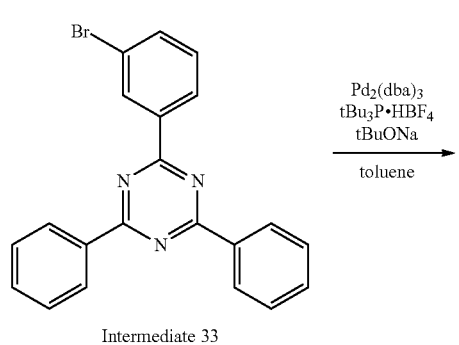

Intermediate 33

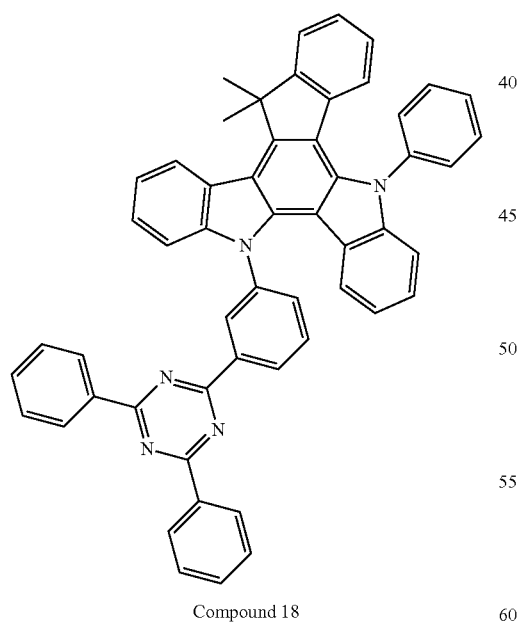

Compound 18

The compound 18 was obtained in the same manner as in Example 14 except for using the intermediate 33 synthesized by a known method in place of bromobenzene. The obtained compound was identified by mass spectrometry. The result was m/e=755 to the molecular weight of 755.30.

Example 19: Synthesis of Compound 19

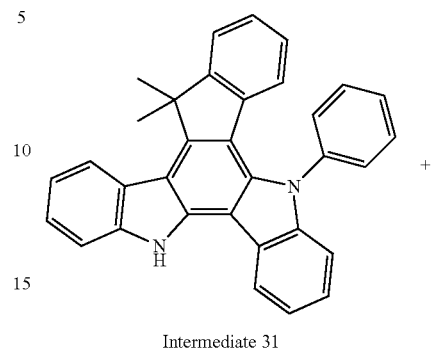

Intermediate 31

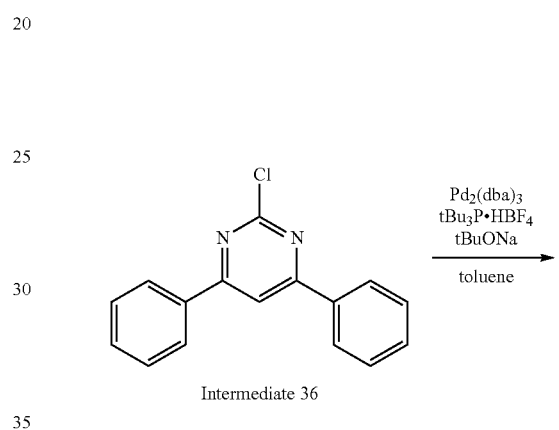

Intermediate 36

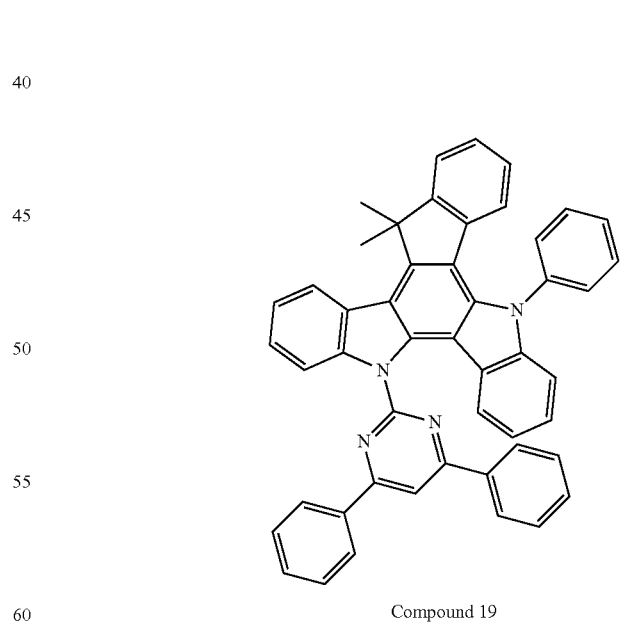

Compound 19

The compound 19 was obtained in the same manner as in Example 14 except for using the intermediate 36 synthesized by a known method in place of bromobenzene. The obtained compound was identified by mass spectrometry. The result was m/e=678 to the molecular weight of 678.28.

Example 20: Synthesis of Compound 20

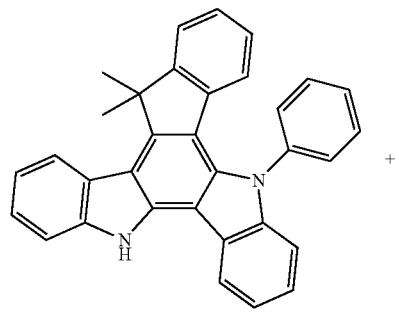

Intermediate 31

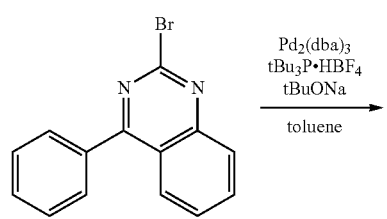

Intermediate 34

Example 21: Synthesis of Compound 21

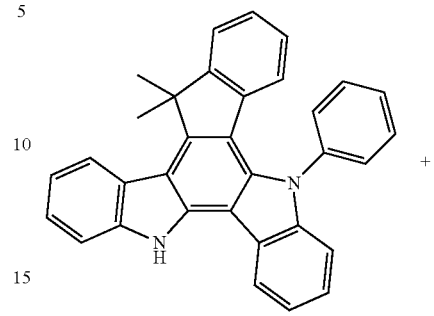

Intermediate 31

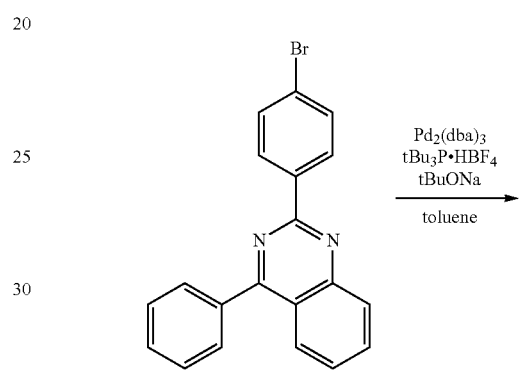

Intermediate 34

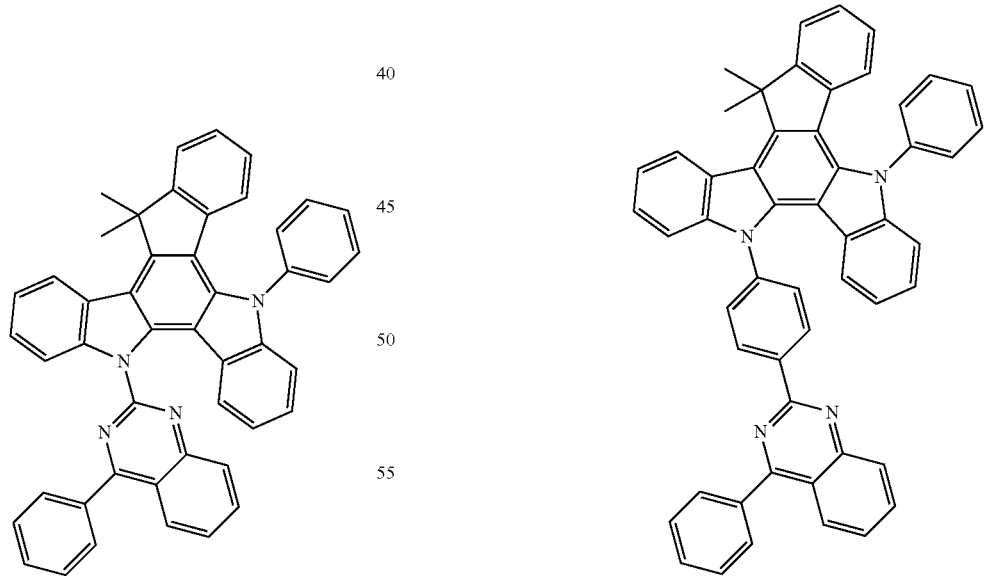

Compound 20 (left), Compound 21 (right)

The compound 20 was obtained in the same manner as in Example 14 except for using the intermediate 34 synthesized by a known method in place of bromobenzene. The obtained compound was identified by mass spectrometry. The result was m/e=652 to the molecular weight of 652.26.

The compound 21 was obtained in the same manner as in Example 14 except for using the intermediate 34 synthesized by a known method in place of bromobenzene. The obtained compound was identified by mass spectrometry. The result was m/e=728 to the molecular weight of 728.29.

Example 22: Synthesis of Compound 22

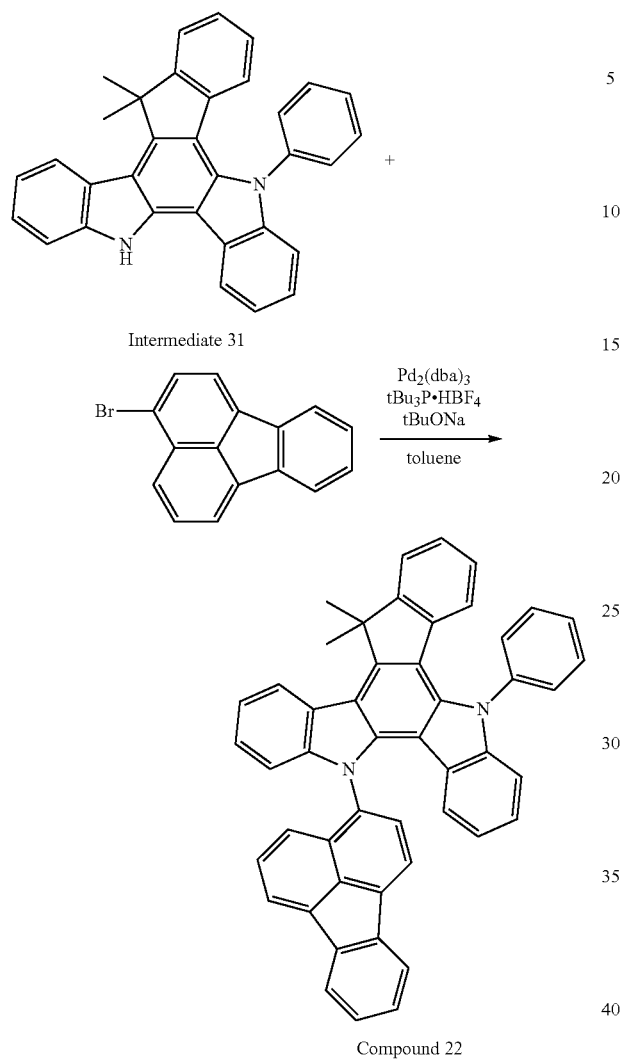

Intermediate 31

Compound 22

The compound 22 was obtained in the same manner as in Example 14 except for using 3-bromofluoranthene in place of bromobenzene. The obtained compound was identified by mass spectrometry. The result was m/e=648 to the molecular weight of 648.26.

Example 23: Synthesis of Compound 23

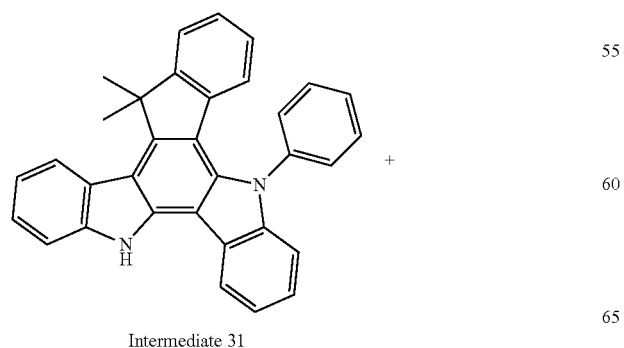

Intermediate 31

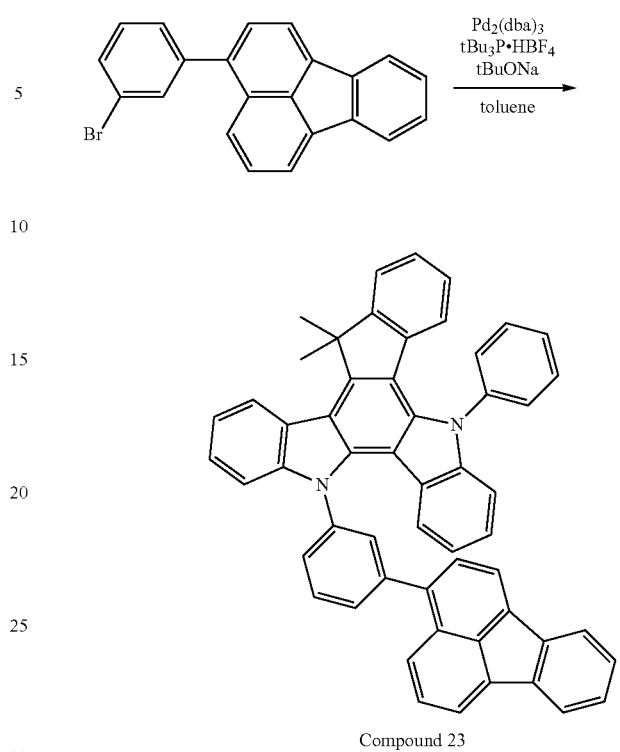

Compound 23

The compound 23 was obtained in the same manner as in Example 14 except for using 3-β-bromophenyl)fluoranthene in place of bromobenzene. The obtained compound was identified by mass spectrometry. The result was m/e=724 to the molecular weight of 724.29.

Example 24: Synthesis of Compound 24

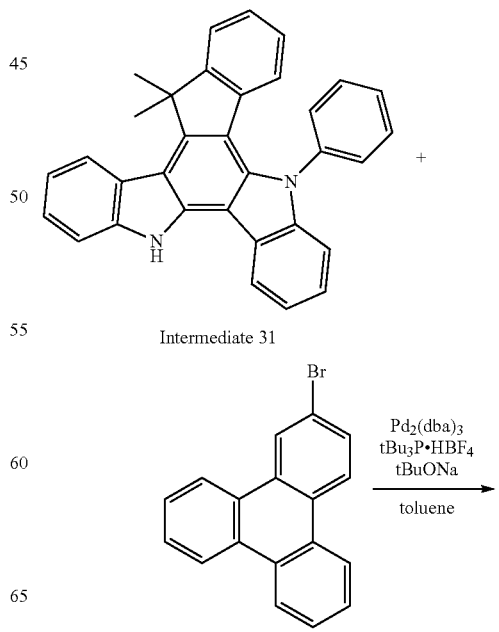

Intermediate 31

-continued

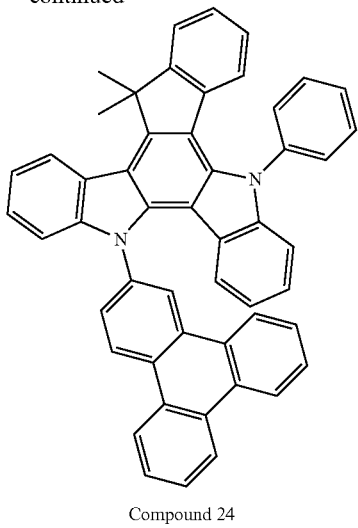

Compound 24

The compound 24 was obtained in the same manner as in Example 14 except for using 2-bromotriphenylene in place of bromobenzene. The obtained compound was identified by mass spectrometry. The result was m/e=674 to the molecular weight of 674.27.

Example 25: Production of Organic EL Device

A glass substrate of 25 mm×75 mm×1.1 mm thickness having ITO transparent electrode (product of Geomatec Company) for use as a support for organic EL device was cleaned by ultrasonic cleaning in isopropyl alcohol for 5 min and then UV ozone cleaning for 30 min to remove the foreign matter (particularly the organic substances adversely affecting EL properties) on the surface of the ITO transparent electrode layer.

The cleaned glass substrate having the transparent electrode lines with a thickness of 77 nm was mounted to a substrate holder of a vacuum vapor deposition apparatus. The following compound HI as a hole injecting material was vapor-deposited on the surface on which the transparent electrode line was formed so as to cover the transparent electrode to form a hole injecting layer with a thickness of 10 nm. Then, the following compound HT1 as a first hole transporting material was vapor-deposited to form a first hole transporting layer with a thickness of 50 nm. Successively after forming the first hole transporting layer, the following compound HT2 as a second hole transporting material was vapor-deposited to form a second hole transporting layer with a thickness of 15 nm.

On the second hole transporting layer, the compound 1 (first host material) obtained in Example 1, the following compound Host2 (second host material), and Ir(ppy)$_3$ (phosphorescent emitting material) were co-deposited to form a phosphorescent emitting layer with a thickness of 30 nm. The ratio of compound 1:Host2:Ir(ppy)$_3$ in the emitting layer was 47.5%:47.5%:5% by mass. The co-deposited film works as a light emitting layer.

Successively after forming the light emitting layer, the following compound HB was vapor-deposited into a film with a thickness of 5 nm. The compound HB film works as a hole blocking layer. Further, the following compound ET was formed into a film with a thickness of 30 nm. The compound ET film works as an electron transporting layer.

Then, LiF was vapor-deposited into a film with a thickness of 1 nm at a film-forming speed of 0.01 nm/min to form an electron injecting electrode (cathode). Finally, metallic Al was vapor-deposited on the LiF film to form a metallic cathode with a thickness of 80 nm, thereby obtaining an organic EL device.

The compounds used in the examples and comparative examples are shown below.

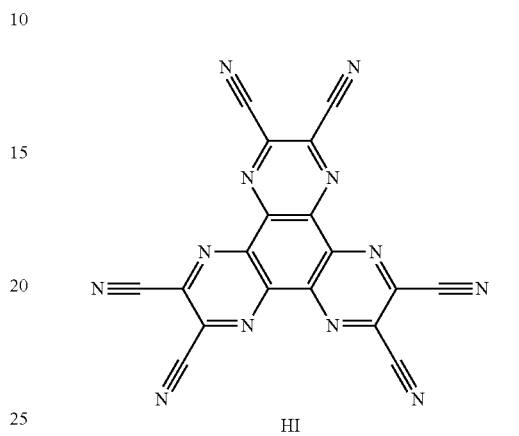

HI

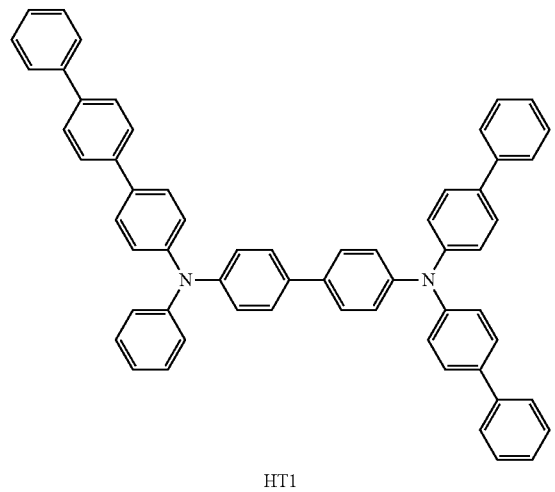

HT1

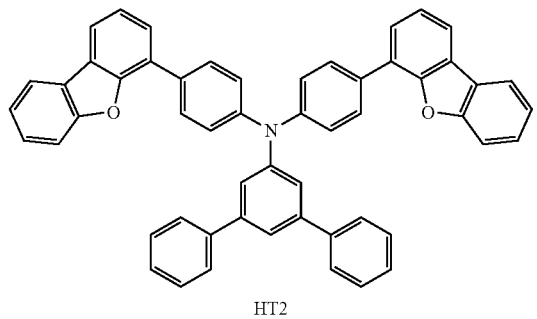

HT2

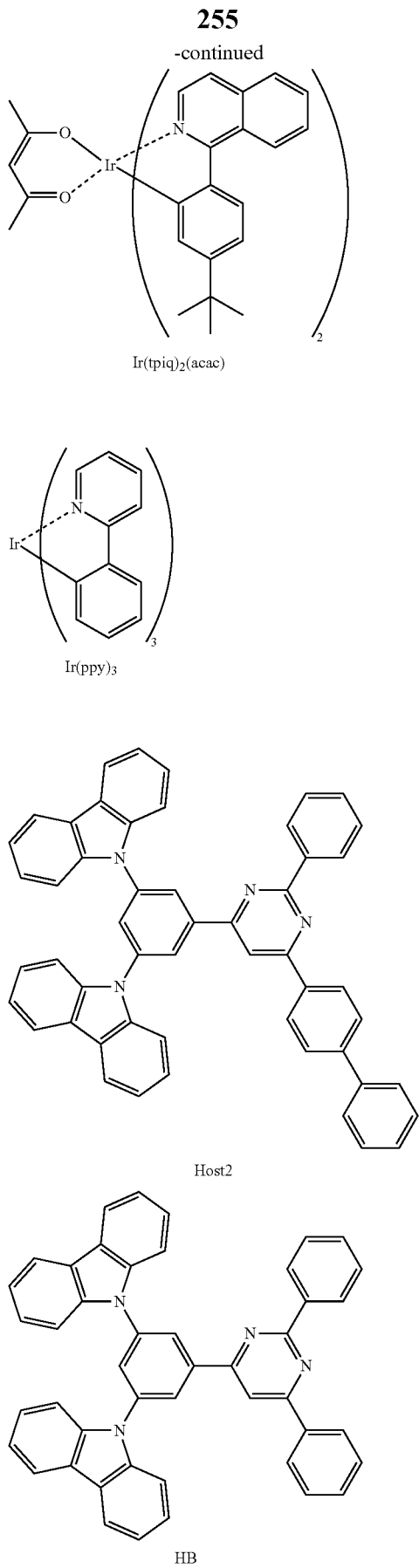

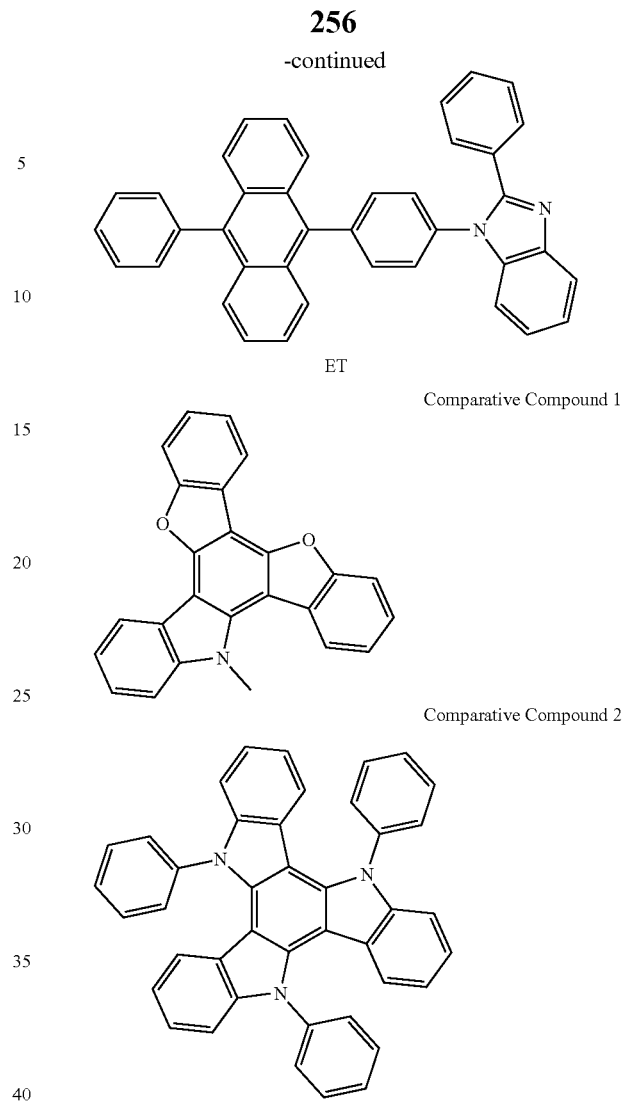

The organic EL device thus obtained was measured for the external quantum efficiency (%) and the lifetime (h) according to the following evaluation methods.

Evaluation of Emission Properties of Organic EL Device

The external quantum efficiency (%) was measured using a spectroradiometer (CS-1000 manufactured by Minolta) while driving the organic EL device thus obtained at room temperature by a constant direct current (current density: 10 mA/cm$^2$). The result is shown in Table 1.

Evaluation of Lifetime

The obtained organic EL device was allowed to emit light by driving it at room temperature by a constant direct current, and the time taken until the luminance was reduced to 80% of the initial luminance of 5000 cd/m$^2$ (LT80) was measured. The result is shown in Table 1.

Examples 26 to 47

Each organic EL device having the following device structure A, B or C was produced in the same manner as in Example 25 while using the compound listed in Table 1 as the host material or the first host material. The results of evaluation are shown in Table 1.

Device Structures

A: ITO (130 nm)/HI (10 nm)/HT1 (50 nm)/HT2 (15 nm)/host: Ir(tpiq)$_2$(acac) (40 nm, 95%:5% by mass)/HB (5 nm)/ET (30 nm)/LiF (1 nm)/Al (80 nm)

B: ITO (77 nm)/HI (10 nm)/HT1 (50 nm)/HT2 (15 nm)/host: Ir(ppy)$_3$ (30 nm, 95%:5% by mass)/HB (5 nm)/ET (30 nm)/LiF (1 nm)/Al (80 nm)

C: ITO (77 nm)/HI (10 nm)/HT1 (50 nm)/HT2 (15 nm)/first host:second host (Host2):Ir(ppy)$_3$ (40 nm, 47.5%:47.5%:5% by mass)/HB (5 nm)/ET (30 nm)/LiF (1 nm)/Al (80 nm)

Example 48

An organic EL device having the device structure A was produced in the same manner as in Example 25 except for using the following compound 25 in the light emitting layer as the host material. The results of evaluation are shown in Table 1.

Compound 25

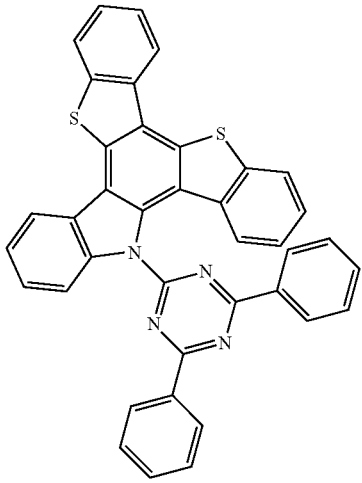

Comparative Example 1

An organic EL device having the device structure A was produced in the same manner as in Example 25 except for using the comparative compound 1 in place of the compound 1 in the light emitting layer as the host material. The obtained organic EL device was measured for the external quantum efficiency and the lifetime (LT80) until the luminance was reduced to 80%. The results are shown in Table 1.

Comparative Example 2

An organic EL device was produced in the same manner as in Example 25 except for forming the light emitting layer by using the comparative compound 2 in place of the compound 1 as the host material. The obtained organic EL device was measured for the external quantum efficiency and the lifetime. The results are shown in Table 1.

Comparative Example 3

An organic EL device having the device structure B was produced in the same manner as in Example 25 except for forming the light emitting layer by using the comparative compound 2 in place of the compound 1 as the host material. The obtained organic EL device was measured for the external quantum efficiency and the lifetime. The results are shown in Table 1.

TABLE 1

| | Host | Device structure | Voltage (V) @10 mA/cm$^2$ | External quantum efficiency (%) @10 mA/cm$^2$ | LT80 (h) @50 mA/cm$^2$ |
|---|---|---|---|---|---|
| | | | Examples | | |
| 25 | Cpd. 1 | C | 4.6 | 14.2 | 100 |
| 26 | Cpd. 3 | A | 4.2 | 19.2 | 320 |
| 27 | Cpd. 4 | A | 3.8 | 20.8 | 280 |
| 28 | Cpd. 5 | A | 4.4 | 19.7 | 450 |
| 29 | Cpd. 6 | A | 4.0 | 20.5 | 350 |
| 30 | Cpd. 7 | A | 4.6 | 16.4 | 460 |
| 31 | Cpd. 8 | A | 4.2 | 17.8 | 400 |
| 32 | Cpd. 9 | A | 4.8 | 16.3 | 380 |
| 33 | Cpd. 10 | A | 4.3 | 18.8 | 330 |
| 34 | Cpd. 11 | A | 4.1 | 19.4 | 270 |
| 35 | Cpd. 12 | A | 4.6 | 18.5 | 350 |
| 36 | Cpd. 13 | A | 5.0 | 17.8 | 320 |
| 37 | Cpd. 14 | C | 4.9 | 16.1 | 95 |
| 38 | Cpd. 15 | C | 4.9 | 16.3 | 98 |
| 39 | Cpd. 16 | C | 4.3 | 17.6 | 105 |
| 40 | Cpd. 17 | B | 3.9 | 17.8 | 88 |
| 41 | Cpd. 18 | B | 3.7 | 18.8 | 83 |
| 42 | Cpd. 19 | B | 4.1 | 17.1 | 93 |
| 43 | Cpd. 20 | A | 4.3 | 19.5 | 480 |
| 44 | Cpd. 21 | A | 4.1 | 20.3 | 430 |
| 45 | Cpd. 22 | A | 4.5 | 16.5 | 500 |
| 46 | Cpd. 23 | A | 4.1 | 17.2 | 470 |
| 47 | Cpd. 24 | B | 4.6 | 14.7 | 103 |
| 48 | Cpd. 25 | A | 4.1 | 19.5 | 230 |
| | | | Comparative Examples | | |
| 1 | Comp. Cpd. 1 | A | 5.4 | 14.4 | 120 |
| 2 | Comp. Cpd .2 | C | 4.8 | 14.6 | 88 |
| 3 | Comp. Cpd. 2 | B | 9.5 | 3.8 | 5 |

As seen from the results of Table 1, it would appear that the organic EL devices employing the heterocyclic compound of the invention show a longer emission life, when comparing the devices of Examples 25 to 48 with those of Comparative Examples 1, 2 and 3 each having the same device structure.

REFERENCE NUMERALS

1: Organic electroluminescence device
2: Substrate
3: Anode
4: Cathode
5: Light emitting layer
6: Anode-side organic thin film layer
7: Cathode-side organic thin film layer
10: Organic thin film layers (emission unit)

What is claimed is:

1. A heterocyclic compound represented by formula (6):

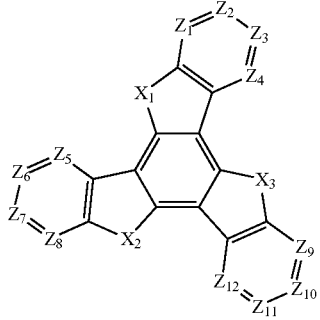
(6)

wherein:
each of $X_1$ to $X_3$ independently represents a linking group represented by any of formulae (2) to (5), two of $X_1$ to $X_3$ being represented by formula (2) and the other being represented by any of formulae (3) to (5):

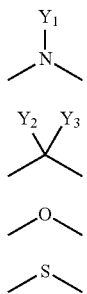

(2)
(3)
(4)
(5)

in formula (2), $Y_1$ represents a substituted or unsubstituted aryl group having 6 to 50 ring carbon atoms or a substituted or unsubstituted heteroaryl group having 5 to 50 ring atoms;

in formula (3), each of $Y_2$ and $Y_3$ independently represents a hydrogen atom or a group, $Y_2$ and $Y_3$ being optionally bonded to each other to form a ring structure;

each of $Z_1$ to $Z_{12}$ independently represents CH, CR, or a nitrogen atom;

each R independently represents a substituent group;

when two or more of $Z_1$ to $Z_{12}$ are CR, the substituent R groups are not bonded to each other to form a ring structure; and each of $Y_1$ to $Y_3$ is optionally bonded to a substituent R group to form a ring structure;

provided that each substituent R group of $Z_2$, $Z_3$, $Z_6$, $Z_7$, $Z_{10}$, and $Z_{11}$ is independently selected from the group consisting of: a substituted or unsubstituted alkyl group having 1 to 50 carbon atoms; a substituted or unsubstituted cycloalkyl group having 3 to 50 ring carbon atoms; a substituted or unsubstituted aralkyl group having 7 to 51 carbon atoms; an amino group; a mono- or di-substituted amino group, wherein the substituent is a substituted or unsubstituted alkyl group having 1 to 50 carbon atoms; a mono-, di- or tri-substituted silyl group, wherein the substituent is a substituted or unsubstituted alkyl group having 1 to 50 carbon atoms; a substituted or unsubstituted heteroaryl group having 5 to 50 ring atoms; a nitro group; a di-substituted phosphoryl group, wherein the substituent is a substituted or unsubstituted alkyl group having 1 to 50 carbon atoms; a boron-containing group; a zinc-containing group; a tin-containing group; a silicon-containing group; a magnesium-containing group; a lithium-containing group; a hydroxyl group; a carboxyl group; a vinyl group; a (meth)acryloyl group; an epoxy group; and an oxetanyl group.

2. The heterocyclic compound according to claim 1, wherein each substituent R group of $Z_1$, $Z_4$, $Z_5$, $Z_8$, $Z_9$, and $Z_{12}$ is independently selected from the group consisting of a substituted or unsubstituted alkyl group having 1 to 50 carbon atoms; a substituted or unsubstituted cycloalkyl group having 3 to 50 ring carbon atoms; a substituted or unsubstituted aryl group having 6 to 50 ring carbon atoms; a substituted or unsubstituted aralkyl group having 7 to 51 carbon atoms; an amino group; a mono- or di-substituted amino group, wherein the substituent is selected from a substituted or unsubstituted alkyl group having 1 to 50 carbon atoms and a substituted or unsubstituted aryl group having 6 to 50 ring carbon atoms; a substituted or unsubstituted alkoxy group having 1 to 50 carbon atoms; an aryloxy group having 6 to 50 ring carbon atoms; a mono-, di- or tri-substituted silyl group, wherein the substituent is selected from a substituted or unsubstituted alkyl group having 1 to 50 carbon atoms and a substituted or unsubstituted aryl group having 6 to 50 ring carbon atoms; a substituted or unsubstituted heteroaryl group having 5 to 50 ring atoms; a substituted or unsubstituted haloalkyl group having 1 to 50 carbon atoms; a halogen atom; a cyano group; a nitro group; a substituted sulfonyl group, wherein the substituent is selected from a substituted or unsubstituted alkyl group having 1 to 50 carbon atoms and a substituted or unsubstituted aryl group having 6 to 50 ring carbon atoms; a di-substituted phosphoryl group, wherein the substituent is selected from a substituted or unsubstituted alkyl group having 1 to 50 carbon atoms and a substituted or unsubstituted aryl group having 6 to 50 ring carbon atoms; an alkylsulfonyloxy group; an arylsulfonyloxy group; an alkylcarbonyloxy group; an arylcarbonyloxy group; a boron-containing group; a zinc-containing group; a tin-containing group; a silicon-containing group; a magnesium-containing group; a lithium-containing group; a hydroxyl group; an alkyl-substituted or aryl-substituted carbonyl group; a carboxyl group; a vinyl group; a (meth)acryloyl group; an epoxy group; and an oxetanyl group.

3. The heterocyclic compound according to claim 1, wherein each substituent R group of $Z_1$, $Z_4$, $Z_5$, $Z_8$, $Z_9$, and $Z_{12}$ is independently selected from the group consisting of a hydrogen atom; a substituted or unsubstituted alkyl group having 1 to 50 carbon atoms; a substituted or unsubstituted cycloalkyl group having 3 to 50 ring carbon atoms; a substituted or unsubstituted aryl group having 6 to 50 ring carbon atoms; a substituted or unsubstituted aralkyl group having 7 to 51 carbon atoms; an amino group; a mono- or di-substituted amino group, wherein the substituent is selected from a substituted or unsubstituted alkyl group having 1 to 50 carbon atoms and a substituted or unsubstituted aryl group having 6 to 50 ring carbon atoms; a substituted or unsubstituted alkoxy group having 1 to 50 carbon atoms; an aryloxy group having 6 to 50 ring carbon atoms; a mono-, di- or tri-substituted silyl group, wherein the substituent is selected from a substituted or unsubstituted alkyl group having 1 to 50 carbon atoms and a substituted or unsubstituted aryl group having 6 to 50 ring carbon atoms;

a substituted or unsubstituted heteroaryl group having 5 to 50 ring atoms; a substituted or unsubstituted haloalkyl group having 1 to 50 carbon atoms; a halogen atom; a cyano group; a nitro group; a substituted sulfonyl group, wherein the substituent is selected from a substituted or unsubstituted alkyl group having 1 to 50 carbon atoms and a substituted or unsubstituted aryl group having 6 to 50 ring carbon atoms; and a di-substituted phosphoryl group, wherein the substituent is selected from a substituted or unsubstituted alkyl group having 1 to 50 carbon atoms and a substituted or unsubstituted aryl group having 6 to 50 ring carbon atoms.

4. The heterocyclic compound according to claim 1, wherein each substituent R group of $Z_1$, $Z_4$, $Z_5$, $Z_8$, $Z_9$, and $Z_{12}$ is independently selected from the group consisting of a hydrogen atom; a substituted or unsubstituted alkyl group having 1 to 50 carbon atoms; a substituted or unsubstituted cycloalkyl group having 3 to 50 ring carbon atoms; a substituted or unsubstituted aryl group having 6 to 50 ring carbon atoms; a substituted or unsubstituted aralkyl group having 7 to 51 carbon atoms; an amino group; a mono- or di-substituted amino group, wherein the substituent is selected from a substituted or unsubstituted alkyl group having 1 to 50 carbon atoms and a substituted or unsubstituted aryl group having 6 to 50 ring carbon atoms; a substituted or unsubstituted alkoxy group having 1 to 50 carbon atoms; an aryloxy group having 6 to 50 ring carbon atoms; a mono-, di- or tri-substituted silyl group, wherein the substituent is selected from a substituted or unsubstituted alkyl group having 1 to 50 carbon atoms and a substituted or unsubstituted aryl group having 6 to 50 ring carbon atoms; a substituted or unsubstituted heteroaryl group having 5 to 50 ring atoms; a substituted or unsubstituted haloalkyl group having 1 to 50 carbon atoms; a halogen atom; a cyano group; and a nitro group.

5. The heterocyclic compound according to claim 1, wherein each of $Y_2$ and $Y_3$ in formula (3) is independently selected from the group consisting of a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, and a substituted or unsubstituted heteroaryl group having 5 to 50 ring atoms.

6. The heterocyclic compound according to claim 1, wherein one of $X_1$ to $X_3$ is represented by formula (3).

7. The heterocyclic compound according to claim 1, wherein one of $X_1$ to $X_3$ is represented by formula (4).

8. The heterocyclic compound according to claim 1, wherein each of $Z_1$, $Z_4$, $Z_5$, $Z_8$, $Z_9$, and $Z_{12}$ is independently CH or CR.

9. A material for organic electroluminescence device comprising the heterocyclic compound according to claim 1.

10. An organic electroluminescence device, comprising:
an anode;
a cathode; and
one or more organic thin film layers between the anode and the cathode;
wherein:
the one or more organic thin film layers comprise a light emitting layer; and
at least one layer of the one or more organic thin film layers comprises the heterocyclic compound according to claim 1.

11. An organic electroluminescence device, comprising:
an anode;
a cathode; and
one or more organic thin film layers between the anode and the cathode;
wherein:
the one or more organic thin film layers comprise a light emitting layer; and
the light emitting layer comprises a heterocyclic compound according to formula (6):

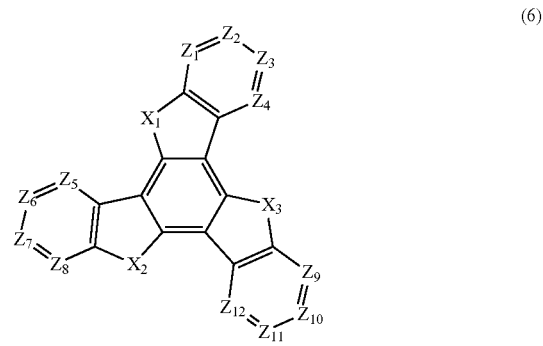

wherein:
each of $X_1$ to $X_3$ independently represents a linking group represented by any of formulae (2) to (5), one or two of $X_1$ to $X_3$ being represented by formula (2) and a remainder being represented by any of formulae (3) to (5):

in formula (2), $Y_1$ represents a substituted or unsubstituted aryl group having 6 to 50 ring carbon atoms or a substituted or unsubstituted heteroaryl group having 5 to 50 ring atoms; and
in formula (3), each of $Y_2$ and $Y_3$ independently represents a hydrogen atom or a group, $Y_2$ and $Y_3$ being optionally bonded to each other to form a ring structure;
each of $Z_1$ to $Z_{12}$ independently represents CH, C(R), or a nitrogen atom;
each R independently represents a substituent group;
when two or more of $Z_1$ to $Z_{12}$ are CR, the substituent R groups are not bonded to each other to form a ring structure; and
each of $Y_1$ to $Y_3$ is optionally bonded to a substituent R group to form a ring structure;
provided that each substituent R group of $Z_2$, $Z_3$, $Z_6$, $Z_7$, $Z_{10}$, and $Z_{11}$ is independently selected from the group consisting of: a substituted or unsubstituted alkyl group having 1 to 50 carbon atoms; a substituted or unsubstituted cycloalkyl group having 3 to 50 ring carbon atoms; a substituted or unsubstituted aralkyl group having 7 to 51 carbon atoms; an amino group; a mono- or di-substituted amino group, wherein the substituent is a substituted or unsubstituted alkyl group having 1 to 50 carbon atoms; a mono-, di- or tri-substituted silyl group, wherein the substituent is a substituted or unsubstituted alkyl group having 1 to 50 carbon atoms; a substituted or unsubstituted heteroaryl group having 5 to 50 ring atoms; a nitro group; a di-substituted phosphoryl group, wherein the substituent is a substituted or unsubstituted alkyl group having 1 to 50 carbon atoms; a boron-containing group; a zinc-containing group; a tin-containing group; a silicon-containing group; a magnesium-containing group; a lithium-containing group; a hydroxyl group; a carboxyl group; a vinyl group; a (meth)acryloyl group; an epoxy group; and an oxetanyl group.

12. The organic electroluminescence device according to claim 11, wherein the organic electroluminescence device further comprises an anode-side organic thin film layer between the anode and the light emitting layer, and the anode-side organic thin film layer comprises the heterocyclic compound.

13. The organic electroluminescence device according to claim 11, wherein the organic electroluminescence device further comprises a cathode-side organic thin film layer between the cathode and the light emitting layer, and the cathode-side organic thin film layer comprises the heterocyclic compound.

14. An organic electroluminescence device, comprising:
an anode;
a cathode; and
one or more organic thin film layers between the anode and the cathode;
wherein:
the one or more organic thin film layers comprise a light emitting layer;
the light emitting layer comprises a phosphorescent emitting material; and
at least one layer of the one or more organic thin film layers comprises a heterocyclic compound according to formula (6):

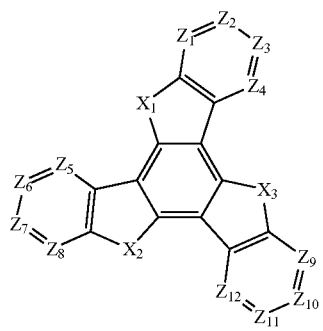

(6)

wherein:
each of $X_1$ to $X_3$ independently represents a linking group represented by any of formulae (2) to (5), one or two of $X_1$ to $X_3$ being represented by formula (2) and a remainder being represented by any of formulae (3) to (5):

(2)

(3)

(4)

(5)

in formula (2), $Y_1$ represents a substituted or unsubstituted aryl group having 6 to 50 ring carbon atoms or a substituted or unsubstituted heteroaryl group having 5 to 50 ring atoms; and in formula (3), each of $Y_2$ and $Y_3$ independently represents a hydrogen atom or a group, $Y_2$ and $Y_3$ being optionally bonded to each other to form a ring structure;

each of $Z_1$ to $Z_{12}$ independently represents CH, C(R), or a nitrogen atom;

each R independently represents a substituent group;

when two or more of $Z_1$ to $Z_{12}$ are CR, the substituent R groups are not bonded to each other to form a ring structure; and each of $Y_1$ to $Y_3$ is optionally bonded to a substituent R group to form a ring structure;

provided that each substituent R group of $Z_2$, $Z_3$, $Z_6$, $Z_7$, $Z_{10}$, and $Z_{11}$ is independently selected from the group consisting of: a substituted or unsubstituted alkyl group having 1 to 50 carbon atoms; a substituted or unsubstituted cycloalkyl group having 3 to 50 ring carbon atoms; a substituted or unsubstituted aralkyl group having 7 to 51 carbon atoms; an amino group; a mono- or di-substituted amino group, wherein the substituent is a substituted or unsubstituted alkyl group having 1 to 50 carbon atoms; a mono-, di- or tri-substituted silyl group, wherein the substituent is a substituted or unsubstituted alkyl group having 1 to 50 carbon atoms; a substituted or unsubstituted heteroaryl group having 5 to 50 ring atoms; a nitro group; a di-substituted phosphoryl group, wherein the substituent is a substituted or unsubstituted alkyl group having 1 to 50 carbon atoms; a boron-containing group; a zinc-containing group; a tin-containing group; a silicon-containing group; a magnesium-containing group; a lithium-containing group; a hydroxyl group; a carboxyl group; a vinyl group; a (meth)acryloyl group; an epoxy group; and an oxetanyl group.

15. The organic electroluminescence device according to claim 11, wherein the light emitting layer comprises a fluorescent emitting material.

16. The organic electroluminescence device according to claim 14, wherein the phosphorescent emitting material is an ortho-metallated complex of a metal selected from the group consisting of iridium (Ir), osmium (Os), and platinum (Pt).

17. An electronic equipment comprising the organic electroluminescence device according to claim 11.

18. The heterocyclic compound according to claim 1, wherein each substituent R group of $Z_1$, $Z_4$, $Z_5$, $Z_8$, $Z_9$, and $Z_{12}$ is independently selected from the group consisting of: a substituted or unsubstituted alkyl group having 1 to 50 carbon atoms; a substituted or unsubstituted cycloalkyl group having 3 to 50 ring carbon atoms; a substituted or unsubstituted aralkyl group having 7 to 51 carbon atoms; an amino group; a mono- or di-substituted amino group, wherein the substituent is a substituted or unsubstituted alkyl group having 1 to 50 carbon atoms; a mono-, di- or tri-substituted silyl group, wherein the substituent is a substituted or unsubstituted alkyl group having 1 to 50 carbon atoms; a substituted or unsubstituted heteroaryl group having 5 to 50 ring atoms; a nitro group; a di-substituted phosphoryl group, wherein the substituent is a substituted or unsubstituted alkyl group having 1 to 50 carbon atoms; a boron-containing group; a zinc-containing group; a tin-containing group; a silicon-containing group; a magnesium-containing group; a lithium-containing group; a hydroxyl group; a carboxyl group; a vinyl group; a (meth)acryloyl group; an epoxy group; and an oxetanyl group.

19. The heterocyclic compound according to claim 1, wherein each of $Z_1$ to $Z_{12}$ in formula (6) is independently CH or a nitrogen atom.

\* \* \* \* \*